(12) United States Patent
Shinohara

(10) Patent No.: US 8,652,955 B2
(45) Date of Patent: Feb. 18, 2014

(54) MANUFACTURING METHOD OF SEMICONDUCTOR INTEGRATED CIRCUIT DEVICE

(75) Inventor: Masaaki Shinohara, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 78 days.

(21) Appl. No.: 13/396,429

(22) Filed: Feb. 14, 2012

(65) Prior Publication Data

US 2012/0244694 A1 Sep. 27, 2012

(30) Foreign Application Priority Data

Mar. 22, 2011 (JP) .................................. 2011-062139

(51) Int. Cl.
*H01L 21/3205* (2006.01)

(52) U.S. Cl.
USPC ........................................................ 438/585

(58) Field of Classification Search
None
See application file for complete search history.

(56) References Cited

U.S. PATENT DOCUMENTS

| | | | |
|---|---|---|---|
| 7,462,566 B2 | 12/2008 | Fujita et al. | |
| 2002/0059557 A1 | 5/2002 | Shin et al. | |
| 2010/0124815 A1 | 5/2010 | Sudo | |

FOREIGN PATENT DOCUMENTS

| | | |
|---|---|---|
| JP | 2002-175981 A | 6/2002 |
| JP | 2008-091824 A | 4/2008 |
| JP | 2010-118599 A | 5/2010 |

*Primary Examiner* — Scott B Geyer
(74) *Attorney, Agent, or Firm* — McDermott Will & Emery LLP

(57) ABSTRACT

Provided is a manufacturing method of semiconductor integrated circuit, which is effective when applied to a processing technique for a gate electrode or the like. In the patterning of a gate stack film having a high-k gate insulating film and a metal electrode film in a memory region, etching for a cut region between adjacent gate electrodes is performed first using a first resist film and, after the first resist film that is no longer needed is removed, etching for a line and space pattern is performed using a second resist film.

20 Claims, 107 Drawing Sheets

MANUFACTURING METHOD OF SEMICONDUCTOR INTEGRATED CIRCUIT DEVICE

CROSS-REFERENCE TO RELATED APPLICATIONS

The disclosure of Japanese Patent Application No. 2011-62139 filed on Mar. 22, 2011 including the specification, drawings and abstract is incorporated herein by reference in its entirety.

BACKGROUND

The present invention relates to a technology which is effective when applied to a processing technique for a gate electrode or the like in a manufacturing method of a semiconductor integrated circuit device (or semiconductor device).

Japanese Unexamined Patent Publication No. 2002-175981 (Patent Document 1) or US Patent Publication No. 2002-59557 (Patent Document 2) corresponding thereto discloses a technique in which, in the patterning of gate electrodes in a SRAM (Static Random Access Memory) or the like, in order to avoid the Rounding of pattern corner portions, the steps of patterning a resist film with respect to a hard mask film, patterning the hard mask film using the resist film, and removing the resist film are repeated twice to obtain a hard-mask-film pattern of which the corner portions are not Rounded.

Japanese Unexamined Patent Publication No. 2008-91824 (Patent Document 3) or U.S. Pat. No. 7,462,566 (Patent Document 4) corresponding thereto discloses a technique in which, in the patterning of gate electrodes or the like, after a hard mask is patterned first using a first resist film having a line & space pattern and the resist film is removed, a micropattern is transferred onto a second resist film and, using the new resist film, the hard mask is processed.

Japanese Unexamined Patent Publication No. 2010-118599 (Patent Document 5) discloses a technique in which, in the patterning of gate electrodes or the like, etching of a target film for separating gate abutment portions located over an isolation region is performed first using a first resist film and, after the resist is removed, etching of the target film is performed using a second resist film having a line & space pattern.

RELATED ART DOCUMENTS

Patent Documents

[Patent Document 1]
Japanese Unexamined Patent Publication No. 2002-175981
[Patent Document 2]
US Patent Publication No. 2002-59557
[Patent Document 3]
Japanese Unexamined Patent Publication No. 2008-91824
[Patent Document 4]
U.S. Pat. No. 7,462,566
[Patent Document 5]
Japanese Unexamined Patent Publication No. 2010-118599

SUMMARY

In order to miniaturize a pattern, particularly to reduce the cell area of a SRAM, it is important to reduce the distance between the end portions of adjacent gates. However, at 28 nm technology node, it is generally difficult to transfer a pattern by one-shot exposure using ArF (at a wavelength of 193 nm). Accordingly, a micropattern is typically formed by repeating exposure, etching, and the like a plurality of times. However, there are such problems that, after the etching for the line & space pattern, the new resist pattern is not planarized and that oxidation resistance and wet etch resistance are low due to the use of a High-k insulating film and a metal electrode member in a gate stack material.

The present invention has been achieved in order to solve such problems.

An object of the present invention is to provide a manufacturing process of a semiconductor integrated circuit device having high reliability.

The above and other objects and novel features of the present invention will become apparent from a statement in the present specification and the accompanying drawings.

The following is a brief description of the outline of a representative embodiment of the invention disclosed in the present application.

That is, according to an aspect of the present invention, in the patterning of a gate stack film (including a dummy gate stack film) having a high-k gate insulating film and a metal electrode film in a memory region, etching for a cut region between adjacent gate electrodes is performed first using a first resist film and, after the first resist film that is no longer needed is removed, etching for a line & space pattern is performed using a second resist film.

The following is a brief description of an effect obtained according to the representative embodiment of the invention disclosed in the present application.

That is, in the patterning of a gate stack film (including a dummy gate stack film) having a high-k gate insulating film and a metal electrode film in a memory region, etching for a cut region between adjacent gate electrodes is performed first using a first resist film and, after the first resist film that is no longer needed is removed, etching for a line & space pattern is performed using a second resist film. Therefore, it is possible to improve the planarity of the upper surface of the second resist when the resist film is formed.

DETAILED DESCRIPTION

[Outline of Embodiments]

Figure 1:
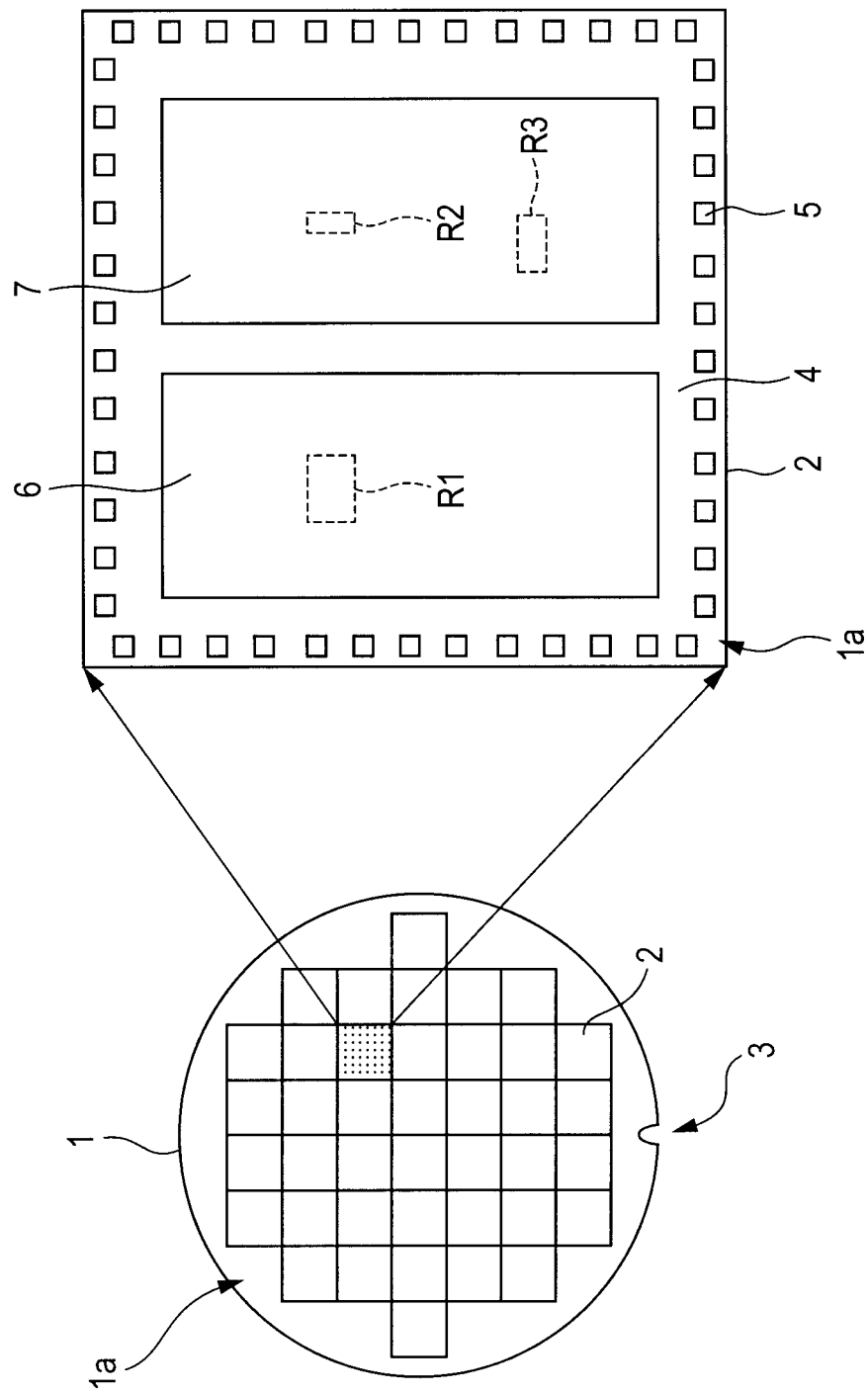
FIG. 1 is a top view of a wafer and a chip for illustrating a top layout of a SOC chip as an example of a target device and so forth in a manufacturing method of a semiconductor integrated circuit device of an embodiment of a first part of the present invention.

First, a description will be given to the outline of representative embodiments (mainly related to a first part) of the invention disclosed in the present application.

1. A method of manufacturing a semiconductor integrated circuit device includes the steps of: (a) providing a semiconductor wafer having first and second main surfaces, of which the first main surface has a plurality of chip regions including a memory region and a non-memory region; (b) forming, over the first main surface of the semiconductor wafer, a gate stack film having a lower-layer high-k gate insulating film and an upper-layer gate metal electrode film; (c) forming, over the gate stack film, a first resist film for defining a cut region between adjacent gate electrodes in extending directions of gate electrodes in the memory region; (d) performing patterning of the first resist film to form a resist film opening corresponding to the cut region between adjacent gate electrodes; (e) performing etching of the gate stack film in the presence of the patterned first resist film; (f) after the step (e), removing the first resist film; (g) after the step (f), forming, over the first main surface of the semiconductor wafer, a second resist film for defining a line & space pattern corresponding to the gate electrodes in the memory region; (h) performing patterning of the second resist film; (i) performing etching of the gate stack film in the presence of the patterned second resist film; and (j) after the step (i), removing the second resist film.

2. In the method of manufacturing a semiconductor integrated circuit device according to article 1, there is no hard mask film between each of the first and second resist films and the gate stack film.

3. In the method of manufacturing a semiconductor integrated circuit device according to article 1 or 2, the second resist film in the step (g) is for also defining a line & space pattern corresponding to gate electrodes in the non-memory region.

4. In the method of manufacturing a semiconductor integrated circuit device according to any one of articles 1 to 3, the cut region between adjacent gate electrodes is in an isolation region.

5. In the method of manufacturing a semiconductor integrated circuit device according to any one of articles 1 to 4, each of the first and second resist films is a multilayer resist film.

6. In the method of manufacturing a semiconductor integrated circuit device according to any one of articles 1 to 5, the step (e) includes the sub-steps of: (e1) performing a treatment for reducing the resist film opening; and (e2) after the sub-step (e1), performing anisotropic dry etching of the gate stack film below the resist film opening.

7. In the method of manufacturing a semiconductor integrated circuit device according to any one of articles 1 to 6, the step (i) includes the sub-steps of: (i1) performing a treatment for reducing a width of the patterned second resist film; and (i2) after the sub-step (i1), performing anisotropic dry etching of a portion of the gate stack film which is not covered with the second resist film.

8. In the method of manufacturing a semiconductor integrated circuit device according to any one of articles 1 to 7, the patterning in each of the steps (d) and (h) is performed by ArF lithography using exposure light at 193 nm.

9. In the method of manufacturing a semiconductor integrated circuit device according to any one of articles 1 to 8, each of the first resist film and the second resist film has: (x1) a lower-layer resist film containing carbon as a main component; (x2) a middle-layer resist film formed over the lower-layer resist film and containing silicon as a main component; and (x3) an upper-layer resist film formed over the middle-layer resist film.

10. In the method of manufacturing a semiconductor integrated circuit device according to any one of articles 1 to 9, the second resist film has: (x1) a lower-layer coated resist film containing carbon as a main component; (x2) a middle-layer resist film formed over the lower-layer resist film and containing silicon as a main component; and (x3) a photosensitive upper-layer resist film formed over the middle-layer resist film.

Next, a description will be given to the outline of other embodiments (mainly related to a second part) of the invention disclosed in the present application.

1. A method of manufacturing a semiconductor integrated circuit device includes the steps of: (a) providing a semiconductor wafer having first and second main surfaces, of which the first main surface has a plurality of chip regions including a memory region and a non-memory region; (b) forming, over the first main surface of the semiconductor wafer, a gate stack film having a lower-layer high-k gate insulating film and an upper-layer gate metal electrode film; (c) forming, over the gate stack film, a hard mask film for gate processing; (d) forming, over the hard mask film for gate processing, a first resist film for defining a cut region between adjacent gate electrodes in extending directions of gate electrodes in the memory region; (e) performing patterning of the first resist film to form a resist film opening corresponding to the cut region between adjacent gate electrodes; (f) performing etching of the hard mask film for gate processing in the presence of the patterned first resist film; (g) after the step (f), removing the first resist film; (h) after the step (c), forming, over the hard mask film for gate processing, a second resist film for defining a line & space pattern corresponding to the gate electrodes in the memory region; (i) performing patterning of the second resist film; (j) performing etching of the hard mask film for gate processing in the presence of the patterned second resist film; (k) after the step (j), removing the second resist film; (l) after the steps (g) and (k), performing etching of the gate stack film in the presence of the patterned hard mask film for gate processing; and (m) after the step (l), removing the hard mask film for gate processing.

2. In the method of manufacturing a semiconductor integrated circuit device according to article 1, the step (h) is performed prior to the step (d).

3. In the method of manufacturing a semiconductor integrated circuit device according to article 1 or 2, the second resist film in the step (h) is for defining a line & space pattern corresponding to gate electrodes in the non-memory region.

4. In the method of manufacturing a semiconductor integrated circuit device according to any one of articles 1 to 3, the cut region between adjacent gate electrodes is in an isolation region.

5. In the method of manufacturing a semiconductor integrated circuit device according to any one of articles 1 to 4, each of the first and second resist films is a multilayer resist film.

6. In the method of manufacturing a semiconductor integrated circuit device according to any one of articles 1 to 5, the step (e) includes the sub-steps of: (e1) performing a treatment for reducing the resist film opening; and (e2) after the sub-step (e1), performing anisotropic dry etching of the hard mask film for gate processing below the resist film opening.

7. In the method of manufacturing a semiconductor integrated circuit device according to any one of articles 1 to 6, the step (i) includes the sub-steps of: (i1) performing a treatment for reducing a width of the patterned second resist film; and (i2) after the sub-step (i1), performing anisotropic dry etching of a portion of the hard mask film for gate processing which is not covered with the second resist film.

8. In the method of manufacturing a semiconductor integrated circuit device according to any one of articles 1 to 7, the patterning in each of the steps (e) and (i) is performed by ArF lithography using exposure light at 193 nm.

9. In the method of manufacturing a semiconductor integrated circuit device according to any one of articles 1 to 8, the first resist film has: (x1) a lower-layer resist film containing carbon as a main component; (x2) a middle-layer resist film formed over the lower-layer resist film and containing silicon as a main component; and (x3) an upper-layer resist film formed over the middle-layer resist film.

10. In the method of manufacturing a semiconductor integrated circuit device according to any one of articles 1 to 9, the second resist film has: (x1) a lower-layer coated resist film containing carbon as a main component; (x2) a middle-layer resist film formed over the lower-layer resist film and containing silicon as a main component; and (x3) a photosensitive upper-layer resist film formed over the middle-layer resist film.

11. The method of manufacturing a semiconductor integrated circuit device according to any one of articles 1 to 10 further includes the step of: (n) after the step (l) and prior to the step (m), growing a selective epitaxial layer from the first main surface of the semiconductor wafer.

12. In the method of manufacturing a semiconductor integrated circuit device according to article 11, the selective epitaxial layer is a SiGe-based epitaxial layer.

Next, a description will be given to the outline of still other embodiments (mainly related to a third part) of the invention disclosed in the present application.

1. A method of manufacturing a semiconductor integrated circuit device includes the steps of: (a) providing a semiconductor wafer having first and second main surfaces, of which the first main surface has a plurality of chip regions including a memory region and a non-memory region; (b) forming, over the first main surface of the semiconductor wafer, a gate stack film having a lower-layer high-k gate insulating film and an upper-layer dummy gate metal electrode film; (c) forming, over the gate stack film, a hard mask film for dummy gate processing; (d) forming, over the hard mask film for dummy gate processing, a first resist film for defining a cut region between adjacent gate electrodes in extending directions of dummy gate electrodes in the memory region; (e) performing patterning of the first resist film to form a resist film opening corresponding to the cut region between adjacent gate electrodes; (f) performing etching of the hard mask film for dummy gate processing in the presence of the patterned first resist film; (g) after the step (f), removing the first resist film; (h) after the step (c), forming, over the hard mask film for dummy gate processing, a second resist film for defining a line & space pattern corresponding to the dummy gate electrodes in the memory region; (i) performing patterning of the second resist film; (j) performing etching of the hard mask film for dummy gate processing in the presence of the patterned second resist film; (k) after the step (j), removing the second resist film; (l) after the steps (g) and (k), performing etching of the gate stack film in the presence of the patterned hard mask film for dummy gate processing; and (m) after the step (l), removing the hard mask film for dummy gate processing.

2. In the method of manufacturing a semiconductor integrated circuit device according to article 1, the step (h) is performed after the step (d).

3. In the method of manufacturing a semiconductor integrated circuit device according to article 1 or 2, the second resist film in the step (h) is for defining a line & space pattern corresponding to dummy gate electrodes in the non-memory region.

4. In the method of manufacturing a semiconductor integrated circuit device according to any one of articles 1 to 3, the cut region between adjacent gate electrodes is in an isolation region.

5. In the method of manufacturing a semiconductor integrated circuit device according to any one of articles 1 to 4, each of the first and second resist films is a multilayer resist film.

6. In the method of manufacturing a semiconductor integrated circuit device according to any one of articles 1 to 5, the step (e) includes the sub-steps of: (e1) performing a treatment for reducing the resist film opening; and (e2) after the sub-step (e1), performing anisotropic dry etching of the hard mask film for dummy gate processing below the resist film opening.

7. In the method of manufacturing a semiconductor integrated circuit device according to any one of articles 1 to 6, the step (i) includes the sub-steps of: (i1) performing a treatment for reducing a width of the patterned second resist film; and (i2) after the sub-step (i1), performing anisotropic dry etching of a portion of the hard mask film for dummy gate processing which is not covered with the second resist film.

8. In the method of manufacturing a semiconductor integrated circuit device according to any one of articles 1 to 7, the patterning in each of the steps (e) and (i) is performed by ArF lithography using exposure light at 193 nm.

9. In the method of manufacturing a semiconductor integrated circuit device according to any one of articles 1 to 8, the first resist film has: (x1) a lower-layer resist film containing carbon as a main component; (x2) a middle-layer resist film formed over the lower-layer resist film and containing silicon as a main component; and (x3) an upper-layer resist film formed over the middle-layer resist film.

10. In the method of manufacturing a semiconductor integrated circuit device according to any one of articles 1 to 9, the second resist film has: (x1) a lower-layer coated resist film containing carbon as a main component; (x2) a middle-layer resist film formed over the lower-layer resist film and containing silicon as a main component; and (x3) a photosensitive upper-layer resist film formed over the middle-layer resist film.

11. The method of manufacturing a semiconductor integrated circuit device according to any one of articles 1 to 10 further includes the step of: (n) after the step (1) and prior to the step (m), growing a selective epitaxial layer from the first main surface of the semiconductor wafer.

12. In the method of manufacturing a semiconductor integrated circuit device according to article 11, the selective epitaxial layer is a SiGe-based epitaxial layer.

[Explanation of Description Form, Basic Terminology, and Use thereof in Present Application]

1. In the present application, if necessary for the sake of convenience, the description of an embodiment may be such that the embodiment is divided into a plurality of sections in the description thereof. However, they are by no means independent of or distinct from each other unless particularly explicitly described otherwise, and one of the individual sections of a single example is details, variations, and so forth of part or the whole of the others. In principle, a repeated description of like parts will be omitted. Each constituent element in the embodiment is not indispensable unless particularly explicitly described otherwise, unless the constituent element is theoretically limited to a given number, or unless it is obvious from the context that the constituent element is indispensable.

Also in the present application, when "semiconductor devices" or "semiconductor integrated circuit devices" are mentioned, they primarily refer to various stand-alone transistors (active elements) and to a device in which a resistor, a capacitor, and the like are integrated around such a stand-alone transistor over a semiconductor chip or the like (e.g., a single-crystal silicon substrate). Representative examples of the various transistors that can be shown include MISFETs (Metal Insulator Semiconductor Field Effect Transistors) represented by a MOSFET (Metal Oxide Semiconductor Field Effect Transistor). Representative examples of an integrated circuit structure that can be shown include CMIS (Complementary Metal Insulator Semiconductor) integrated circuits represented by a CMOS (Complementary Metal Oxide Semiconductor) integrated circuit which is a combination of an N-channel MISFET and a P-channel MISFET.

A wafer process for a present-day semiconductor integrated circuit device, i.e., LSI (Large Scale Integration) can be roughly sub-divided into a FEOL (Front End of Line) process from the loading of a silicon wafer as a raw material to a Premetal process (process including the formation of an interlayer insulating film between the lower end of a M1 wiring layer and a gate electrode structure or the like, the formation of contact holes, the burying of tungsten plugs, and so forth) or the like and a BEOL (Back End of Line) process starting with the formation of the M1 wiring layer, and ending at the formation of a pad opening in a final passivation film over an aluminum-based pad electrode or the like (a wafer-level packaging process is also included in the BEOL process).

2. Likewise, even when such wording as "X comprised of A" is used in association with a material, a composition, or the like in the description of the embodiment or the like, it does not exclude a material, a composition, or the like which contains an element other than A as one of the main constituent elements thereof unless particularly explicitly described otherwise or unless it is obvious from the context that it excludes such a material, a composition, or the like. For example, when a component is mentioned, the wording means "X containing A as a main component" or the like. It will be appreciated that, even when, e.g., a "silicon member" or the like is mentioned, it is not limited to pure silicon, and a member containing a SiGe alloy, another multi-element alloy containing silicon as a main component, another additive, or the like is also included. Likewise, it will also be appreciated that, even when a "silicon oxide film", "silicon-oxide-based insulating film", or the like is mentioned, it includes not only a relatively pure Undoped Silicon Dioxide, but also a thermal oxide film of FSG (Fluorosilicate Glass), TEOS-based silicon oxide, SiOC (Silicon Oxycarbide), Carbon-doped Silicon oxide, OSG (Organosilicate glass), PSG (Phosphorus Silicate Glass), BPSG (Borophosphosilicate Glass), or the like, a CVD oxide film, a coated silicon oxide such as SOG (Spin ON Glass) or NCS (Nano-Clustering Silica), a silica-based Low-k insulating film (porous insulating film) obtained by introducing voids into the same member as mentioned above, a composite film with another silicon-based insulating film which contains any of these mentioned above as a main constituent element thereof, and the like.

As a silicon-based insulating film commonly used in a semiconductor field along with a silicon-oxide-based insulating film, there is a silicon-nitride-based insulating film. Materials belonging to this system include SiN, SiCN, SiNH, SiCNH, and the like. Here, when "silicon nitride" is mentioned, it includes both of SiN and SiNH unless particularly explicitly described otherwise. Likewise, when "SiCN" is mentioned, it includes both of SiCN and SiCNH unless particularly explicitly described otherwise.

SiC has properties similar to those of SiN while, in most cases, SiON should rather be categorized into a silicon-oxide-based insulating film.

A silicon nitride film is used frequently as an etch-stop film in a SAC (Self-Aligned Contact) technique and used also as a Stressor Film in a SMT (Stress Memorization Technique).

Likewise, in the present application, when a "silicide" or "silicide layer" is mentioned, it normally refers to a nickel silicide or a nickel platinum silicide, but it also includes an alloy, a mixed crystal, or the like containing a nickel monosilicide as a main component. Also, the silicide is not limited to a nickel silicide, a nickel platinum silicide, or the like, and may also be a cobalt silicide, a titanium silicide, a tungsten silicide, or the like that has previously achieved an excellent result. As a metal film for silicidation, not only a Ni (nickel) film, but also a nickel alloy film such as, e.g., a Ni—Pt alloy film (alloy film of Ni and Pt), a Ni—V alloy film (alloy film of Ni and V), a Ni—Pd alloy film (alloy film of Ni and Pd), a Ni—Yb alloy film (alloy film of Ni and Yb), or an Ni—Er alloy film (alloy film of Ni and Er) can be used. Note that such a silicide containing nickel as a main metal element will be generally referred to as a "nickel-based silicide".

3. Likewise, it will also be appreciated that, although a preferred example is shown in association with a graphical figure, a position, an attribute, or the like, the graphical figure, position, attribute, or the like is not strictly limited thereto unless particularly explicitly described otherwise or unless it is obvious from the context that the graphical figure, position, attribute, or the like is strictly limited thereto.

4. Further, when a specific numerical value or numerical amount is mentioned, it may be a value more or less than the specific numerical value unless particularly explicitly described otherwise, unless the numerical value is theoretically limited to a given number, or unless it is obvious from the context that the numeral value is limited to a given number.

5. When a "wafer" is mentioned, it typically refers to a single-crystal silicon wafer over which a semiconductor device (the same as a semiconductor integrated circuit device or an electronic device) is formed, but it will be appreciated that the "wafer" also includes a composite wafer of an insulating substrate and a semiconductor layer or the like, such as an epitaxial wafer, a SOI substrate, or an LCD glass substrate.

[Details of Embodiments]

The embodiments will be described in greater detail. Hereinbelow, the details of the embodiments will be described by dividing the present invention into a plurality of parts. Unless particularly mentioned, "Sections", "Embodiments", and the like which are referenced refer to those belonging to the same part in principle.

The embodiments will be further described in greater detail. In the drawings, the same or like parts are designated by the same or similar marks or reference numerals, and a description thereof will not be repeated in principle.

In the accompanying drawings, hatching or the like may be omitted even in a cross section when hatching or the like results in complicated illustration or when the distinction between a portion to be hatched and a vacant space is distinct. In relation thereto, even a two-dimensionally closed hole may have a background outline thereof omitted when it is obvious from the description or the like that the hole is two-dimensionally closed, and so forth. On the other hand, even though not shown in a cross section, a portion other than a vacant space may be hatched to clearly show that the hatched portion is not a vacant space.

<First Part: Portion Mainly Related to Gate First & Non-Hard-Mask Process>

0. Outline of First Part

In order to miniaturize a pattern, particularly to reduce the cell area of a SRAM, it is important to reduce the distance between the end portions of adjacent gates. However, at 28 nm technology node, it is generally difficult to transfer a pattern by one-shot exposure using ArF (at a wavelength of 193 nm). Accordingly, a micropattern is typically formed by repeating exposure, etching, and the like a plurality of times. However, there are such problems that, after the etching for the line & space pattern, the new resist pattern is not planarized and that oxidation resistance and wet etch resistance are low due to the use of a High-k insulating film and a metal electrode member in a gate stack material.

The following is a brief description of the outline of a representative embodiment of the invention disclosed in the present part.

That is, according to an aspect of the present invention of the present part, in the patterning of a gate stack film (including a dummy gate stack film) having a high-k gate insulating film and a metal electrode film in a memory region, etching for a cut region between adjacent gate electrodes is performed first using a first resist film and, after the first resist film that is no longer needed is removed, etching for a line & space pattern is performed using a second resist film.

The following is a brief description of an effect obtained according to the representative embodiment of the invention disclosed in the present part.

That is, in the patterning of a gate stack film (including a dummy gate stack film) having a high-k gate insulating film and a metal electrode film in a memory region, etching for a cut region between adjacent gate electrodes is performed first using a first resist film and, after the first resist film that is no longer needed is removed, etching for a line & space pattern is performed using a second resist film. Therefore, it is possible to improve the planarity of the upper surface of the second resist when the resist film is formed.

1. Description of Top Layout of SOC Chip as Example of Target Device, etc. in Manufacturing Method of Semiconductor Integrated Circuit Device of Embodiment of Present Invention (See Mainly FIG. 1)

Note that, hereinbelow, a SOC chip will be described specifically as an example of a target device of the present invention. However, it will be appreciated that the target device may also be a memory-only chip. In the following example, the specific description will be given using mainly a product in the generation of 28 nm technology node as an example, but it will be appreciated that the present invention is also applicable to other generations.

FIG. 1 is a top view of a wafer and a chip for illustrating a top layout of the SOC chip as the example of the target device and so forth in the manufacturing method of the semiconductor integrated circuit device of the embodiment of the present invention. Based on the drawing, a description will be given to the top layout of the SOC chip as the example of the target device and so forth in the manufacturing method of the semiconductor integrated circuit device of the embodiment of the present invention.

As shown in FIG. 1, a device main surface 1a (first main surface) of a wafer 1 (here, by way of example, a single-crystal silicon wafer having a diameter of 300 mm will be described, but the diameter of the wafer may also be 450 mm or 200 mm) is formed with a large number of chip regions 2. Also, the wafer 1 is provided with a notch 3 for discrimination of the orientation thereof.

Next, a description will be given to the details of the layout of each of the chips 2 (chip regions). In a peripheral portion 4 of the chip region 2, a large number of bonding pads 5 are provided and, in the inner area thereof, a memory region 6 and a non-memory region 7 are provided. Here, as an example of the memory region 6, a SRAM (Static Random Access Memory) is shown, but the memory region 6 is not limited thereto. The memory region 6 may also be a DRAM (Dynamic Random Access Memory) or a flash memory. Note that, to be precise, the "memory region" indicates a memory cell region. Accordingly, a major part of a memory peripheral circuit belongs to the non-memory region 7. Therefore, the non-memory region 7 includes not only such a memory peripheral circuit, but also a logic circuit, an analog circuit, and the like.

2. Description of Outline of Gate Patterning Process in Manufacturing Method of Semiconductor Integrated Circuit Device of Above Embodiment of Present Invention (See Mainly FIGS. 2 to 5 and FIGS. 6 to 9)

Here, following the description of the SRAM mixed logic chip in Section 1, a description will be given to the patterning (double patterning process) of gate electrodes and so forth in the memory cell region 6 and the non-memory cell region 7 (FIG. 1).

Figure 2:
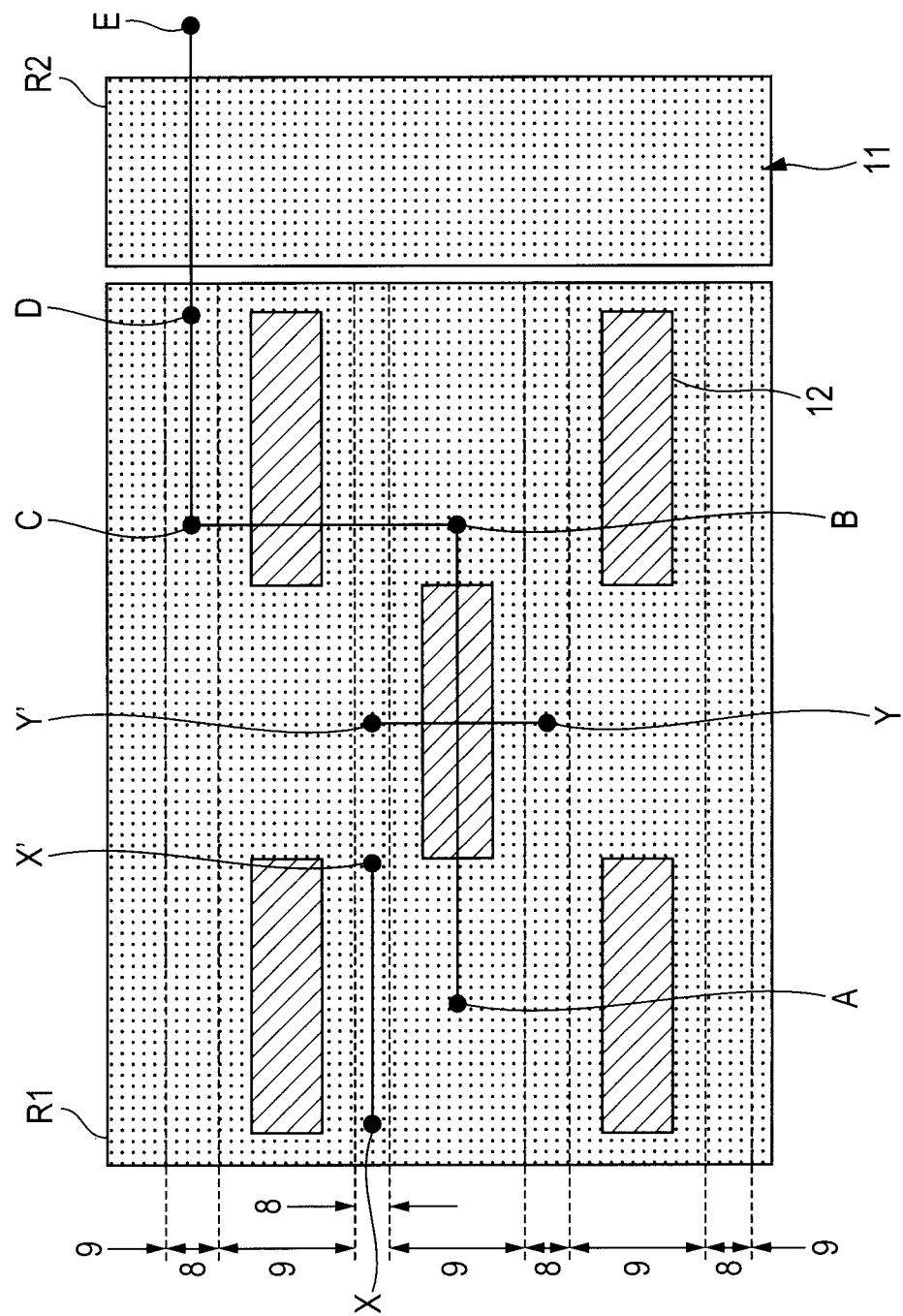
FIG. 2 is a top view (at the completion of patterning of a resist film for the patterning of cut regions between adjacent gate electrodes) of a cut-away portion R1 from a memory region and a cut-away portion R2 from a non-memory region of FIG. 1, which is for illustrating the outline of a gate patterning process in the manufacturing method of the semiconductor integrated circuit device of the above embodiment of the first part of the present invention.
Figure 3:
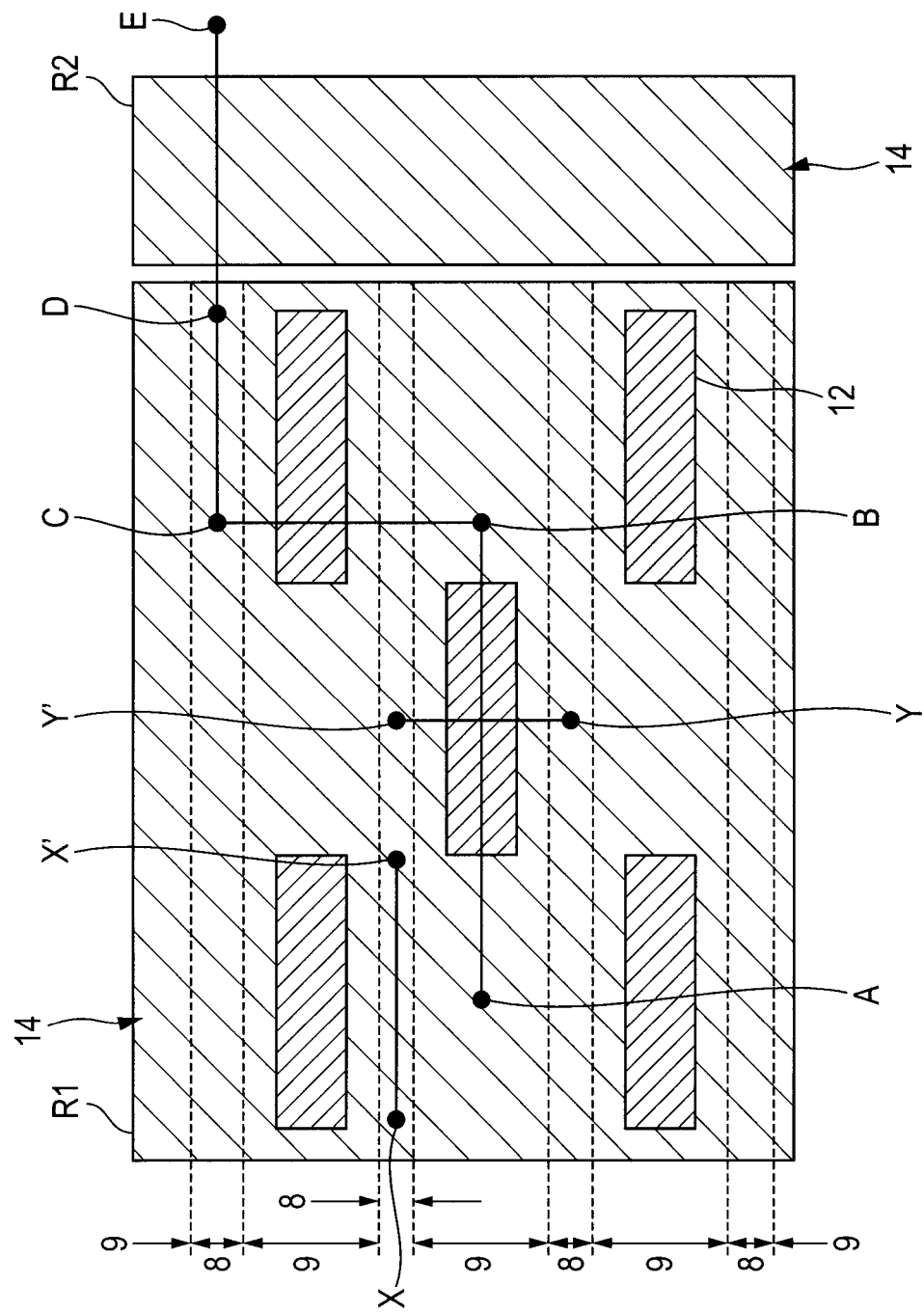
FIG. 3 is a top view (at the completion of etching for the cut regions between adjacent gate electrodes) of the cut-away portion R1 from the memory region and the cut-away portion R2 from the non-memory region of FIG. 1, which is for illustrating the outline of the gate patterning process in the manufacturing method of the semiconductor integrated circuit device of the above embodiment of the first part of the present invention.
Figure 4:
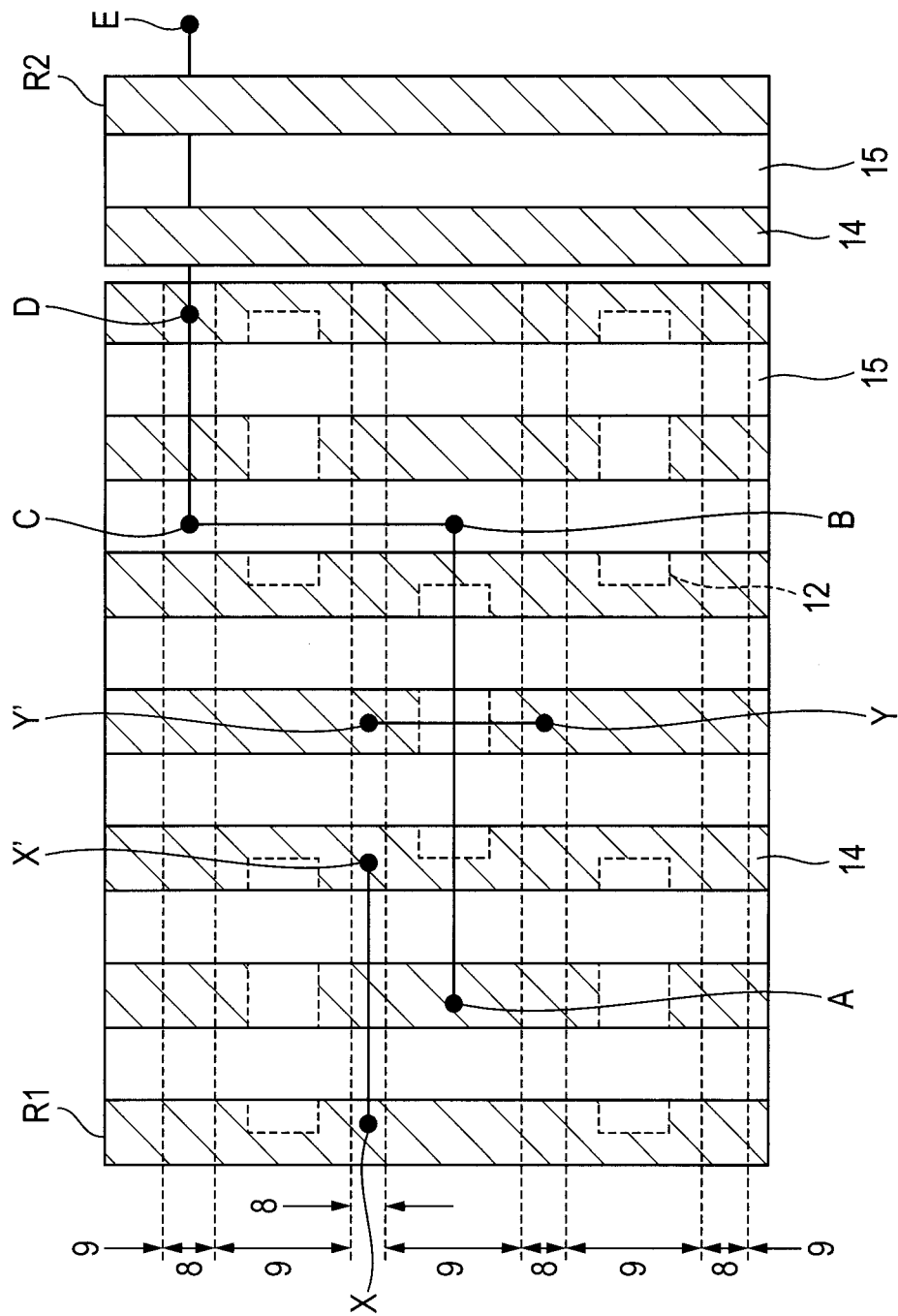
FIG. 4 is a top view (at the completion of patterning of a resist film for gate electrode patterning) of the cut-away portion R1 from the memory region and the cut-away portion R2 from the non-memory region of FIG. 1, which is for illustrating the outline of the gate patterning process in the manufacturing method of the semiconductor integrated circuit device of the above embodiment of the first part of the present invention.
Figure 5:
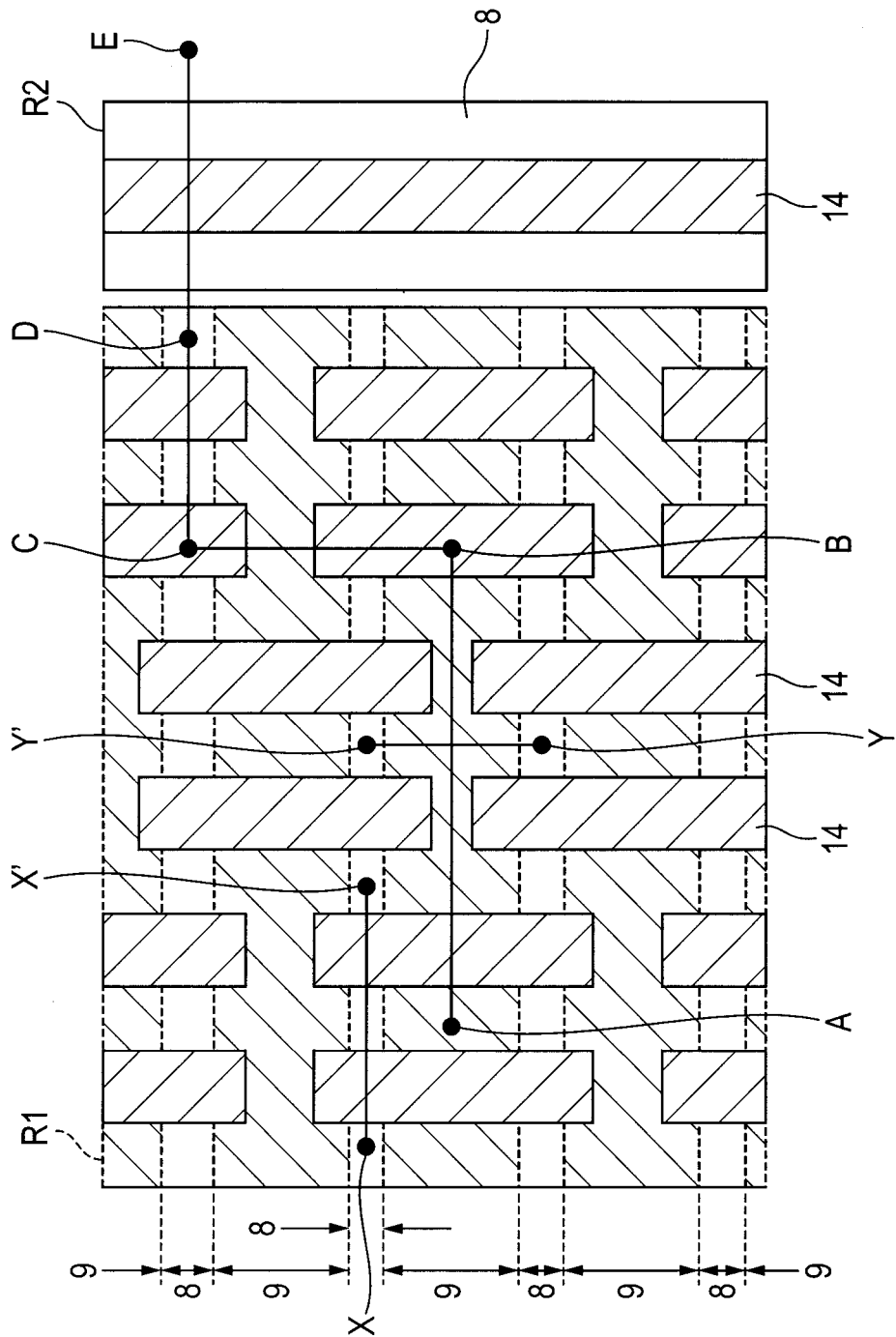
FIG. 5 is a top view (at the completion of etching of a gate electrode film) of the cut-away portion R1 from the memory region and the cut-away portion R2 from the non-memory region of FIG. 1, which is for illustrating the outline of the gate patterning process in the manufacturing method of the semiconductor integrated circuit device of the above embodiment of the first part of the present invention.
Figure 6:
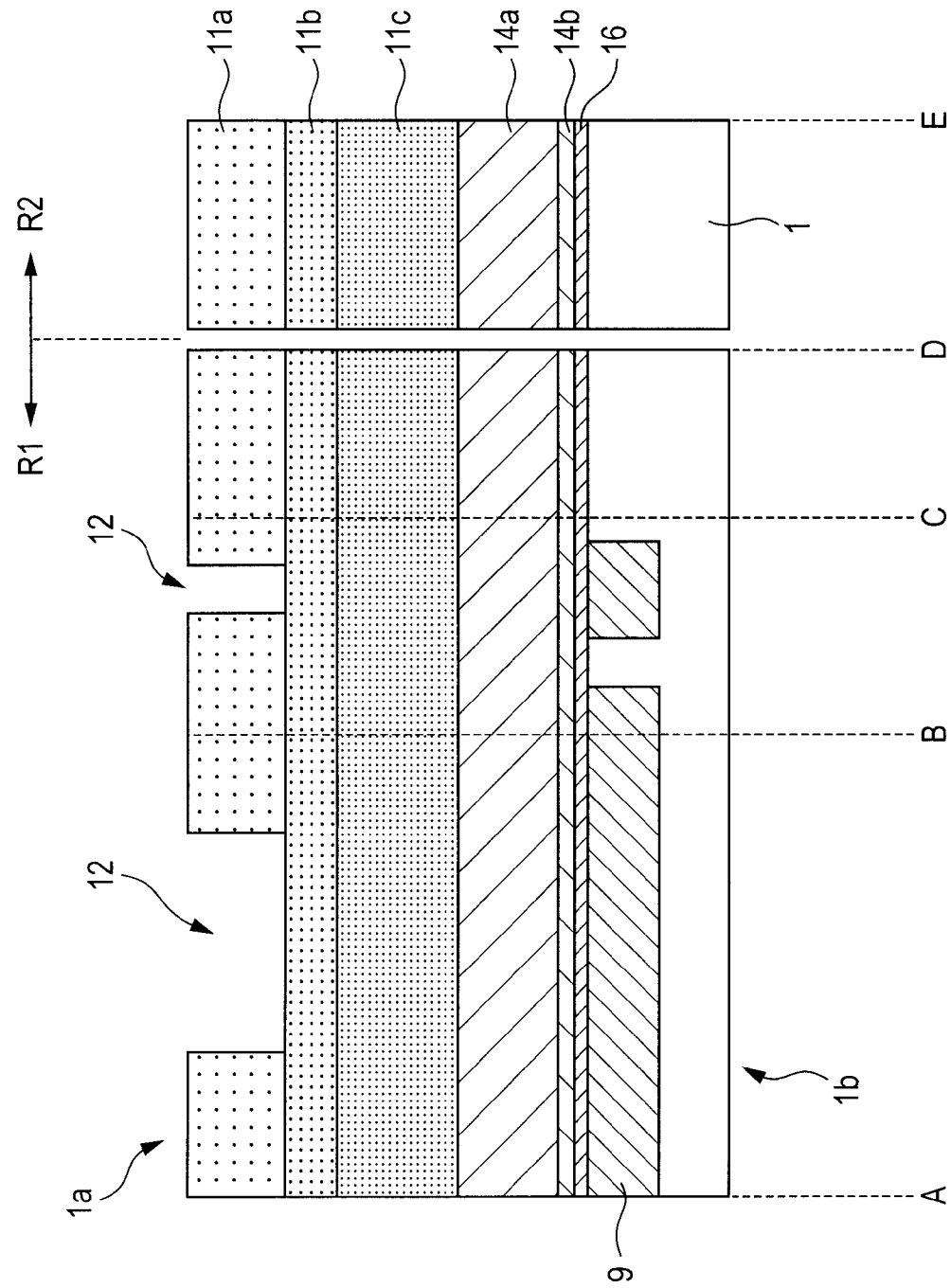
FIG. 6 is a device cross-sectional view (at the completion of patterning of the resist film for the patterning of the cut regions between adjacent gate electrodes) corresponding to the A-B-C-D-E cross section of FIG. 2, which is for illustrating the details of the gate patterning process in the manufacturing method of the semiconductor integrated circuit device of the above embodiment of the first part of the present invention.
Figure 7:
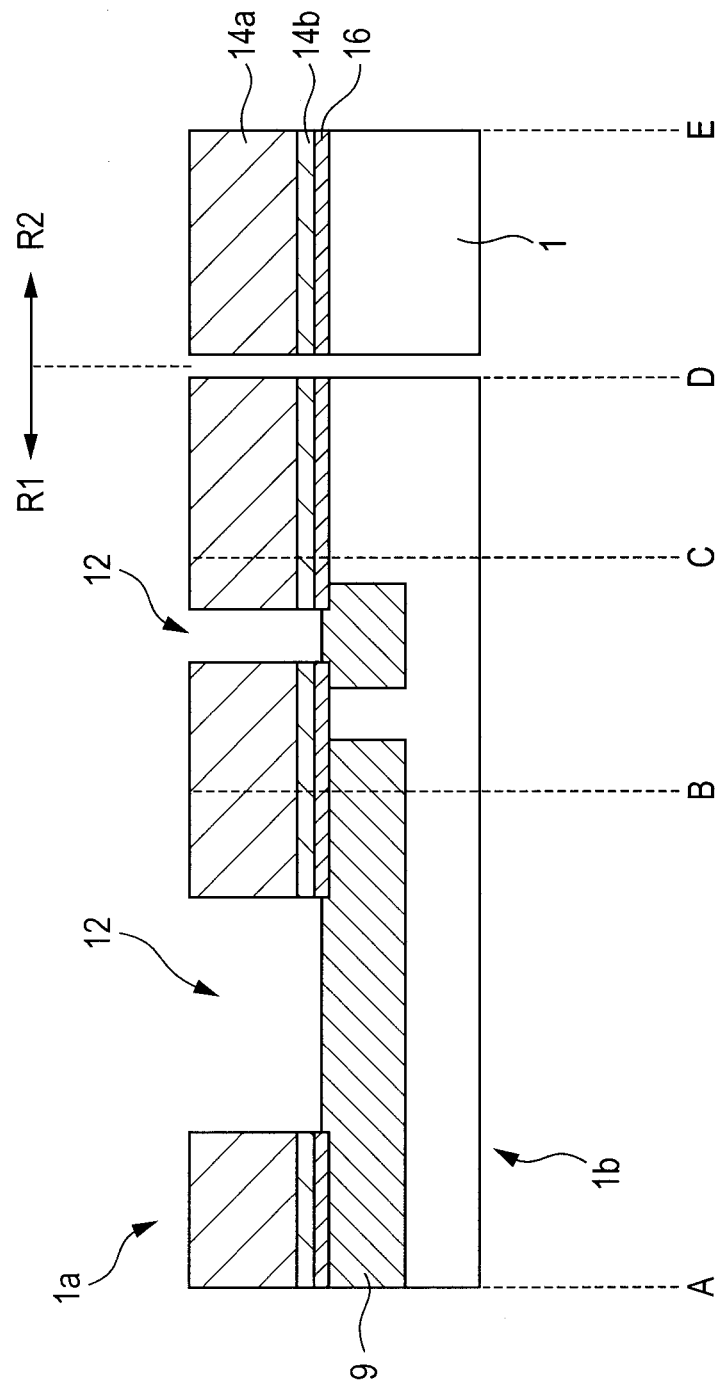
FIG. 7 is a device cross-sectional view (at the completion of etching for the cut regions between adjacent gate electrodes) corresponding to the A-B-C-D-E cross section of FIG. 3, which is for illustrating the details of the gate patterning process in the manufacturing method of the semiconductor integrated circuit device of the above embodiment of the first part of the present invention.
Figure 8:
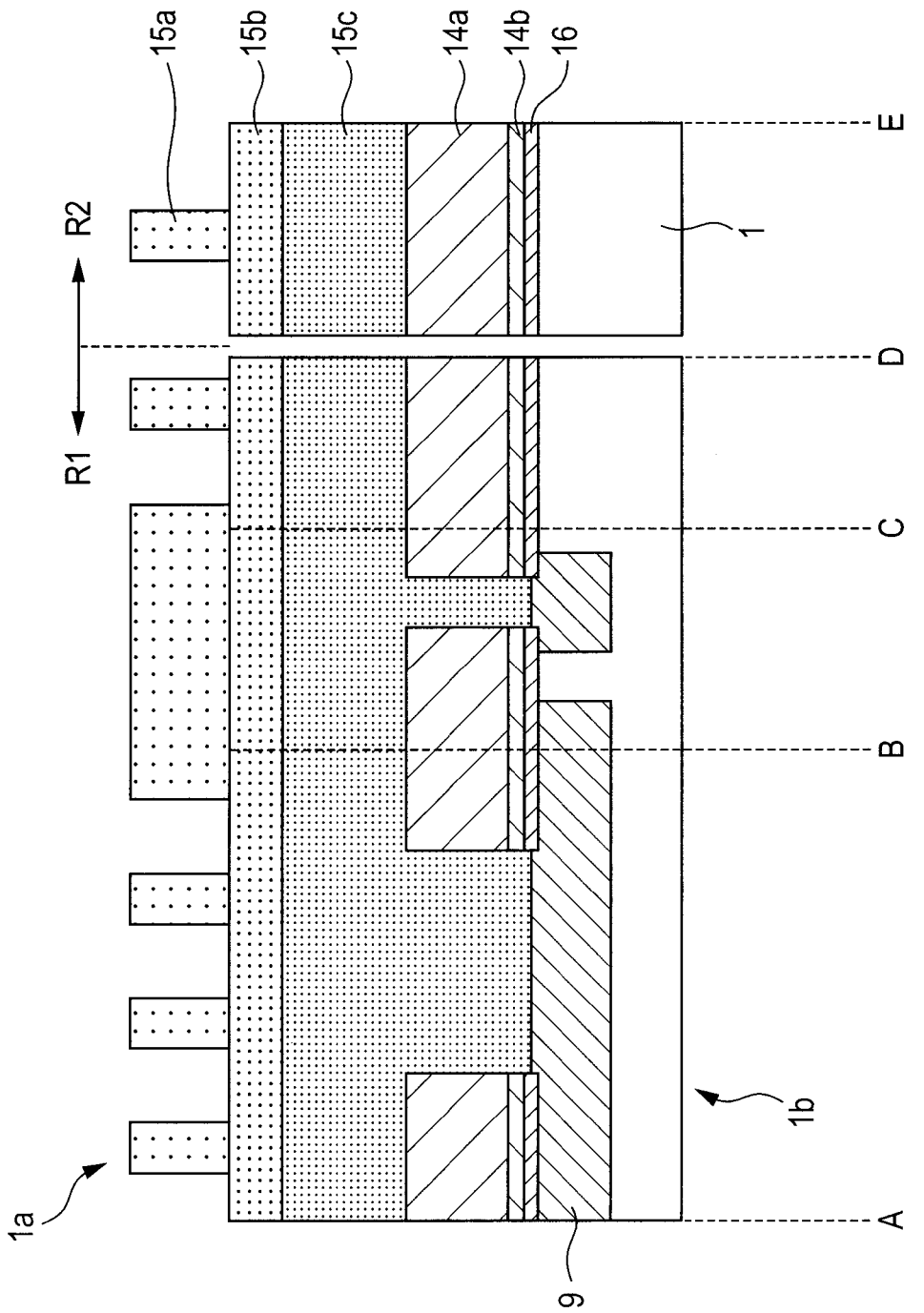
FIG. 8 is a device cross-sectional view (at the completion of patterning of the resist film for gate electrode patterning) corresponding to the A-B-C-D-E cross section of FIG. 4, which is for illustrating the details of the gate patterning process in the manufacturing method of the semiconductor integrated circuit device of the above embodiment of the first part of the present invention.
Figure 9:
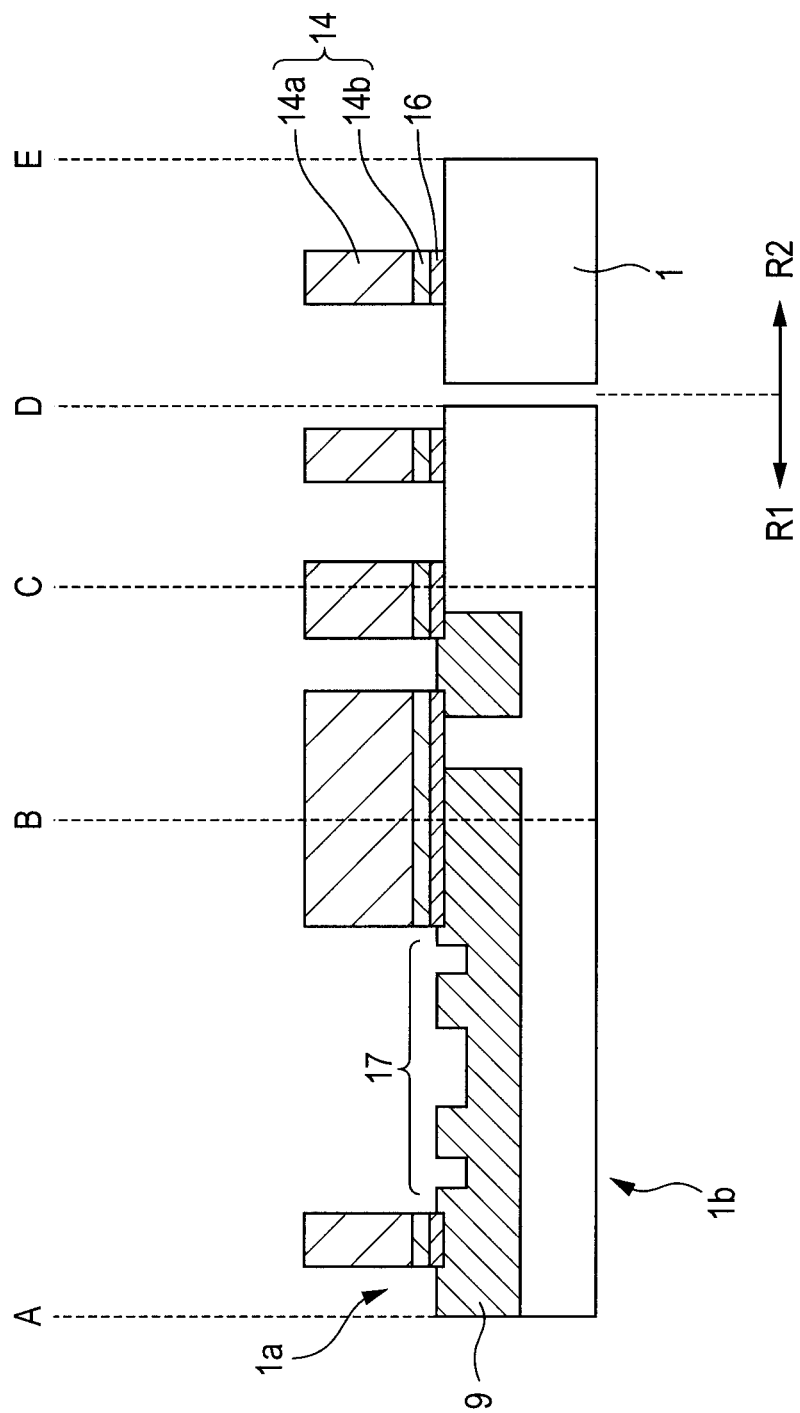
FIG. 9 is a device cross-sectional view (at the completion of etching of the gate electrode film) corresponding to the A-B-C-D-E cross section of FIG. 5, which is for illustrating the details of the gate patterning process in the manufacturing method of the semiconductor integrated circuit device of the above embodiment of the first part of the present invention.

FIG. 2 is a top view (at the completion of patterning of a resist film for the patterning of cut regions between adjacent gate electrodes) of a cut-away portion R1 from a memory region and a cut-away portion R2 from a non-memory region of FIG. 1, which is for illustrating the outline of a gate patterning process in the manufacturing method of the semiconductor integrated circuit device of the above embodiment of the present invention. FIG. 3 is a top view (at the completion of etching for the cut regions between adjacent gate electrodes) of the cut-away portion R1 from the memory region and the cut-away portion R2 from the non-memory region of FIG. 1, which is for illustrating the outline of the gate patterning process in the manufacturing method of the semiconductor integrated circuit device of the above embodiment of the present invention. FIG. 4 is a top view (at the completion of patterning of a resist film for gate electrode patterning) of the cut-away portion R1 from the memory region and the cut-away portion R2 from the non-memory region of FIG. 1, which is for illustrating the outline of the gate patterning process in the manufacturing method of the semiconductor integrated circuit device of the above embodiment of the present invention. FIG. 5 is a top view (at the completion of etching of a gate electrode film) of the cut-away portion R1 from the memory region and the cut-away portion R2 from the non-memory region of FIG. 1, which is for illustrating the outline of the gate patterning process in the manufacturing method of the semiconductor integrated circuit device of the above embodiment of the present invention. FIG. 6 is a device cross-sectional view (at the completion of patterning of the resist film for the patterning of the cut regions between adjacent gate electrodes) corresponding to the A-B-C-D-E cross section of FIG. 2, which is for illustrating the details of the gate patterning process in the manufacturing method of the semiconductor integrated circuit device of the above embodiment of the present invention. FIG. 7 is a device cross-sectional view (at the completion of etching for the cut regions between adjacent gate electrodes) corresponding to the A-B-C-D-E cross section of FIG. 3, which is for illustrating the details of the gate patterning process in the manufacturing method of the semiconductor integrated circuit device of the above embodiment of the present invention. FIG. 8 is a device cross-sectional view (at the completion of patterning of the resist film for gate electrode patterning) corresponding to the A-B-C-D-E cross section of FIG. 4, which is for illustrating the details of the gate patterning process in the manufacturing method of the semiconductor integrated circuit device of the above embodiment of the present invention. FIG. 9 is a device cross-sectional view (at the completion of etching of the gate electrode film) corresponding to the A-B-C-D-E cross section of FIG. 5, which is for illustrating the details of the gate patterning process in the manufacturing method of the semiconductor integrated circuit device of the above embodiment of the present invention. Based on these drawings, a description will be given to the outline of the gate patterning process in the manufacturing method of the semiconductor integrated circuit device of the above embodiment of the present invention.

First, the wafer 1 prior to processing of the gate electrode film is provided (see FIGS. 2 and 6). This is performed, for example, as follows. For example, the P-type single-crystal silicon wafer 1 is provided and, in the device main surface 1a (main surface opposite to a back surface 1b), isolation regions 9 such as, e.g., STI (Shallow Trench Isolation) are formed. Subsequently, in active regions 8, required impurity doped regions such as well regions are formed.

Further, over substantially the entire device main surface 1a (first main surface) of the wafer 1, a High-k gate insulating film 16 (gate insulating film including a High-k gate insulating film) is deposited. Here, the "High-k gate insulating film" indicates a gate insulating film having a dielectric constant higher than that of a related-art gate insulating film (a silicon oxide film, a silicon oxynitride film, a silicon nitride film, or a laminate film thereof) including a silicon oxide film as a main film component).

Next, over substantially the entire upper surface of the High-k gate insulating film 16, a lower-layer film 14b of the gate electrode film, such as, e.g., a titanium nitride film, is deposited.

Next, over substantially the entire upper surface of the titanium nitride film 14b, e.g., a polysilicon film 14a (which may also be an amorphous silicon film) as an upper-layer film of the gate electrode film is deposited.

Next, over substantially the entire upper surface of the polysilicon film 14a, a multilayer resist film 11 (first resist film) for the patterning of the cut regions between adjacent gate electrodes is formed by coating or the like. The multilayer resist film 11 includes a carbon-based non-photosensitive lower-layer film 11c (lower-layer film) such as a SOC (Spin On Carbon) film, a silicon-based non-photosensitive middle-layer film 11b (middle-layer film) such as a Si-BARC (Silicon-Bottom Anti-Reflection Coating) film, an organic photosensitive upper-layer film 11a (upper-layer film) such as an ArF chemically amplified resist film, and the like. The Si-BARC film is a coated or CVD deposited antireflection film containing silicon as one of main components (the content of silicon is in a range of, e.g., about 15 wt % to 45 wt %, which is also the same in the following second resist film). The SOC film is a coated or CVD deposited (a CVD deposited carbon-based film is called an amorphous carbon film) underlying film (film having an etching selectivity to a silicon-based member) containing carbon as one of main components (the content of carbon is in a range of, e.g., about 80 wt % to 90 wt %, which is also the same in the following second resist film).

Next, as shown in FIGS. 2 to 6, exposure to light and development of the ArF chemically amplified resist film 11a are performed to form resist film openings 12 corresponding to the cut regions between adjacent gate electrodes. The exposure using ArF excimer laser light (at a wavelength of 193 nm) is performed using, e.g., an optical mask and an immersion projection lithography stepper (immersion scanner). Here, the width (equivalent to the length of a shorter side) of each of the resist film openings 12 is, e.g., about 60 to 70 nm and on the same order as the width of each of the isolation regions, which is reduced to, e.g., about 20 to 25 nm by a shrinkage treatment described later.

Subsequently, the pattern of the ArF chemically amplified resist film 11a (upper-layer film) of the multilayer resist film 11 is successively transferred onto the Si-BARC film 11b (middle-layer film) and the SOC film 11c (lower-layer film) (the details of which will be described in Section 3).

Next, as shown in FIGS. 3 and 7, by dry etching using the patterned resist film 11 for the patterning of the cut regions between adjacent gate electrodes as a mask, a gate electrode film 14 (including the polysilicon film 14a and the titanium nitride film 14b) and the High-k gate insulating film 16 are processed to open the cut regions 12 between adjacent gate electrodes.

Next, as shown in FIGS. 4 and 8, in the same manner as described above, a resist film 15 (second resist film) for gate electrode patterning is formed over substantially the entire device main surface 1a (first main surface) of the wafer 1 by, e.g., coating or the like. The multilayer resist film 15 includes a carbon-based non-photosensitive lower-layer film 15c (lower-layer film) such as a SOC film, a silicon-based non-photosensitive middle-layer film 15b (middle-layer film) such as a Si-BARC film, an organic photosensitive upper-layer film 15a (upper-layer film) such as an ArF chemically amplified resist film, and the like. Here, in the same manner as described above, exposure to light and development of the ArF chemically amplified resist film 15a are performed to form the resist film pattern 15a corresponding to the line & space pattern of the gate electrodes. In the same manner as described above, the exposure using ArF excimer laser light (at a wavelength of 193 nm) is performed using, e.g., an optical mask and an immersion projection lithography stepper (immersion scanner). Here, the width of the resist film pattern 15a corresponding to the line & space pattern of the gate electrodes is, e.g., about 45 nm at the beginning of patterning, which is reduced to, e.g., about 30 nm by a trimming treatment described below. Note that, in terms of planarization, the carbon-based lower-layer film in this step is preferably a coated planar film such as a SOC film.

Subsequently, the pattern of the ArF chemically amplified resist film 15a (upper-layer film) of the multilayer resist film 15 is successively transferred onto the Si-BARC film 15b (middle-layer film) and the SOC film 15c (lower-layer film) (the details of which will be described in Section 3).

Next, as shown in FIGS. 5 and 9, by dry etching using the patterned multilayer resist film 15 (second resist film) for gate electrode patterning as a mask, the gate electrode film (including the polysilicon film 14a and the titanium nitride film 14b) and the High-k gate insulating film 16 are processed to form gate electrodes 14.

During the foregoing steps, recessed portions 17 are formed by etching.

3. Detailed Description of Gate Patterning Process in Manufacturing Method of Semiconductor Integrated Circuit Device of Above Embodiment of Present Invention (See Mainly FIGS. 10 to 17 and FIGS. 18 to 22)

Figure 10:
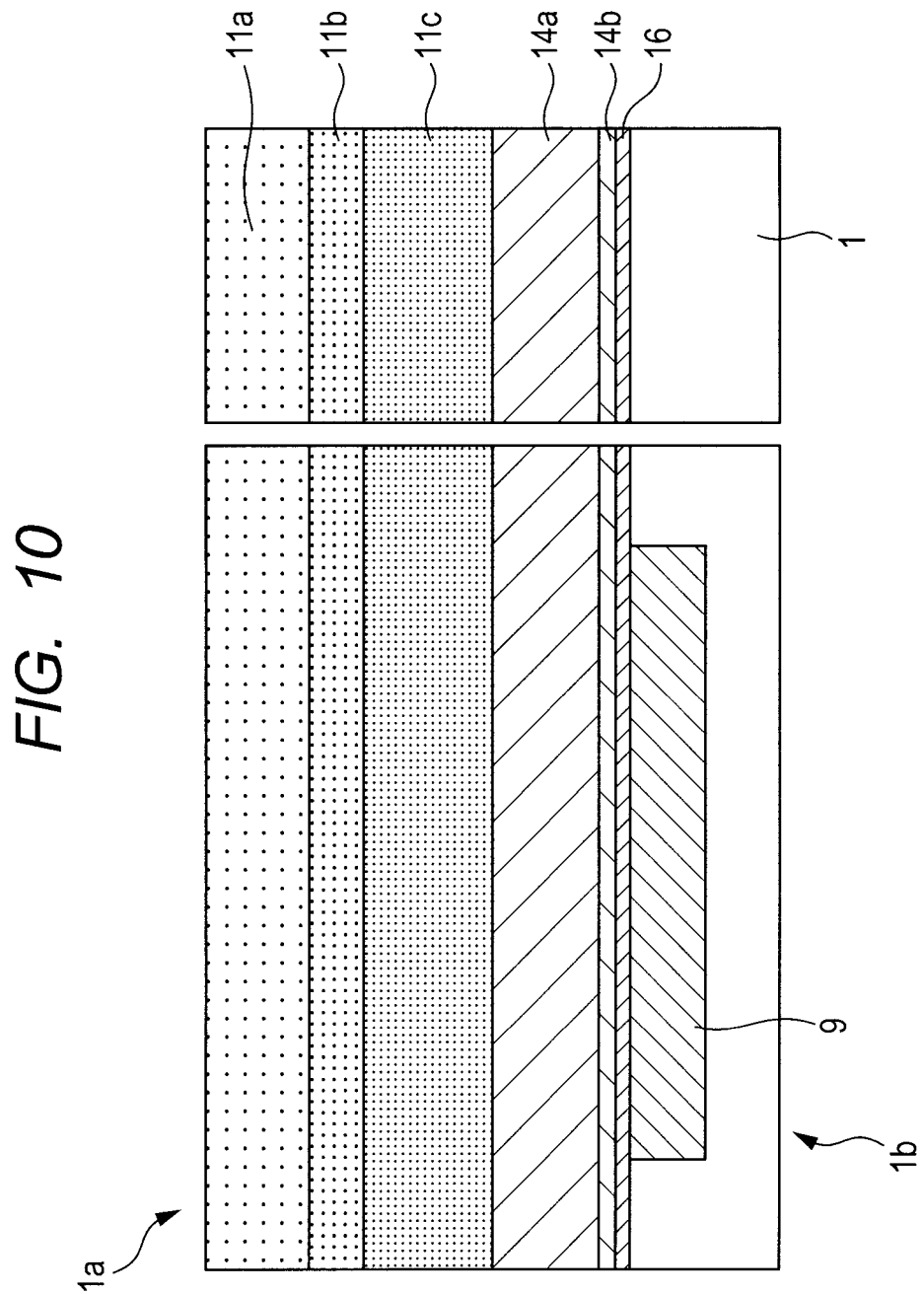
FIG. 10 is a device cross-sectional view (at the completion of formation of the resist film for the patterning of the cut regions between adjacent gate electrodes) along a Y-Y' cross section and a D-E cross section each corresponding to a process flow from FIG. 2 to FIG. 5, which is for illustrating a detailed step of the gate patterning process in the manufacturing method of the semiconductor integrated circuit device of the above embodiment of the first part of the present invention.
Figure 11:
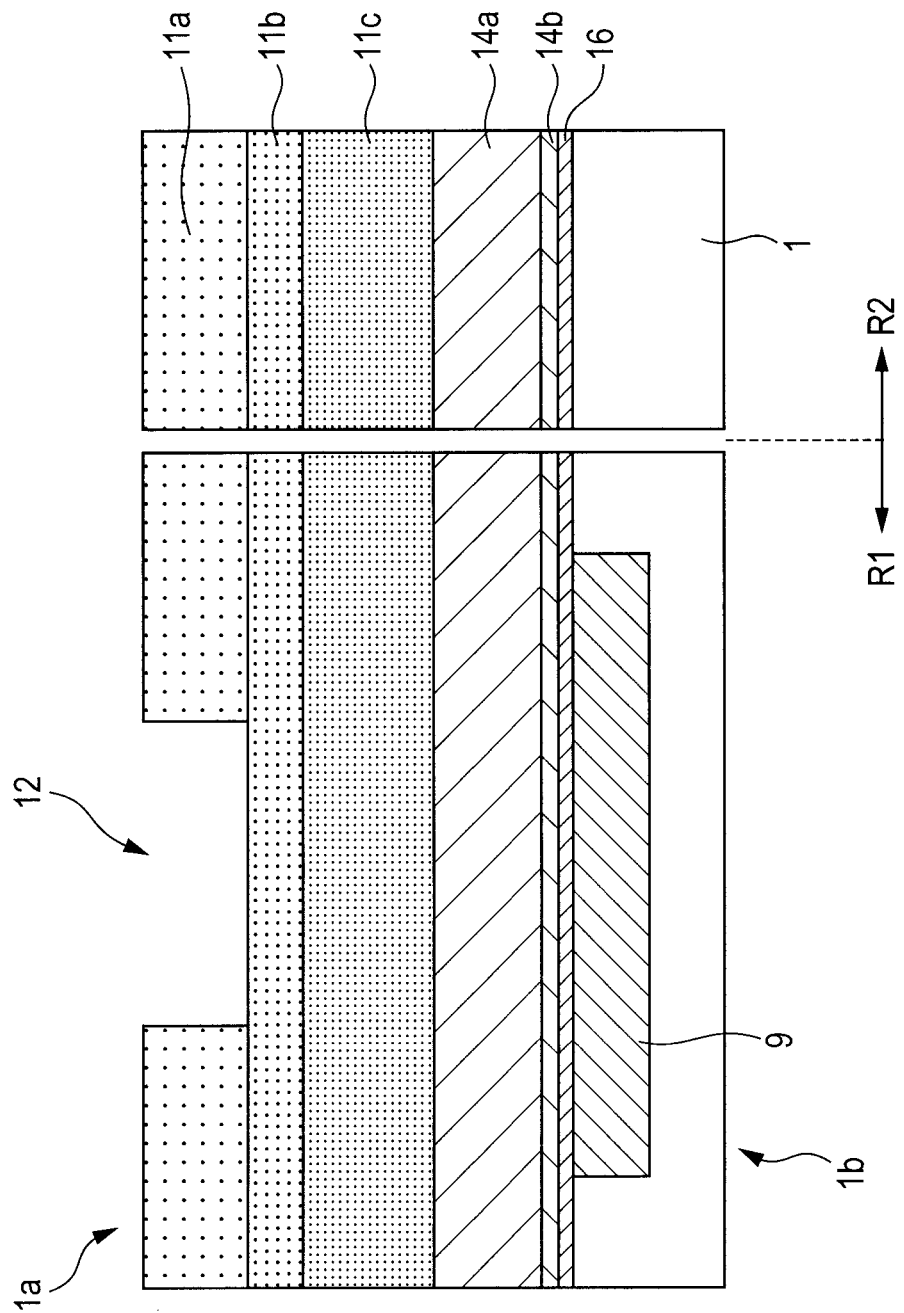
FIG. 11 is a device cross-sectional view (at the completion of patterning of an upper-layer film of a multilayer resist film for the patterning of the cut regions between adjacent gate electrodes) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the first part of the present invention.
Figure 12:
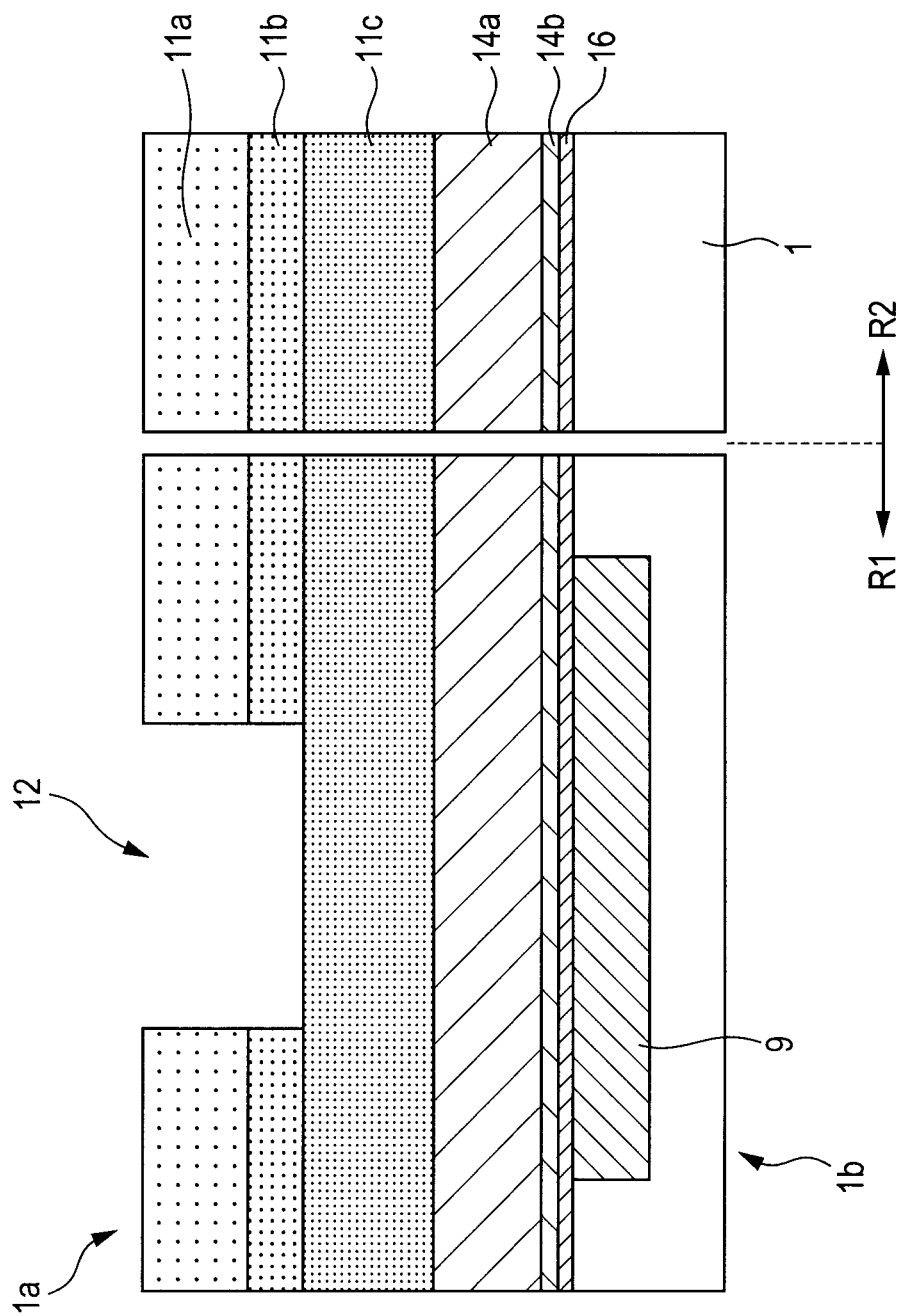
FIG. 12 is a device cross-sectional view (at the completion of etching of a middle-layer film of the multilayer resist film for the patterning of the cut regions between adjacent gate electrodes) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the first part of the present invention.
Figure 13:
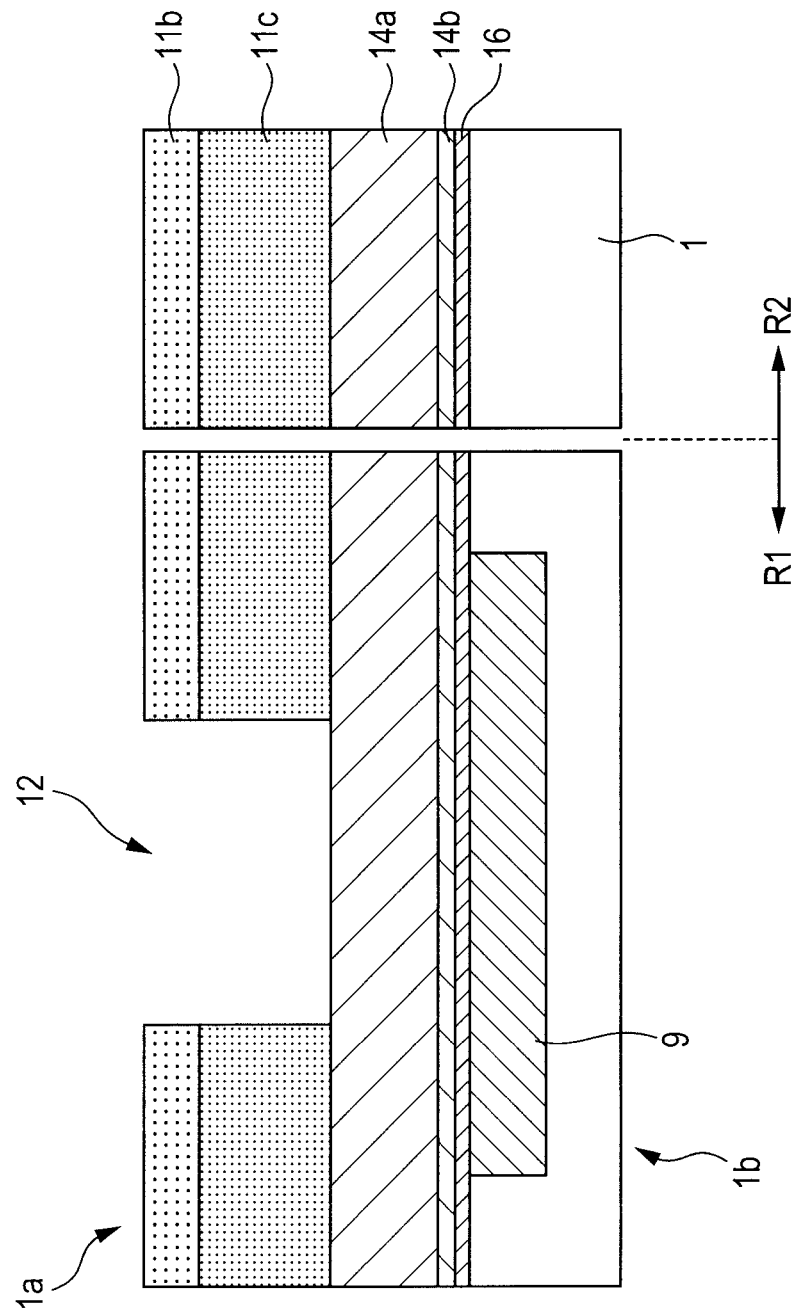
FIG. 13 is a device cross-sectional view (at the completion of etching of a lower-layer film of the multilayer resist film for the patterning of the cut regions between adjacent gate electrodes) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the first part of the present invention.
Figure 14:
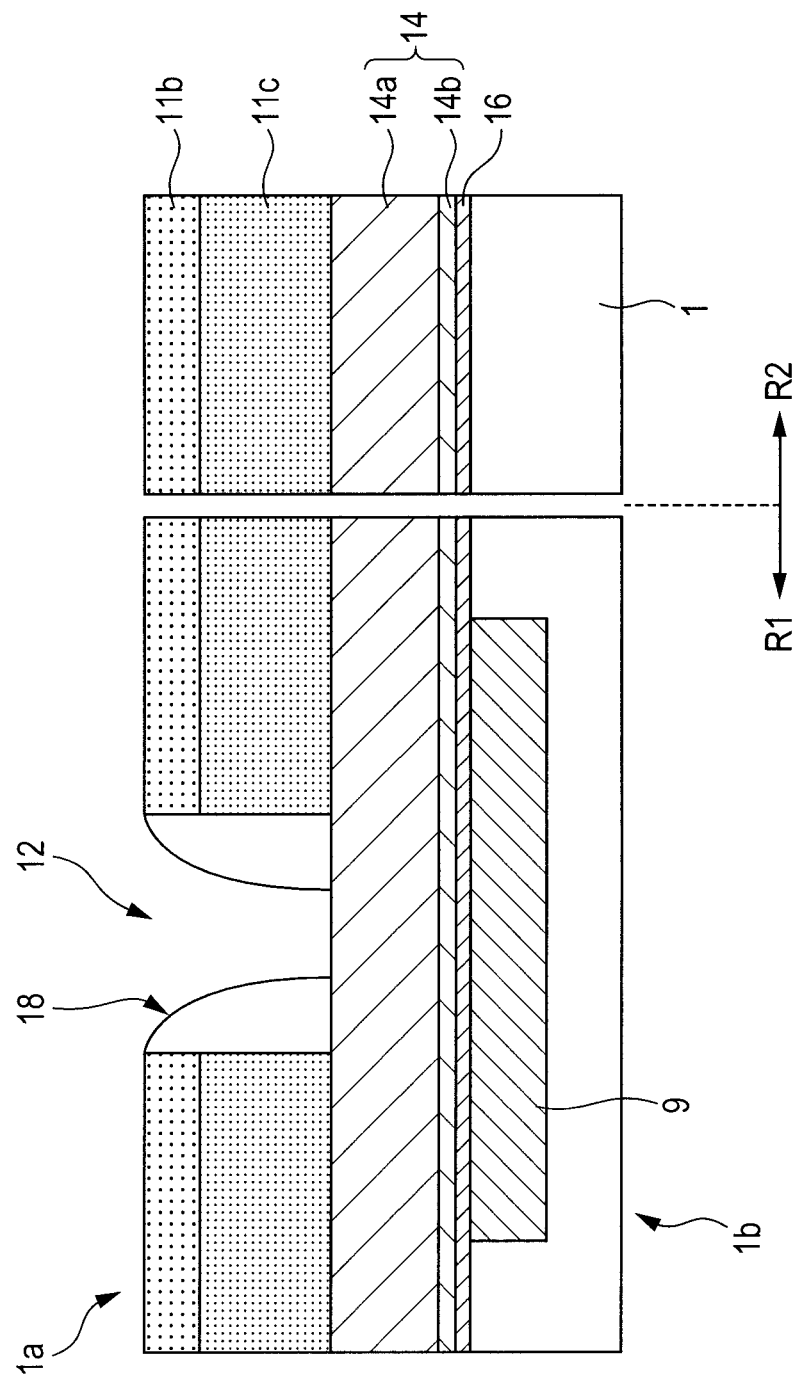
FIG. 14 is a device cross-sectional view (at the completion of a shrinkage step for processing the gate electrode film or the like) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the first part of the present invention.
Figure 15:
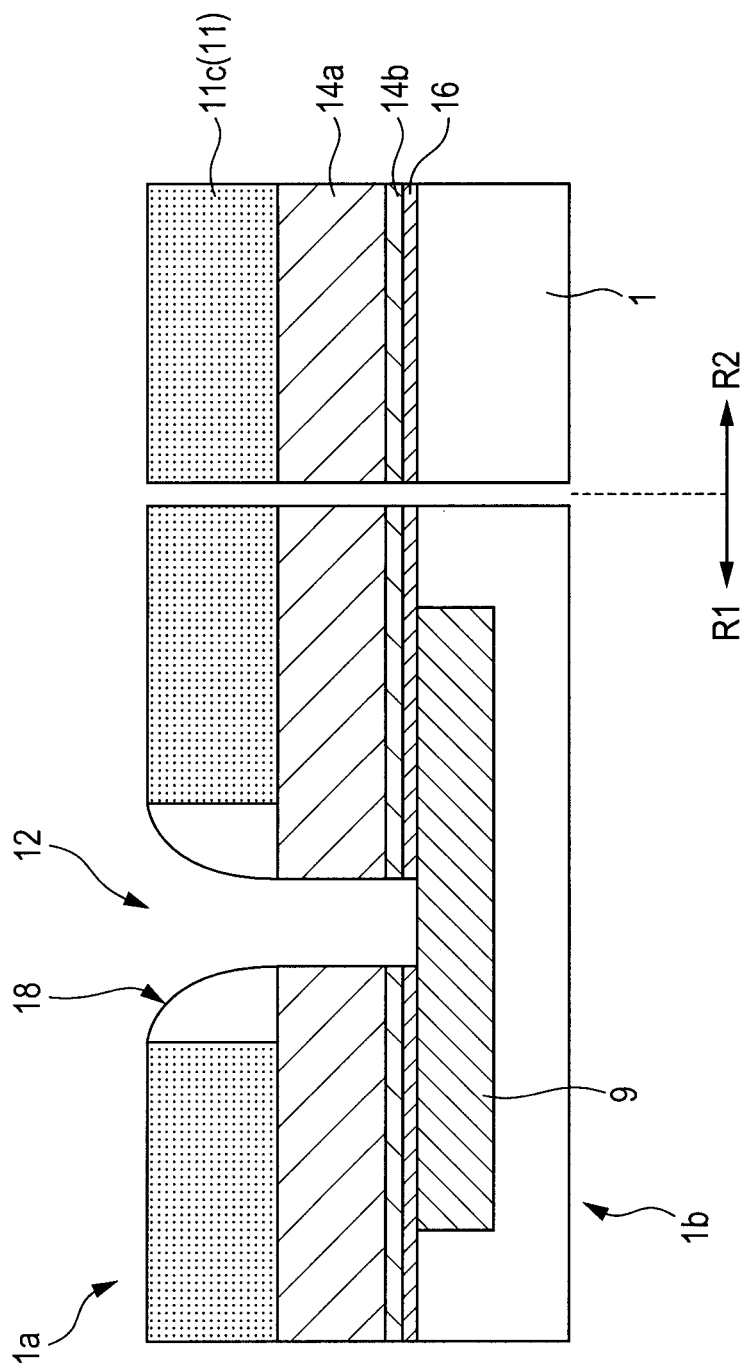
FIG. 15 is a device cross-sectional view (at the completion of an etching step for the gate electrode film or the like) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the first part of the present invention.
Figure 16:
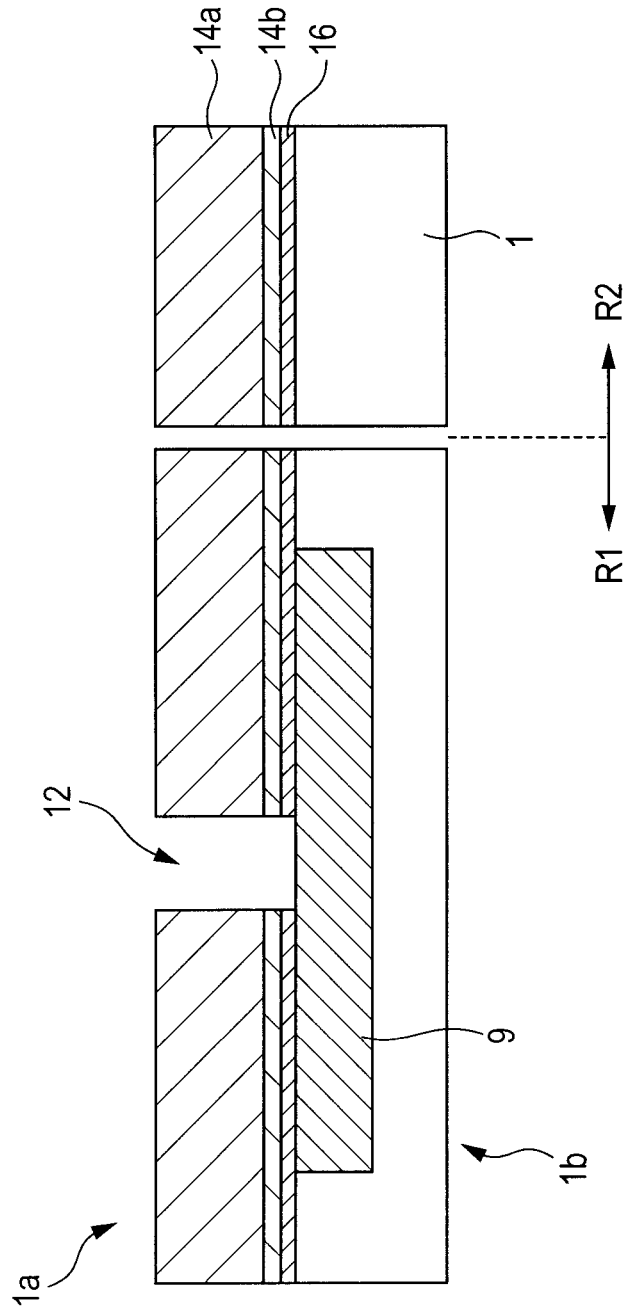
FIG. 16 is a device cross-sectional view (at the completion of removal of the lower-layer film of the multilayer resist film for the patterning of the cut regions between adjacent gate electrodes or the like) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the first part of the present invention.
Figure 17:
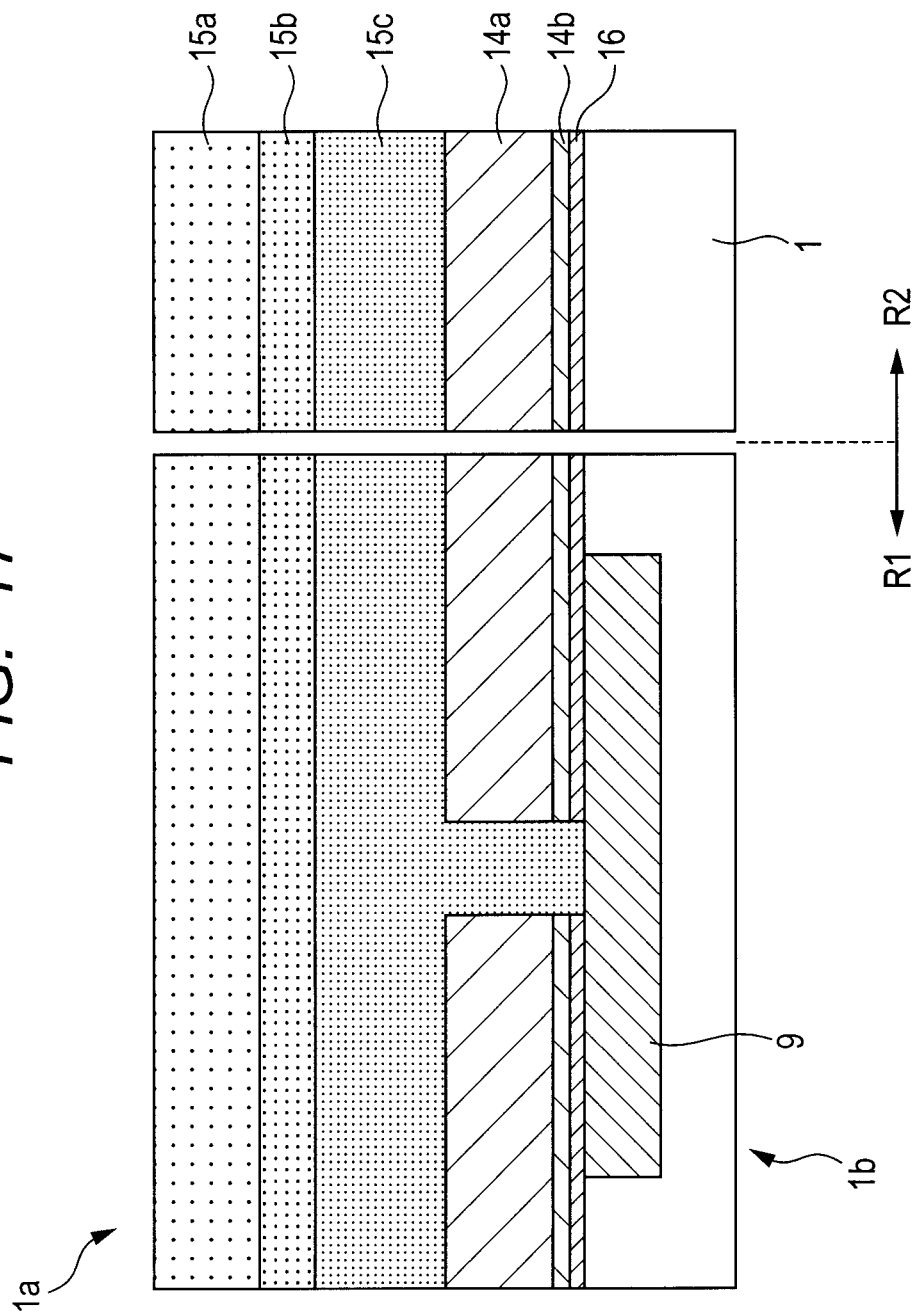
FIG. 17 is a device cross-sectional view (at the completion of coating of a resist film for gate electrode patterning) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the first part of the present invention.
Figure 18:
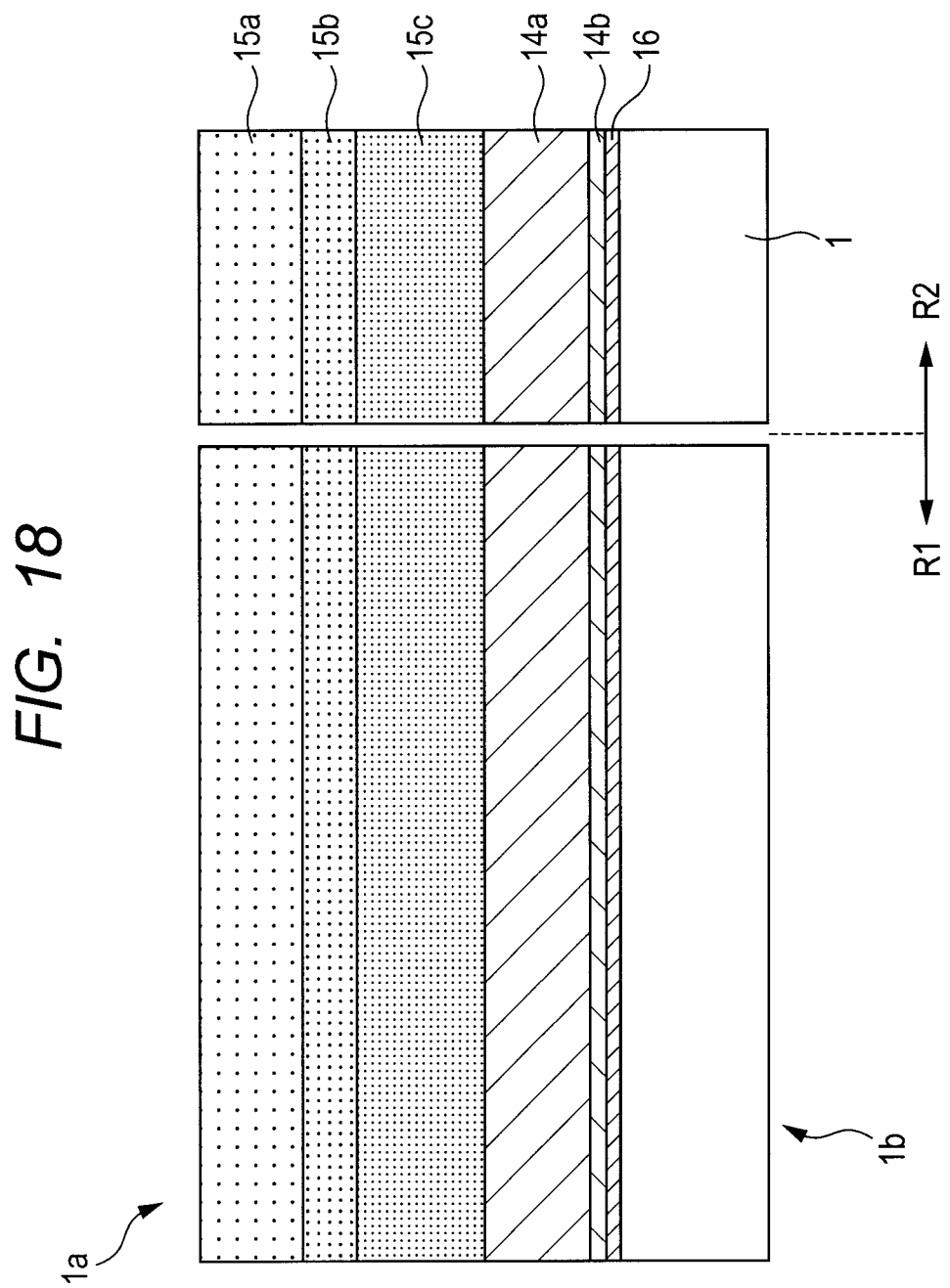
FIG. 18 is a device cross-sectional view (the same as FIG. 17, i.e., at the completion of coating of the resist film for gate electrode patterning) along the X-X' cross section and the D-E cross section each corresponding to the process flow from FIG. 2 to FIG. 5, which is for illustrating a detailed step of the gate patterning process in the manufacturing method of the semiconductor integrated circuit device of the above embodiment of the first part of the present invention.
Figure 19:
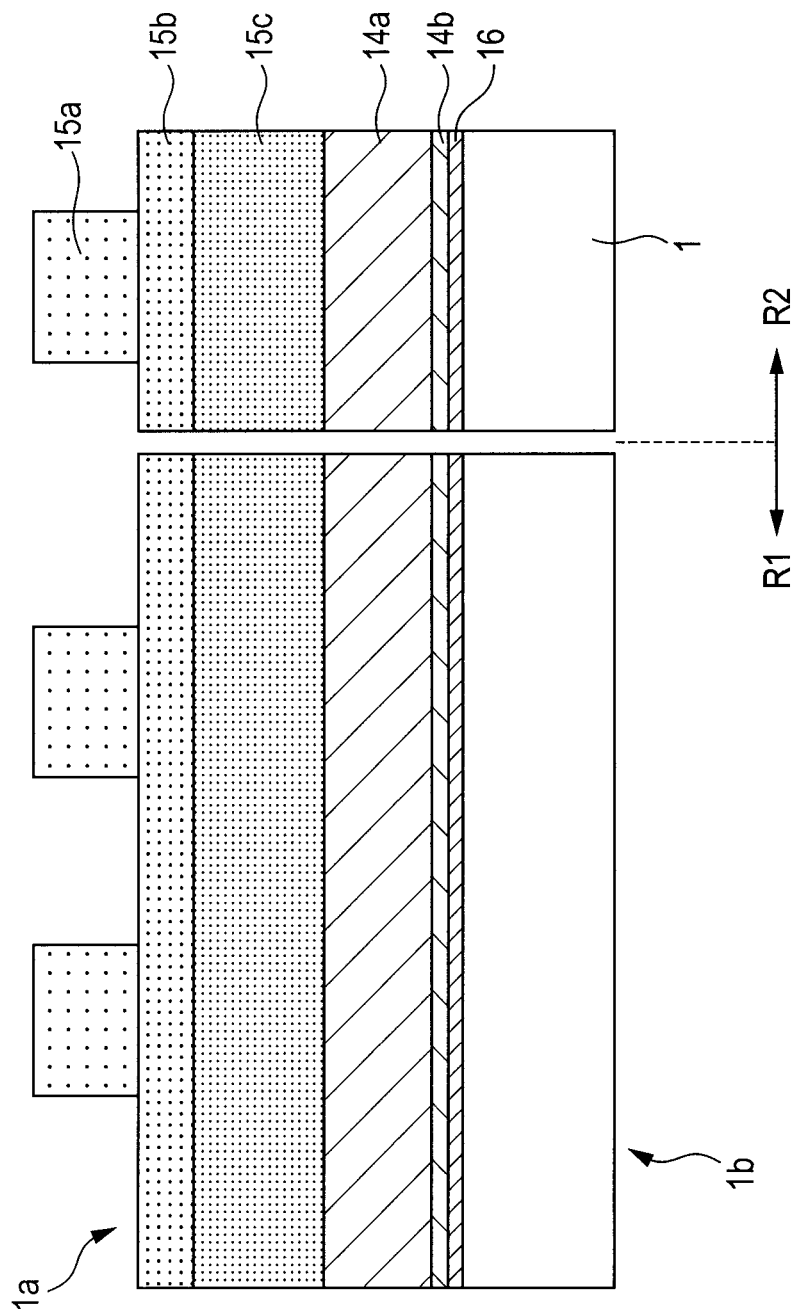
FIG. 19 is a device cross-sectional view (at the completion of development of an upper-layer film of a multilayer resist film for gate electrode patterning) along the X-X' cross section and the D-E cross section each corresponding to the process flow from FIG. 2 to FIG. 5, which is for illustrating a detailed step of the gate patterning process in the manufacturing method of the semiconductor integrated circuit device of the above embodiment of the first part of the present invention.
Figure 20:
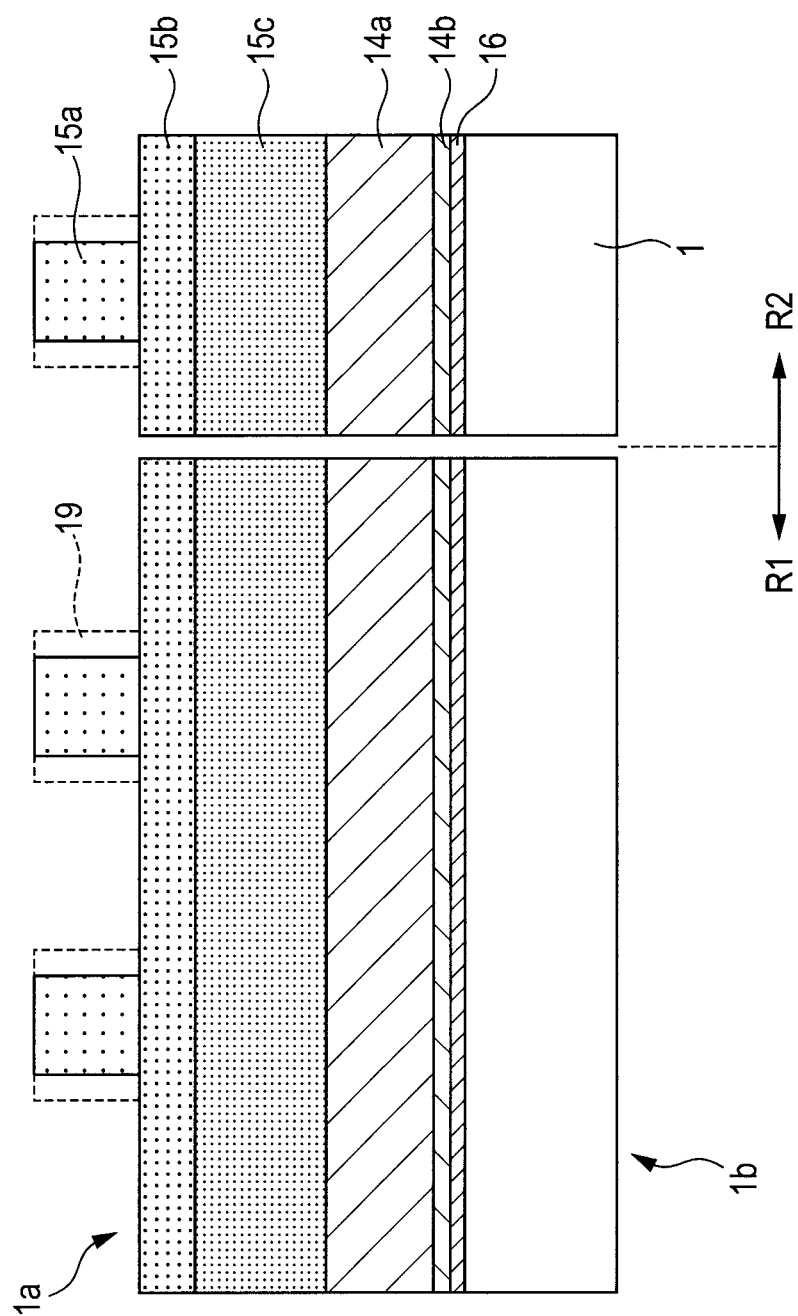
FIG. 20 is a device cross-sectional view (at the completion of trimming of the upper-layer film of the multilayer resist film for gate electrode patterning) along the X-X' cross section and the D-E cross section each corresponding to the process flow from FIG. 2 to FIG. 5, which is for illustrating a detailed step of the gate patterning process in the manufacturing method of the semiconductor integrated circuit device of the above embodiment of the first part of the present invention.
Figure 21:
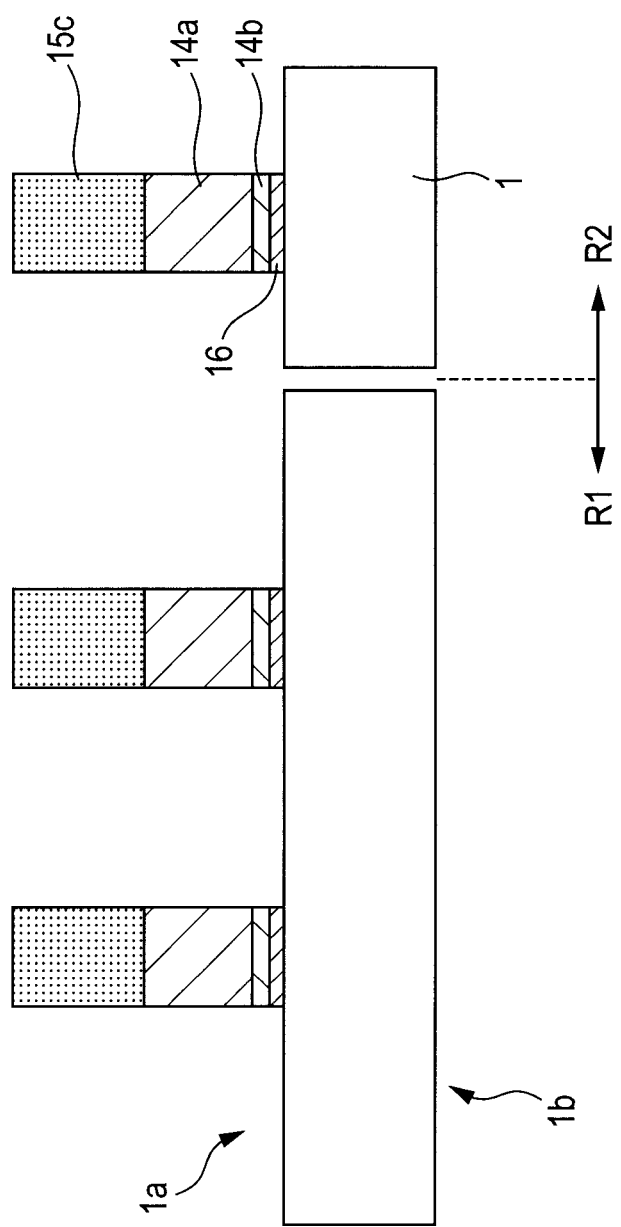
FIG. 21 is a device cross-sectional view (at the completion of etching of the gate electrode film or the like) along the X-X' cross section and the D-E cross section each corresponding to the process flow from FIG. 2 to FIG. 5, which is for illustrating a detailed step of the gate patterning process in the manufacturing method of the semiconductor integrated circuit device of the above embodiment of the first part of the present invention.
Figure 22:
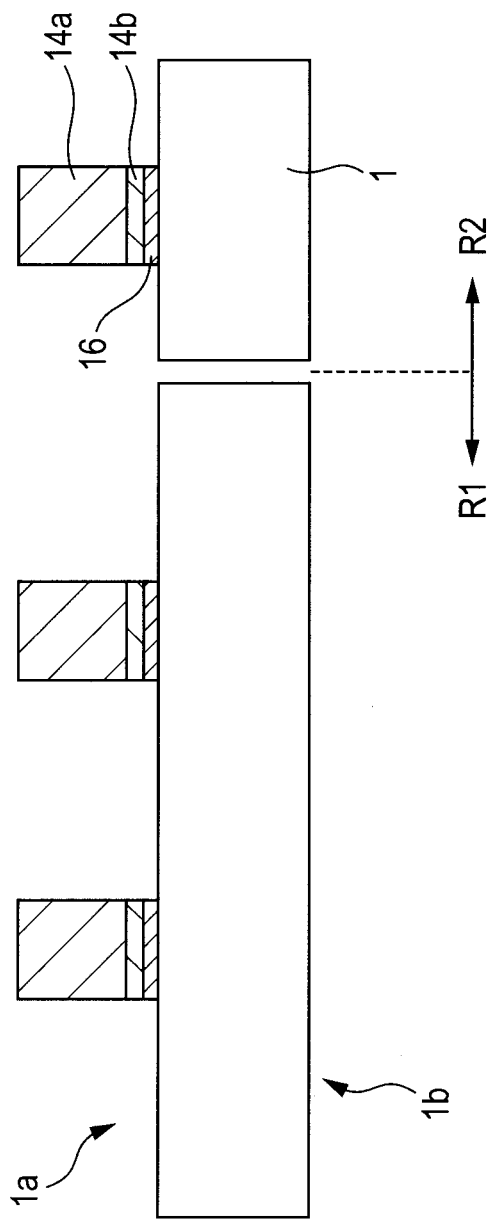
FIG. 22 is a device cross-sectional view (at the completion of removal of a lower-layer film of the multilayer resist film for gate electrode patterning) along the X-X' cross section and the D-E cross section each corresponding to the process flow from FIG. 2 to FIG. 5, which is for illustrating a detailed step of the gate patterning process in the manufacturing method of the semiconductor integrated circuit device of the above embodiment of the first part of the present invention.

FIG. 10 is a device cross-sectional view (at the completion of formation of the resist film for the patterning of the cut regions between adjacent gate electrodes) along a Y-Y' cross section and a D-E cross section each corresponding to a process flow from FIG. 2 to FIG. 5, which is for illustrating a detailed step of the gate patterning process in the manufacturing method of the semiconductor integrated circuit device of the above embodiment of the present invention. FIG. 11 is a device cross-sectional view (at the completion of patterning of an upper-layer film of a multilayer resist film for the patterning of the cut regions between adjacent gate electrodes) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the present invention. FIG. 12 is a device cross-sectional view (at the completion of etching of a middle-layer film of the multilayer resist film for the patterning of the cut regions between adjacent gate electrodes) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the present invention. FIG. 13 is a device cross-sectional view (at the completion of etching of a lower-layer film of the multilayer resist film for the patterning of the cut regions between adjacent gate electrodes) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the present invention. FIG. 14 is a device cross-sectional view (at the completion of a shrinkage step for processing the gate electrode film or the like) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the present invention. FIG. 15 is a device cross-sectional view (at the completion of an etching step for the gate electrode film or the like) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the present invention. FIG. 16 is a device cross-sectional view (at the completion of removal of the lower-layer film of the multilayer resist film for the patterning of the cut regions between adjacent gate electrodes or the like) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the present invention. FIG. 17 is a device cross-sectional view (at the completion of coating of a resist film for gate electrode patterning) along the Y-Y' cross section and the D-E cross section each corresponding to the process flow from FIG. 2 to FIG. 5, which is for illustrating a detailed step of the gate patterning process in the manufacturing method of the semiconductor integrated circuit device of the above embodiment of the present invention. FIG. 18 is a device cross-sectional view (the same as FIG. 17, i.e., at the completion of coating of the resist film for gate electrode patterning) along the X-X' cross section and the D-E cross section each corresponding to the process flow from FIG. 2 to FIG. 5, which is for illustrating a detailed step of the gate patterning process in the manufacturing method of the semiconductor integrated circuit device of the above embodiment of the present invention. FIG. 19 is a device cross-sectional view (at the completion of development of an upper-layer film of a multilayer resist film for gate electrode patterning) along the X-X' cross section and the D-E cross section each corresponding to the process flow from FIG. 2 to FIG. 5, which is for illustrating a detailed step of the gate patterning process in the manufacturing method of the semiconductor integrated circuit device of the above embodiment of the present invention. FIG. 20 is a device cross-sectional view (at the completion of trimming of the upper-layer film of the multilayer resist film for gate electrode patterning) along the X-X' cross section and the D-E cross section each corresponding to the process flow from FIG. 2 to FIG. 5, which is for illustrating a detailed step of the gate patterning process in the manufacturing method of the semiconductor integrated circuit device of the above embodiment of the present invention. FIG. 21 is a device cross-sectional view (at the completion of etching of the gate electrode film or the like) along the X-X' cross section and the D-E cross section each corresponding to the process flow from FIG. 2 to FIG. 5, which is for illustrating a detailed step of the gate patterning process in the manufacturing method of the semiconductor integrated circuit device of the above embodiment of the present invention. FIG. 22 is a device cross-sectional view (at the completion of removal of a lower-layer film of the multilayer resist film for gate electrode patterning) along the X-X' cross section and the D-E cross section each corresponding to the process flow from FIG. 2 to FIG. 5, which is for illustrating a detailed step of the gate patterning process in the manufacturing method of the semiconductor integrated circuit device of the above embodiment of the present invention. Based on these drawings, a description will be given to the details of the gate patterning process in the manufacturing method of the semiconductor integrated circuit device of the above embodiment of the present invention.

As shown in FIG. 10, e.g., the P-type single-crystal silicon wafer 1 is provided and, in the device main surface 1a, the isolation regions 9 such as, e.g., STI are formed. Subsequently, in the active regions 8, required impurity doped regions such as well regions are formed.

Further, over substantially the entire device main surface 1a (first main surface) of the wafer 1, a High-k gate insulating film 16 (gate insulating film including a High-k gate insulating film) is deposited. As an example of the High-k gate insulating film 16, a hafnium-oxide-based insulating film having a thickness of, e.g., about 0.7 to 1.5 nm can be shown.

Next, over substantially the entire upper surface of the High-k gate insulating film 16, the lower-layer film 14b of the gate electrode film, such as, e.g., a titanium nitride film (having a thickness of, e.g., about 10 nm) is deposited.

Next, as the upper-layer film of the gate electrode film, the polysilicon film 14a (which may also be, e.g., an amorphous silicon film) having a thickness of, e.g., about 50 nm is deposited over substantially the entire upper surface of the titanium nitride film 14b.

Next, over substantially the entire upper surface of the polysilicon film 14a, the multilayer resist film 11 (first resist film) for the patterning of the cut regions between adjacent gate electrodes is formed by coating or the like. For example, the multi-layer resist film 11 is formed as follows. That is, over substantially the entire upper surface of the polysilicon film 14a, the carbon-based non-photosensitive lower-layer film 11c (lower-layer film) such as a SOC film (having a thickness of, e.g., about 100 to 300 nm) is formed first by coating or the like. Note that the carbon-based non-photosensitive lower-layer film 11c may also be an amorphous carbon film deposited by CVD (Chemical Vapor Deposition) or the like. Subsequently, over substantially the entire upper surface of the SOC film 11c, the silicon-based non-photosensitive middle-layer film 11b (middle-layer film) such as, e.g., a Si-BARC film (having a thickness of, e.g., about 10 to 100 nm) is formed by coating or the like. Subsequently, over substantially the entire upper surface of the Si-BARC film 11b, the organic photosensitive upper-layer film 11a (upper-layer film) such as, e.g., an ArF chemically amplified resist film (having a thickness of, e.g., about 50 to 180 nm) is formed by coating or the like.

Next, as shown in FIG. 11, exposure to light and development of the ArF chemically amplified resist film 11a are performed to form each of the resist film openings 12 corresponding to the cut regions between adjacent gate electrodes. The exposure using ArF excimer laser light (at a wavelength of 193 nm) is performed using, e.g., an optical mask and an immersion projection lithography stepper (immersion scanner).

Next, as shown in FIG. 12, using the patterned ArF chemically amplified resist film 11a as a mask, the pattern of the ArF chemically amplified resist film 11a is transferred onto the Si-BARC film 11b by dry etching using a Fluorocarbon-based gas (such as, e.g., $CF_4$).

Next, as shown in FIG. 13, using the patterned Si-BARC film 11b as a mask, the pattern of the Si-BARC film 11b is transferred onto the SOC film 11c by dry etching using, e.g., an oxygen-based gas (such as, e.g., $O_2$). At this time, the remaining ArF chemically amplified resist film 11a is removed simultaneously.

Next, as shown in FIG. 14, in a state where the wafer 1 has been introduced into the etching chamber of a dry etching apparatus for etching, e.g., the gate electrodes 14, a pre-etching treatment (shrinkage treatment) is performed (a kind of dry etching treatment by which the upper surface of the polysilicon film 14a is slightly etched). That is, sidewalls 18 for shrinkage are formed over the side walls of each of the resist film openings 12. Examples of conditions for the shrinkage treatment that can be shown include a gas atmosphere of, e.g., $CHF_3$ (100 to 300 sccm)/$O_2$ (10 to 50 sccm), an RF power of, e.g., about 500 to 1000 W, a wafer bias of 100 to 300 V, and a wafer stage temperature of about 10 to 50° C. Next, as shown in FIG. 15, by dry etching using the patterned SOC film 11c as a mask, the shrunk cut regions 12 between adjacent gate electrodes 12 are formed successively in the polysilicon film 14a (an etching gas is a halogen-based gas, specific examples of which include HBr), the titanium nitride film 14b (an etching gas is a halogen-based gas, specific examples of which include $Cl_2$/HBr), and the gate insulating film 16 (an etching gas is a halogen-based gas, specific examples of which include $BCl_3/Cl_2$). At this time, the remaining Si-BARC film 11b is removed simultaneously.

Next, as shown in FIG. 16, the SOC film 11c and the sidewalls 18 for shrinkage are removed by an ashing treatment and wet cleaning or the like. Preferred examples of conditions for the wet cleaning that can be shown are such that: (1) in a first step, a chemical solution is a diluted hydrochloric acid having a composition in which a hydrogen chloride concentration is about 0.0418 mol %, a processing time is about 60 seconds, and a processing temperature is a room temperature (15 to 25° C.); and (2) in a second step, a chemical solution is a mixed acid having a composition in which a hydrogen chloride concentration is about 0.411 mol % and a hydrogen fluoride concentration is about 0.0106 mol %, a processing time is about 60 seconds, and a processing temperature is a room temperature (15 to 25° C.).

Next, as shown in FIGS. 17 and 18, over substantially the entire device main surface 1a (first main surface) of the wafer 1, the multi-layer resist film 15 (second resist film) for gate electrode patterning is formed by coating or the like. For example, the multilayer resist film 15 is formed as follows. That is, over substantially the entire device surface 1a of the wafer 1, the carbon-based non-photosensitive lower-layer film 15c (lower-layer film) such as a SOC film (having a thickness of, e.g., about 100 to 300 nm) is formed first by coating or the like. Subsequently, over substantially the entire upper surface of the SOC film 15c, the silicon-based non-photosensitive middle-layer film 15b (middle-layer film) such as, e.g., a Si-BARC film (having a thickness of, e.g., about 10 to 100 nm) is formed by coating or the like. Subsequently, over substantially the entire upper surface of the Si-BARC film 15b, e.g., the organic photosensitive upper-layer film 15a (upper-layer film) such as, e.g., an ArF chemically amplified resist film (having a thickness of, e.g., about 50 to 180 nm) is formed by coating or the like.

Next, as shown in FIG. 19, exposure to light and development of the ArF chemically amplified resist film 15a are performed to form the resist film pattern 15a corresponding to the line & space pattern of the gate electrodes. In the same manner as described above, the exposure using ArF excimer laser light (at a wavelength of 193 nm) is performed using, e.g., an optical mask and an immersion projection lithography stepper (immersion scanner).

Next, as shown in FIG. 20, the patterned resist film pattern 15a is subjected to a Trimming treatment such that the final resist film pattern 15a has a width smaller than a width 19 of the original resist film. The trimming treatment is the same treatment as dry etching, and is normally performed in the same apparatus or the same chamber as used in a subsequent etching process. Examples of an atmospheric gas for the trimming treatment that can be shown include, e.g., a $Cl_2/O_2$-based gas.

Next, as shown in FIG. 21, in the same manner as described above, the trimmed resist film pattern 15a is transferred successively to the Si-BARC film 15a (an etching atmosphere is, e.g., a $CF_4$-based gas atmosphere) and the SOC film 15c (an etching atmosphere is, e.g., an $O_2$-based gas atmosphere). Then, in the same manner as described above, by dry etching using the patterned SOC film 15c as a mask, the line & space pattern of the trimmed gate electrodes is formed successively in the polysilicon film 14a (an etching atmosphere is, e.g., a $SF_6/CF_4$-based gas atmosphere), the titanium nitride film 14b (an etching atmosphere is, e.g., a $HBr/Cl_2$-based gas atmosphere), and the gate insulating film 16 (an etching atmosphere is, e.g., a $BCl_3/Cl_2$-based gas atmosphere). At this time, the remaining Si-BARC film 15b is removed simultaneously.

Next, as shown in FIG. 22, the SOC film 15c is removed by an ashing treatment or the like and wet cleaning. Preferred examples of conditions for the wet cleaning that can be shown are such that: (1) in a first step, a chemical solution is a diluted hydrochloric acid having a composition in which a hydrogen chloride concentration is about 0.0418 mol %, a processing time is about 60 seconds, and a processing temperature is a room temperature (15 to 25° C.); and (2) in a second step, a chemical solution is a mixed acid having a composition in which a hydrogen chloride concentration is about 0.411 mol % and a hydrogen fluoride concentration is about 0.0106 mol %, a processing time is about 60 seconds, and a processing temperature is a room temperature (15 to 25° C.).

4. Description of Outline of Main Process After Gate Processing in Manufacturing Method of Semiconductor Integrated Circuit Device of Above Embodiment of Present Invention (See Mainly FIGS. 23 to 30)

Figure 23:
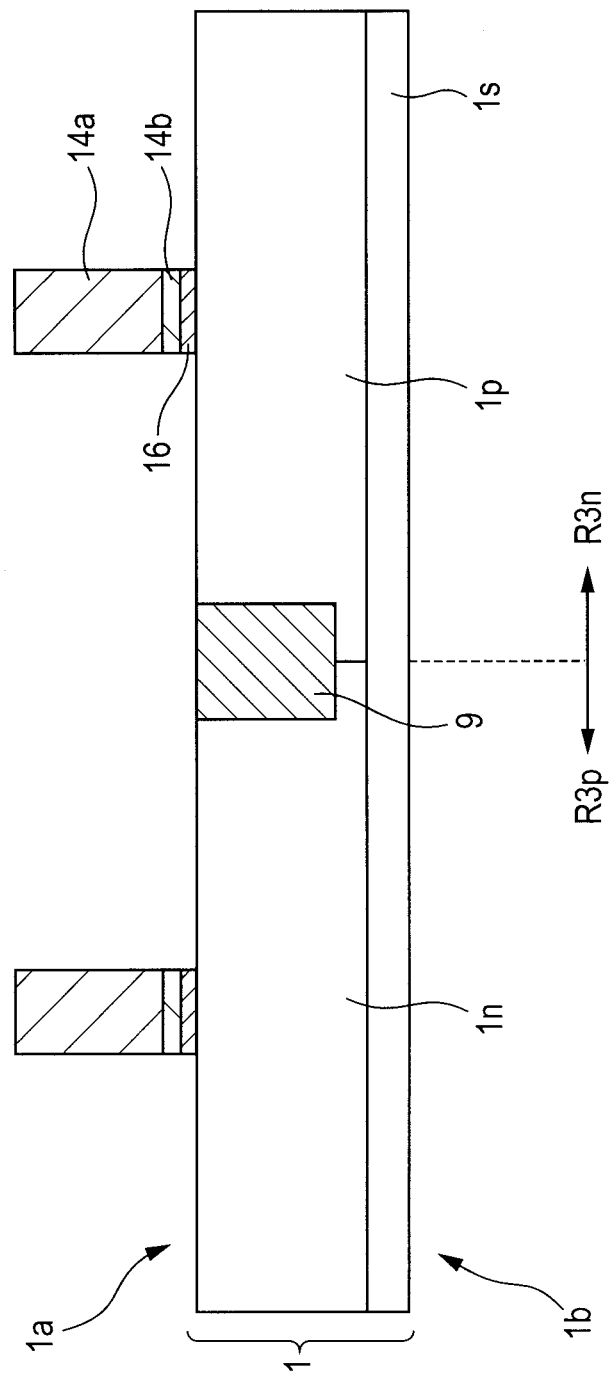
FIG. 23 is a schematic device cross-sectional view (the same as FIG. 22, i.e., at the completion of removal of the lower-layer film of the multilayer resist film for gate electrode patterning) of a CMISFET pair cut-away portion R3 from the non-memory region of FIG. 1, which is for illustrating the outline of a main process after gate processing in the manufacturing method of the semiconductor integrated circuit device of the above embodiment of the first part of the present invention.
Figure 24:
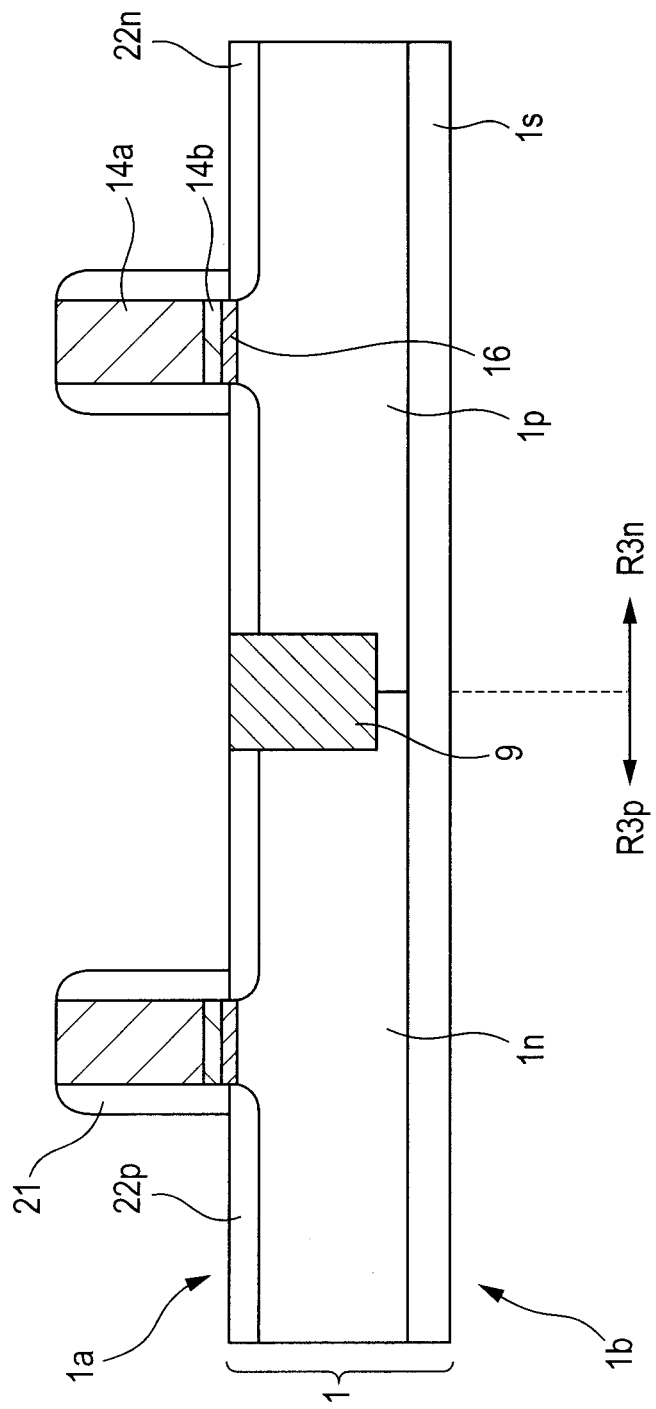
FIG. 24 is a schematic device cross-sectional view (at the completion of introduction of offset spacers and extension regions) of the CMISFET pair cut-away portion R3 from the non-memory region of FIG. 1, which is for illustrating the outline of the main process after gate processing in the manufacturing method of the semiconductor integrated circuit device of the above embodiment of the first part of the present invention.
Figure 25:
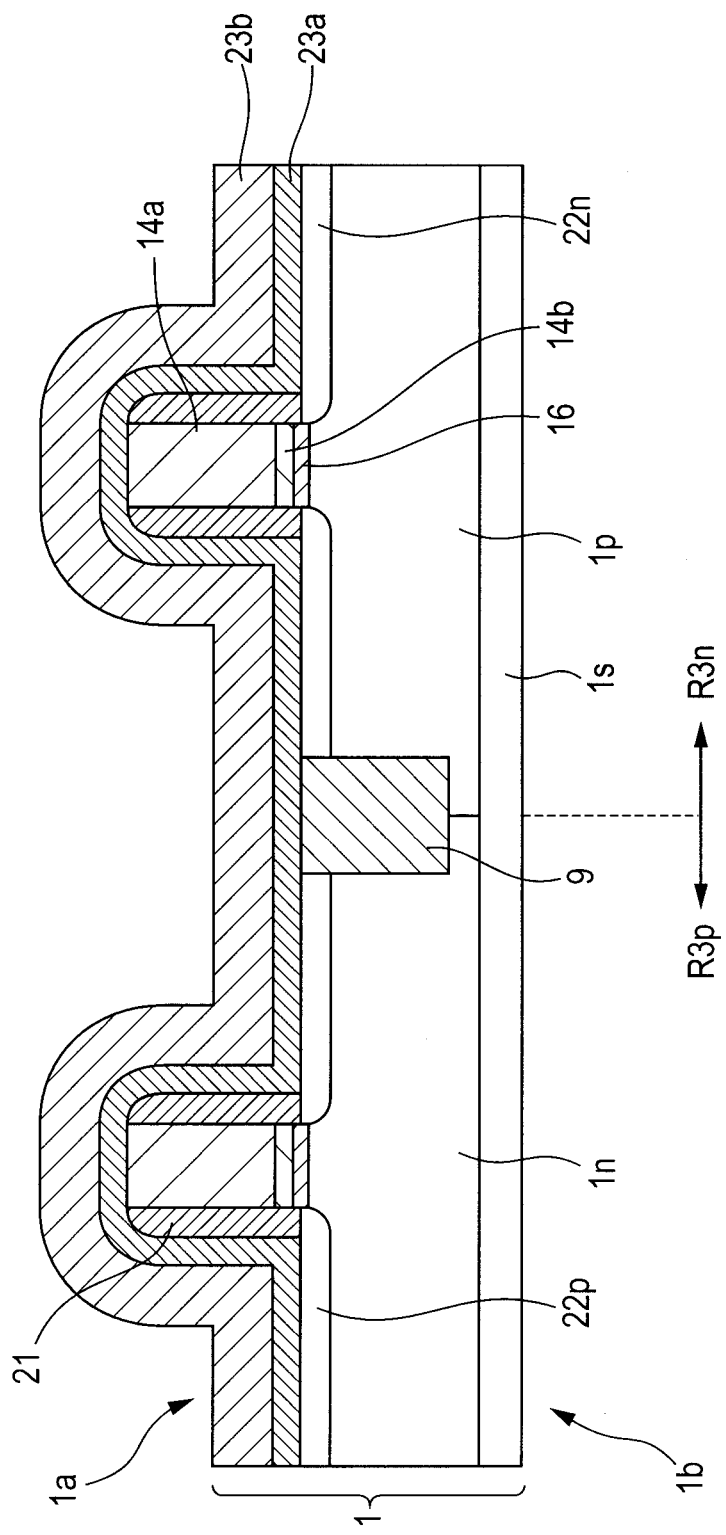
FIG. 25 is a schematic device cross-sectional view (at the completion of deposition of an insulating film for forming sidewalls) of the CMISFET pair cut-away portion R3 from the non-memory region of FIG. 1, which is for illustrating the outline of the main process after gate processing in the manufacturing method of the semiconductor integrated circuit device of the above embodiment of the first part of the present invention.
Figure 26:
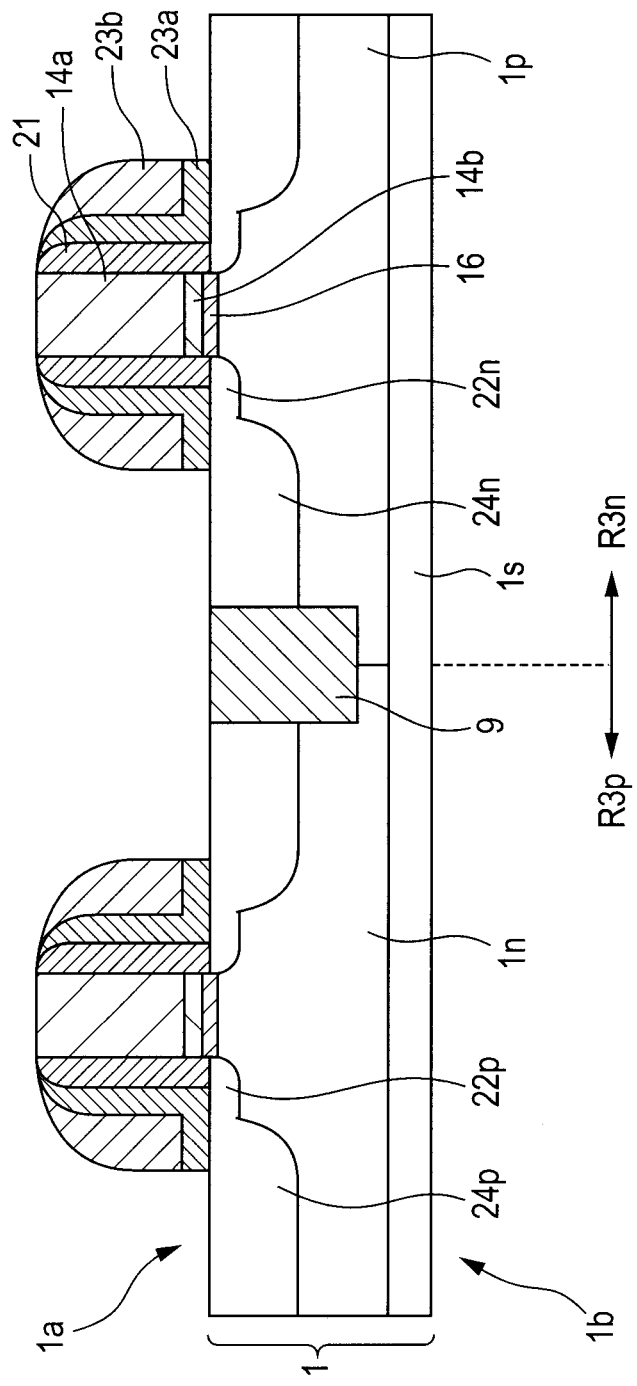
FIG. 26 is a schematic device cross-sectional view (at the completion of formation of the sidewalls) of the CMISFET pair cut-away portion R3 from the non-memory region of FIG. 1, which is for illustrating the outline of the main process after gate processing in the manufacturing method of the semiconductor integrated circuit device of the above embodiment of the first part of the present invention.
Figure 27:
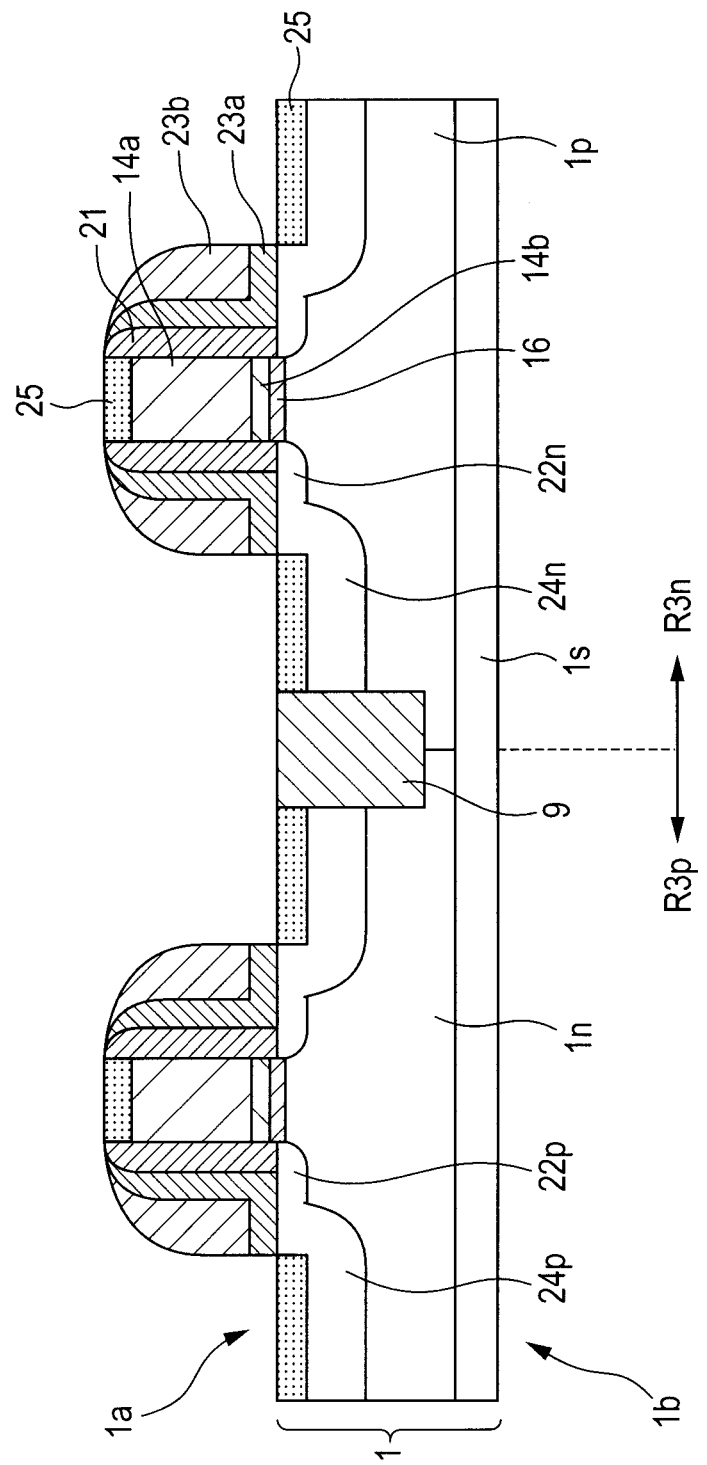
FIG. 27 is a schematic device cross-sectional view (at the completion of formation of silicide layers) of the CMISFET pair cut-away portion R3 from the non-memory region of FIG. 1, which is for illustrating the outline of the main process after gate processing in the manufacturing method of the semiconductor integrated circuit device of the above embodiment of the first part of the present invention.
Figure 28:
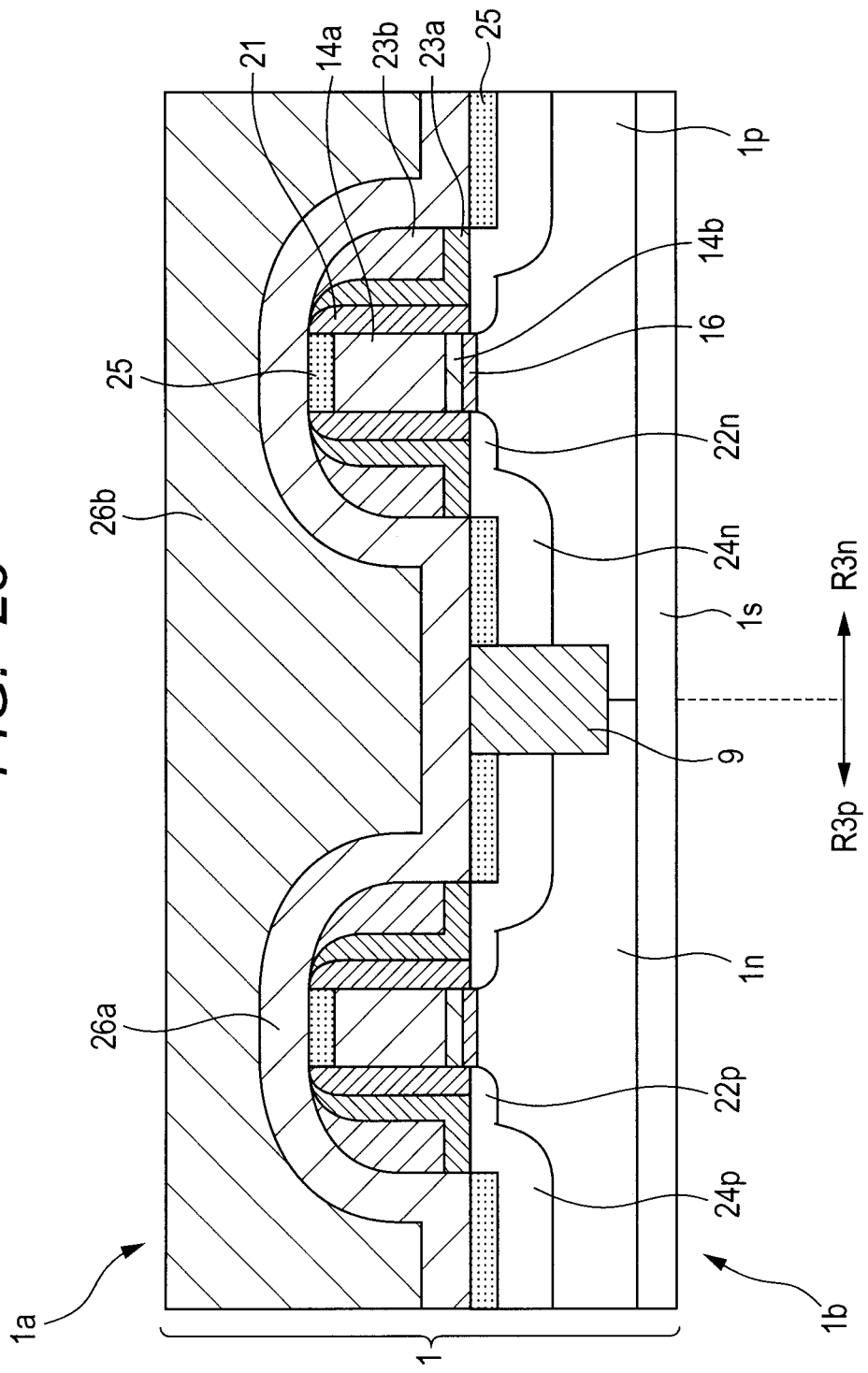
FIG. 28 is a schematic device cross-sectional view (at the completion of deposition of premetal insulting films) of the CMISFET pair cut-away portion R3 from the non-memory region of FIG. 1, which is for illustrating the outline of the main process after gate processing in the manufacturing method of the semiconductor integrated circuit device of the above embodiment of the first part of the present invention.
Figure 29:
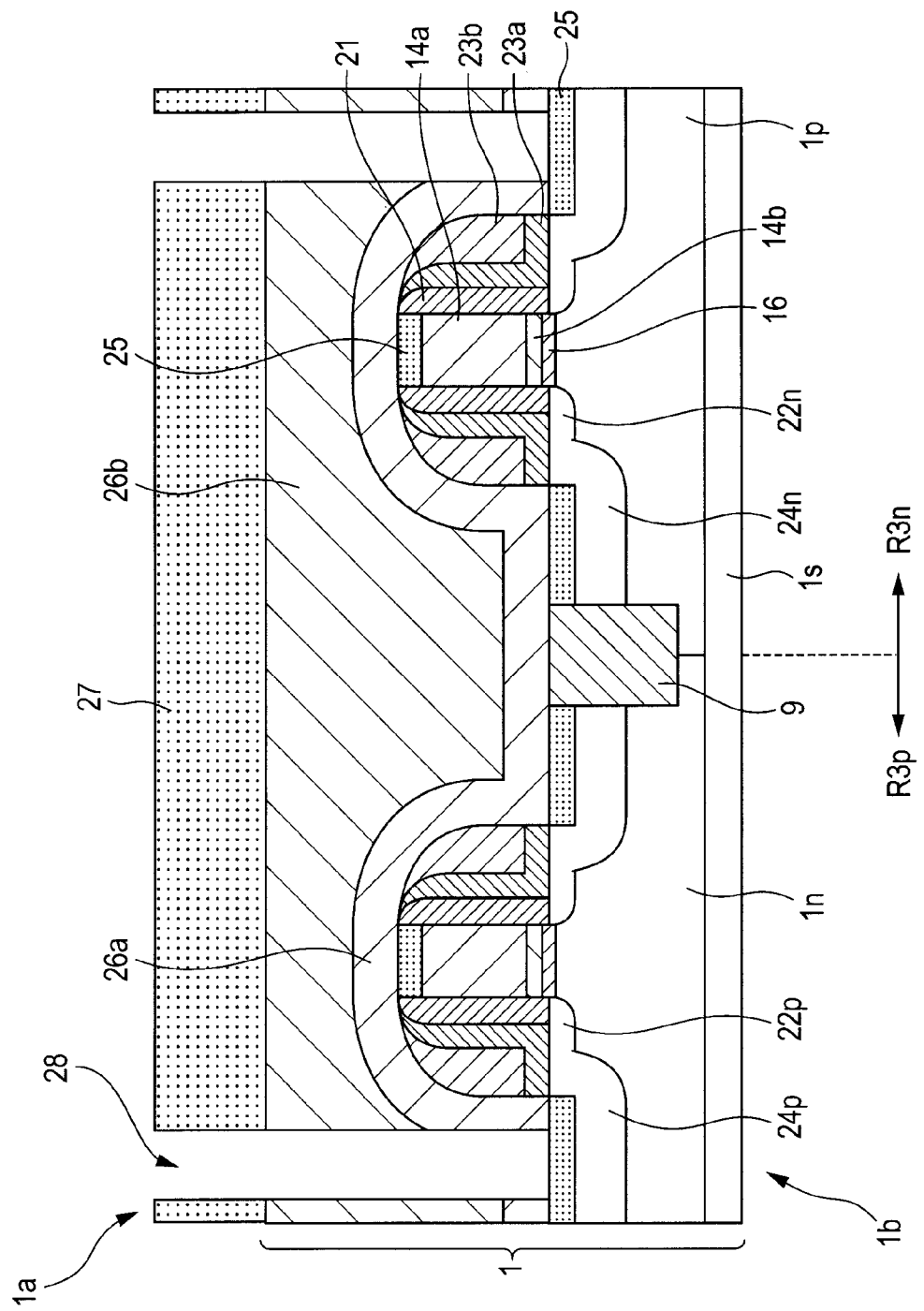
FIG. 29 is a schematic device cross-sectional view (at the completion of formation of contact holes) of the CMISFET pair cut-away portion R3 from the non-memory region of FIG. 1, which is for illustrating the outline of the main process after gate processing in the manufacturing method of the semiconductor integrated circuit device of the above embodiment of the first part of the present invention.
Figure 30:
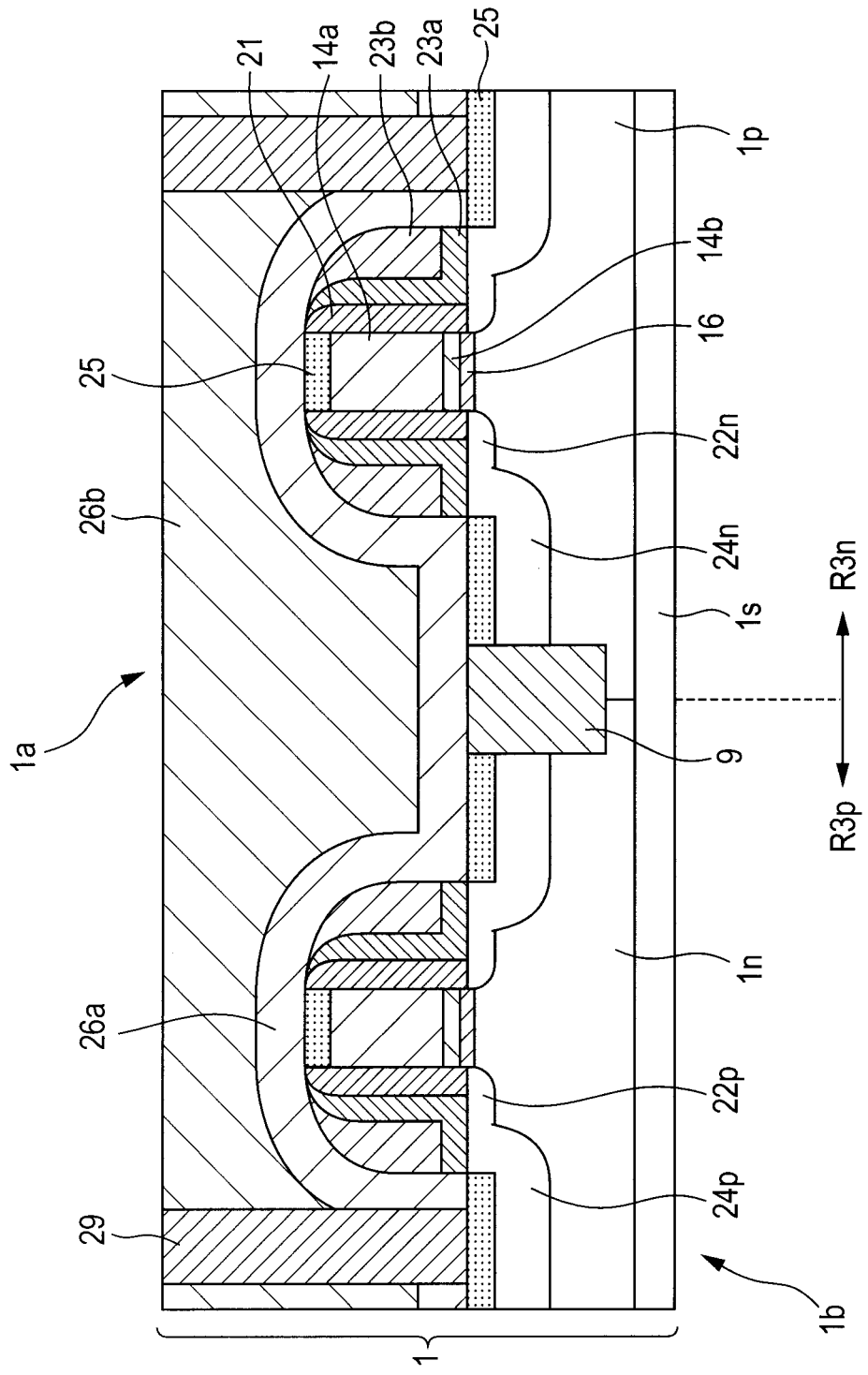
FIG. 30 is a schematic device cross-sectional view (at the completion of burying of tungsten plugs) of the CMISFET pair cut-away portion R3 from the non-memory region of FIG. 1, which is for illustrating the outline of the main process after gate processing in the manufacturing method of the semiconductor integrated circuit device of the above embodiment of the first part of the present invention.

FIG. 23 is a schematic device cross-sectional view (the same as FIG. 22, i.e., at the completion of removal of the lower-layer film of the multilayer resist film for gate electrode patterning) of a CMISFET pair cut-away portion R3 from the non-memory region of FIG. 1, which is for illustrating the outline of a main process after gate processing in the manufacturing method of the semiconductor integrated circuit device of the above embodiment of the present invention. FIG. 24 is a schematic device cross-sectional view (at the completion of introduction of offset spacers and extension regions) of the CMISFET pair cut-away portion R3 from the non-memory region of FIG. 1, which is for illustrating the outline of the main process after gate processing in the manufacturing method of the semiconductor integrated circuit device of the above embodiment of the present invention. FIG. 25 is a schematic device cross-sectional view (at the completion of deposition of an insulating film for forming sidewalls) of the CMISFET pair cut-away portion R3 from the non-memory region of FIG. 1, which is for illustrating the outline of the main process after gate processing in the manufacturing method of the semiconductor integrated circuit device of the above embodiment of the present invention. FIG. 26 is a schematic device cross-sectional view (at the completion of formation of the sidewalls) of the CMISFET pair cut-away portion R3 from the non-memory region of FIG. 1, which is for illustrating the outline of the main process after gate processing in the manufacturing method of the semiconductor integrated circuit device of the above embodiment of the present invention. FIG. 27 is a schematic device cross-sectional view (at the completion of formation of silicide layers) of the CMISFET pair cut-away portion R3 from the non-memory region of FIG. 1, which is for illustrating the outline of the main process after gate processing in the manufacturing method of the semiconductor integrated circuit device of the above embodiment of the present invention. FIG. 28 is a schematic device cross-sectional view (at the completion of deposition of premetal insulting films) of the CMISFET pair cut-away portion R3 from the non-memory region of FIG. 1, which is for illustrating the outline of the main process after gate processing in the manufacturing method of the semiconductor integrated circuit device of the above embodiment of the present invention. FIG. 29 is a schematic device cross-sectional view (at the completion of formation of contact holes) of the CMISFET pair cut-away portion R3 from the non-memory region of FIG. 1, which is for illustrating the outline of the main process after gate processing in the manufacturing method of the semiconductor integrated circuit device of the above embodiment of the present invention. FIG. 30 is a schematic device cross-sectional view (at the completion of burying of tungsten plugs) of the CMISFET pair cut-away portion R3 from the non-memory region of FIG. 1, which is for illustrating the outline of the main process after gate processing in the manufacturing method of the semiconductor integrated circuit device of the above embodiment of the present invention. Based on these drawings, a description will be given to the outline of a main process after gate processing in the manufacturing method of the semiconductor integrated circuit device of the above embodiment of the present invention.

Based on FIG. 23 (showing the same process step as shown in FIGS. 9 and 22), a description will be given to portions corresponding to a P-channel device region R3p of the CMISFET pair cut-away portion from the non-memory region and an N-channel device region R3n of the CMISFET pair cut-away portion from the non-memory region of FIG. 1 after the time when the patterning of the line & space pattern of the gate electrodes is completed. As shown in FIG. 23, in the upper half of the P-type single-crystal silicon substrate portion of the wafer 1, an N-well region in and a P-well region 1p are provided.

Next, as shown in FIG. 24, over substantially the entire device surface 1a of the wafer 1, an offset spacer silicon nitride film 21 (having a thickness of, e.g., about 2 to 7 nm) is deposited by, e.g., CVD. Subsequently, by anisotropic dry etching, the offset spacer silicon nitride film 21 is etched back to form the offset spacers 21.

Subsequently, into the respective surface areas of the device surface 1a of the wafer 1 in the P-channel device region R3p and the N-channel device region R3n, P-type extension regions 22p (examples of conditions for ion plantation include an ion species of $BF_2$, an implantation energy of 1 KeV to 5 KeV, and a dose of $1 \times 10^{15}/cm^2$ to $8 \times 10^{15}/cm^2$ and an ion species of C, an implantation energy of 1 KeV to 5 KeV, and a dose of $4 \times 10^{14}/cm^2$ to $9 \times 10^{14}/cm^2$) and N-type extension regions 22n (examples of conditions for ion plantation include an ion species of As, an implantation energy of 1 KeV to 10 KeV, and a dose of $1 \times 10^{15}/cm^2$ to $9 \times 10^{15}/cm^2$ and an ion species of C, an implantation energy of 1 KeV to 5 KeV, and a dose of $4 \times 10^{14}/cm^2$ to $9 \times 10^{14}/cm^2$) are introduced by ion implantation.

Next, as shown in FIG. 25, over substantially the entire device surface 1a of the wafer 1, a sidewall silicon oxide film 23a (having a thickness of, e.g., about 5 to 10 nm) is deposited by, e.g., CVD. Subsequently, over substantially the entire upper surface of the sidewall silicon oxide film 23a, a sidewall silicon nitride film 23b (having a thickness of, e.g., about 20 to 30 nm) is deposited by, e.g., CVD.

Next, as shown in FIG. 26, by anisotropic dry etching, the sidewall silicon oxide film 23a and the sidewall silicon nitride film 23b are etched back to form the silicon oxide film sidewalls 23a and the silicon nitride film sidewalls 23b. Subsequently, into the respective surface areas of the device surface 1a of the wafer 1 in the P-channel device region R3p and the N-channel device region R3n, P-type heavily doped source/drain regions 24p (examples of conditions for ion plantation include an ion species of B, an implantation energy of 0.5 KeV to 20 KeV, and a dose of $1 \times 10^{15}/cm^2$ to $8 \times 10^{15}/cm^2$) and N-type heavily doped source/drain regions 24n (examples of conditions for ion plantation include an ion species of As, an implantation energy of 2 KeV to 40 KeV, and a dose of $8 \times 10^{14}/cm^2$ to $4 \times 10^{15}/cm^2$ and an ion species of P, an implantation energy of 10 KeV to 80 KeV, and a dose of $1\times10^{13}/cm^2$ to $8\times10^{13}/cm^2$) are introduced by ion implantation.

Next, as shown in FIG. 27, by a Salicide process, silicide layers 25 such as, e.g., nickel platinum silicide layers are formed over the gate electrodes and in the surface areas of the source/drain regions.

Next, as shown in FIG. 28, over substantially the entire device surface 1a of the wafer 1, a silicon nitride film (having a thickness of, e.g., about 20 to 30 nm) is deposited as a premetal lower-layer insulating film 26a by, e.g., plasma CVD. Subsequently, over substantially the entire upper surface of the silicon nitride film 26a, a silicon oxide film (having a thickness of, e.g., about 150 to 240 nm) is deposited as a premetal upper-layer insulating film 26b by, e.g., plasma CVD.

Subsequently, as shown in FIG. 29, over substantially the entire upper surface of the silicon oxide film 26b, a resist film 27 for forming contact holes is formed by coating or the like. Subsequently, by typical lithography (e.g., ArF lithography), the resist film 27 is patterned. By anisotropic dry etching using the patterned resist film 27 as a mask, contact holes 28 are opened in the silicon oxide film 26b and the silicon nitride film 26a. Thereafter, the resist film 27 that is no longer needed is removed by ashing or the like.

Next, as shown in FIG. 30, tungsten plugs 29 are buried in the contact holes 28. Thereafter, as necessary, multilayer wiring is formed by a copper-based damascene method (buried wiring method) or an aluminum-based normal wiring method (non-buried wiring method).

5. Description of SRAM memory cell in SOC Chip as Example of Target Device, etc. in Manufacturing Method of Semiconductor Integrated Circuit Device of Above Embodiment of Present Invention (See Mainly FIGS. 31 and 32)

Here, the specific description has been given using the 6-transistor cell as an example, but the invention disclosed in the present application is not limited thereto. It will be appreciated that the present invention is also applicable to a memory cell having another structure.

Figure 31:
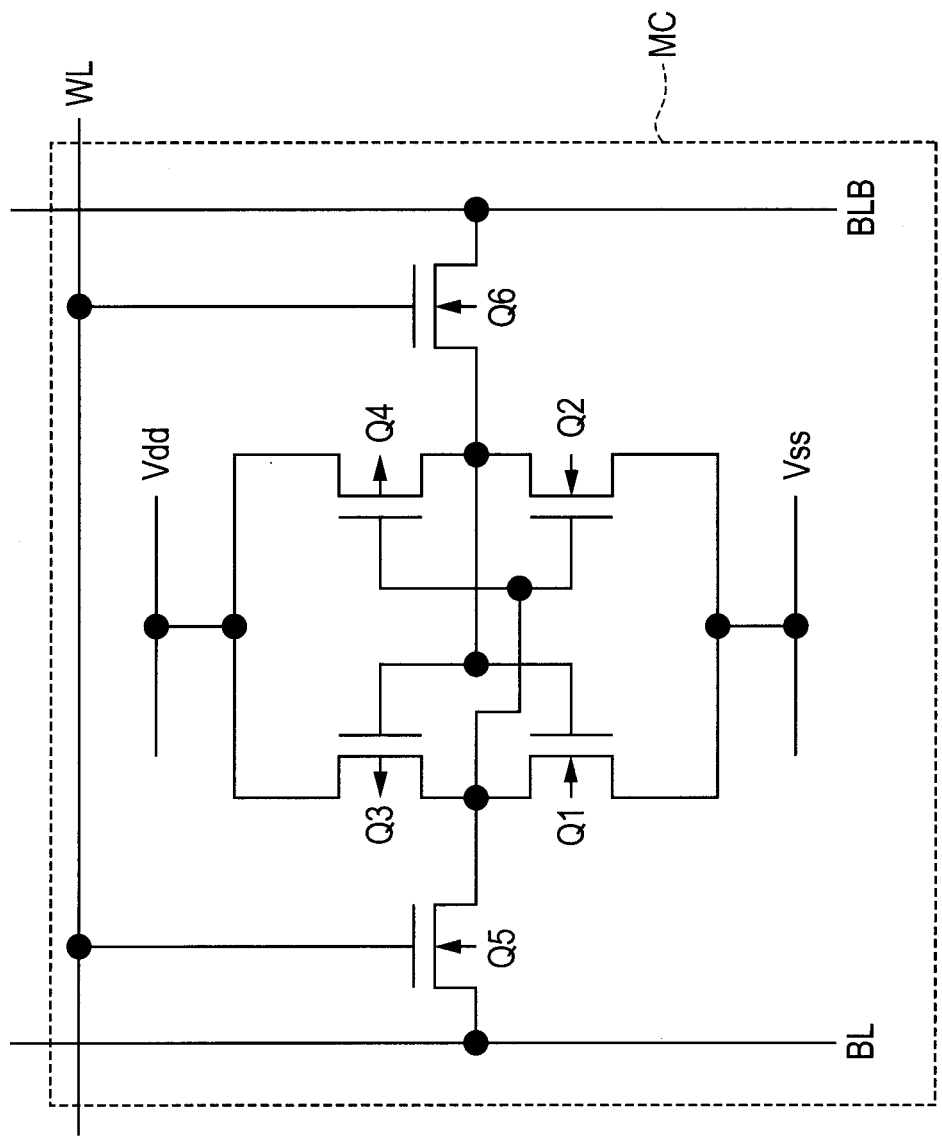
FIG. 31 is a circuit diagram of a SRAM memory cell of the SOC chip as an example of the target device in the manufacturing method of the semiconductor integrated circuit device of the above embodiment of the first part of the present invention.
Figure 32:
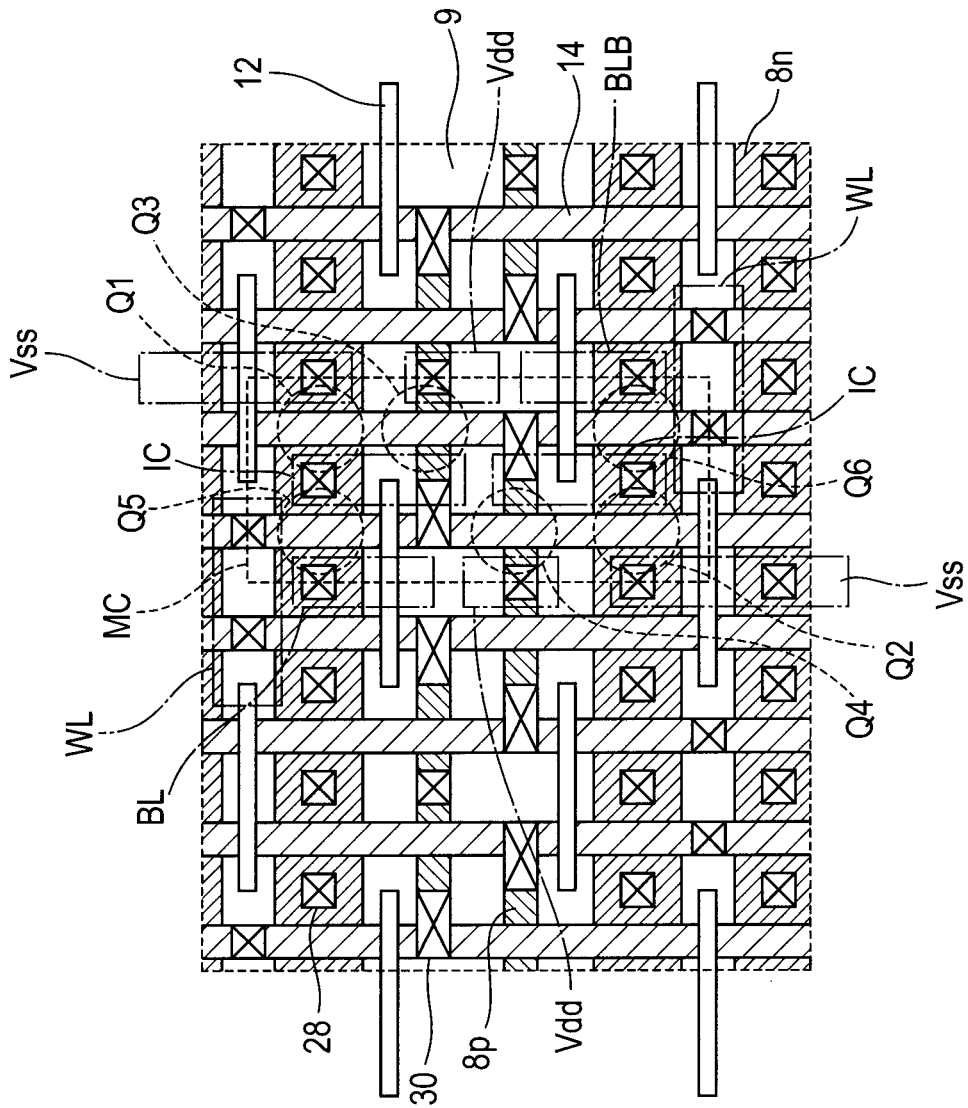
FIG. 32 is a two-dimensional layout diagram of the memory cell showing an example of a real two-dimensional layout of the SRAM memory cell of the SOC chip as the example of the target device in the manufacturing method of the semiconductor integrated circuit device of the above embodiment of the first part of the present invention.

FIG. 31 is a circuit diagram of a SRAM memory cell of the SOC chip as an example of the target device in the manufacturing method of the semiconductor integrated circuit device of the above embodiment of the present invention. FIG. 32 is a two-dimensional layout diagram of the memory cell showing an example of a real two-dimensional layout of the SRAM memory cell of the SOC chip as the example of the target device in the manufacturing method of the semiconductor integrated circuit device of the above embodiment of the present invention. Based on these drawings, a description will be given to an SRAM memory cell in a SOC chip as an example of the target device and so forth in the manufacturing method of the semiconductor integrated circuit device of the above embodiment of the present invention.

As shown in FIG. 31, in an SRAM memory cell MC, a word line WL and a pair of bit lines BL and BLB are provided to extend orthogonally to each other. In the vicinities of the intersection points thereof, N-type memory transistors Q1 and Q2, P-type memory transistors Q3 and Q4, read transistors Q5 and Q6, a power supply line Vdd for supplying power thereto, a reference voltage line Vss, and the like, are disposed.

FIG. 32 illustrates the SRAM memory cell MC of FIG. 31 which is shown in a real layout. As shown in FIG. 32, it can be seen that a large number of the gate electrodes 14 extending vertically are regularly cut by the cut regions 12 between adjacent gate electrodes. Of a large number of contact portions 28 and 30, those shown in laterally elongated shapes are the shared contact portions 30. Here, the contact portions 28 of active regions 8n of the N-channel devices are coupled to the shared contact portions 30 of active regions 8p of the P-channel devices with interconnection metal wires IC.

6. Supplemental Description, Consideration, etc. to Manufacturing Method of Semiconductor Integrated Circuit Device of Above Embodiment of Present Invention In a SRAM wide cell as shown in Section 5, reducing the longitudinal space portion between adjacent gates, i.e., the cut region 12 between adjacent gate electrodes (see FIG. 2) is an important technical challenge to a reduction in cell area. However, in the generation of 28 nm Technology Node or thereafter, a resolution limit is not surpassed. Therefore, it is impossible to perform gate electrode patterning by one-step lithography (e.g., ArF lithography using exposure light at a wavelength of 193 nm and an immersion projection lithography stepper). Also, in the generation of 28 nm technology node or thereafter, a Gate stack Structure includes a High-k gate insulating film and a metal-based gate so that oxidation resistance and wet treatment resistance tend to deteriorate. In addition, since it is necessary to use a multilayer resist process (in the generation of 45 nm technology node or thereafter), there is also a problem specific to the multilayer resist process.

To solve the problem of the resolution limit, the present invention uses a Multiple Patterning Process which repeats patterning of an etching mask film such as a resist film and etching of an underlying film using the patterned etching mask film a plurality of times. However, a method (referred to as a "L & S first method") which simply performs the patterning (first lithography) of the line & space pattern of gate electrodes first, and subsequently performs the patterning (second lithography) of the cut region 12 between adjacent gate electrodes (see FIG. 2) has a problem (see FIG. 1) that a resist film in the second lithography cannot ensure planarity between the memory region 6 (pattern high-density region) and the non-memory region 7 (pattern low-density region). Specifically, it is difficult to achieve global planarization using the lower-layer film 15c (see FIG. 8) such as a SOC film.

Accordingly, in the example shown in Sections 2 to 4, for example, the patterning (first lithography) of the cut region 12 between adjacent gate electrodes (see FIG. 2) is performed first, and then the patterning (second lithography) of the line & space pattern of the gate electrodes is performed (referred to as a "L & S last method"). In accordance with the L & S last method, the pattern density in the cut region 12 between adjacent gate electrodes (see FIG. 2) is generally low so that pattern density unbalance does not occur between the cut region 12 between adjacent gate electrodes and the non-memory region 7 (pattern low-density region).

Also, when a shrinkage treatment (treatment for reducing the area of the resist opening corresponding to the cut region between adjacent gate electrodes) is involved in the patterning of the cut region 12 between adjacent gate electrodes (see FIG. 2), in accordance with the L & S first method, roughness in an underlie is significant so that a post-shrinkage shape becomes unstable depending on the underlie. On the other hand, in the L & S last method, the underlie is planar so that the post-shrinkage shape is stabilized.

In addition, to solve the problems of deteriorated oxidation resistance and wet treatment resistance, it is effective not only to use the L & S last method, but also to perform layout such that the cut region 12 between adjacent gate electrodes (see FIG. 2) is included within the isolation region 9 (referred to as a "layout method which locates gate end portions within the isolation region"). In the multiple patterning process, removal of a resist film involving ashing and a wet chemical solution treatment is performed a plurality of times so that excessive recession of a gate insulating film and excessive oxidation of a metal-based gate electrode portion are likely to occur. However, in the layout method which locates gate end portions within the isolation region, such a multiple treatment is performed not over the active region, but mainly over the isolation region 9 (see FIG. 2). Therefore, it is possible to reduce influence on device characteristics.

Note that, in the L & S last method, it is effective to perform the patterning of the gate electrodes in the non-memory region 7 simultaneously with the patterning of the line & space pattern of the gate electrodes in the memory region 6. This is because, since the shrinkage treatment increases the width of the covering portion of the resist, it cannot be used for the patterning of the line & space pattern of the gate electrodes. Additionally, by doing so, there is also the advantage of allowing a trimming treatment to be used for the patterning of the line & space pattern of the gate electrodes in the memory region 6 and the non-memory region 7 (irrespective of the presence or absence of the shrinkage treatment).

Note that, in the process described in Sections 2 to 4 and the like, a hard mask (such as, e.g., a SiN film) is not basically used. Accordingly, it is unnecessary to remove the hard mask afterward, and therefore an overall process can be simplified.

7. Summary

While the invention achieved by the present inventors has been specifically described heretofore based on the embodiment thereof, the present invention is not limited thereto. It will be appreciated that various changes and modifications can be made in the invention within the scope not departing from the gist thereof.

For example, in the above embodiment, the specific description has been given by mainly using the Gate First method as an example, but the present invention is not limited thereto. It will be appreciated that the present invention is also applicable to a Dummy Gate Process in the Gate Last method.

Also, in the above embodiment, the specific description has been given by mainly using the method which does not use a Hard Mask as an example, but the present invention is not limited thereto. It will be appreciated that a hard mask may also be used for either one or both of the Patterning of the cut region between adjacent gate electrodes and the patterning of the Line & space Pattern of the gate electrodes.

Also, in the above embodiment, the specific description has been given mainly to the example in which the typical silicon-based (not a silicon-based alloy) member is used in the source/drain regions, but the present invention is not limited thereto. It will be appreciated that the present invention is also applicable to an example in which a silicon-based alloy (SiGe or SiC) is used in source/drain regions.

<Second Part: Portion Mainly Related to Gate First & Hard-Mask Process>

0. Outline of Second Part

In order to miniaturize a pattern, particularly to reduce the cell area of a SRAM, it is important to reduce the distance between the end portions of adjacent gate electrodes. However, at 28 nm technology node, it is generally difficult to transfer a pattern by one-shot exposure using ArF (at a wavelength of 193 nm). Accordingly, a micropattern is typically formed by repeating exposure, etching, and the like a plurality of times. However, there are such problems that, after the etching for the line & space pattern, the new resist pattern is not planarized and that oxidation resistance and wet etch resistance are low due to the use of a High-k insulating film and a metal electrode member in a gate stack material.

The following is a brief description of the outline of a representative embodiment of the invention disclosed in the present part.

That is, according to an aspect of the present invention, in the patterning of a gate stack film (including a dummy gate stack film) having a high-k gate insulating film and a metal electrode film in a memory region, a hard mask is patterned using two resist films into a line & space pattern and the pattern of a cut region between adjacent gate electrodes, and etching of the gate stack film is performed using the patterned hard mask.

The following is a brief description of an effect obtained according to the representative embodiment of the invention disclosed in the present part.

That is, in the patterning of a gate stack film (including a dummy gate stack film) having a high-k gate insulating film and a metal electrode film in a memory region, a hard mask is patterned using two resist films into a line & space pattern and the pattern of a cut region between adjacent gate electrodes, and etching of the gate stack film is performed using the patterned hard mask. Therefore, it is possible to prevent damage to the side surfaces of the gate stack film due to an oxidation treatment and a repeated chemical solution treatment.

1. Description of Top Layout of SOC Chip as Example of Target Device, etc. in Manufacturing Method of Semiconductor Integrated Circuit Device of Embodiment of Present Invention (See Mainly FIG. 33)

Figure 33:
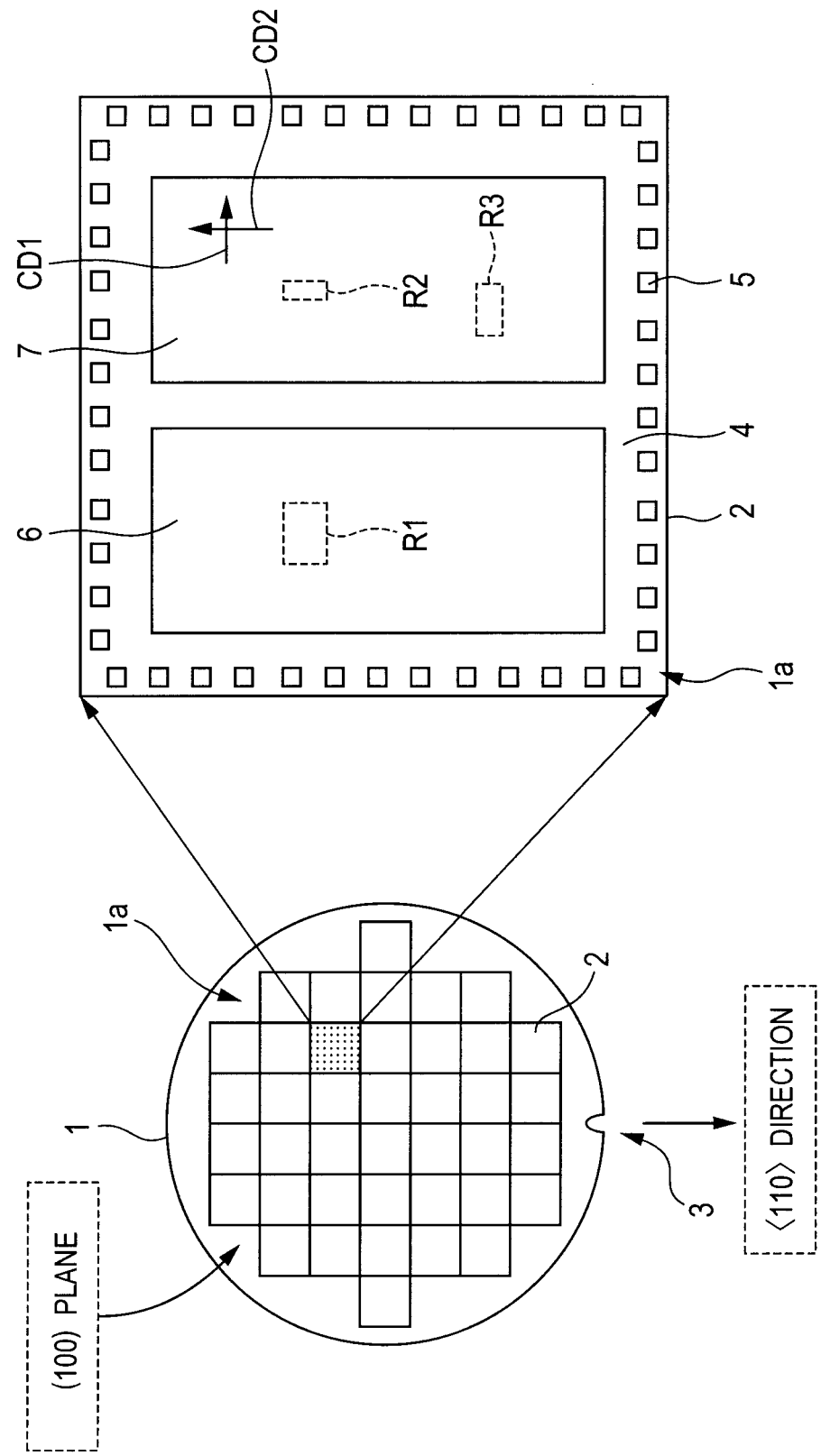
FIG. 33 is a top view of a wafer and a chip for illustrating a top layout of a SOC chip as an example of a target device and so forth in a manufacturing method of a semiconductor integrated circuit device of an embodiment of a second part of the present invention.

FIG. 33 is a top view of a wafer and a chip for illustrating a top layout of a SOC chip as an example of a target device and so forth in a manufacturing method of a semiconductor integrated circuit device of an embodiment of the present invention. Based on the drawing, a description will be given to the top layout of the SOC chip as the example of the target device and so forth in the manufacturing method of the semiconductor integrated circuit device of the embodiment of the present invention.

As shown in FIG. 33, a device main surface 1a (first main surface) of a wafer 1 (here, by way of example, a single-crystal silicon wafer having a diameter of 300 mm will be described, but the diameter of the wafer may also be 450 mm or 200 mm) is formed with a large number of chip regions 2. Also, the wafer 1 is provided with a notch 3 for discrimination of the orientation thereof. Note that the surface orientation of the device main surface 1a of the wafer 1 is, e.g., a (100) plane (including a plane equivalent thereto), and a crystal orientation in the direction of the notch 3 is, e.g., a <110> orientation. Note that channel directions CD1 and CD2 of the individual MISFETs, i.e., channel length directions (each of which is a direction from the source to the drain or from the drain to the source, i.e., a direction equivalent to the <110> orientation) are indicated by the arrows unless particularly explicitly described otherwise. Also, an orientation or a crystal plane has a substantial meaning, and includes not only the very orientation (or crystal plane), but also an orientation (or crystal plane) slightly shifted therefrom therearound (by, e.g., about not more than 7 degrees in a forward or rearward direction).

Next, a description will be given to the details of the layout of each of the chips 2 (chip regions). In a peripheral portion 4 of the chip region 2, a large number of bonding pads are provided and, in the inner area thereof, a memory region 6 and a non-memory region 7 are provided. Here, as an example of the memory region 6, a SRAM (Static Random Access Memory) is shown, but the memory region 6 is not limited thereto. The memory region 6 may also be a DRAM (Dynamic Random Access Memory) or a flash memory. Note that, to be precise, the "memory region" indicates a memory cell region. Accordingly, a major part of a memory peripheral circuit belongs to the non-memory region 7. Therefore, the non-memory region 7 includes not only such a memory peripheral circuit, but also a logic circuit, an analog circuit, and the like.

2. Description of Outline of Gate Patterning Process in Manufacturing Method of Semiconductor Integrated Circuit Device of Above Embodiment of Present Invention (See Mainly FIGS. 34 to 41)

Here, following the description of the SRAM mixed logic chip in Section 1, a description will be given to the patterning (double patterning process) of the gate electrodes and so forth in the memory cell region 6 and the non-memory cell region 7 (FIG. 33).

Figure 34:
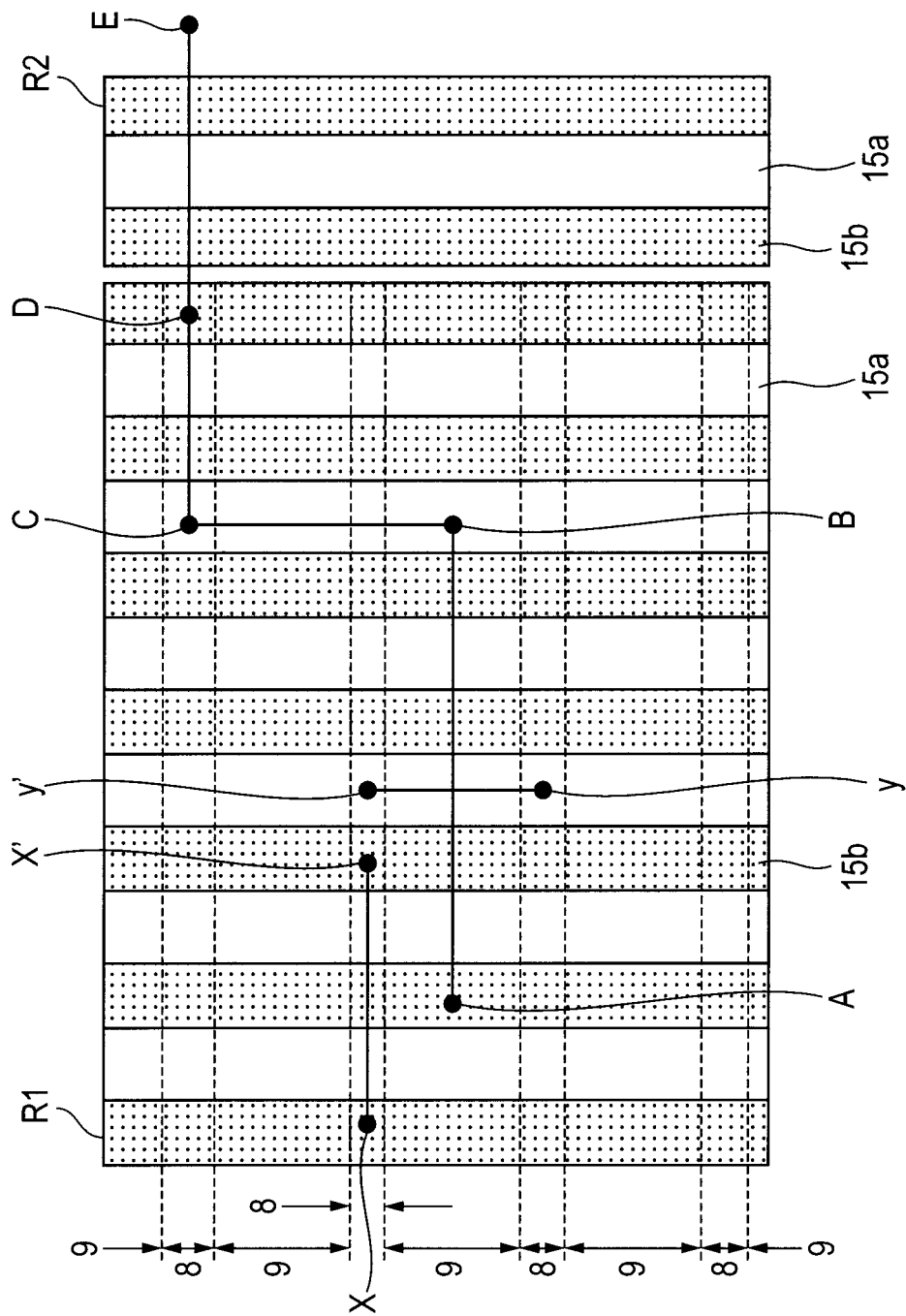
FIG. 34 is a top view (at the completion of patterning of an upper-layer resist film for the line & space patterning of gate electrodes) of a cut-away portion R1 from a memory region and a cut-away portion R2 from a non-memory region of FIG. 33, which is for illustrating the outline of a gate patterning process in the manufacturing method of the semiconductor integrated circuit device of the above embodiment of the second part of the present invention.
Figure 35:
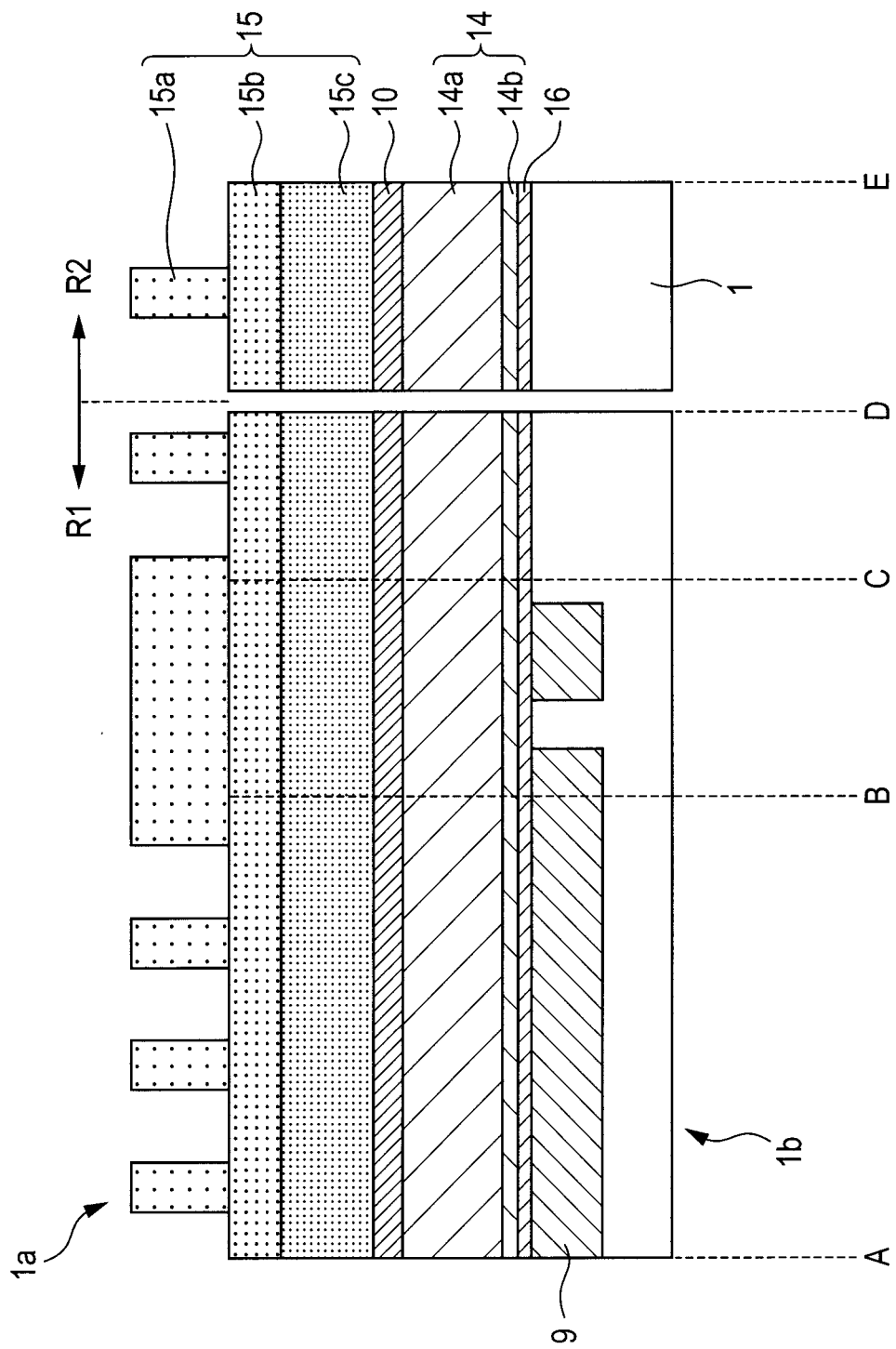
FIG. 35 is a device cross-sectional view (at the completion of patterning of the upper-layer resist film for the line & space patterning of the gate electrodes) corresponding to the A-B-C-D-E cross section of FIG. 34, which is for illustrating the details of the gate patterning process in the manufacturing method of the semiconductor integrated circuit device of the above embodiment of the second part of the present invention.
Figure 36:
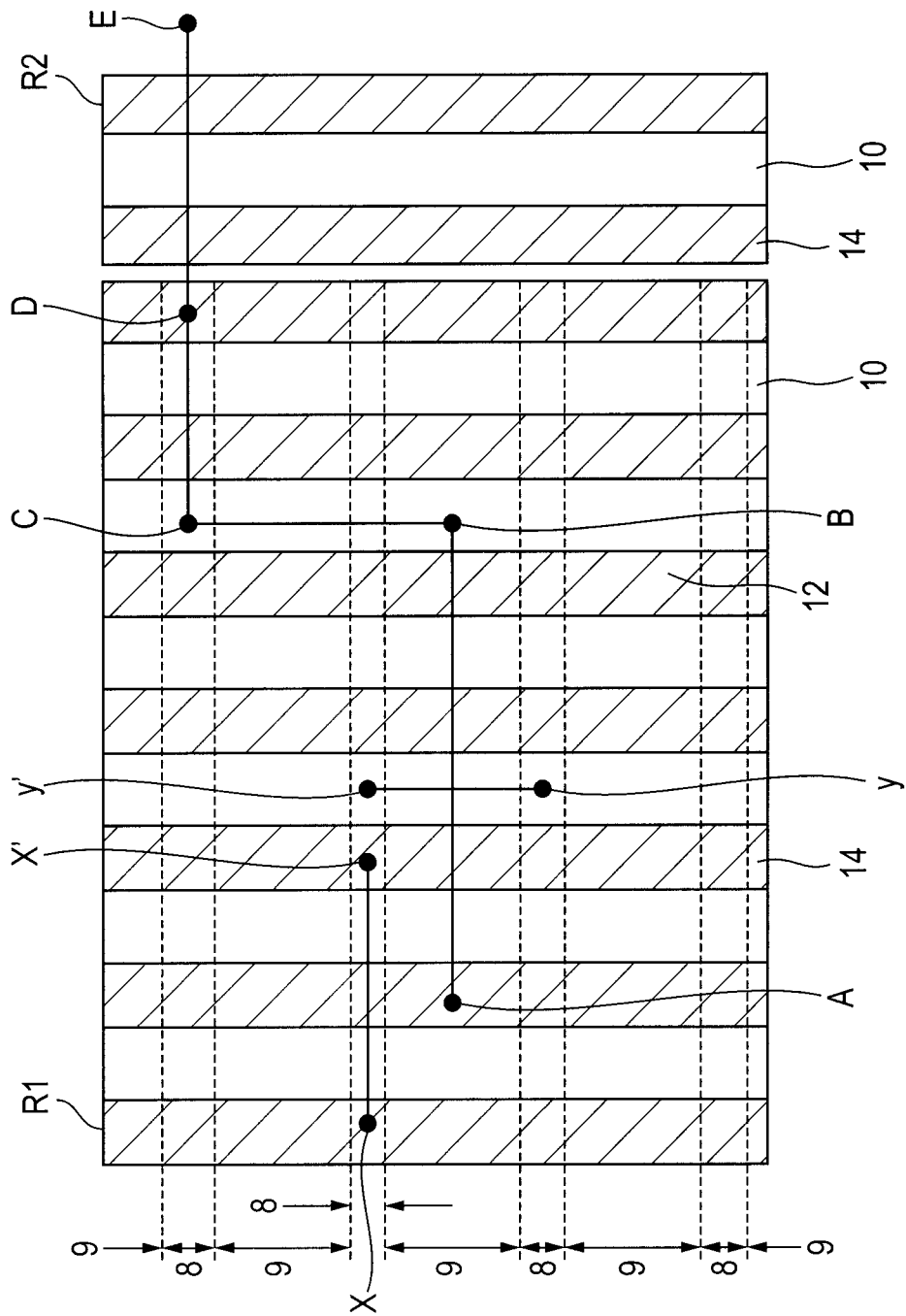
FIG. 36 is a top view (at the completion of line & space etching of a hard mask for gate electrode patterning) of the cut-away portion R1 from the memory region and the cut-away portion R2 from the non-memory region of FIG. 33, which is for illustrating the outline of the gate patterning process in the manufacturing method of the semiconductor integrated circuit device of the above embodiment of the second part of the present invention.
Figure 37:
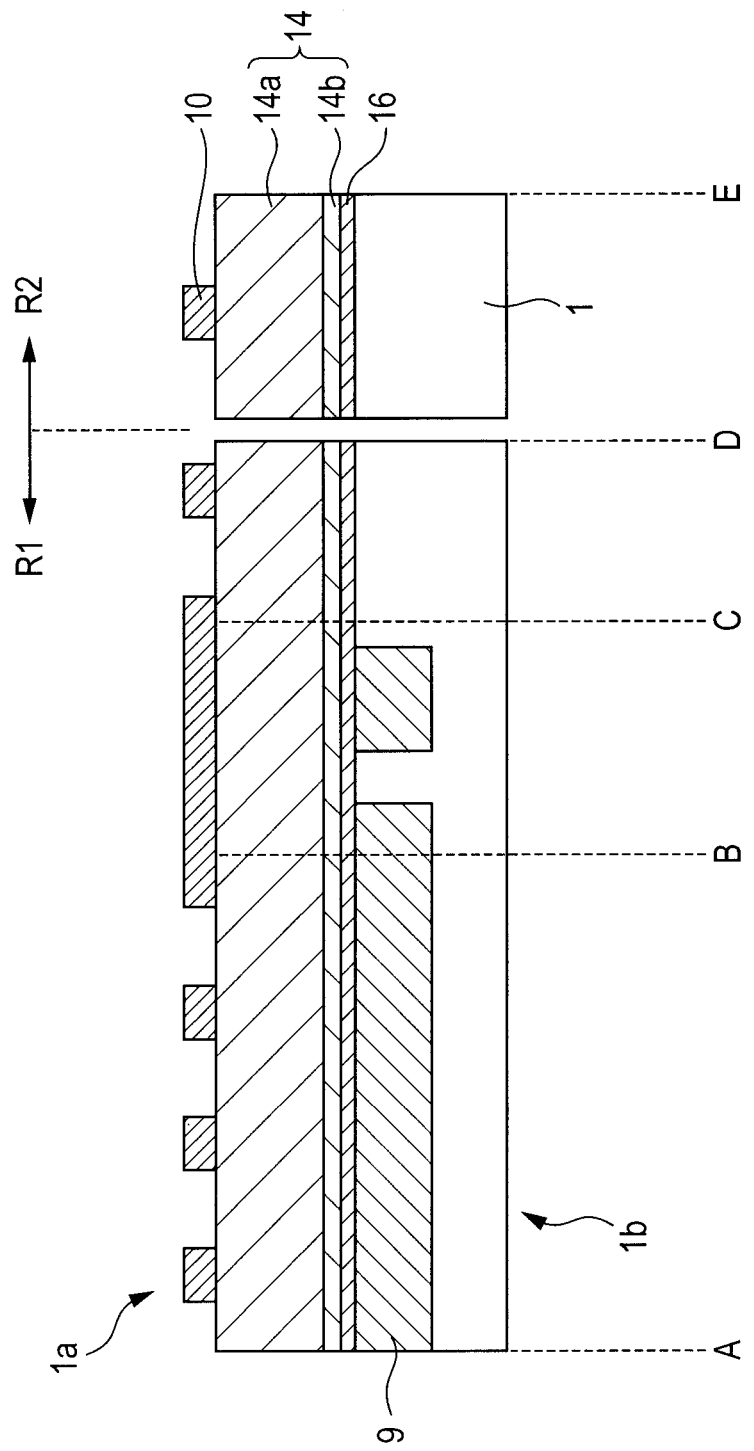
FIG. 37 is a device cross-sectional view (at the completion of the line & space etching of the hard mask for gate electrode patterning) corresponding to the A-B-C-D-E cross section of FIG. 34, which is for illustrating the details of the gate patterning process in the manufacturing method of the semiconductor integrated circuit device of the above embodiment of the second part of the present invention.
Figure 38:
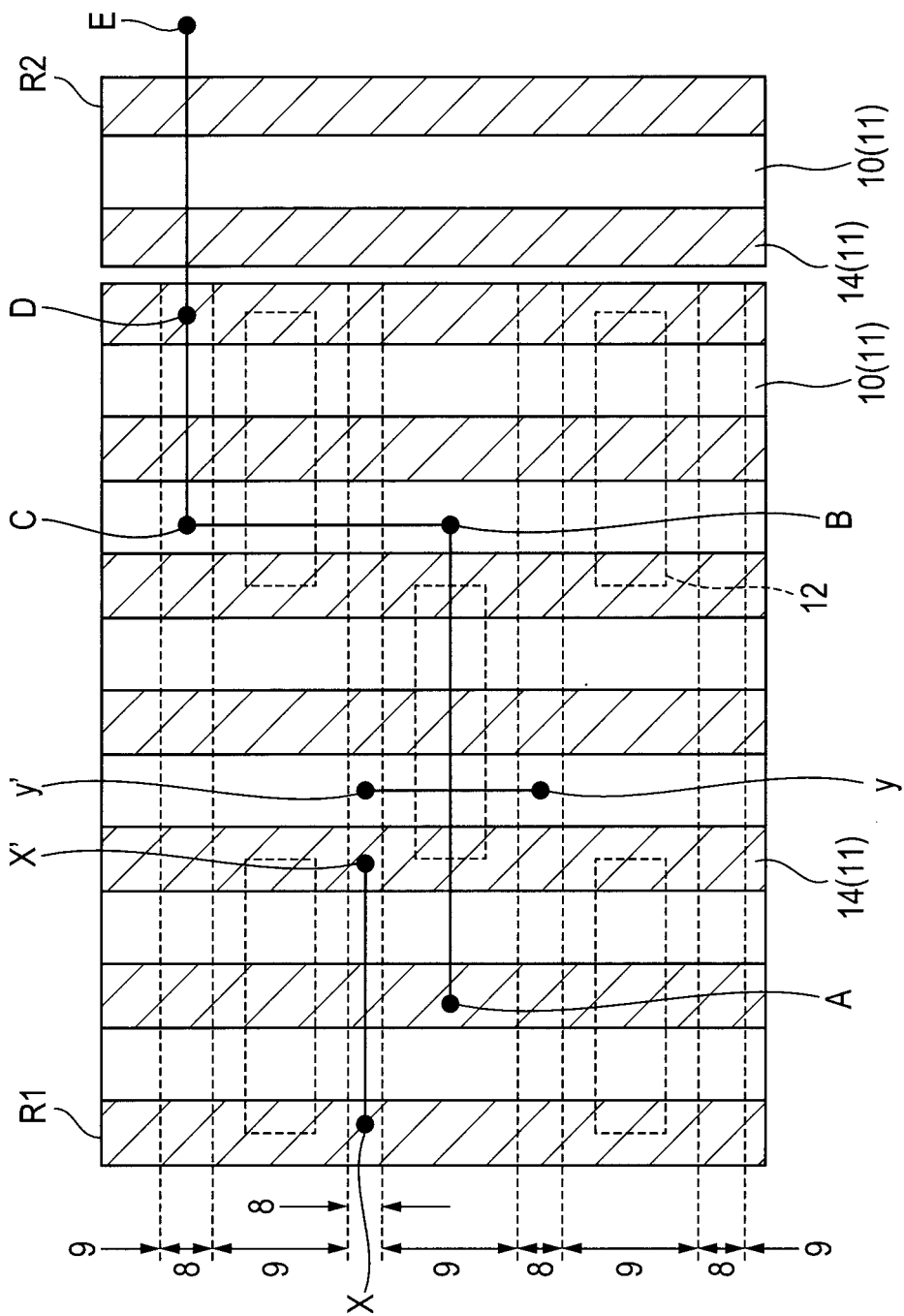
FIG. 38 is a top view (at the completion of patterning of an upper-layer resist film for the patterning of cut regions between adjacent gate electrodes) of the cut-away portion R1 from the memory region and the cut-away portion R2 from the non-memory region of FIG. 33, which is for illustrating the outline of the gate patterning process in the manufacturing method of the semiconductor integrated circuit device of the above embodiment of the second part of the present invention.
Figure 39:
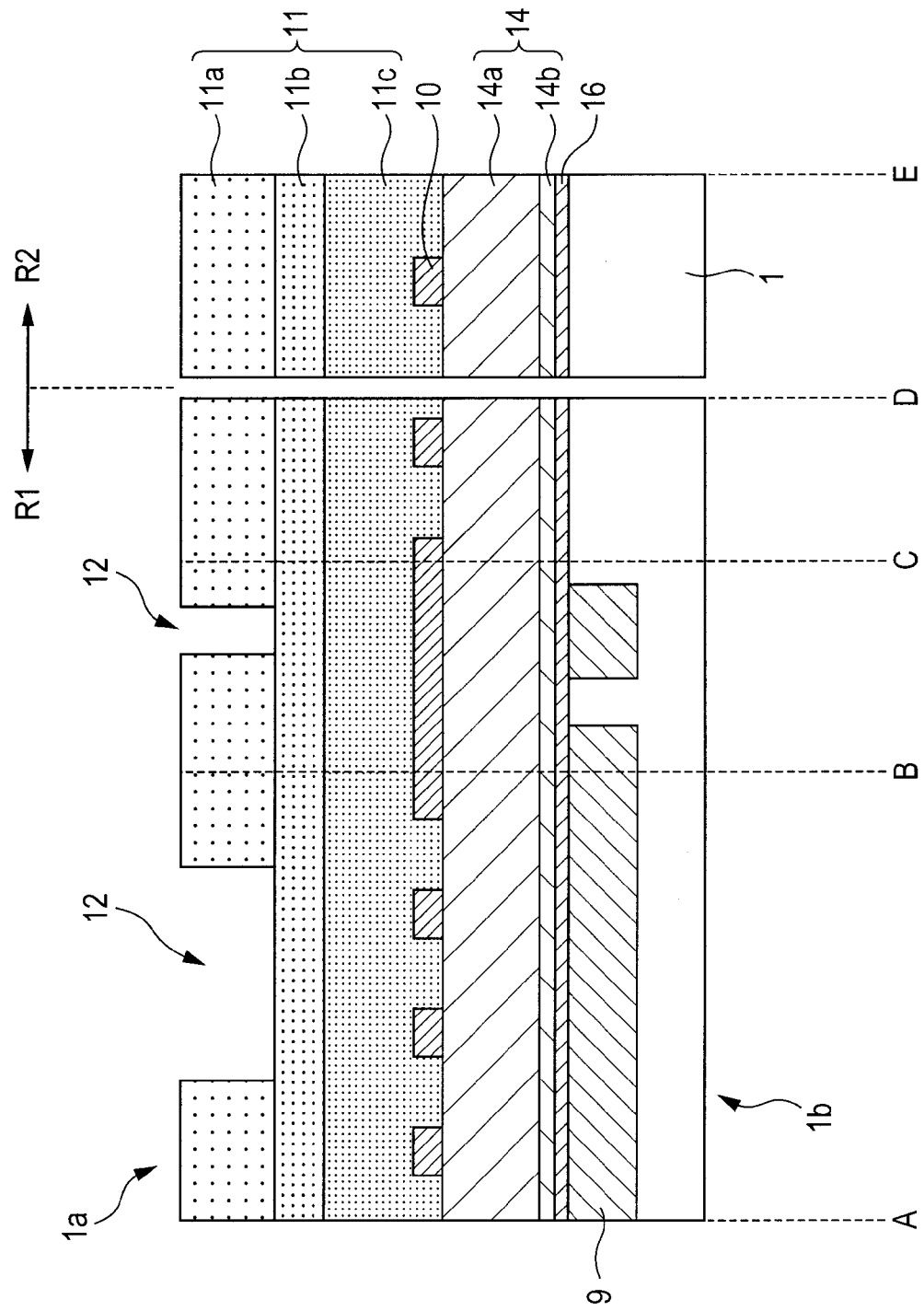
FIG. 39 is a device cross-sectional view (at the completion of patterning of the upper-layer resist film for the patterning of the cut regions between adjacent gate electrodes) corresponding to the A-B-C-D-E cross section of FIG. 34, which is for illustrating the details of the gate patterning process in the manufacturing method of the semiconductor integrated circuit device of the above embodiment of the second part of the present invention.
Figure 40:
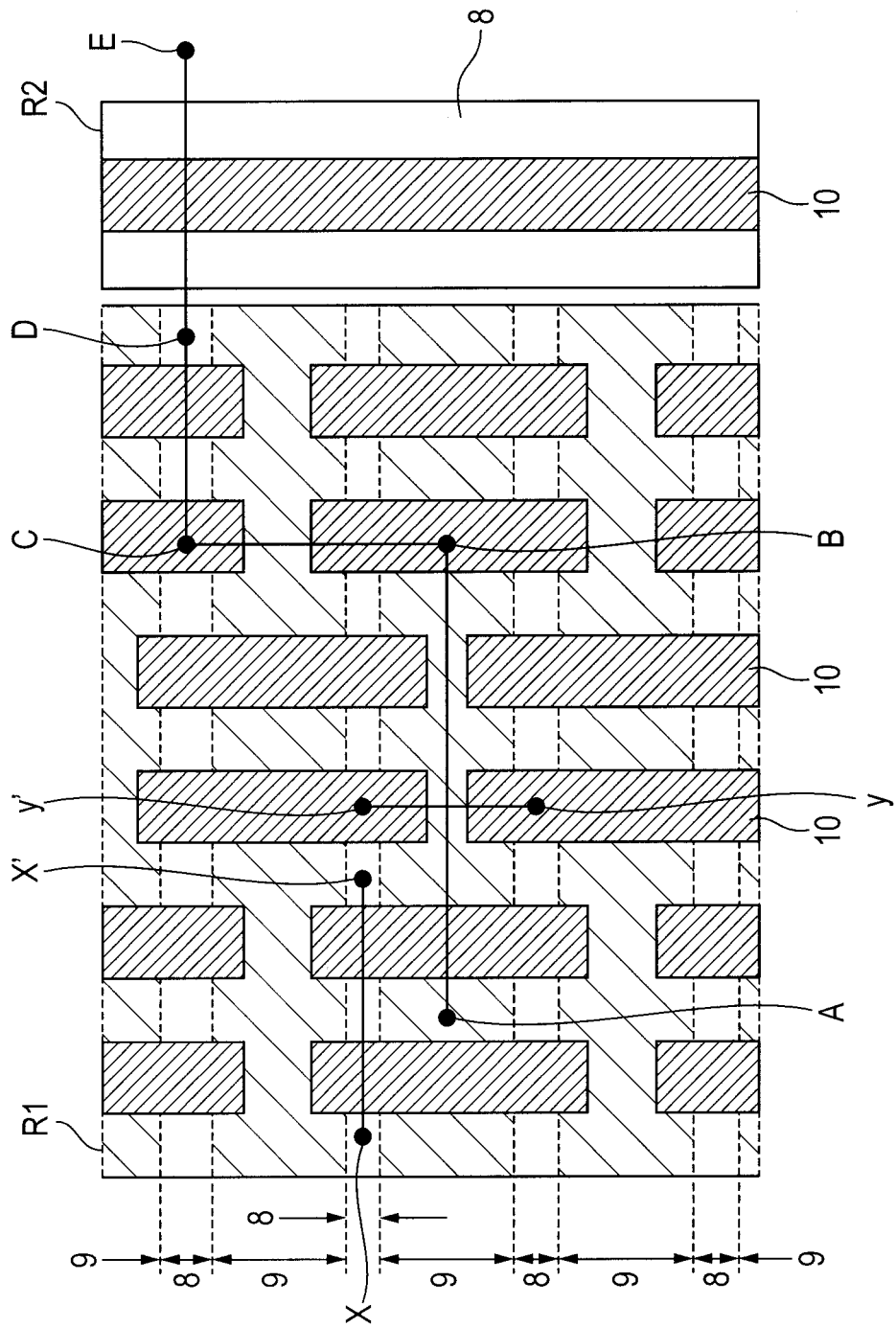
FIG. 40 is a top view (at the completion of the patterning of the gate electrodes) of the cut-away portion R1 from the memory region and the cut-away portion R2 from the non-memory region of FIG. 33, which is for illustrating the outline of the gate patterning process in the manufacturing method of the semiconductor integrated circuit device of the above embodiment of the second part of the present invention.
Figure 41:
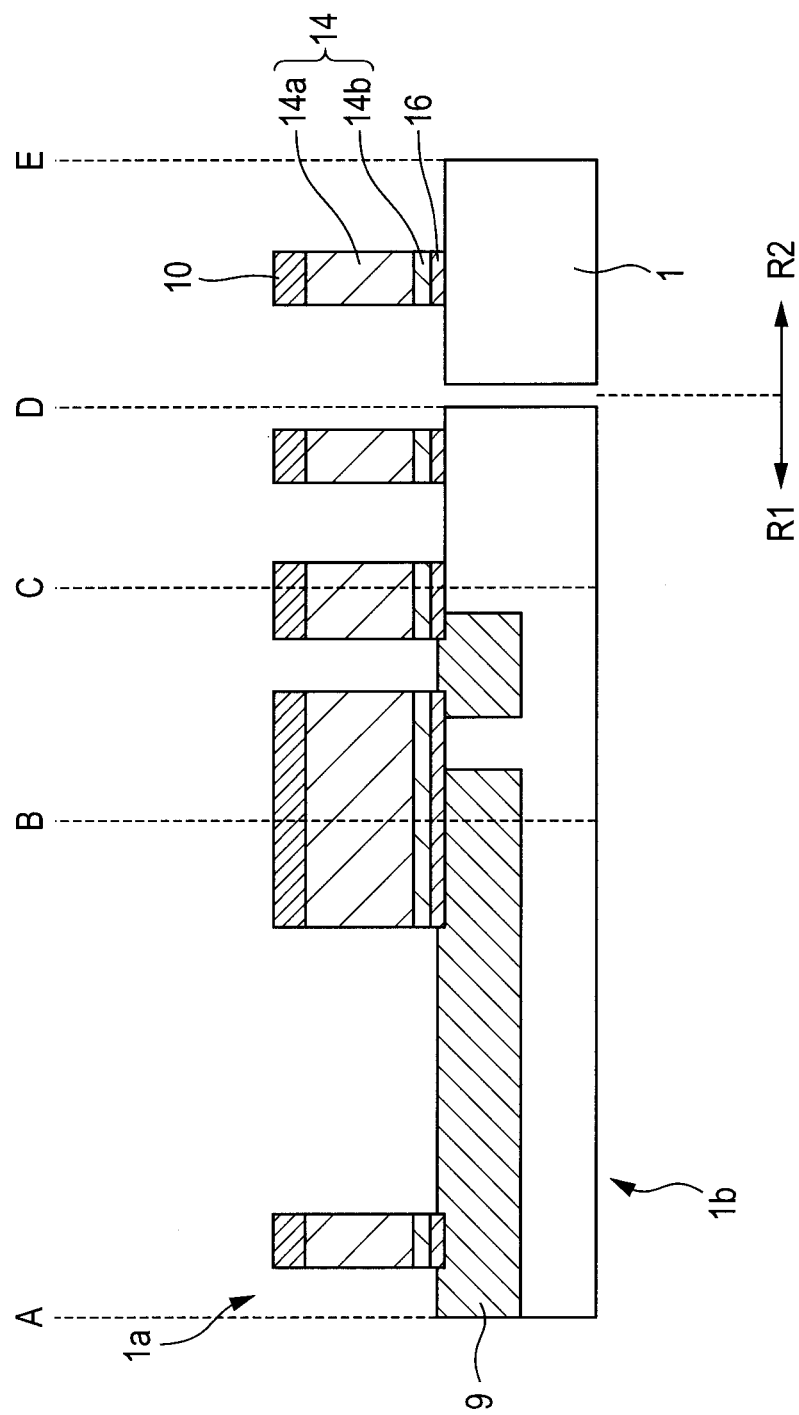
FIG. 41 is a device cross-sectional view (at the completion of the patterning of the gate electrodes) corresponding to the A-B-C-D-E cross section of FIG. 34, which is for illustrating the details of the gate patterning process in the manufacturing method of the semiconductor integrated circuit device of the above embodiment of the second part of the present invention.

FIG. 34 is a top view (at the completion of patterning of an upper-layer resist film for the line & space patterning of gate electrodes) of a cut-away portion R1 from a memory region and a cut-away portion R2 from a non-memory region of FIG. 33, which is for illustrating the outline of a gate patterning process in the manufacturing method of the semiconductor integrated circuit device of the above embodiment of the present invention. FIG. 35 is a device cross-sectional view (at the completion of patterning of the upper-layer resist film for the line & space patterning of the gate electrodes) corresponding to the A-B-C-D-E cross section of FIG. 34, which is for illustrating the details of the gate patterning process in the manufacturing method of the semiconductor integrated circuit device of the above embodiment of the present invention. FIG. 36 is a top view (at the completion of line & space etching of a hard mask for gate electrode patterning) of the cut-away portion R1 from the memory region and the cut-away portion R2 from the non-memory region of FIG. 33, which is for illustrating the outline of the gate patterning process in the manufacturing method of the semiconductor integrated circuit device of the above embodiment of the present invention. FIG. 37 is a device cross-sectional view (at the completion of the line & space etching of the hard mask for gate electrode patterning) corresponding to the A-B-C-D-E cross section of FIG. 34, which is for illustrating the details of the gate patterning process in the manufacturing method of the semiconductor integrated circuit device of the above embodiment of the present invention. FIG. 38 is a top view (at the completion of patterning of an upper-layer resist film for the patterning of cut regions between adjacent gate electrodes) of the cut-away portion R1 from the memory region and the cut-away portion R2 from the non-memory region of FIG. 33, which is for illustrating the outline of the gate patterning process in the manufacturing method of the semiconductor integrated circuit device of the above embodiment of the present invention. FIG. 39 is a device cross-sectional view (at the completion of patterning of the upper-layer resist film for the patterning of the cut regions between adjacent gate electrodes) corresponding to the A-B-C-D-E cross section of FIG. 34, which is for illustrating the details of the gate patterning process in the manufacturing method of the semiconductor integrated circuit device of the above embodiment of the present invention. FIG. 40 is a top view (at the completion of the patterning of the gate electrodes) of the cut-away portion R1 from the memory region and the cut-away portion R2 from the non-memory region of FIG. 33, which is for illustrating the outline of the gate patterning process in the manufacturing method of the semiconductor integrated circuit device of the above embodiment of the present invention. FIG. 41 is a device cross-sectional view (at the completion of the patterning of the gate electrodes) corresponding to the A-B-C-D-E cross section of FIG. 34, which is for illustrating the details of the gate patterning process in the manufacturing method of the semiconductor integrated circuit device of the above embodiment of the present invention. Based on these drawings, a description will be given to the outline of the gate patterning process in the manufacturing method of the semiconductor integrated circuit device of the above embodiment of the present invention.

First, the wafer 1 prior to processing of the gate electrode film is provided (see FIGS. 34 and 35). This is performed, for example, as follows. For example, the P-type single-crystal silicon wafer 1 is provided and, in the device main surface 1a (main surface opposite to a back surface 1b), isolation regions 9 such as, e.g., STI (Shallow Trench Isolation) are formed. Subsequently, in active regions 8, required impurity doped regions such as well regions are formed.

Further, over substantially the entire device main surface 1a (first main surface) of the wafer 1, a High-k gate insulating film 16 (gate insulating film including a High-k gate insulating film) is deposited. Here, the "High-k gate insulating film" indicates a gate insulating film having a dielectric constant higher than that of a related-art gate insulating film (a silicon oxide film, a silicon oxynitride film, a silicon nitride film, or a laminate film thereof) including a silicon oxide film as a main film component).

Next, over substantially the entire upper surface of the High-k gate insulating film 16, a lower-layer film 14b of a gate electrode film 14, such as, e.g., a titanium nitride film, is deposited.

Next, over substantially the entire upper surface of the titanium nitride film 14b, e.g., a polysilicon film 14a (which may also be an amorphous silicon film) as an upper-layer film of the gate electrode film 14 is deposited.

Next, over substantially the entire upper surface of the polysilicon film 14a, a hard mask film 10 for gate processing (e.g., silicon nitride film) is deposited by, e.g., CVD (Chemical Vapor Deposition).

Next, over substantially the entire upper surface of the silicon nitride film 10, a resist film 15 (a second resist film or a resist film for gate electrode line & space patterning) for gate electrode patterning is formed by coating or the like. The resist film 15 for gate electrode patterning includes a carbon-based non-photosensitive lower-layer film 15c (lower-layer film) such as a SOC (Spin On Carbon) film, a silicon-based non-photosensitive middle-layer film 15b (middle-layer film) such as a Si-BARC (Silicon-Bottom Anti-Reflection Coating) film, an organic photosensitive upper-layer film 15a (upper-layer film) such as an ArF chemically amplified resist film, and the like. The Si-BARC film is a coated or CVD deposited antireflection film containing silicon as one of main components (the content of silicon is in a range of, e.g., about 15 wt % to 45 wt %, which is also the same in the foregoing second resist film). The SOC film is a coated or CVD deposited (a CVD deposited carbon-based film is called an amorphous carbon film) underlying film (film having an etching selectivity to a silicon-based member) containing carbon as one of main components (the content of carbon is in a range of, e.g., about 80 wt % to 90 wt %, which is also the same as in the foregoing second resist film).

Next, as shown in FIGS. 34 and 35, exposure to light and development of the ArF chemically amplified resist film 15a are performed to form a resist film pattern 15a corresponding to the line & space pattern of the gate electrodes. The exposure using ArF excimer laser light (at a wavelength of 193 nm) is performed using, e.g., an optical mask and an immersion projection lithography stepper (immersion scanner). Here, the width of the resist film pattern 15a corresponding to the line & space pattern of the gate electrodes is, e.g., about 45 nm at the beginning of patterning, which is reduced to, e.g., about 30 nm by a trimming treatment described below. Note that the carbon-based lower-layer film in this step is preferably a coated planar film such as a SOC film.

Subsequently, the pattern of the ArF chemically amplified resist film 15a (upper-layer film) of the multilayer resist film 15 is successively transferred onto the Si-BARC film 15b (middle-layer film) and the SOC film 15c (lower-layer film) (the details of which will be described in Section 3).

Next, as shown in FIGS. 36 and 37, by dry etching using the patterned multilayer resist film 15 (second resist film) for gate electrode patterning as a mask, the hard mask film 10 (silicon nitride film) for gate processing is patterned by dry etching. Thereafter, the remaining resist film 15 for gate electrode patterning is removed by ashing or the like.

Next, as shown in FIGS. 38 and 39, in the same manner as described above, a resist film 11 (first resist film) for the patterning of the cut regions between adjacent gate electrodes is formed over substantially the entire device surface 1a of the wafer 1 by, e.g., coating or the like. In the same manner as described above, the multilayer resist film 11 includes a carbon-based non-photosensitive lower-layer film 11c (lower-layer film) such as a SOC (Spin On Carbon) film, a silicon-based non-photosensitive middle-layer film 11b (middle-layer film) such as a Si-BARC (Silicon-Bottom Anti-Reflection Coating) film, an organic photosensitive upper-layer film 11a (upper-layer film) such as an ArF chemically amplified resist film, and the like.

Next, exposure to light and development of the ArF chemically amplified resist film 11a are performed to form resist film openings 12 corresponding to the cut regions between adjacent gate electrodes. The exposure using ArF excimer laser light (at a wavelength of 193 nm) is performed using, e.g., an optical mask and an immersion projection lithography stepper (immersion scanner). Here, the width (equivalent to the length of a shorter side) of each of the resist film openings 12 is, e.g., about 60 to 70 nm and on the same order as the width of each of the isolation regions, which is reduced to, e.g., about 20 to 25 nm by a shrinkage treatment described later.

Subsequently, the pattern of the ArF chemically amplified resist film 11a (upper-layer film) of the multilayer resist film 11 is successively transferred onto the Si-BARC film 11b (middle-layer film) and the SOC film 11c (lower-layer film) (the details of which will be described in Section 3). Thereafter, the remaining resist film 11 for gate electrode patterning is removed by ashing or the like.

Next, as shown in FIGS. 40 and 41, by dry etching using the patterned hard mask 10 (silicon nitride film) for gate processing as a mask, the gate electrode film 14 (including the polysilicon film 14a and the titanium nitride film 14b) and the High-k gate insulating film 16 are processed to form the gate electrodes 14.

3. Detailed Description of Gate Patterning Process in Manufacturing Method of Semiconductor Integrated Circuit Device of Above Embodiment of Present Invention (See Mainly FIGS. 42 to 45 and FIGS. 46 to 53)

Figure 42:
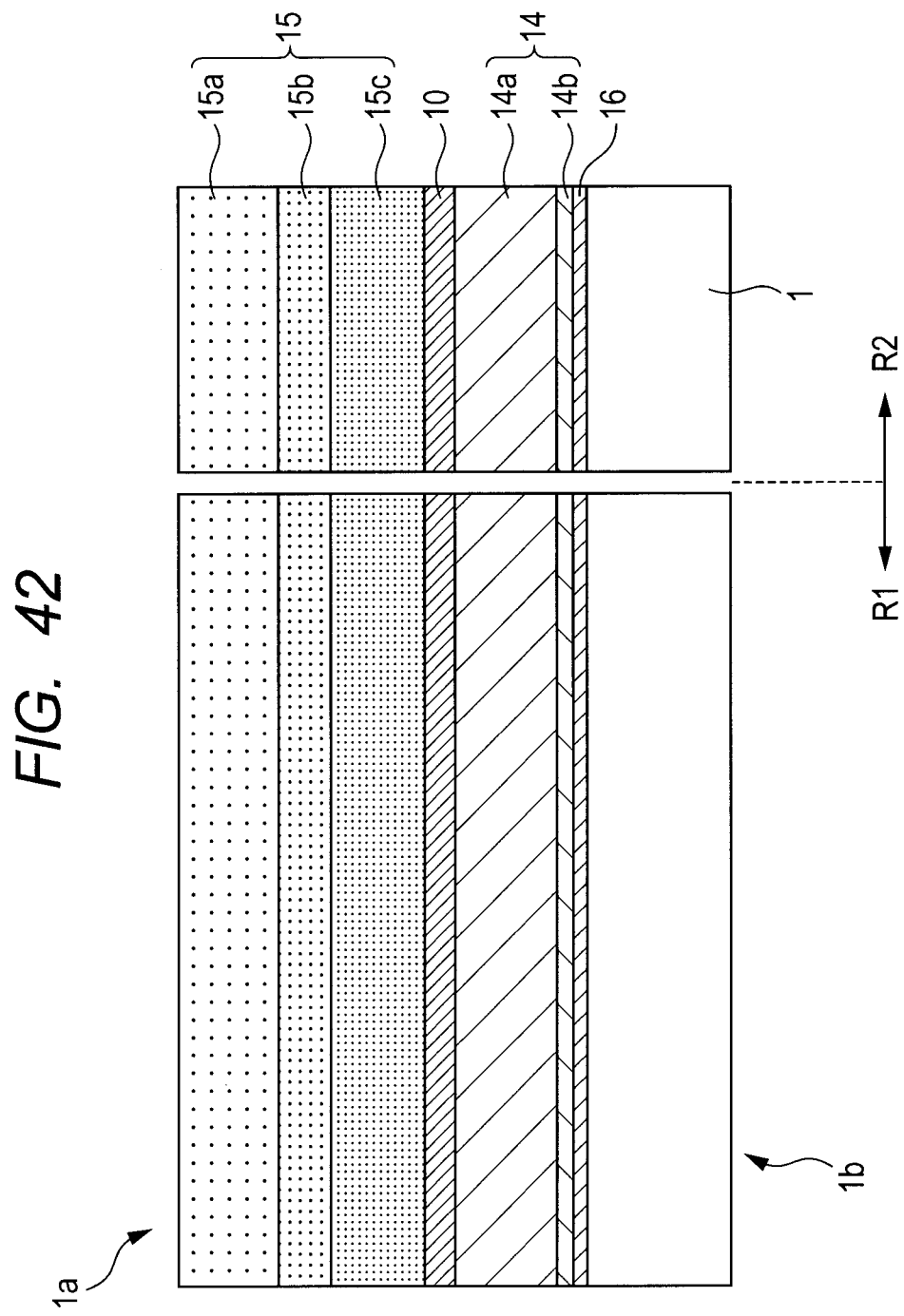
FIG. 42 is a device cross-sectional view (at the completion of formation of a multilayer resist film for the line & space patterning of the gate electrodes) along an X-X' cross section and a D-E cross section each corresponding to a process flow from FIG. 34 to FIG. 41, which is for illustrating a detailed step of the gate patterning process in the manufacturing method of the semiconductor integrated circuit device of the above embodiment of the second part of the present invention.
Figure 43:
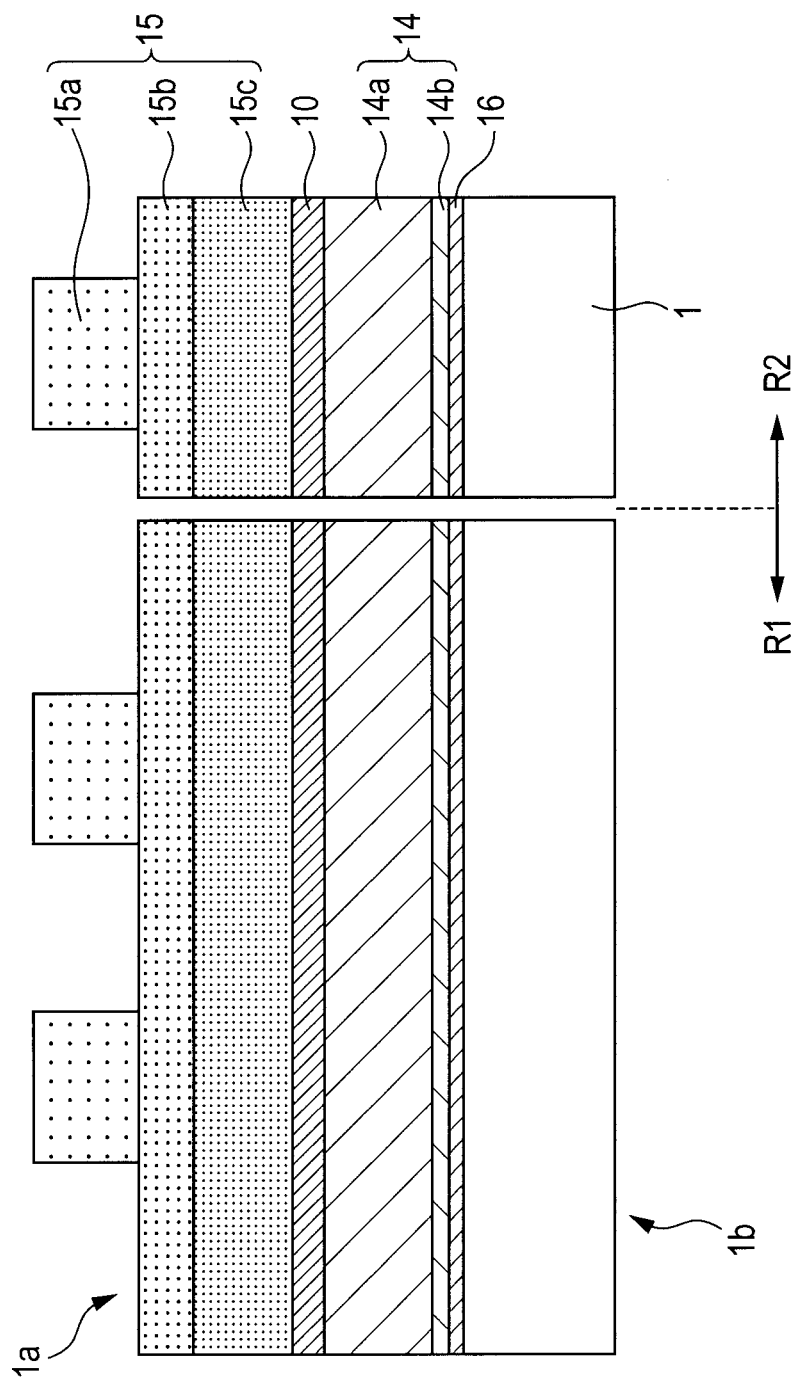
FIG. 43 is a device cross-sectional view (at the completion of patterning of the upper-layer resist film for the line & space patterning of the gate electrodes) along the X-X' cross section and the D-E cross section each corresponding to the process flow from FIG. 34 to FIG. 41, which is for illustrating a detailed step of the gate patterning process in the manufacturing method of the semiconductor integrated circuit device of the above embodiment of the second part of the present invention.
Figure 44:
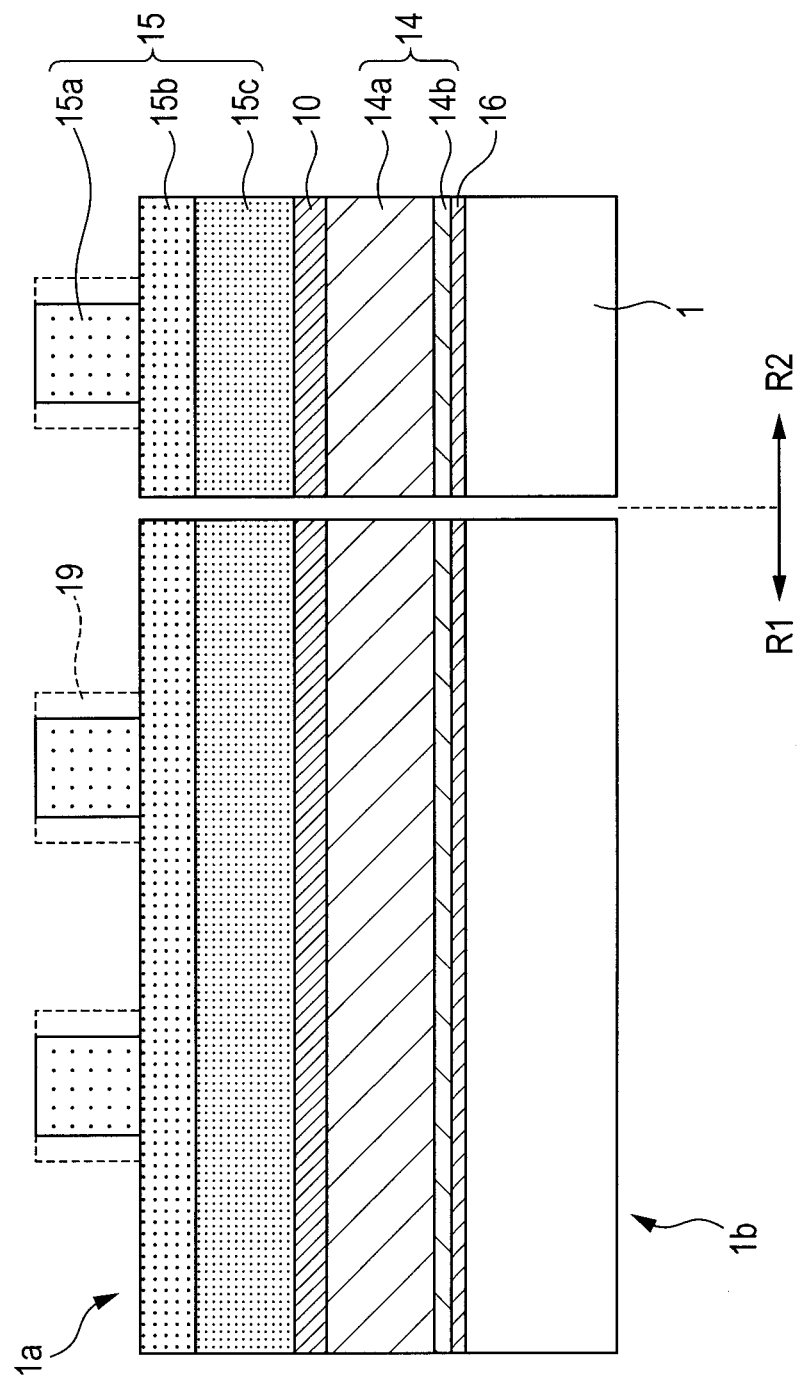
FIG. 44 is a device cross-sectional view (at the completion of trimming of the upper-layer resist film for the line & space patterning of the gate electrodes) along the X-X' cross section and the D-E cross section each corresponding to the process flow from FIG. 34 to FIG. 41, which is for illustrating a detailed step of the gate patterning process in the manufacturing method of the semiconductor integrated circuit device of the above embodiment of the second part of the present invention.
Figure 45:
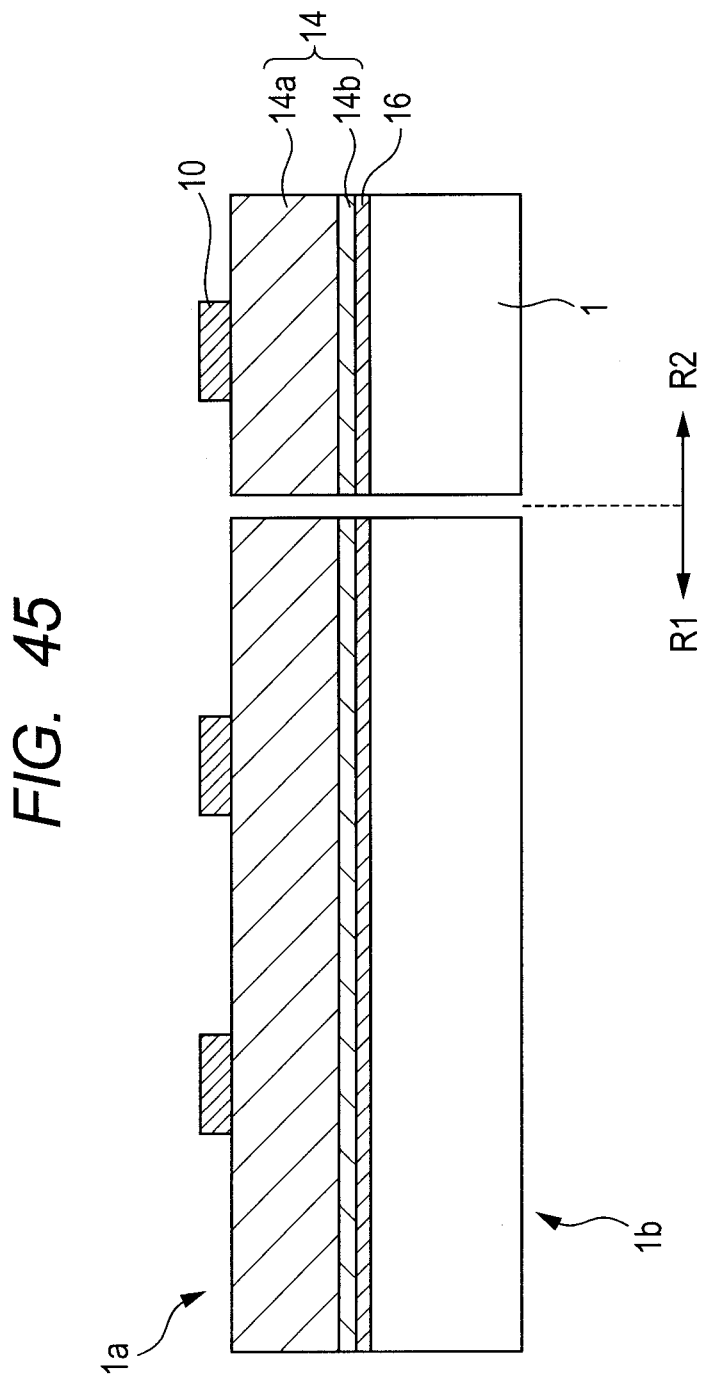
FIG. 45 is a device cross-sectional view (at the completion of line & space patterning of a hard mask for gate electrode patterning) along the X-X' cross section and the D-E cross section each corresponding to the process flow from FIG. 34 to FIG. 41, which is for illustrating a detailed step of the gate patterning process in the manufacturing method of the semiconductor integrated circuit device of the above embodiment of the second part of the present invention.
Figure 46:
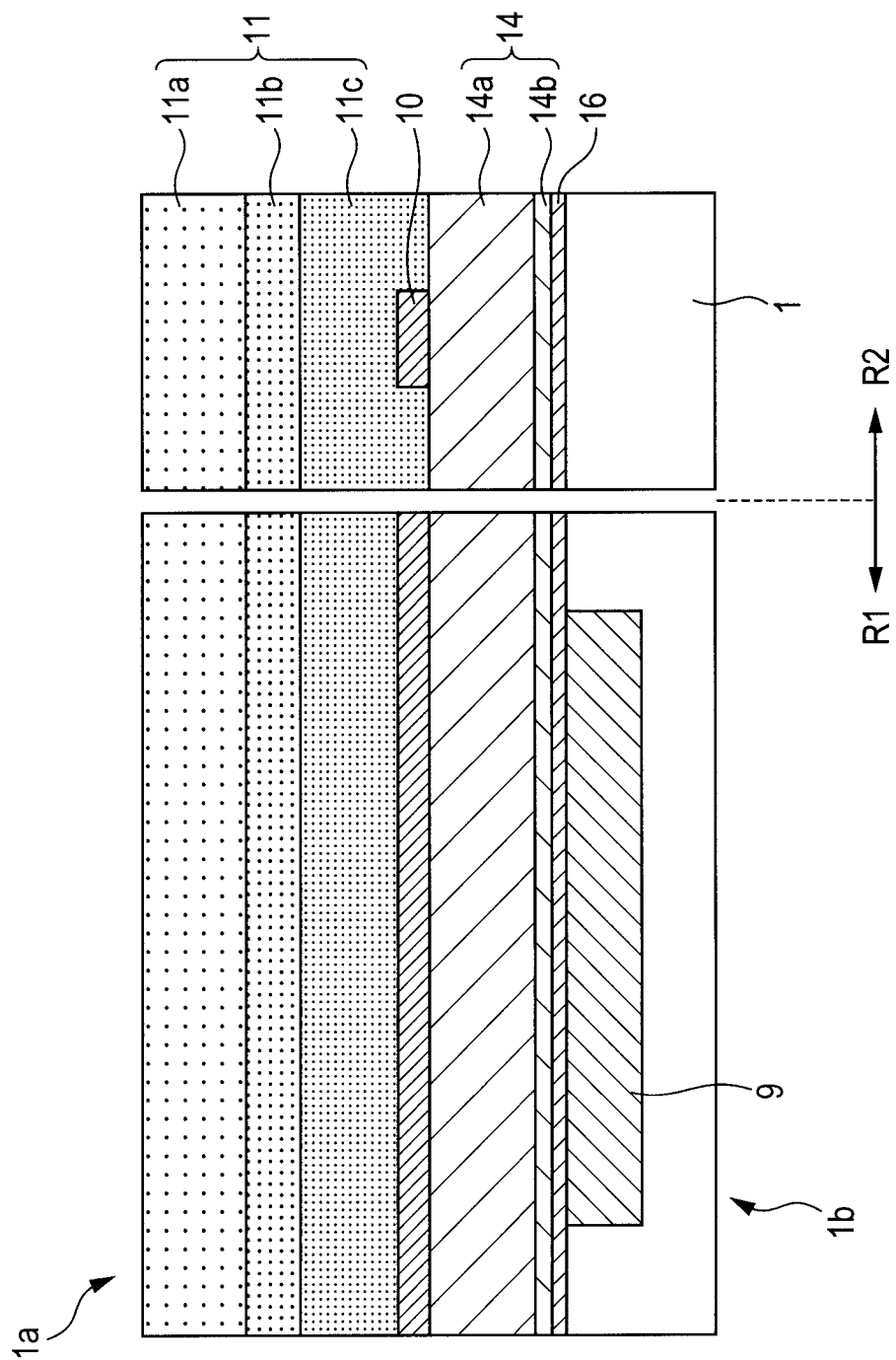
FIG. 46 is a device cross-sectional view (at the completion of formation of a multilayer resist film for the patterning of the cut regions between adjacent gate electrodes) along a y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the second part of the present invention.
Figure 47:
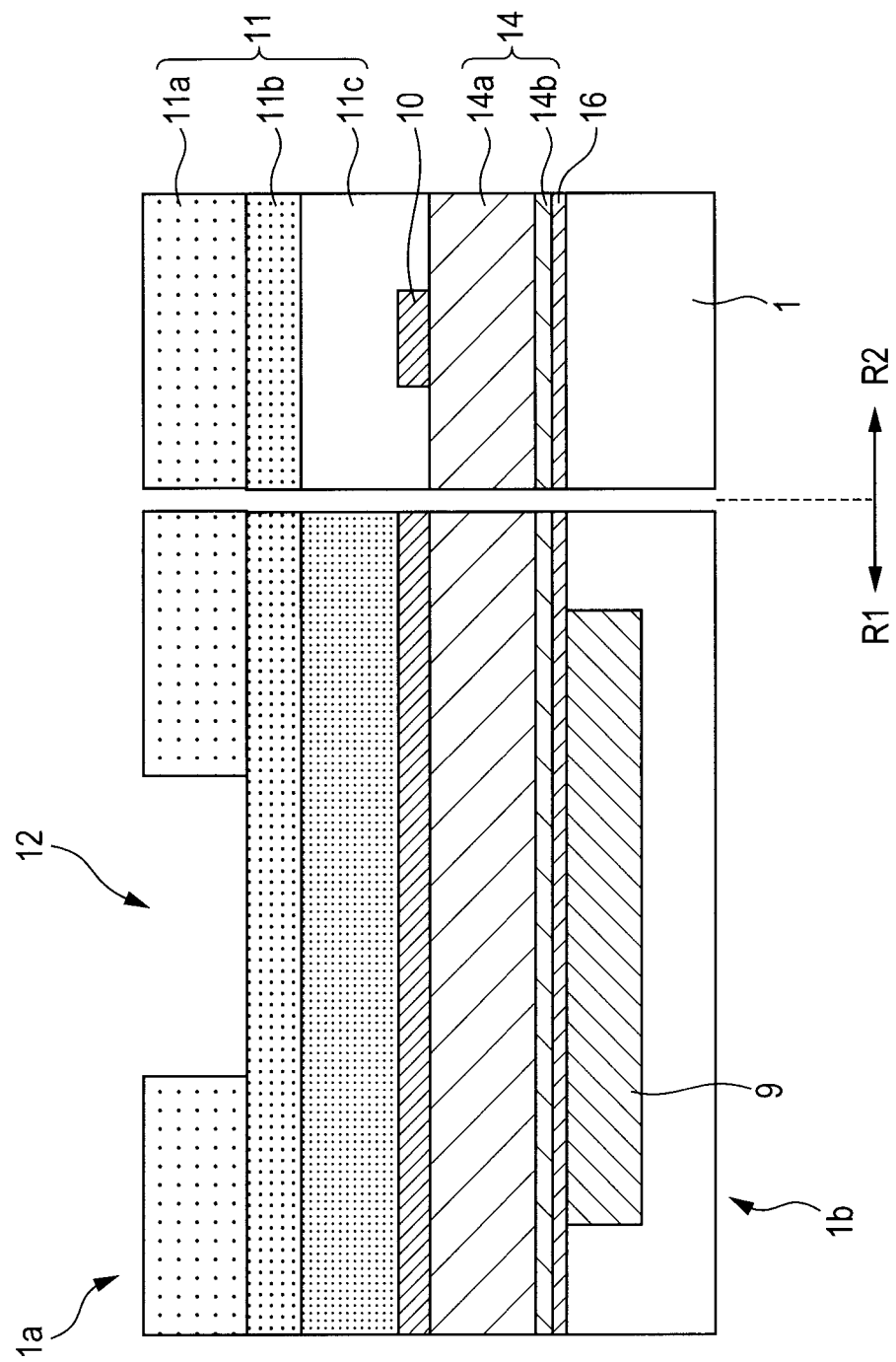
FIG. 47 is a device cross-sectional view (at the completion of patterning of the upper-layer resist film for the patterning of the cut regions between adjacent gate electrodes) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the second part of the present invention.
Figure 48:
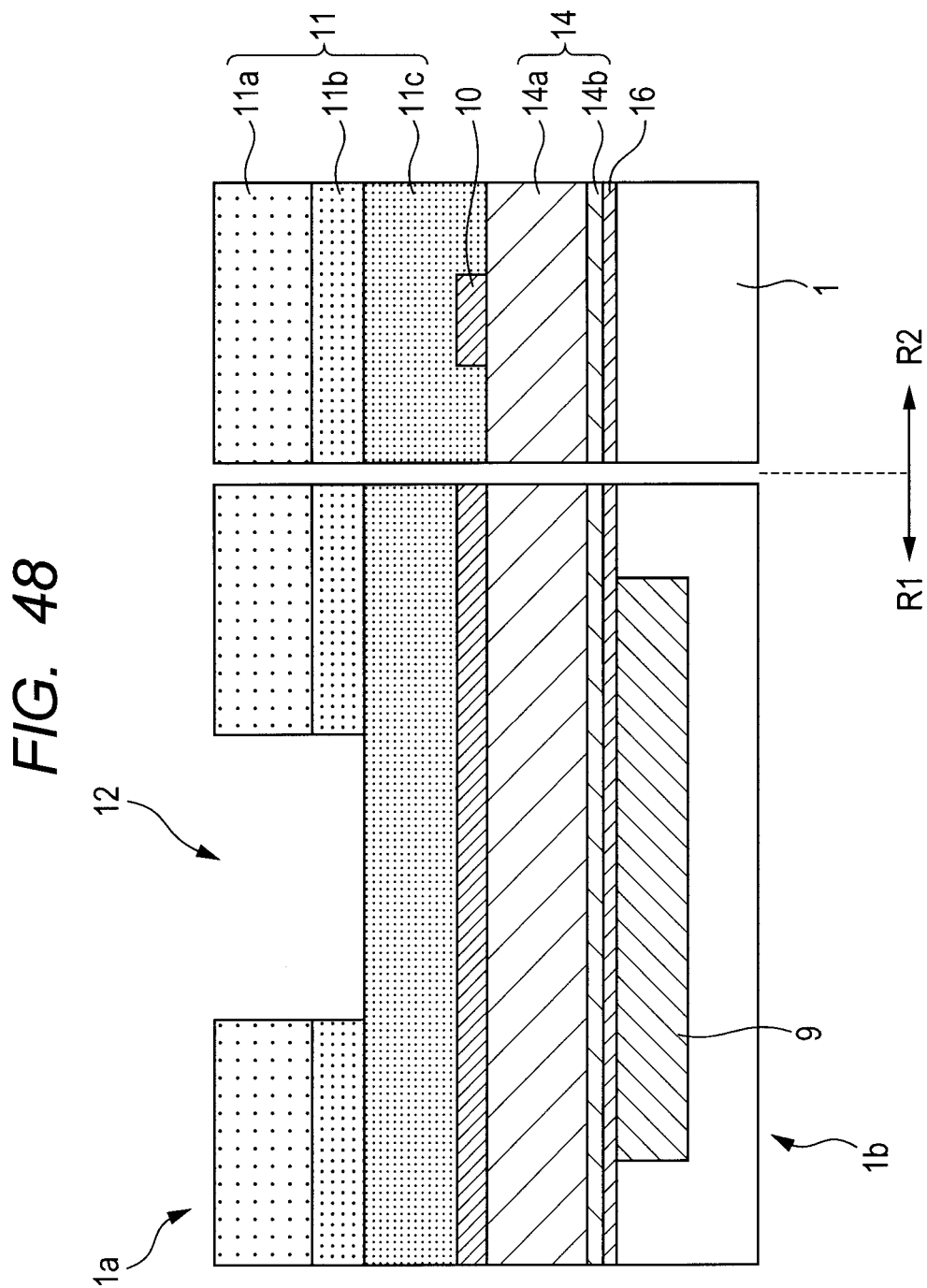
FIG. 48 is a device cross-sectional view (at the completion of patterning of a middle-layer resist film for the patterning of the cut regions between adjacent gate electrodes) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the second part of the present invention.
Figure 49:
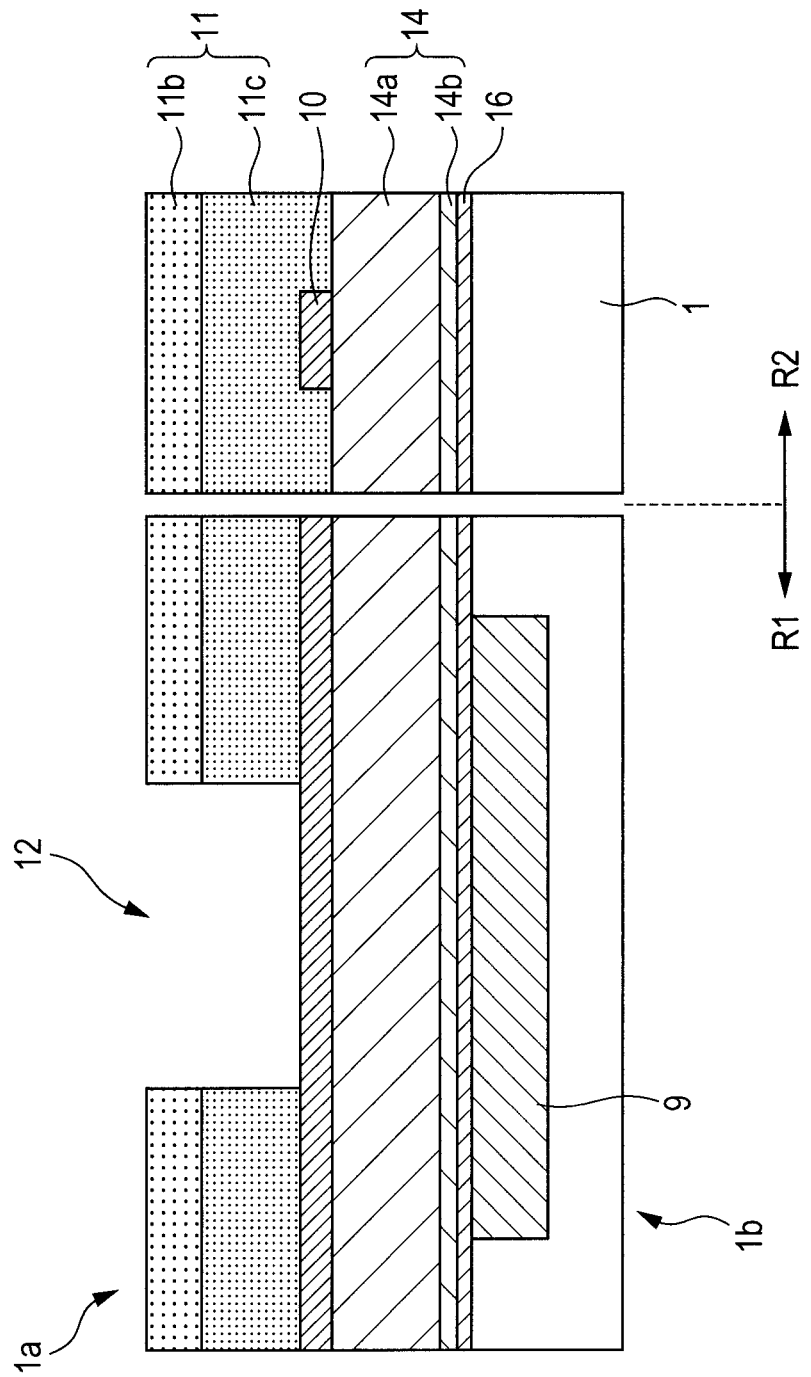
FIG. 49 is a device cross-sectional view (at the completion of patterning of a lower-layer resist film for the patterning of the cut regions between adjacent gate electrodes) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the second part of the present invention.
Figure 50:
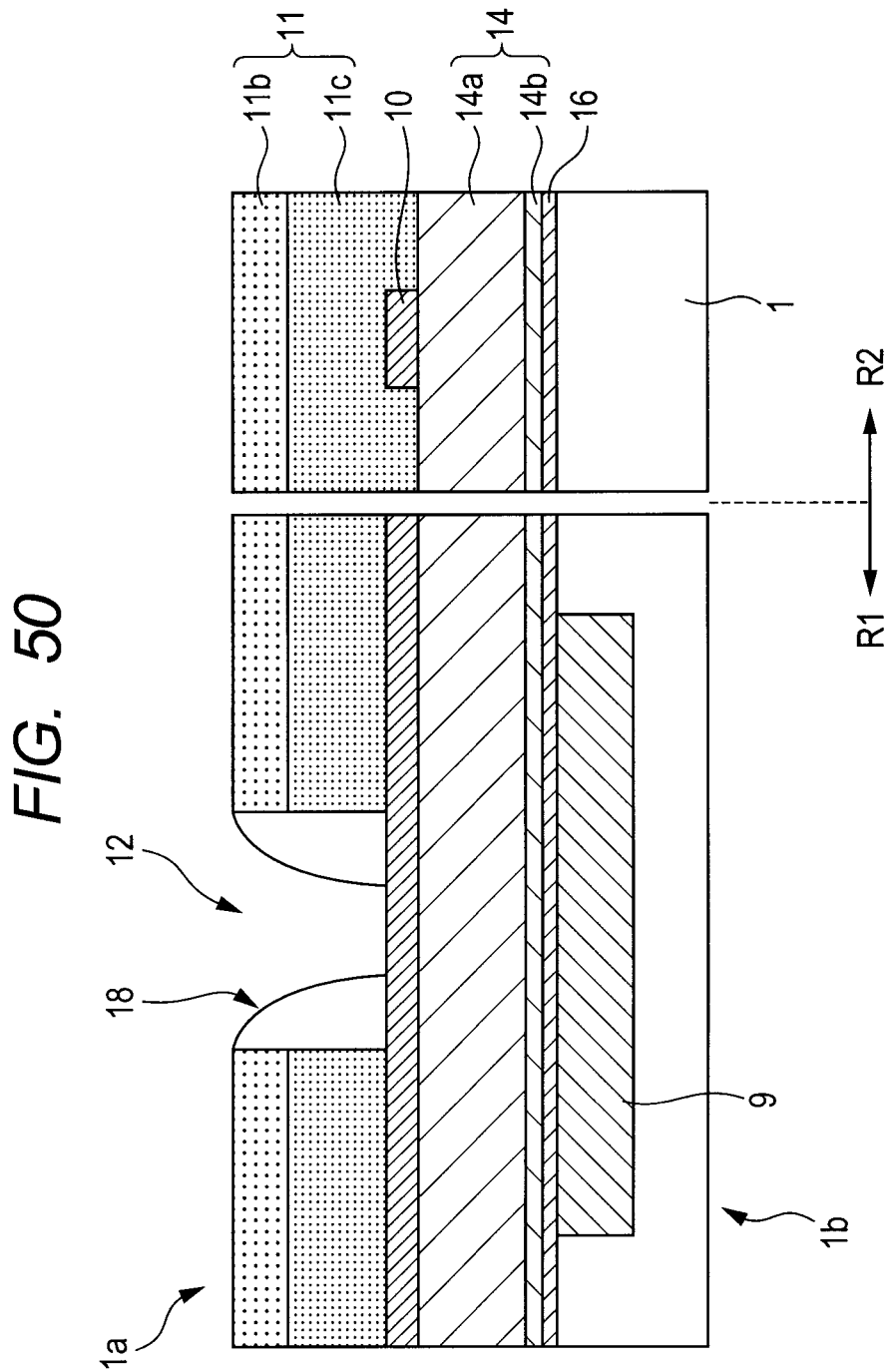
FIG. 50 is a device cross-sectional view (at the completion of shrinkage of an opening in the multilayer resist film for the patterning of the cut regions between adjacent gate electrodes) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the second part of the present invention.
Figure 51:
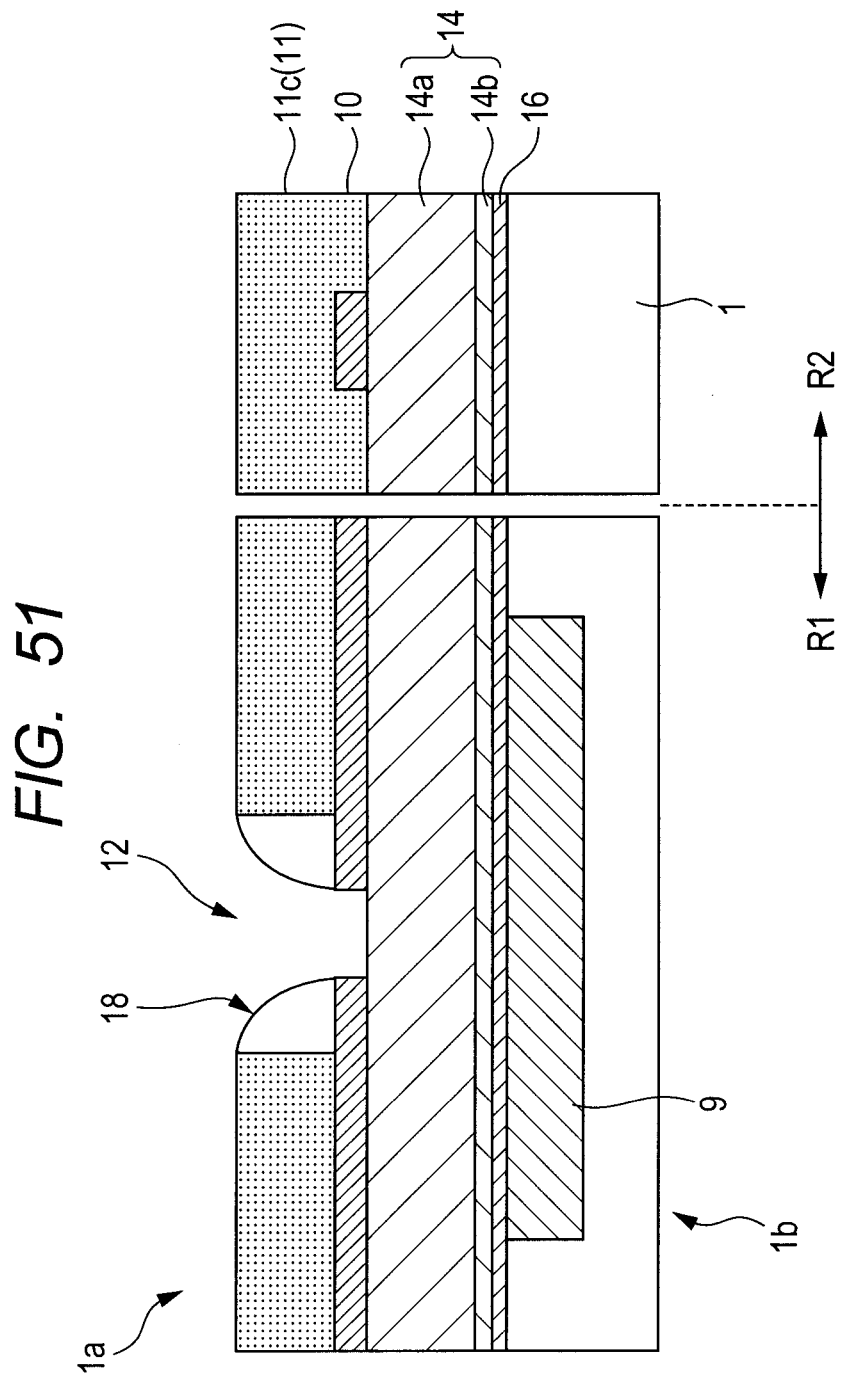
FIG. 51 is a device cross-sectional view (at the completion of patterning of a hard mask into the pattern of the cut regions between adjacent gate electrodes) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the second part of the present invention.
Figure 52:
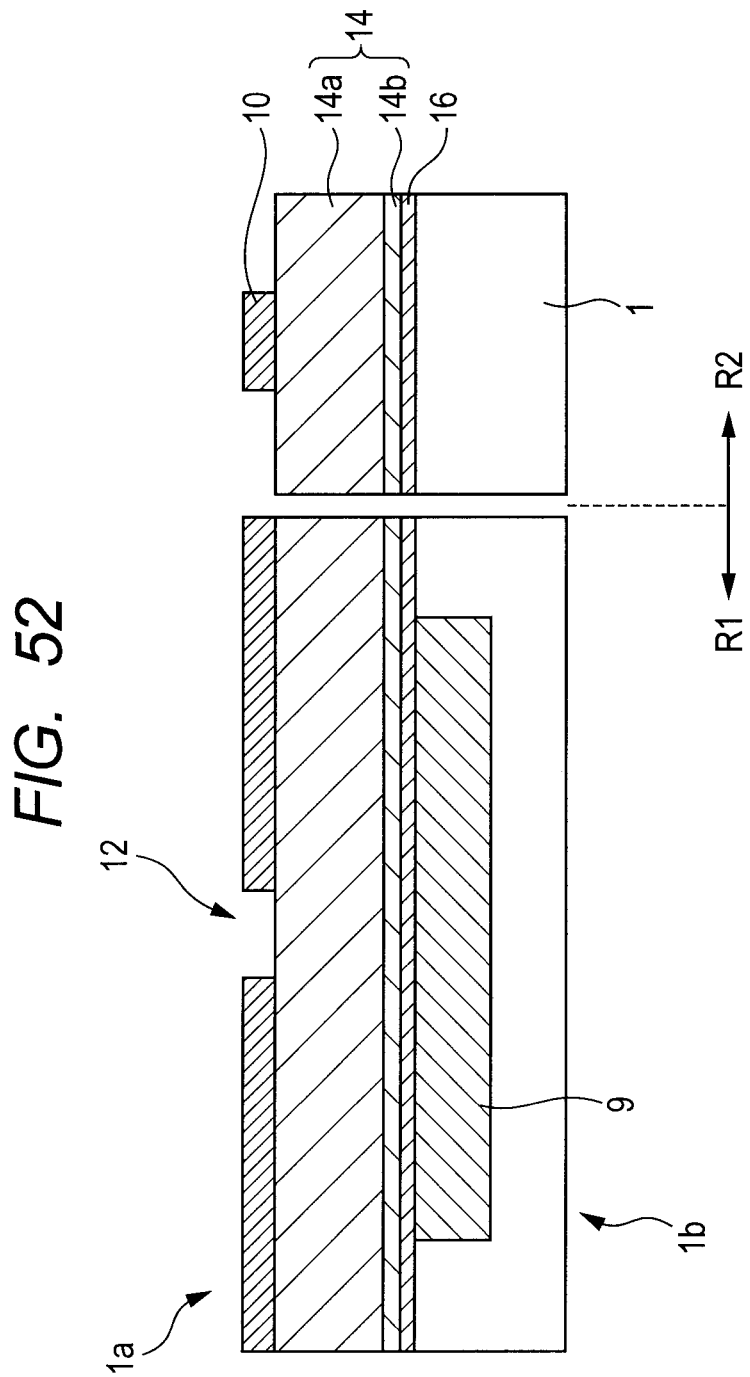
FIG. 52 is a device cross-sectional view (at the completion of removal of the multilayer resist film for the patterning of the cut regions between adjacent gate electrodes) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the second part of the present invention.
Figure 53:
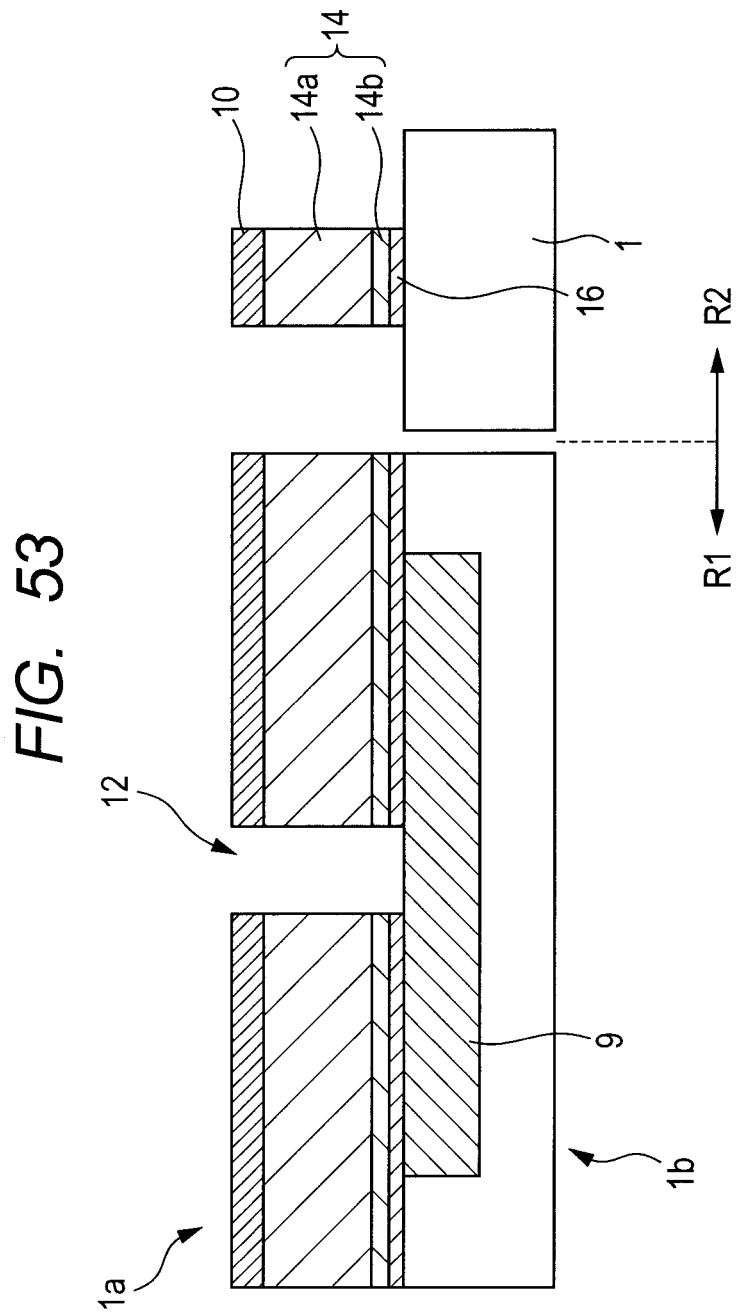
FIG. 53 is a device cross-sectional view (at the completion of etching of a gate electrode film and the like) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the second part of the present invention.

FIG. 42 is a device cross-sectional view (at the completion of formation of a multilayer resist film for the line & space patterning of the gate electrodes) along an X-X' cross section and a D-E cross section each corresponding to a process flow from FIG. 34 to FIG. 41, which is for illustrating a detailed step of the gate patterning process in the manufacturing method of the semiconductor integrated circuit device of the above embodiment of the present invention. FIG. 43 is a device cross-sectional view (at the completion of patterning of the upper-layer resist film for the line & space patterning of the gate electrodes) along the X-X' cross section and the D-E cross section each corresponding to the process flow from FIG. 34 to FIG. 41, which is for illustrating a detailed step of the gate patterning process in the manufacturing method of the semiconductor integrated circuit device of the above embodiment of the present invention. FIG. 44 is a device cross-sectional view (at the completion of trimming of the upper-layer resist film for the line & space patterning of the gate electrodes) along the X-X' cross section and the D-E cross section each corresponding to the process flow from FIG. 34 to FIG. 41, which is for illustrating a detailed step of the gate patterning process in the manufacturing method of the semiconductor integrated circuit device of the above embodiment of the present invention. FIG. 45 is a device cross-sectional view (at the completion of line & space patterning of a hard mask for gate electrode patterning) along the X-X' cross section and the D-E cross section each corresponding to the process flow from FIG. 34 to FIG. 41, which is for illustrating a detailed step of the gate patterning process in the manufacturing method of the semiconductor integrated circuit device of the above embodiment of the present invention. FIG. 46 is a device cross-sectional view (at the completion of formation of a multilayer resist film for the patterning of the cut regions between adjacent gate electrodes) along a y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the present invention. FIG. 47 is a device cross-sectional view (at the completion of patterning of the upper-layer resist film for the patterning of the cut regions between adjacent gate electrodes) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the present invention. FIG. 48 is a device cross-sectional view (at the completion of patterning of a middle-layer resist film for the patterning of the cut regions between adjacent gate electrodes) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the present invention. FIG. 49 is a device cross-sectional view (at the completion of patterning of a lower-layer resist film for the patterning of the cut regions between adjacent gate electrodes) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the present invention. FIG. 50 is a device cross-sectional view (at the completion of shrinkage of an opening in the multilayer resist film for the patterning of the cut regions between adjacent gate electrodes) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the present invention. FIG. 51 is a device cross-sectional view (at the completion of patterning of a hard mask into the pattern of the cut regions between adjacent gate electrodes) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the present invention. FIG. 52 is a device cross-sectional view (at the completion of removal of the multilayer resist film for the patterning of the cut regions between adjacent gate electrodes) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the present invention. FIG. 53 is a device cross-sectional view (at the completion of etching of a gate electrode film and the like) along the y-y' cross section and the D-E cross section each corresponding to the process flow from FIG. 34 to FIG. 41, which is for illustrating a detailed step of the gate patterning process in the manufacturing method of the semiconductor integrated circuit device of the above embodiment of the present invention. Based on these drawings, a description will be given to the details of the gate patterning process in the manufacturing method of the semiconductor integrated circuit device of the above embodiment of the present invention.

As shown in FIG. 42, e.g., the P-type single-crystal silicon wafer 1 is provided and, in the device main surface 1*a*, the isolation regions 9 such as, e.g., STI are formed. Subsequently, in the active regions 8, required impurity doped regions such as well regions are formed.

Further, over substantially the entire device main surface 1*a* (first main surface) of the wafer 1, a High-k gate insulating film 16 (gate insulating film including a High-k gate insulating film) is deposited. As an example of the High-k gate insulating film 16, a hafnium-oxide-based insulating film having a thickness of, e.g., about 0.7 to 1.5 nm can be shown.

Next, over substantially the entire upper surface of the High-k gate insulating film 16, the lower-layer film 14*b* of the gate electrode film, such as, e.g., a titanium nitride film (having a thickness of, e.g., about 10 nm) is deposited.

Next, as the upper-layer film of the gate electrode film 14, the polysilicon film 14*a* (which may also be, e.g., an amorphous silicon film) having a thickness of, e.g., about 50 nm is deposited over substantially the entire upper surface of the titanium nitride film 14*b*.

Next, over substantially the entire upper surface of the polysilicon film 14*a*, as the hard mask 10 for gate processing, a silicon nitride film (having a thickness of, e.g., about 50 nm) is deposited by, e.g., CVD.

Next, over substantially the entire device main surface 1*a* (first main surface) of the wafer 1, the multilayer resist film 15 (second resist film) for gate electrode patterning is formed by coating or the like. For example, the multi-layer resist film 15 is formed as follows. That is, over substantially the entire device surface 1*a* of the wafer 1, the carbon-based non-photosensitive lower-layer film 15*c* (lower-layer film) such as a SOC film (having a thickness of, e.g., about 100 to 300 nm) is formed first by coating or the like. Subsequently, over substantially the entire upper surface of the SOC film 15*c*, the silicon-based non-photosensitive middle-layer film 15*b* (middle-layer film) such as, e.g., a Si-BARC film (having a thickness of, e.g., about 10 to 100 nm) is formed by coating or the like. Subsequently, over substantially the entire upper surface of the Si-BARC film 15*b*, the organic photosensitive upper-layer film 15*a* (upper-layer film) such as, e.g., an ArF chemically amplified resist film (having a thickness of, e.g., about 50 to 180 nm) is formed by coating or the like.

Next, as shown in FIG. 43, exposure to light and development of the ArF chemically amplified resist film 15*a* are performed to form the resist film pattern 15*a* corresponding to the line & space pattern of the gate electrodes. The exposure using ArF excimer laser light (at a wavelength of 193 nm) is performed using, e.g., an optical mask and an immersion projection lithography stepper (immersion scanner).

Next, as shown in FIG. 44, the patterned resist film pattern 15*a* is subjected to a Trimming treatment such that the final resist film pattern 15*a* has a width smaller than the width 19 of the original resist film. The trimming treatment is the same treatment as dry etching, and is normally performed in the same apparatus or the same chamber as used in a subsequent etching process. Examples of an atmospheric gas for the trimming treatment that can be shown include, e.g., a $Cl_2/O_2$-based gas.

Subsequently, in the same manner as described above, the trimmed resist film pattern 15*a* is transferred successively to the Si-BARC film 15*a* (an etching atmosphere is, e.g., a $CF_4$-based gas atmosphere) and the SOC film 15*c* (an etching atmosphere is, e.g., an $O_2$-based gas atmosphere).

Next, as shown in FIG. 45, by dry etching using the patterned SOC film 15*c* as a mask, the hard mask film 10 (silicon nitride film) for gate processing is patterned. Thereafter, the remaining resist film 15 for gate electrode patterning is removed by ashing or the like.

Next, as shown in FIG. 46, over substantially the entire upper surface of the titanium nitride film 14*b*, the multilayer resist film 11 (first resist film) for the patterning of the cut regions between adjacent gate electrodes is formed by coating or the like. For example, the multi-layer resist film is formed as follows. That is, over substantially the entire upper surface of the polysilicon film 14*a*, the carbon-based non-photosensitive lower-layer film 11*c* (lower-layer film) such as a SOC film (having a thickness of, e.g., about 100 to 300 nm) is formed first by coating or the like. Note that the carbon-based non-photosensitive lower-layer film 11*c* may also be an amorphous carbon film formed by CVD (Chemical Vapor Deposition) or the like. Subsequently, over substantially the entire upper surface of the SOC film 11*c*, the silicon-based non-photosensitive middle-layer film 11*b* (middle-layer film) such as, e.g., a Si-BARC film (having a thickness of, e.g., about 10 to 100 nm) is formed by coating or the like. Subsequently, over substantially the entire upper surface of the Si-BARC film 11*b*, the organic photosensitive upper-layer film 11*a* (upper-layer film) such as, e.g., an ArF chemically amplified resist film (having a thickness of, e.g., about 50 to 180 nm) is formed by coating or the like.

Next, as shown in FIG. 47, exposure to light and development of the ArF chemically amplified resist film 11*a* are performed to form each of the resist film openings 12 corresponding to the cut regions between adjacent gate electrodes. The exposure using ArF excimer laser light (at a wavelength of 193 nm) is performed using, e.g., an optical mask and an immersion projection lithography stepper (immersion scanner).

Next, as shown in FIG. 48, using the patterned ArF chemically amplified resist film 11*a* as a mask, the pattern of the ArF chemically amplified resist film 11*a* is transferred onto the Si-BARC film 11*b* by dry etching using a Fluorocarbon-based gas (such as, e.g., $CF_4$).

Next, as shown in FIG. 49, using the patterned Si-BARC film 11*b* as a mask, the pattern of the Si-BARC film 11*b* is transferred onto the SOC film 11*c* by dry etching using, e.g., an oxygen-based gas (such as, e.g., $O_2$). At this time, the remaining ArF chemically amplified resist film 11*a* is removed simultaneously.

Next, as shown in FIG. 50, in a state where the wafer 1 has been introduced into the etching chamber of a dry etching apparatus for etching, e.g., the gate electrodes 14, a pre-etching treatment (shrinkage treatment) is performed (a kind of dry etching treatment). That is, sidewalls 18 for shrinkage are formed over the side walls of each of the resist film openings 12. Examples of conditions for the shrinkage treatment that can be shown include a gas atmosphere of, e.g., $CHF_3$ (100 to 300 sccm)/$O_2$ (10 to 50 sccm), an RF power of, e.g., about 500 to 1000 W, a wafer bias of 100 to 300 V, and a wafer stage temperature of about 10 to 50° C.

Next, as shown in FIG. 51, by dry etching (in, e.g., a $CH_4$-based or $CHF_3$-based gas atmosphere) using the patterned SOC film 11c as a mask, the hard mask film 10 for gate processing is patterned. At this time, the remaining Si-BARC film 11b is removed simultaneously.

Next, as shown in FIG. 52, the SOC film 11c and the sidewalls 18 for shrinkage are removed by an ashing treatment and wet cleaning or the like. Preferred examples of conditions for the wet cleaning that can be shown are such that: (1) in a first step, a chemical solution is a diluted hydrochloric acid having a composition in which a hydrogen chloride concentration is about 0.0418 mol %, a processing time is about 60 seconds, and a processing temperature is a room temperature (15 to 25° C.); and (2) in a second step, a chemical solution is a mixed acid having a composition in which a hydrogen chloride concentration is about 0.411 mol % and a hydrogen fluoride concentration is about 0.0106 mol %, a processing time is about 60 seconds, and a processing temperature is a room temperature (15 to 25° C.).

Figure 54:
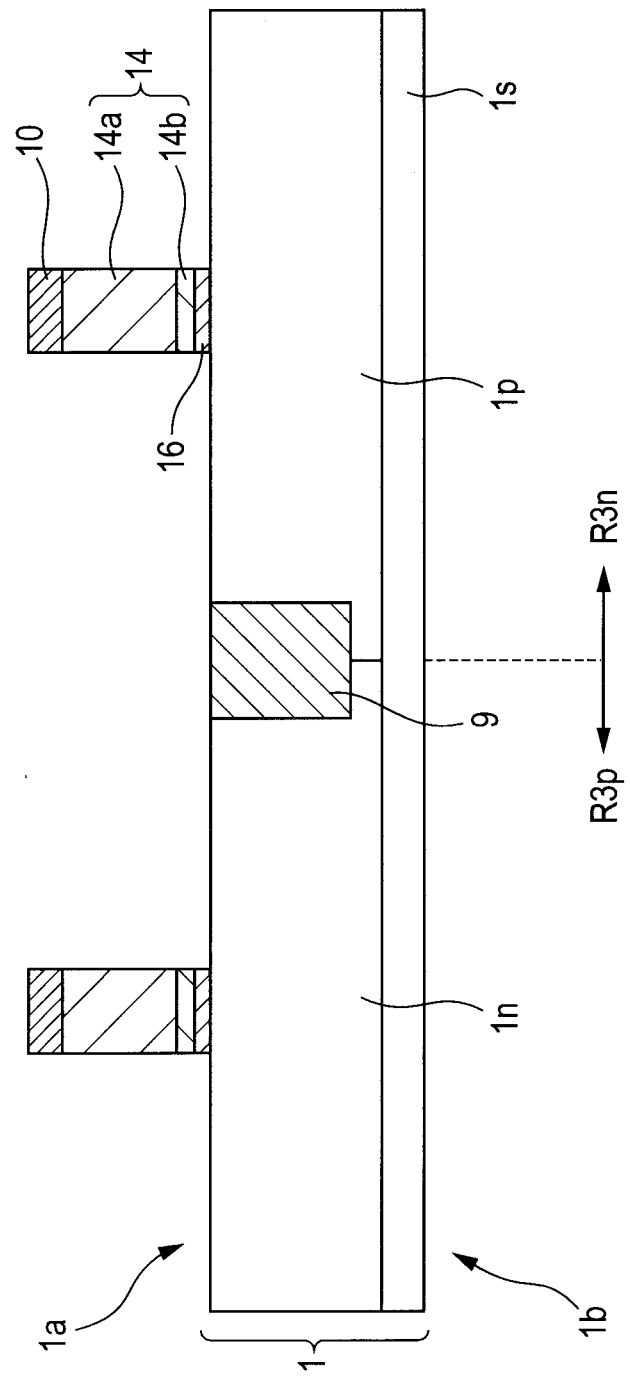
FIG. 54 is a schematic device cross-sectional view (the same as FIG. 53, i.e., at the completion of etching of the gate electrode film and the like) of a CMISFET pair cut-away portion R3 from the non-memory region of FIG. 33, which is for illustrating the outline of a main process after gate processing in the manufacturing method of the semiconductor integrated circuit device of the above embodiment of the second part of the present invention.

Next, as shown in FIG. 53, using the patterned hard mask film 10 for gate processing as a mask, the polysilicon film 14a (an etching gas is a halogen-based gas, specific examples of which include HBr), the titanium nitride film 14b (an etching gas is a halogen-based gas, specific examples of which include $Cl_2$/HBr), and the gate insulating film 16 (an etching gas is a halogen-based gas, specific examples of which include $BCl_3$/$Cl_2$) are successively subjected to dry etching to form the gate electrodes 14 (see FIG. 54).

4. Description of Outline of Main Process After Gate Processing in Manufacturing Method of Semiconductor Integrated Circuit Device of Above Embodiment of Present Invention (See Mainly FIGS. 54 to 66)

Figure 55:
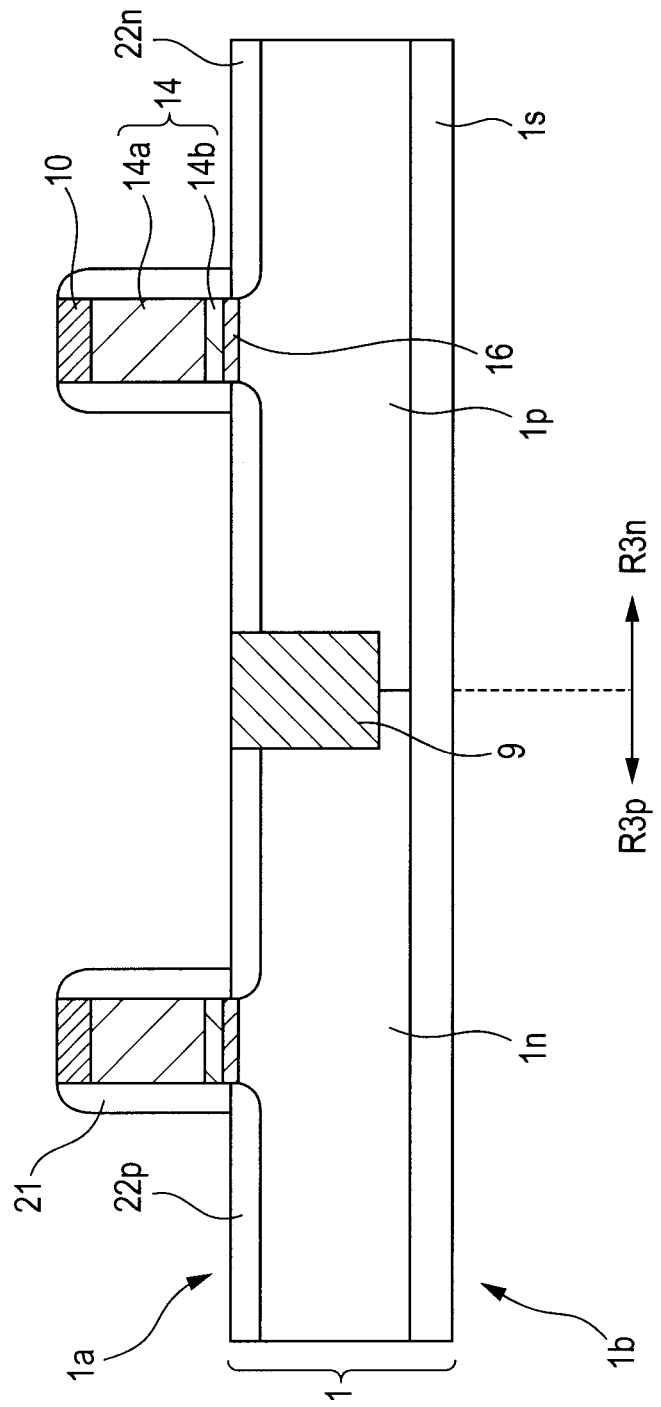
FIG. 55 is a schematic device cross-sectional view (at the completion of introduction of offset spacers and extension regions) of the CMISFET pair cut-away portion R3 from the non-memory region of FIG. 33, which is for illustrating the outline of the main process after gate processing in the manufacturing method of the semiconductor integrated circuit device of the above embodiment of the second part of the present invention.
Figure 56:
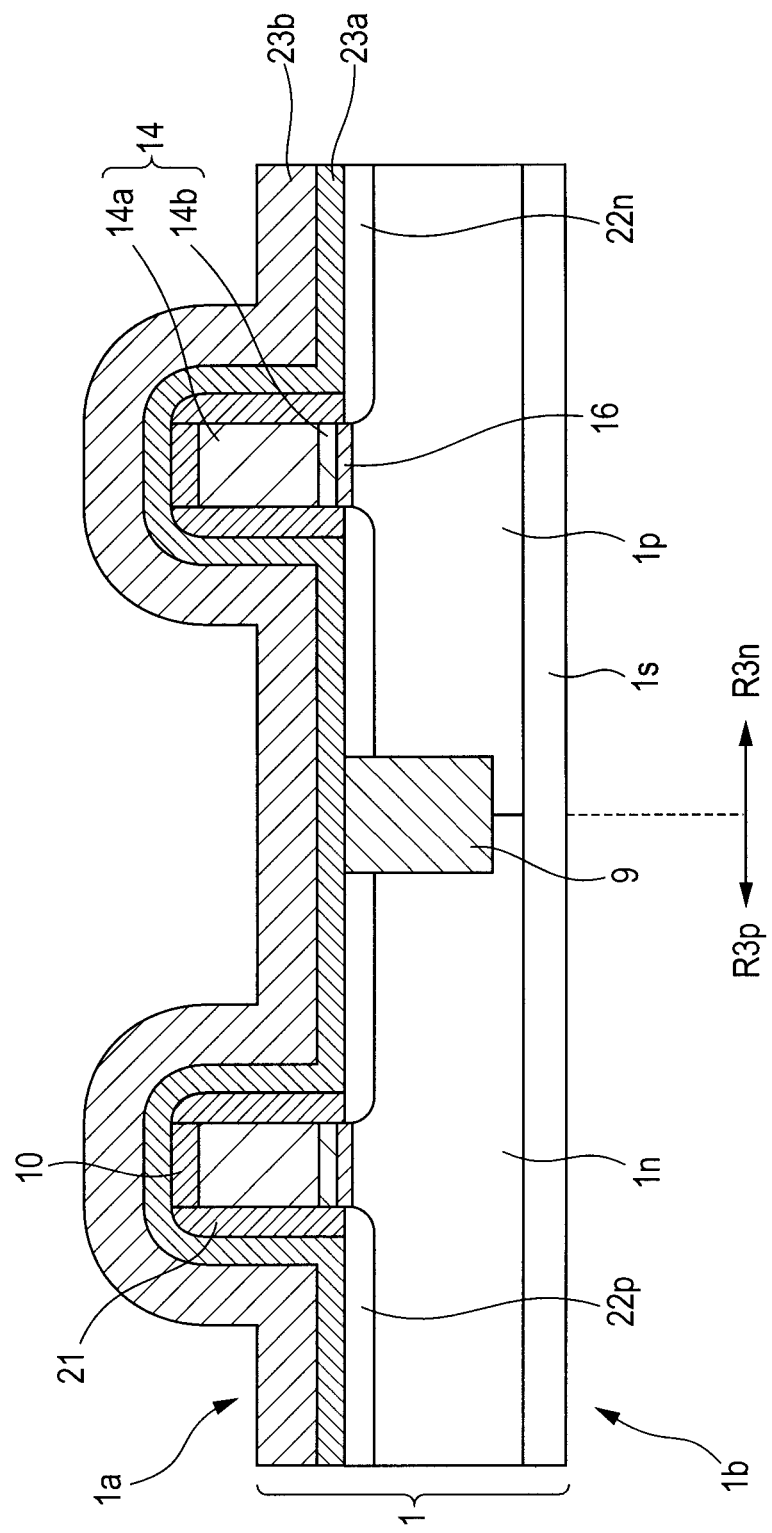
FIG. 56 is a schematic device cross-sectional view (at the completion of deposition of an insulating film for forming sidewalls) of the CMISFET pair cut-away portion R3 from the non-memory region of FIG. 33, which is for illustrating the outline of the main process after gate processing in the manufacturing method of the semiconductor integrated circuit device of the above embodiment of the second part of the present invention.
Figure 57:
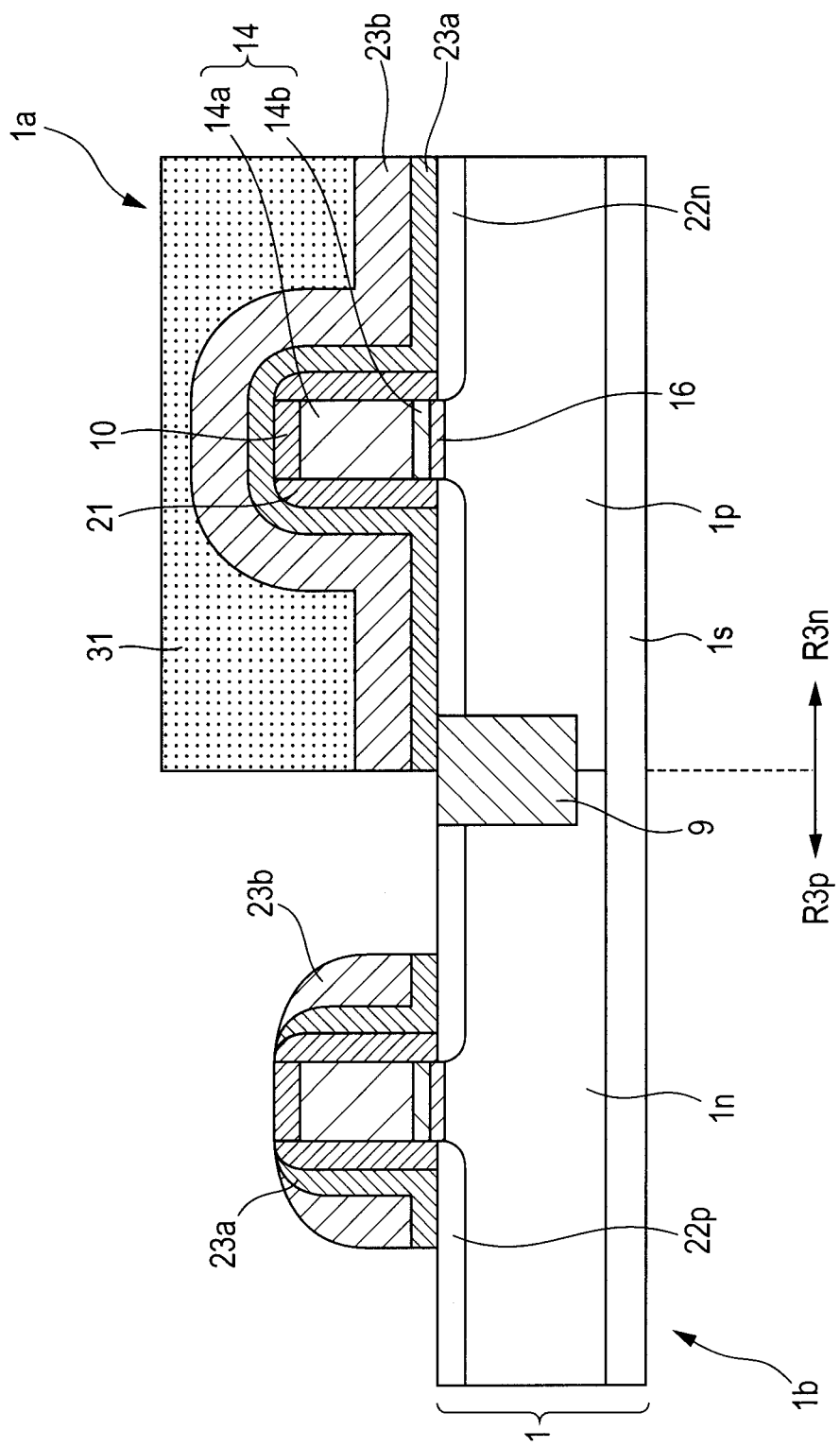
FIG. 57 is a schematic device cross-sectional view (at the completion of formation of P-channel-side sidewalls) of the CMISFET pair cut-away portion R3 from the non-memory region of FIG. 33, which is for illustrating the outline of the main process after gate processing in the manufacturing method of the semiconductor integrated circuit device of the above embodiment of the second part of the present invention.
Figure 58:
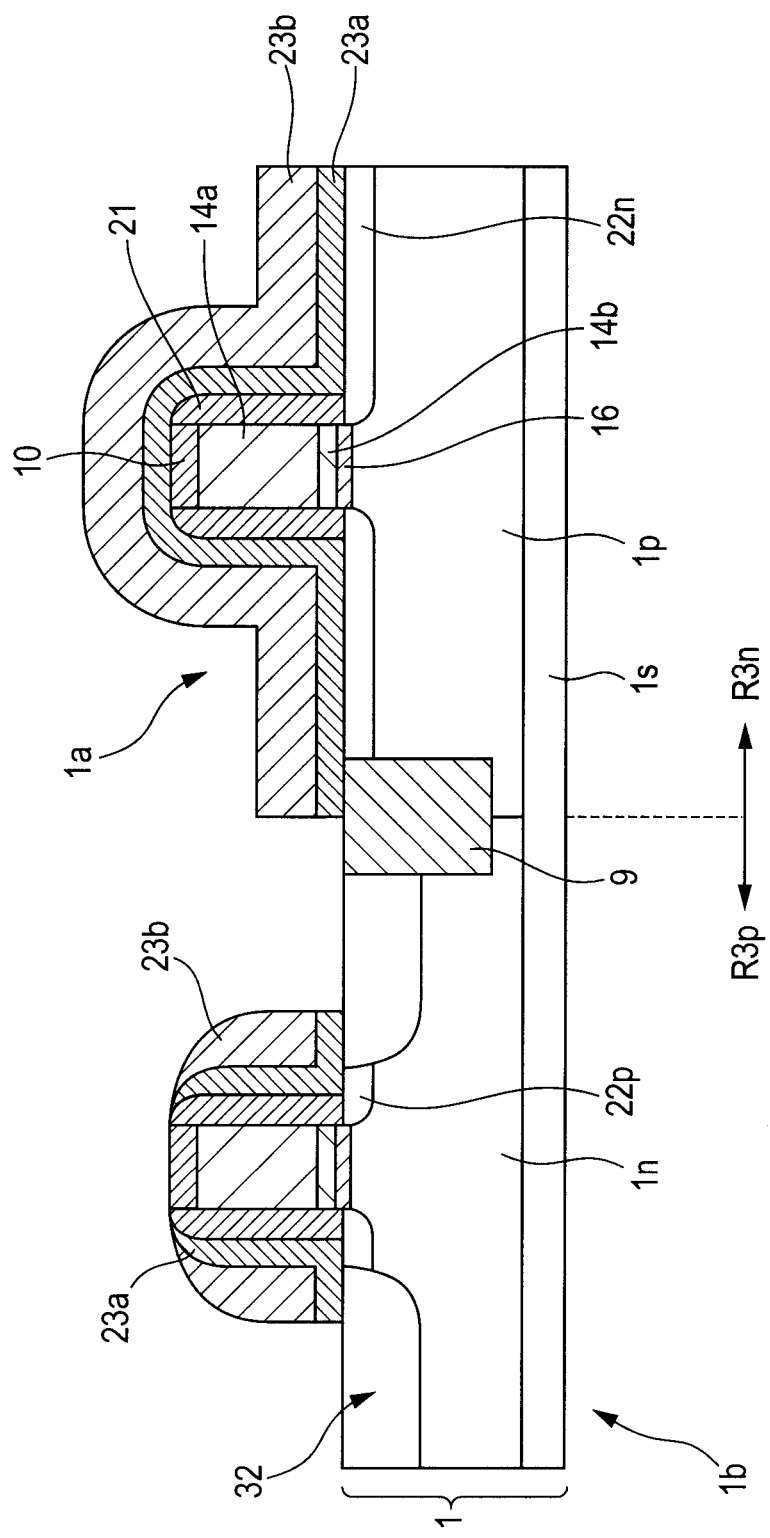
FIG. 58 is a schematic device cross-sectional view (at the completion of formation of recesses in P-channel-side source/drain regions) of the CMISFET pair cut-away portion R3 from the non-memory region of FIG. 33, which is for illustrating the outline of the main process after gate processing in the manufacturing method of the semiconductor integrated circuit device of the above embodiment of the second part of the present invention.
Figure 59:
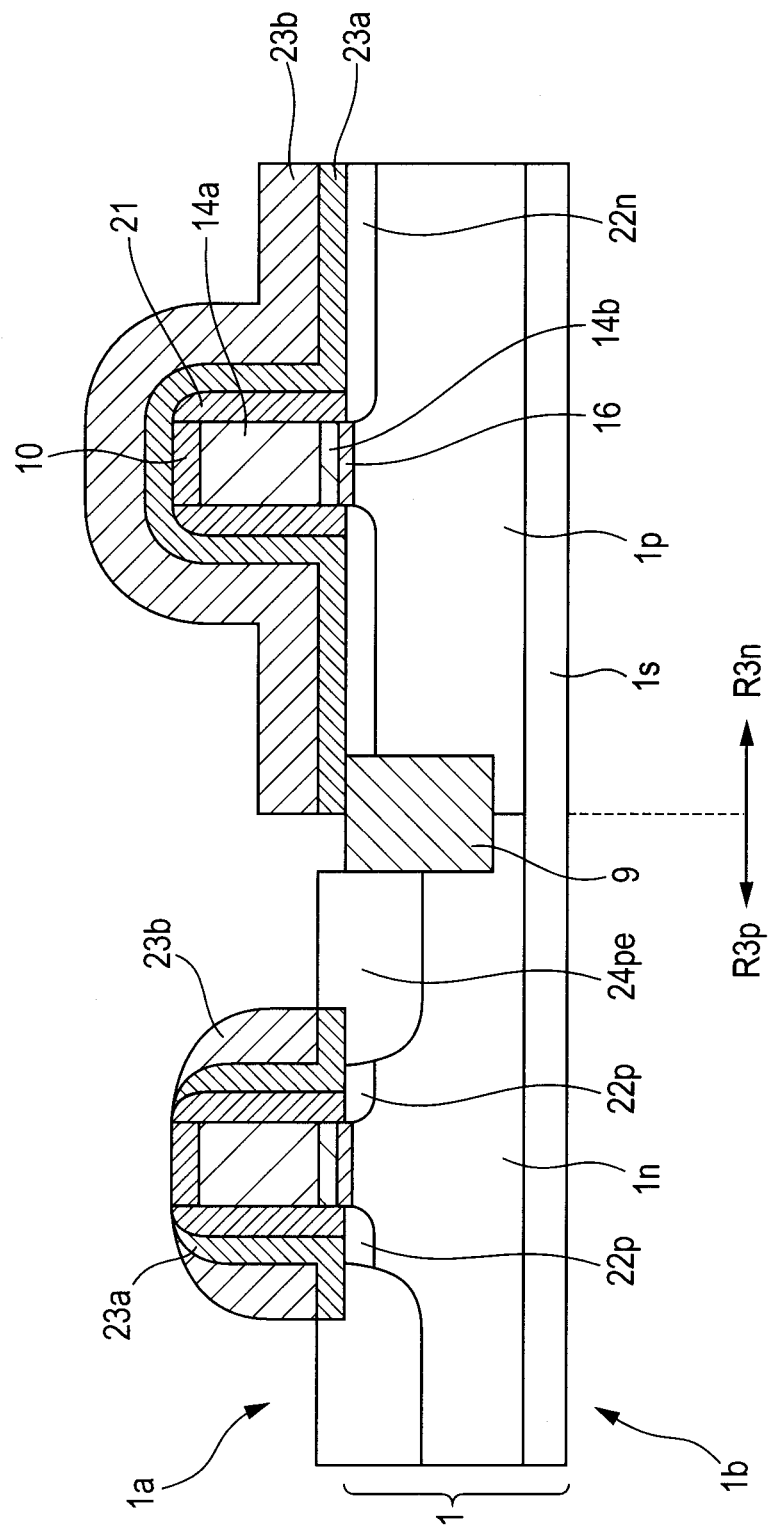
FIG. 59 is a schematic device cross-sectional view (at the completion of selective epitaxial growth for filling the recesses in the P-channel-side source/drain regions) of the CMISFET pair cut-away portion R3 from the non-memory region of FIG. 33, which is for illustrating the outline of the main process after gate processing in the manufacturing method of the semiconductor integrated circuit device of the above embodiment of the second part of the present invention.
Figure 60:
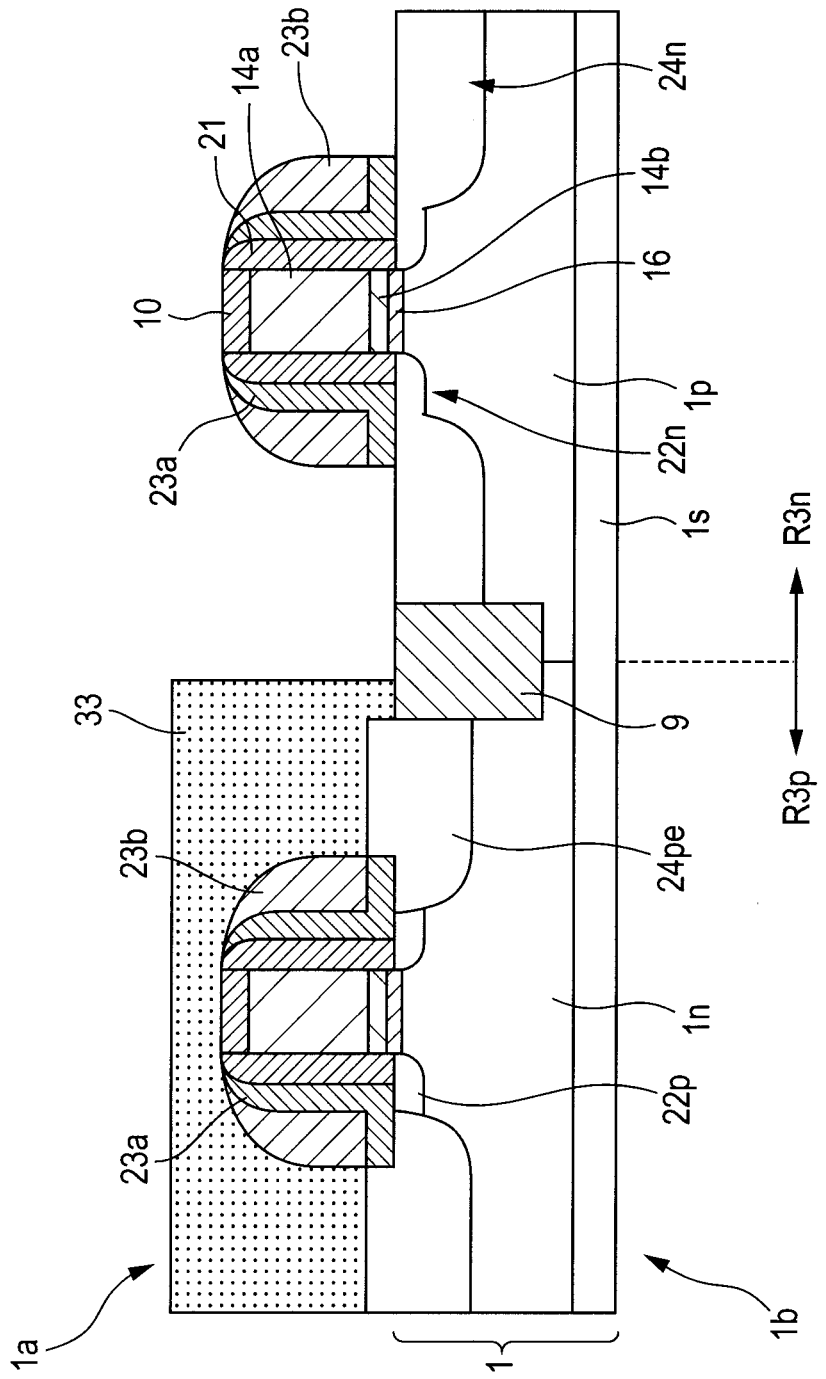
FIG. 60 is a schematic device cross-sectional view (at the completion of formation of N-channel-side sidewalls) of the CMISFET pair cut-away portion R3 from the non-memory region of FIG. 33, which is for illustrating the outline of the main process after gate processing in the manufacturing method of the semiconductor integrated circuit device of the above embodiment of the second part of the present invention.
Figure 61:
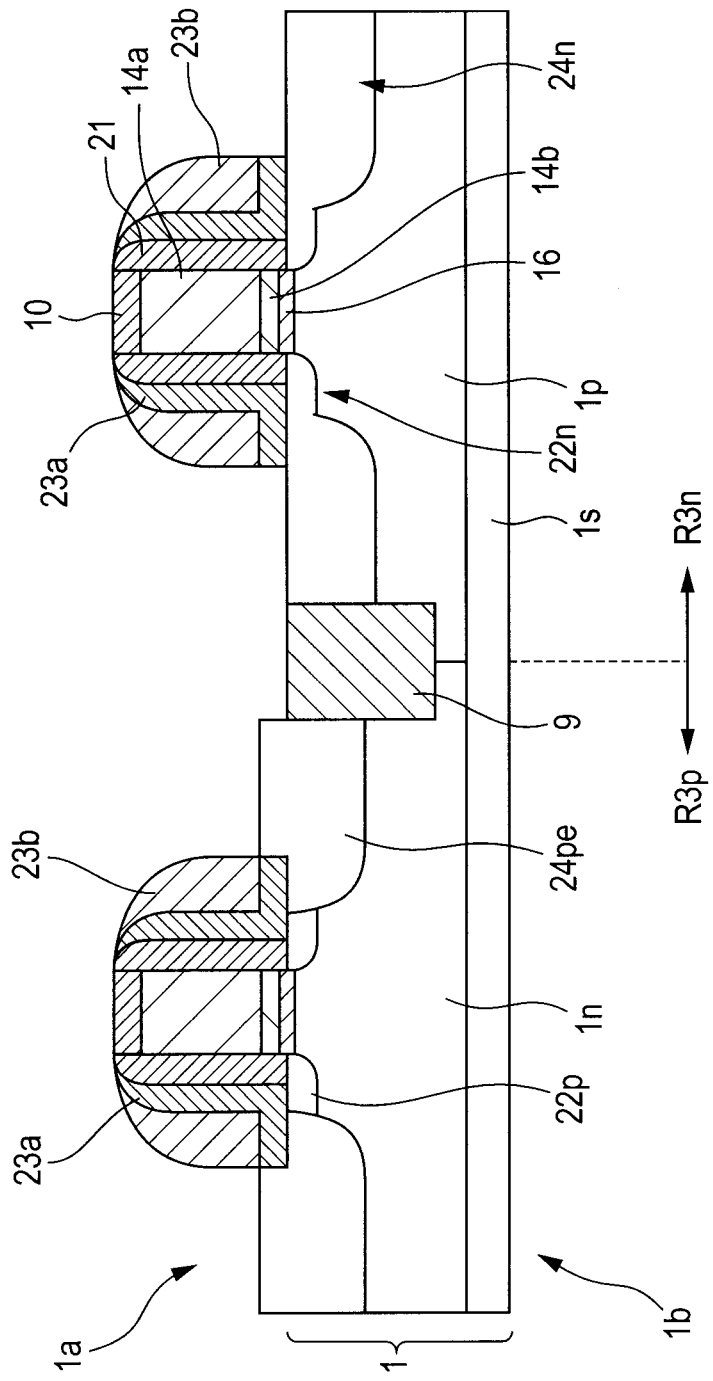
FIG. 61 is a schematic device cross-sectional view (at the completion of removal of a resist film for forming the N-channel-side sidewalls) of the CMISFET pair cut-away portion R3 from the non-memory region of FIG. 33, which is for illustrating the outline of the main process after gate processing in the manufacturing method of the semiconductor integrated circuit device of the above embodiment of the second part of the present invention.
Figure 62:
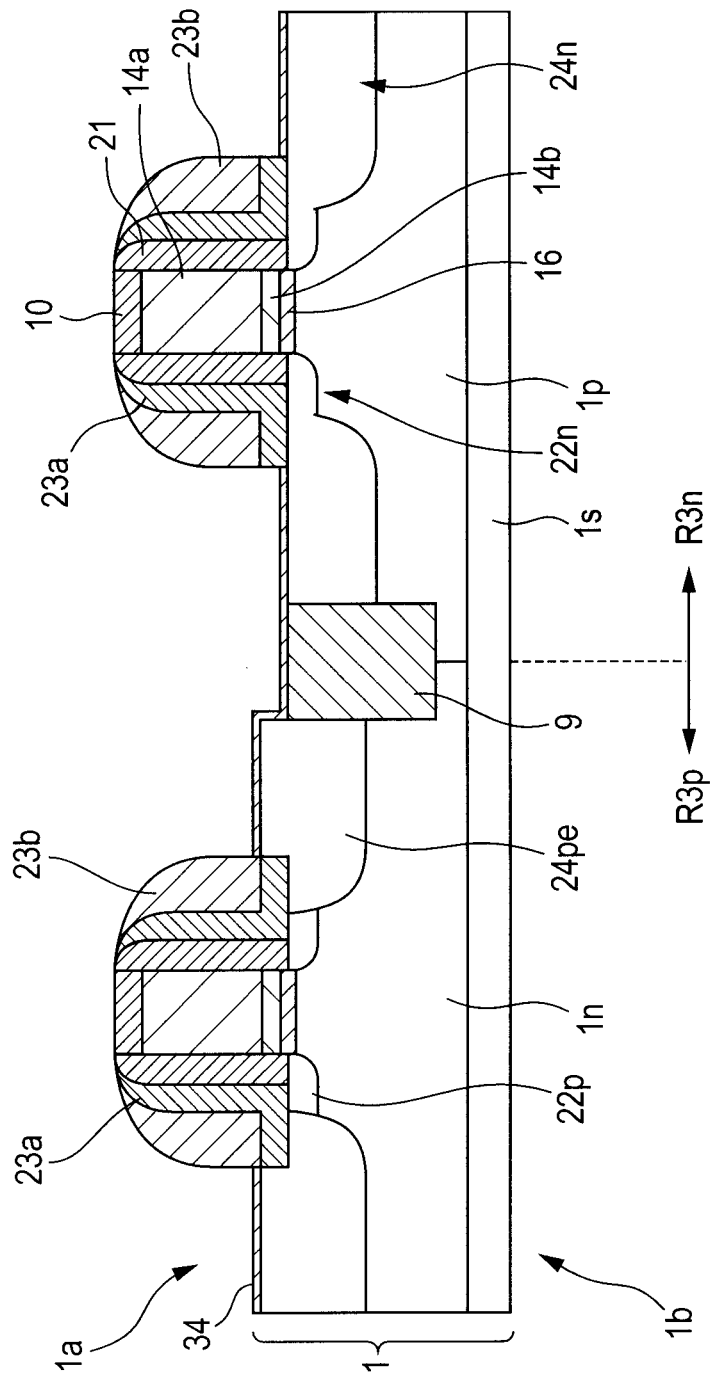
FIG. 62 is a schematic device cross-sectional view (at the completion of formation of a substrate surface oxidation film for stopping etching of a silicon nitride film) of the CMISFET pair cut-away portion R3 from the non-memory region of FIG. 33, which is for illustrating the outline of the main process after gate processing in the manufacturing method of the semiconductor integrated circuit device of the above embodiment of the second part of the present invention.
Figure 63:
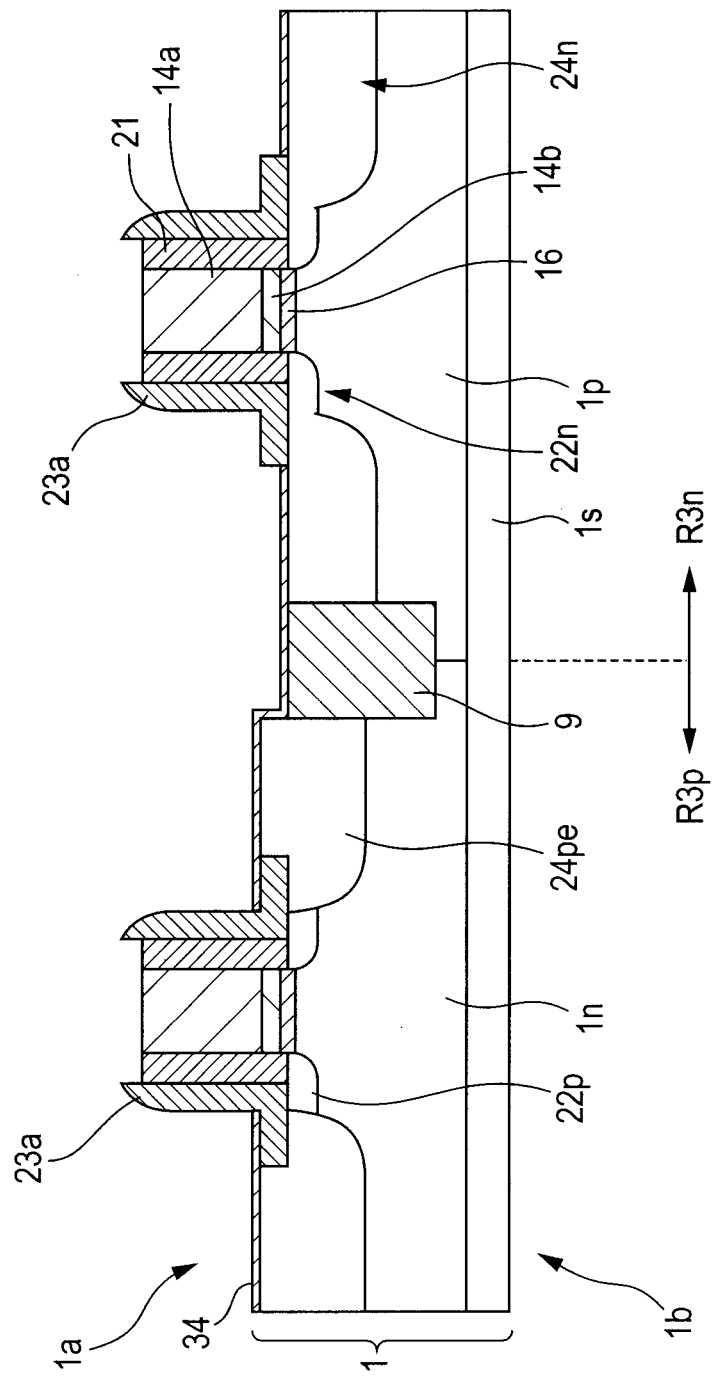
FIG. 63 is a schematic device cross-sectional view (at the completion of removal of a hard mask) of the CMISFET pair cut-away portion R3 from the non-memory region of FIG. 33, which is for illustrating the outline of the main process after gate processing in the manufacturing method of the semiconductor integrated circuit device of the above embodiment of the second part of the present invention.
Figure 64:
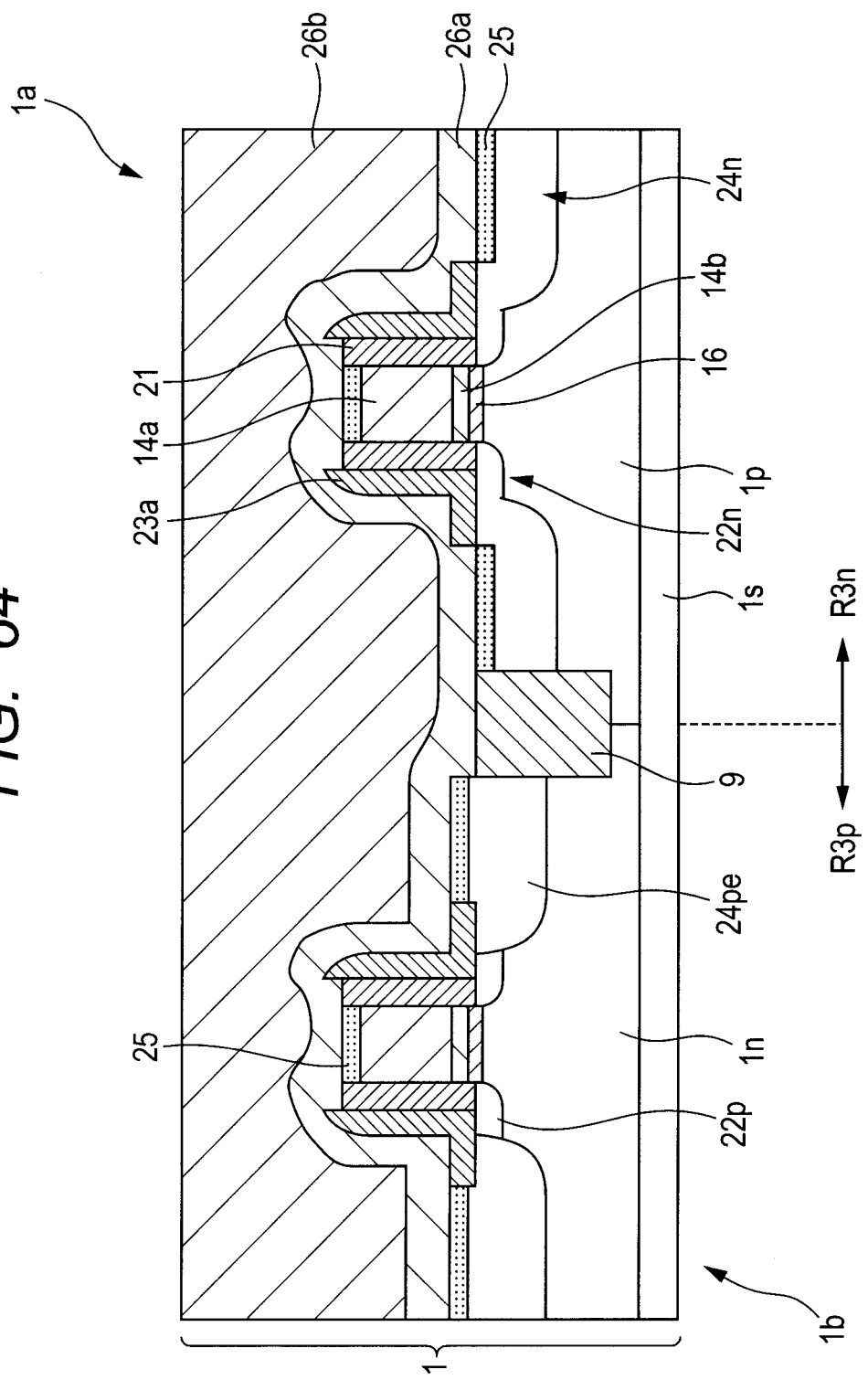
FIG. 64 is a schematic device cross-sectional view (at the completion of deposition of a premetal insulating film) of the CMISFET pair cut-away portion R3 from the non-memory region of FIG. 33, which is for illustrating the outline of the main process after gate processing in the manufacturing method of the semiconductor integrated circuit device of the above embodiment of the second part of the present invention.
Figure 65:
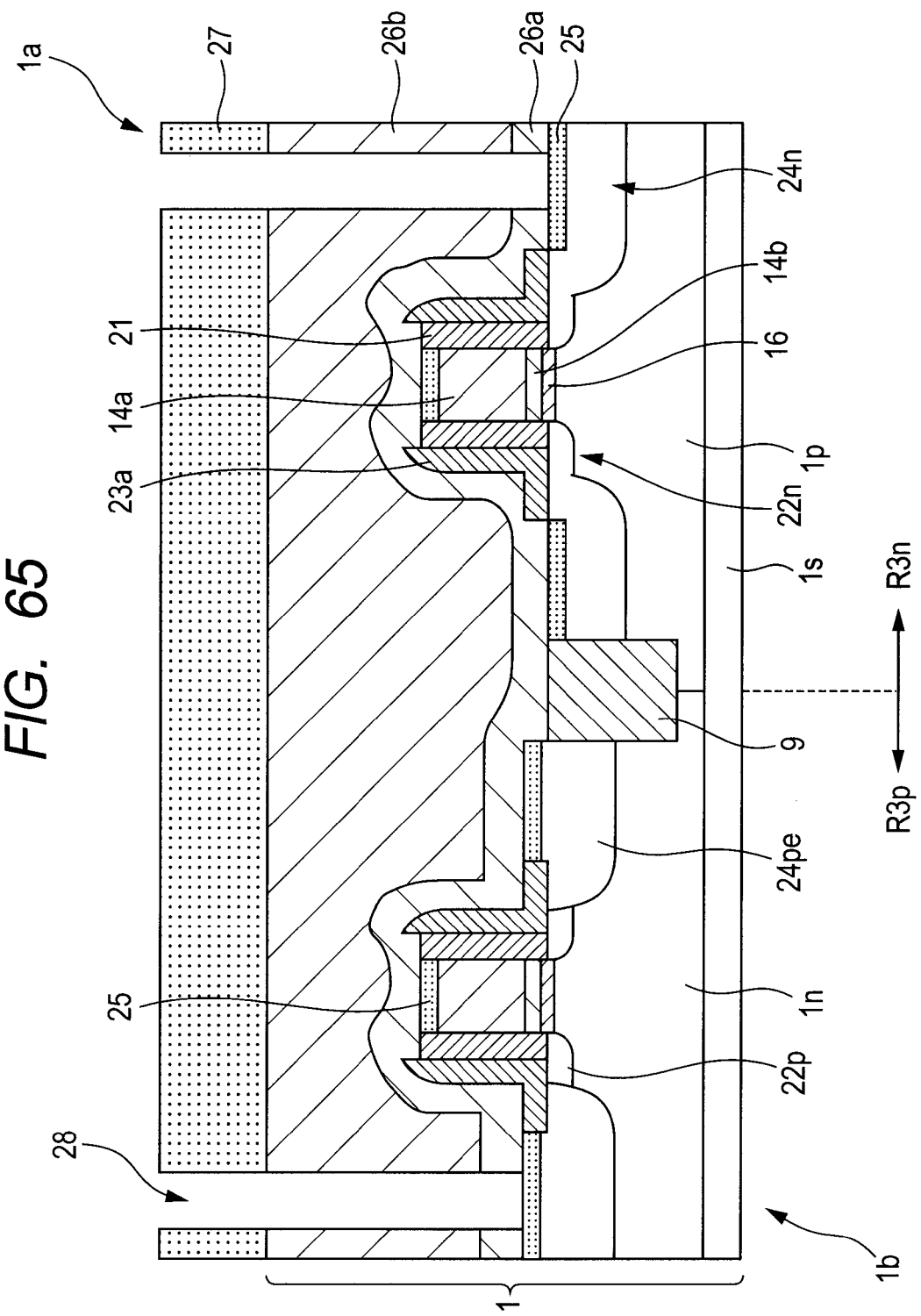
FIG. 65 is a schematic device cross-sectional view (at the completion of formation of contact holes) of the CMISFET pair cut-away portion R3 from the non-memory region of FIG. 33, which is for illustrating the outline of the main process after gate processing in the manufacturing method of the semiconductor integrated circuit device of the above embodiment of the second part of the present invention.
Figure 66:
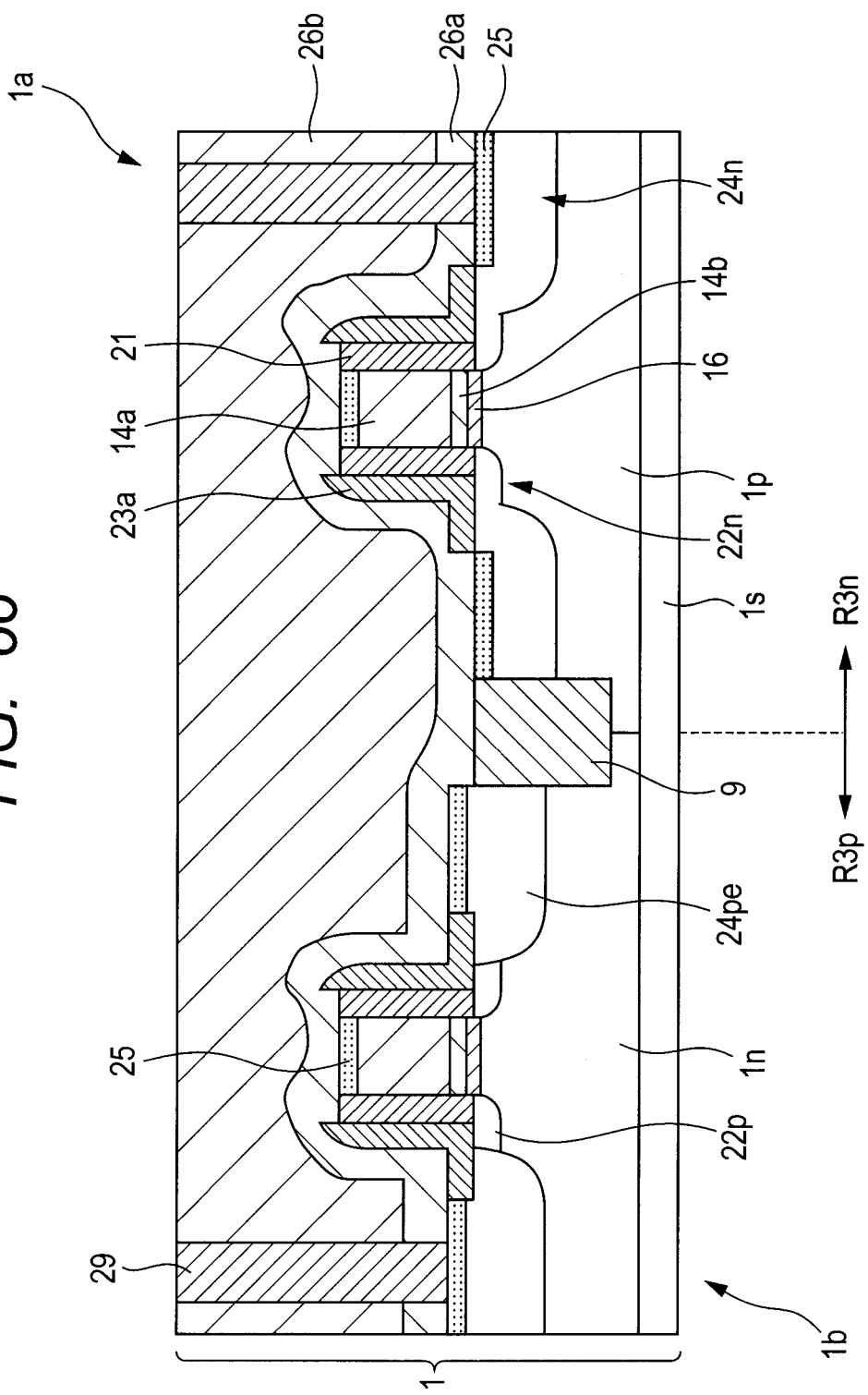
FIG. 66 is a schematic device cross-sectional view (at the completion of burying of tungsten plugs) of the CMISFET pair cut-away portion R3 from the non-memory region of FIG. 33, which is for illustrating the outline of the main process after gate processing in the manufacturing method of the semiconductor integrated circuit device of the above embodiment of the second part of the present invention.

FIG. 54 is a schematic device cross-sectional view (the same as FIG. 53, i.e., at the completion of etching of the gate electrode film and the like) of a CMISFET pair cut-away portion R3 from the non-memory region of FIG. 33, which is for illustrating the outline of a main process after gate processing in the manufacturing method of the semiconductor integrated circuit device of the above embodiment of the present invention. FIG. 55 is a schematic device cross-sectional view (at the completion of introduction of offset spacers and extension regions) of the CMISFET pair cut-away portion R3 from the non-memory region of FIG. 33, which is for illustrating the outline of the main process after gate processing in the manufacturing method of the semiconductor integrated circuit device of the above embodiment of the present invention. FIG. 56 is a schematic device cross-sectional view (at the completion of deposition of an insulating film for forming sidewalls) of the CMISFET pair cut-away portion R3 from the non-memory region of FIG. 33, which is for illustrating the outline of the main process after gate processing in the manufacturing method of the semiconductor integrated circuit device of the above embodiment of the present invention. FIG. 57 is a schematic device cross-sectional view (at the completion of formation of P-channel-side sidewalls) of the CMISFET pair cut-away portion R3 from the non-memory region of FIG. 33, which is for illustrating the outline of the main process after gate processing in the manufacturing method of the semiconductor integrated circuit device of the above embodiment of the present invention. FIG. 58 is a schematic device cross-sectional view (at the completion of formation of recesses in P-channel-side source/drain regions) of the CMISFET pair cut-away portion R3 from the non-memory region of FIG. 33, which is for illustrating the outline of the main process after gate processing in the manufacturing method of the semiconductor integrated circuit device of the above embodiment of the present invention. FIG. 59 is a schematic device cross-sectional view (at the completion of selective epitaxial growth for filling the recesses in the P-channel-side source/drain regions) of the CMISFET pair cut-away portion R3 from the non-memory region of FIG. 33, which is for illustrating the outline of the main process after gate processing in the manufacturing method of the semiconductor integrated circuit device of the above embodiment of the present invention. FIG. 60 is a schematic device cross-sectional view (at the completion of formation of N-channel-side sidewalls) of the CMISFET pair cut-away portion R3 from the non-memory region of FIG. 33, which is for illustrating the outline of the main process after gate processing in the manufacturing method of the semiconductor integrated circuit device of the above embodiment of the present invention. FIG. 61 is a schematic device cross-sectional view (at the completion of removal of a resist film for forming the N-channel-side sidewalls) of the CMISFET pair cut-away portion R3 from the non-memory region of FIG. 33, which is for illustrating the outline of the main process after gate processing in the manufacturing method of the semiconductor integrated circuit device of the above embodiment of the present invention. FIG. 62 is a schematic device cross-sectional view (at the completion of formation of a substrate surface oxidation film for stopping etching of a silicon nitride film) of the CMISFET pair cut-away portion R3 from the non-memory region of FIG. 33, which is for illustrating the outline of the main process after gate processing in the manufacturing method of the semiconductor integrated circuit device of the above embodiment of the present invention. FIG. 63 is a schematic device cross-sectional view (at the completion of removal of a hard mask) of the CMISFET pair cut-away portion R3 from the non-memory region of FIG. 33, which is for illustrating the outline of the main process after gate processing in the manufacturing method of the semiconductor integrated circuit device of the above embodiment of the present invention. FIG. 64 is a schematic device cross-sectional view (at the completion of deposition of a premetal insulating film) of the CMISFET pair cut-away portion R3 from the non-memory region of FIG. 33, which is for illustrating the outline of the main process after gate processing in the manufacturing method of the semiconductor integrated circuit device of the above embodiment of the present invention. FIG. 65 is a schematic device cross-sectional view (at the completion of formation of contact holes) of the CMISFET pair cut-away portion R3 from the non-memory region of FIG. 33, which is for illustrating the outline of the main process after gate processing in the manufacturing method of the semiconductor integrated circuit device of the above embodiment of the present invention. FIG. 66 is a schematic device cross-sectional view (at the completion of burying of tungsten plugs) of the CMISFET pair cut-away portion R3 from the non-memory region of FIG. 33, which is for illustrating the outline of the main process after gate processing in the manufacturing method of the semiconductor integrated circuit device of the above embodiment of the present invention. Based on these drawings, a description will be given to the outline of a main process after gate processing in the manufacturing method of the semiconductor integrated circuit device of the above embodiment of the present invention.

Based on FIG. 54 (showing the same process step as in FIGS. 41 and 53), a description will be given to portions corresponding to a P-channel device region R3p of the CMISFET pair cut-away portion from the non-memory region and an N-channel device region R3n of the CMISFET pair cut-away portion from the non-memory region of FIG. 33 after the time when the patterning of the line & space pattern of the gate electrodes is completed. As shown in FIG. 54, in the upper half of the P-type single-crystal silicon substrate portion of the wafer 1, an N-well region 1n and a P-well region 1p are provided.

Next, as shown in FIG. 55, over substantially the entire device surface 1a of the wafer 1, an offset spacer silicon nitride film 21 (having a thickness of, e.g., about 2 to 7 nm) is deposited by, e.g., CVD. Subsequently, by anisotropic dry etching, the offset spacer silicon nitride film 21 is etched back to form the offset spacers 21.

Subsequently, into the respective surface areas of the device surface 1a of the wafer 1 in the P-channel device region R3p and the N-channel device region R3n, P-type extension regions 22p (examples of conditions for ion plantation include an ion species of $BF_2$, an implantation energy of 1 KeV to 5 KeV, and a dose of $1 \times 10^{15}/cm^2$ to $8 \times 10^{15}/cm^2$ and an ion species of C, an implantation energy of 1 KeV to 5 KeV, and a dose of $4 \times 10^{14}/cm^2$ to $9 \times 10^{14}/cm^2$) and N-type extension regions 22n (examples of conditions for ion plantation include an ion species of As, an implantation energy of 1 KeV to 10 KeV, and a dose of $1 \times 10^{15}/cm^2$ to $9 \times 10^{15}/cm^2$ and an ion species of C, an implantation energy of 1 KeV to 5 KeV, and a dose of $4 \times 10^{14}/cm^2$ to $9 \times 10^{14}/cm^2$) are introduced by ion implantation.

Next, as shown in FIG. 56, over substantially the entire device surface 1a of the wafer 1, a sidewall silicon oxide film 23a (having a thickness of, e.g., about 5 to 10 nm) is deposited by, e.g., CVD. Subsequently, over substantially the entire upper surface of the sidewall silicon oxide film 23a, a sidewall silicon nitride film 23b (having a thickness of, e.g., about 20 to 30 nm) is deposited by, e.g., CVD.

Next, as shown in FIG. 57, in a state where an N-channel side is covered with a resist film 31 for etching back sidewall insulating films in a P-channel region, sidewall insulating films 23a and 23b in the P-channel region are formed by anisotropic dry etching. Thereafter, the resist film 31 for etching back the sidewall insulating films in the P-channel region is removed.

Next, as shown in FIG. 58, by, e.g., wet etching (using, e.g., an alkaline silicon etching solution) or isotropic dry etching (using a gas system of, e.g., $O_2/CF_4$ or the like), source/drain recesses 32 to be filled are formed in portions intended to serve as P-type heavily doped SiGe source/drain regions 24pe (see FIG. 59).

Next, as shown in FIG. 59, by, e.g., selective epitaxial growth, the source/drain recesses 32 to be filled are filled with SiGe (in which a Ge composition is, e.g., about 20 to 40 atm %) epitaxial layers doped with boron (in which a boron concentration is, e.g., about $1 \times 10^{19}/cm^3$ to $5 \times 10^{20}/cm^3$), i.e., the P-type heavily doped SiGe source/drain regions 24pe (using a gas system of, e.g., $SiH_4$, $SiH_2Cl_2$, $Si_2H_6$, or the like). As a result, a compressive stress acts on the channel region and the like to allow an improvement in hole mobility. Likewise, by also introducing SiC epitaxial layers (in which a carbon composition is, e.g., about 1 atm %) doped with an N-type impurity into the source/drain regions of the N-channel region, a tensile stress acts on the channel region and the like to allow an improvement in electron mobility.

Next, as shown in FIG. 60, in a state where a P-channel side is covered with a resist film 33 for etching back sidewall insulating films in the N-channel region, the sidewall insulating films 23a and 23b in the N-channel region are formed by anisotropic dry etching.

Next, as shown in FIG. 61, the resist film 33 for etching back the sidewall insulating films in the N-channel region are removed.

Next, as shown in FIG. 62, over the top surface 1a of the substrate 1, a thin silicon oxide film, i.e., a substrate surface oxidation film 34 for stopping etching of a silicon nitride film is formed by thermal oxidation or the like.

Next, as shown in FIG. 63, by, e.g., a wet treatment using a hot phosphoric acid or the like, the hard mask films (silicon nitride films) for gate processing and the like are removed.

Next, as shown in FIG. 64, by a Salicide method, nickel-based silicide films 25 (such as, e.g., NiPt silicide) are formed. Subsequently, over substantially the entire device surface 1a of the wafer 1, by, e.g., plasma CVD, a silicon nitride film (having a thickness of, e.g., about 20 to 30 nm) is deposited as a CESL (Contact Etch Stop Layer) and a premetal lower-layer insulating film 26a. Subsequently, over substantially the entire upper surface of the silicon nitride film 26a, by, e.g., plasma CVD, a silicon oxide film (having a thickness of, e.g., about 150 to 240 nm) is deposited as a premetal upper-layer insulating film 26b.

Subsequently, as shown in FIG. 65, over substantially the entire upper surface of the silicon oxide film 26b, a resist film 27 for forming contact holes is formed by coating or the like. Subsequently, by typical lithography (e.g., ArF lithography), the resist film 27 is patterned. By anisotropic dry etching using the patterned resist film 27 as a mask, contact holes 28 are opened in the silicon oxide film 26b and the silicon nitride film 26a. Thereafter, the resist film 27 that is no longer needed is removed by ashing or the like.

Next, as shown in FIG. 66, tungsten plugs 29 are buried in the contact holes 28. Thereafter, as necessary, multilayer wiring is formed by a copper-based damascene method (buried wiring method) or an aluminum-based normal wiring method (non-buried wiring method).

5. Description of SRAM memory cell in SOC Chip as Example of Target Device, etc. in Manufacturing Method of Semiconductor Integrated Circuit Device of Above Embodiment of Present Invention (See Mainly FIGS. 67 and 68)

Here, the specific description has been given using the 6-transistor cell as an example, but the invention disclosed in the present application is not limited thereto. It will be appreciated that the present invention is also applicable to a memory cell having another structure.

Figure 67:
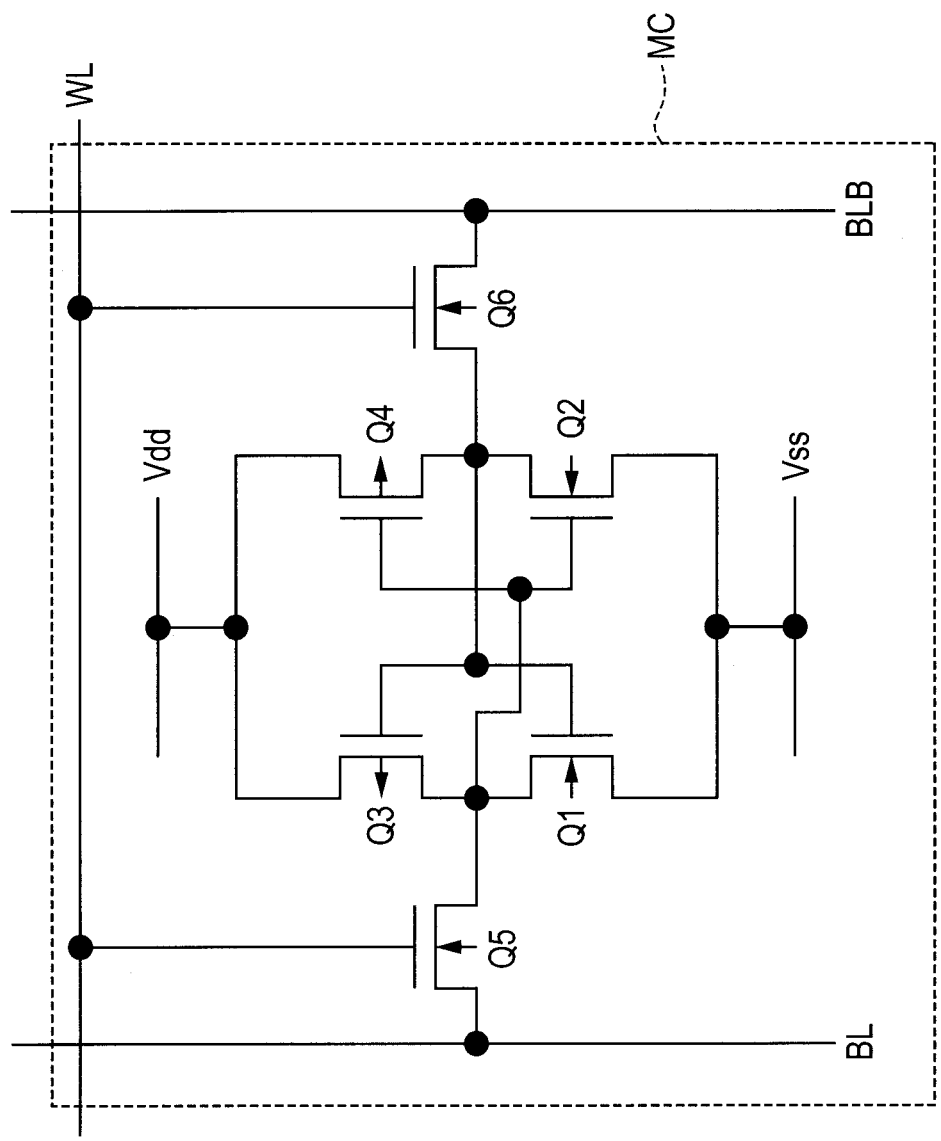
FIG. 67 is a circuit diagram of a SRAM memory cell of the SOC chip as an example of the target device in the manufacturing method of the semiconductor integrated circuit device of the above embodiment of the second part of the present invention.
Figure 68:
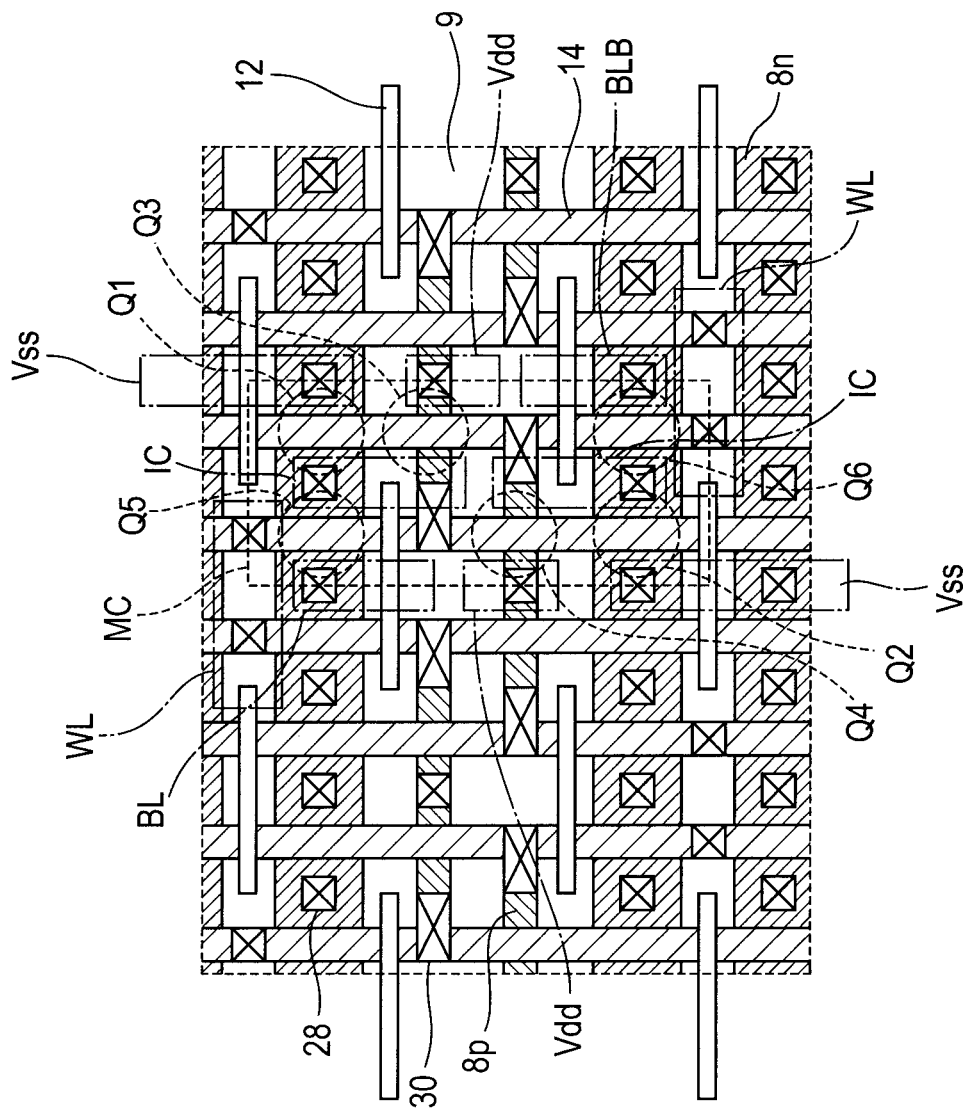
FIG. 68 is a two-dimensional layout diagram of the memory cell showing an example of a real two-dimensional layout of the SRAM memory cell of the SOC chip as the example of the target device in the manufacturing method of the semiconductor integrated circuit device of the above embodiment of the second part of the present invention.

FIG. 67 is a circuit diagram of a SRAM memory cell of the SOC chip as an example of the target device in the manufacturing method of the semiconductor integrated circuit device of the above embodiment of the present invention. FIG. 68 is a two-dimensional layout diagram of the memory cell showing an example of a real two-dimensional layout of the SRAM memory cell of the SOC chip as the example of the target device in the manufacturing method of the semiconductor integrated circuit device of the above embodiment of the present invention.

Based on these drawings, a description will be given to an SRAM memory cell in a SOC chip as an example of the target device and so forth in the manufacturing method of the semiconductor integrated circuit device of the above embodiment of the present invention.

As shown in FIG. 67, in an SRAM memory cell MC, a word line WL and a pair of bit lines BL and BLB are provided to extend orthogonally to each other. In the vicinities of the intersection points thereof, N-type memory transistors Q1 and Q2, P-type memory transistors Q3 and Q4, read transistors Q5 and Q6, a power supply line Vdd for supplying power thereto, a reference voltage line Vss, and the like, are disposed.

FIG. 68 illustrates the SRAM memory cell MC of FIG. 67 which is shown in a real layout. As shown in FIG. 68, it can be seen that a large number of the gate electrodes 14 extending vertically are regularly cut by the cut regions 12 between adjacent gate electrodes. Of a large number of contact portions 28 and 30, those shown in laterally elongated shapes are the shared contact portions 30. Here, the contact portions 28 of active regions 8n of the N-channel devices are coupled to the shared contact portions 30 of active regions 8p of the P-channel devices with interconnection metal wires IC.

6. Supplemental Description and Consideration, etc. to Manufacturing Method of Semiconductor Integrated Circuit Device of Above Embodiment of Present Invention In a SRAM wide cell as shown in Section 5, reducing the longitudinal space portion between adjacent gates, i.e., the cut region 12 between adjacent gate electrodes (see FIG. 34) is an important technical challenge to a reduction in cell area. However, in the generation of 28 nm Technology Node or thereafter, a resolution limit is not surpassed. Therefore, it is impossible to perform gate electrode patterning by one-step lithography (e.g., ArF lithography using exposure light at a wavelength of 193 nm and an immersion projection lithography stepper). Also, in the generation of 28 nm technology node or thereafter, a Gate stack Structure includes a High-k gate insulating film and a metal-based gate so that oxidation resistance and wet treatment resistance tend to deteriorate. In addition, since it is necessary to use a multilayer resist process (in the generation of 45 nm technology node or thereafter), there is also a problem specific to the multilayer resist process.

To solve the problem of the resolution limit, the present invention uses a Multiple Patterning Process which repeats patterning of an etching mask film such as a resist film and etching of an underlying film using the patterned etching mask film a plurality of times. However, a method (referred to as a "L & S first method") which simply performs the patterning (first lithography) of the line & space pattern of gate electrodes first, and subsequently performs the patterning (second lithography) of the cut region 12 between adjacent gate electrodes (see FIG. 34) has a problem (see FIG. 33) that a resist film in the second lithography cannot ensure planarity between the memory region 6 (pattern high-density region) and the non-memory region 7 (pattern low-density region).

Accordingly, in the example shown in Sections 2 to 4, for example, the patterning (first lithography) of the hard mask (see FIG. 37) into the line & space pattern of the gate electrodes is performed first, then the patterning (second lithography) of the hard mask into the pattern of the cut region 12 between adjacent gate electrodes (see FIG. 38) is performed and, using the patterned hard mask, an underlying gate stack structure is processed (referred to as a "hard mask multiple patterning method"). In accordance with the hard mask multiple patterning method, the hard mask 10 (see FIG. 39) is relatively thin so that planarity at the time of second exposure to light presents no problem. In the above embodiment, the L & S first method is used in which the patterning of the line & space pattern is performed first in terms of exposure order, but the method (referred to as the "L & S last method") may also be used in which the patterning of the cut region between adjacent gate electrodes is performed first.

Also, when a shrinkage treatment (treatment for reducing the area of the resist opening corresponding to the cut region between adjacent gate electrodes) is involved in the patterning of the cut region 12 between adjacent gate electrodes (see FIG. 38), in accordance with a simple L & S first method, roughness in an underlie is significant so that a post-shrinkage shape becomes unstable depending on the underlie. On the other hand, in the hard mask multiple patterning method, the underlie is relatively planar so that the post-shrinkage shape is stabilized.

In addition, to solve the problems of deteriorated oxidation resistance and wet treatment resistance, it is effective not only to use the hard mask multiple patterning method, but also to perform layout such that the cut region 12 between adjacent gate electrodes (see FIG. 38) is included within the isolation region 9 (referred to as a "layout method which locates gate end portions within the isolation region"). In the multiple patterning process, removal of a resist film involving ashing and a wet chemical solution treatment is performed a plurality of times so that excessive recession of a gate insulating film and excessive oxidation of a metal-based gate electrode portion are likely to occur (though, in a method using a hard mask, damage resulting from ashing or a wet chemical solution treatment is relatively smaller than in a method not using a hard mask). However, in the layout method which locates gate end portions within the isolation region, such a multiple treatment is performed not over the active region, but mainly over the isolation region 9 (see FIG. 38). Therefore, it is possible to reduce influence on device characteristics.

Note that, in the hard mask multiple patterning method (irrelevant to exposure order), it is effective to perform the patterning of the gate electrodes in the non-memory region 7 simultaneously with the patterning of the line & space pattern of the gate electrodes in the memory region 6. This is because, since the shrinkage treatment increases the width of the covering portion of the resist, it cannot be used for the patterning of the line & space pattern of the gate electrodes. Additionally, by doing so, there is also the advantage of allowing a trimming treatment to be used for the patterning of the line & space pattern of the gate electrodes in the memory region 6 and the non-memory region 7 (irrespective of the presence or absence of the shrinkage treatment).

Also, in the hard mask multiple patterning method (irrelevant to exposure order), process consistency with a selective epitaxial filling method for the source/drain regions (see FIG. 59) is excellent.

7. Summary

While the invention achieved by the present inventors has been specifically described heretofore based on the embodiment thereof, the present invention is not limited thereto. It will be appreciated that various changes and modifications can be made in the invention within the scope not departing from the gist thereof.

For example, in the above embodiment, the patterning of the gate electrodes in the non-memory region 7 is performed only during the patterning of the line & space pattern of the gate electrodes in the memory region 6. However, the patterning in the non-memory region 7 may also be performed as follows. It may also be also possible to perform the patterning (first lithography) of the hard mask of the line & space pattern of the gate electrodes at the same time as in the memory region 6, then perform patterning (second lithography) of the hard mask so as to partly remove the unneeded line & space pattern in the non-memory region while simultaneously patterning the hard mask into the pattern of the cut regions between adjacent gate electrodes in the memory region 6, and process the underlying gate stack structure using the patterned hard mask. At technology nodes of 32 nm, 28 nm, and thereafter, in terms of exposure to light, it is convenient to use a line & space structure even for the gate electrodes in the non-memory region. In addition, since the present embodiment uses the hard mask, even when the hard mask over the active region in the non-memory region is patterned by the second lithography, influence on device characteristics is minor.

For example, in the above embodiment, the specific description has been given by mainly using the Gate First method as an example, but the present invention is not limited thereto. It will be appreciated that the present invention is also applicable to a Dummy Gate Process in the Gate Last method.

Also, in the above embodiment, the specific description has been given by mainly using the method which uses a Hard Mask as an example, but the present invention is not limited thereto. It will be appreciated that a hard mask need not be used for either of the Patterning of the cut region between adjacent gate electrodes and the patterning of the Line & space Pattern of the gate electrodes.

Also, in the above embodiment, the specific description has been given mainly to the example in which a SiGe-based member is used in the P-channel-side source/drain regions, but the present invention is not limited thereto. It will be appreciated that the present invention is also applicable to an example in which a typical silicon-based member (not an alloy such as SiGe) and a silicon-based alloy (such as SiGe or SiC) are used in the P-channel-side and N-channel-side source/drain regions.

<Third Part: Portion Mainly Related to Gate Last & Hard-Mask Process>

0. Outline of Third Part

In a Gate Last method, in order to miniaturize a pattern, particularly to reduce the cell area of a SRAM, it is important to reduce the distance between the end portions of adjacent gate electrodes. However, at 28 nm technology node, it is generally difficult to transfer a pattern by one-shot exposure using ArF (at a wavelength of 193 nm). Accordingly, a micro-pattern is typically formed by repeating exposure, etching, and the like a plurality of times. However, there are such problems that, after the etching for the line & space pattern, the new resist pattern is not planarized and that oxidation resistance and wet etch resistance are low due to the use of a High-k insulating film and a metal electrode member in a gate stack material.

The following is a brief description of the outline of a representative embodiment of the invention disclosed in the present part.

That is, according to an aspect of the present invention, in the patterning of a dummy gate stack film having a high-k gate insulating film and a metal electrode film in a memory region, a hard mask is patterned using two resist films into a line & space pattern and the pattern of a cut region between adjacent dummy gate electrodes, and etching of the dummy gate stack film is performed using the patterned hard mask.

The following is a brief description of an effect obtained according to the representative embodiment of the invention disclosed in the present part.

That is, in the patterning of a dummy gate stack film having a high-k gate insulating film and a metal electrode film in a memory region, a hard mask is patterned using two resist films into a line & space pattern and the pattern of a cut region between adjacent dummy gate electrodes, and etching of the dummy gate stack film is performed using the patterned hard mask. Therefore, it is possible to prevent damage to the side surfaces of the gate stack film due to an oxidation treatment and a repeated chemical solution treatment.

1. Description of Top Layout of SOC Chip as Example of Target Device, etc. in Manufacturing Method of Semiconductor Integrated Circuit Device of Embodiment of Present Invention (See Mainly FIG. 69)

Note that, hereinbelow, a SOC chip will be described specifically as an example of a target device of the present invention. However, it will be appreciated that the target device may also be a memory-only chip. In the following example, the specific description will be given using mainly a product in the generation of 28 nm technology node as an example, but it will be appreciated that the present invention is also applicable to other generations.

Figure 69:
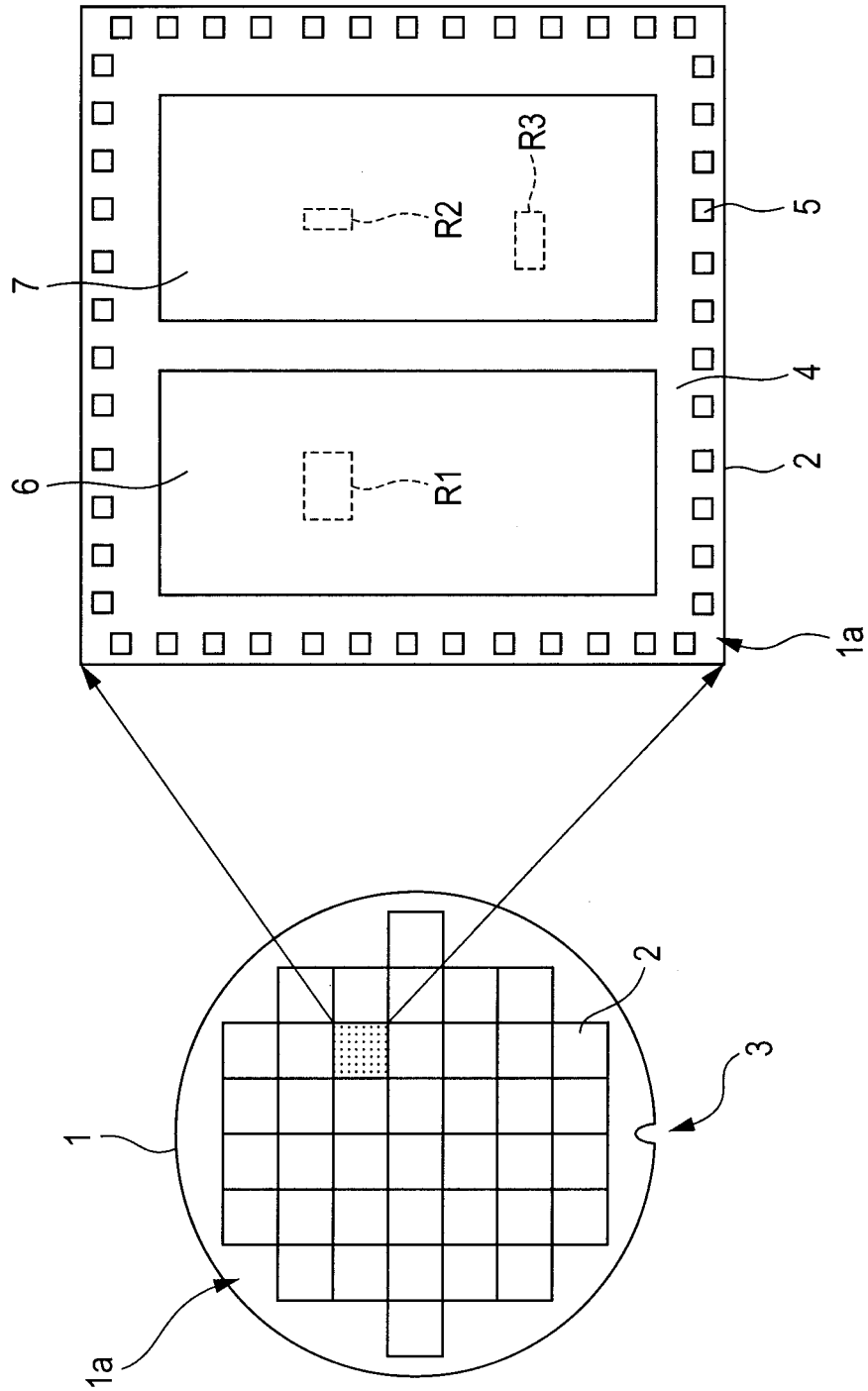
FIG. 69 is a top view of a wafer and a chip for illustrating a top layout of a SOC chip as an example of a target device and so forth in a manufacturing method of a semiconductor integrated circuit device of an embodiment of a third part of the present invention.

FIG. 69 is a top view of a wafer and a chip for illustrating a top layout of a SOC chip as an example of a target device and so forth in a manufacturing method of a semiconductor integrated circuit device of an embodiment of the present invention. Based on the drawing, a description will be given to the top layout of the SOC chip as the example of the target device and so forth in the manufacturing method of the semiconductor integrated circuit device of the embodiment of the present invention.

As shown in FIG. 69, a device main surface 1a (first main surface) of a wafer 1 (here, by way of example, a single-crystal silicon wafer having a diameter of 300 mm will be described, but the diameter of the wafer may also be 450 mm or 200 mm) is formed with a large number of chip regions 2. Also, the wafer 1 is provided with a notch 3 for discrimination of the orientation thereof. Note that the surface orientation of the device main surface 1a of the wafer 1 is, e.g., a (100) plane (including a plane equivalent thereto), and a crystal orientation in the direction of the notch 3 is, e.g., a <110> orientation. Note that channel directions CD1 and CD2 of the individual MISFETs, i.e., channel length directions (each of which is a direction from the source to the drain or from the drain to the source, i.e., a direction equivalent to the <110> orientation) are indicated by the arrows unless particularly explicitly described otherwise. Also, an orientation or a crystal plane has a substantial meaning, and includes not only the very orientation (or crystal plane), but also an orientation (or crystal plane) slightly shifted therefrom therearound (by, e.g., about not more than 7 degrees in a forward or rearward direction).

Next, a description will be given to the details of the layout of each of the chips 2 (chip regions). In a peripheral portion 4 of the chip region 2, a large number of bonding pads 5 are provided and, in the inner area thereof, a memory region 6 and a non-memory region 7 are provided. Here, as an example of the memory region 6, a SRAM (Static Random Access Memory) is shown, but the memory region 6 is not limited thereto. The memory region 6 may also be a DRAM (Dynamic Random Access Memory) or a flash memory. Note that, to be precise, the "memory region" indicates a memory cell region. Accordingly, a major part of a memory peripheral circuit belongs to the non-memory region 7. Therefore, the non-memory region 7 includes not only such a memory peripheral circuit, but also a logic circuit, an analog circuit, and the like.

2. Description of Outline of Gate Patterning Process in Manufacturing Method of Semiconductor Integrated Circuit Device of Above Embodiment of Present Invention (See Mainly FIGS. 70 to 77)

Here, following the description of the SRAM mixed logic chip in Section 1, a description will be given to the patterning (double patterning process) of the gate electrodes and so forth in the memory cell region 6 and the non-memory cell region 7 (FIG. 69).

Figure 70:
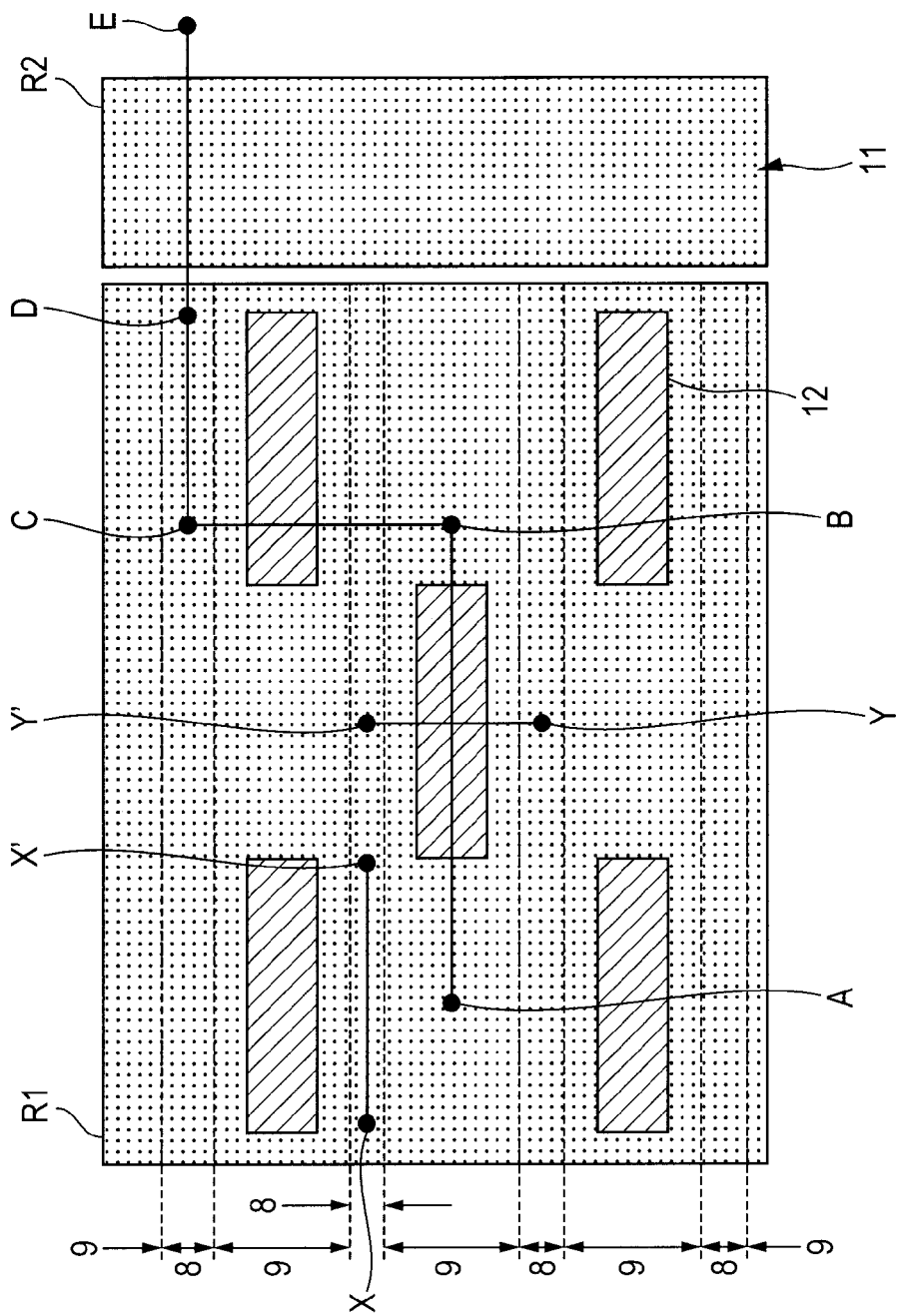
FIG. 70 is a top view (at the completion of patterning of a resist film for the patterning of cut regions between adjacent gate or dummy gate electrodes) of a cut-away portion R1 from the memory region and a cut-away portion R2 from the non-memory region of FIG. 69, which is for illustrating the outline of a dummy gate patterning process in the manufacturing method of the semiconductor integrated circuit device of the above embodiment of the present invention.
Figure 71:
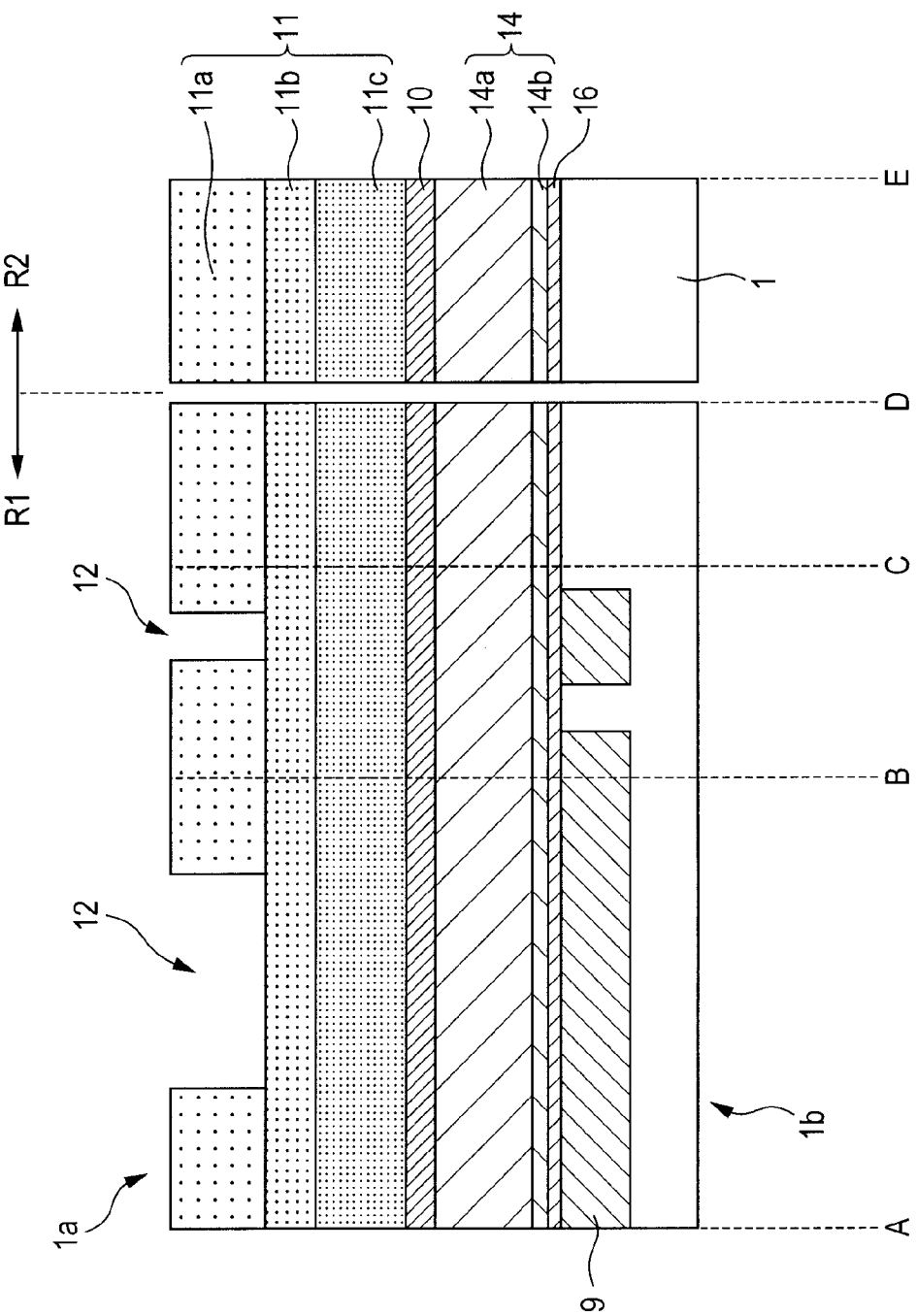
FIG. 71 is a device cross-sectional view (at the completion of patterning of the resist film for the patterning of the cut regions between adjacent gate or dummy gate electrodes) corresponding to the A-B-C-D-E cross section of FIG. 70, which is for illustrating the details of the dummy gate patterning process in the manufacturing method of the semiconductor integrated circuit device of the above embodiment of the third part of the present invention.
Figure 72:
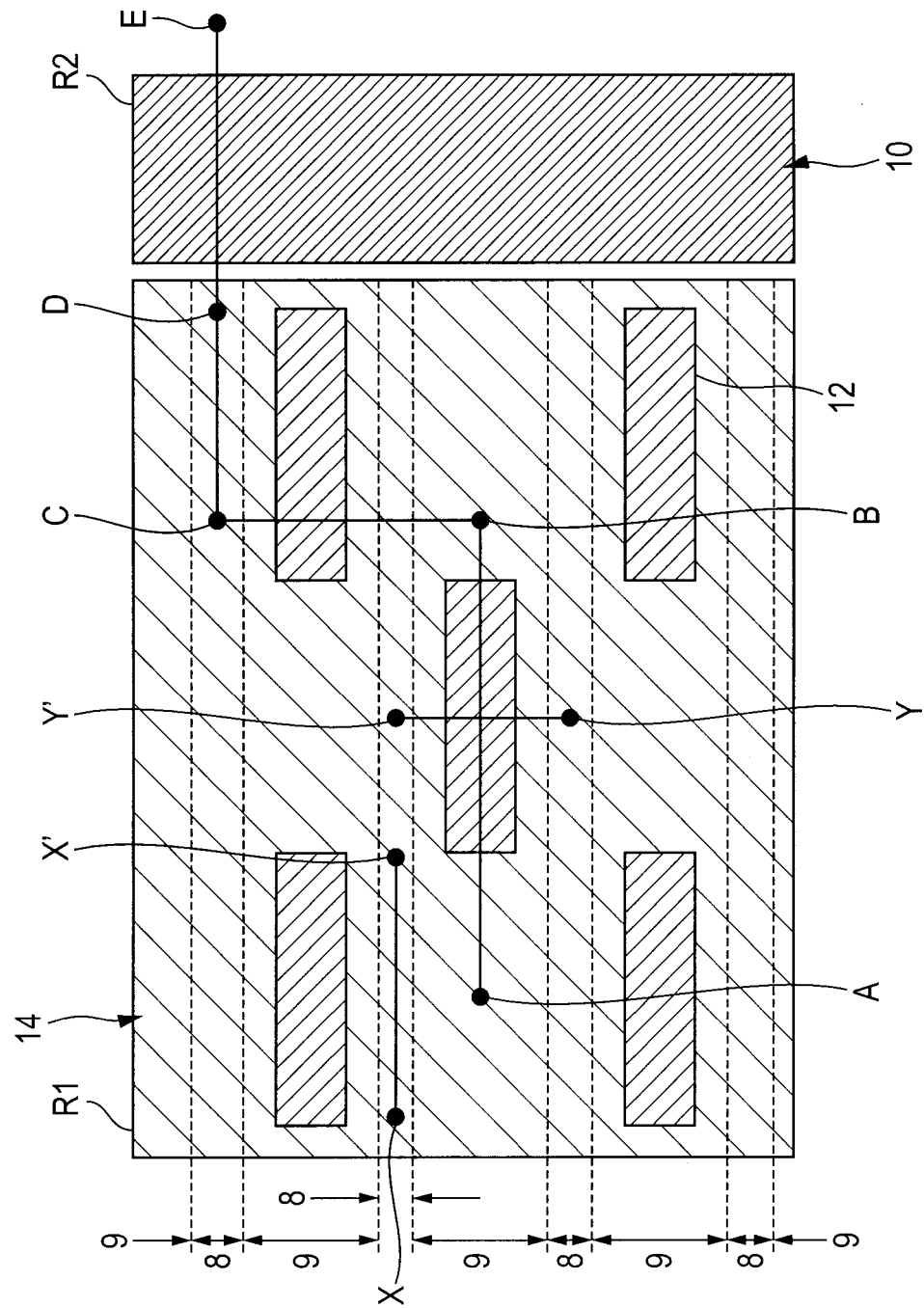
FIG. 72 is a top view (at the completion of etching of a hard mask for processing the cut regions between adjacent gate or dummy gate electrodes) of the cut-away portion R1 from the memory region and the cut-away portion R2 from the non-memory region of FIG. 69, which is for illustrating the outline of the dummy gate patterning process in the manufacturing method of the semiconductor integrated circuit device of the above embodiment of the third part of the present invention.
Figure 73:
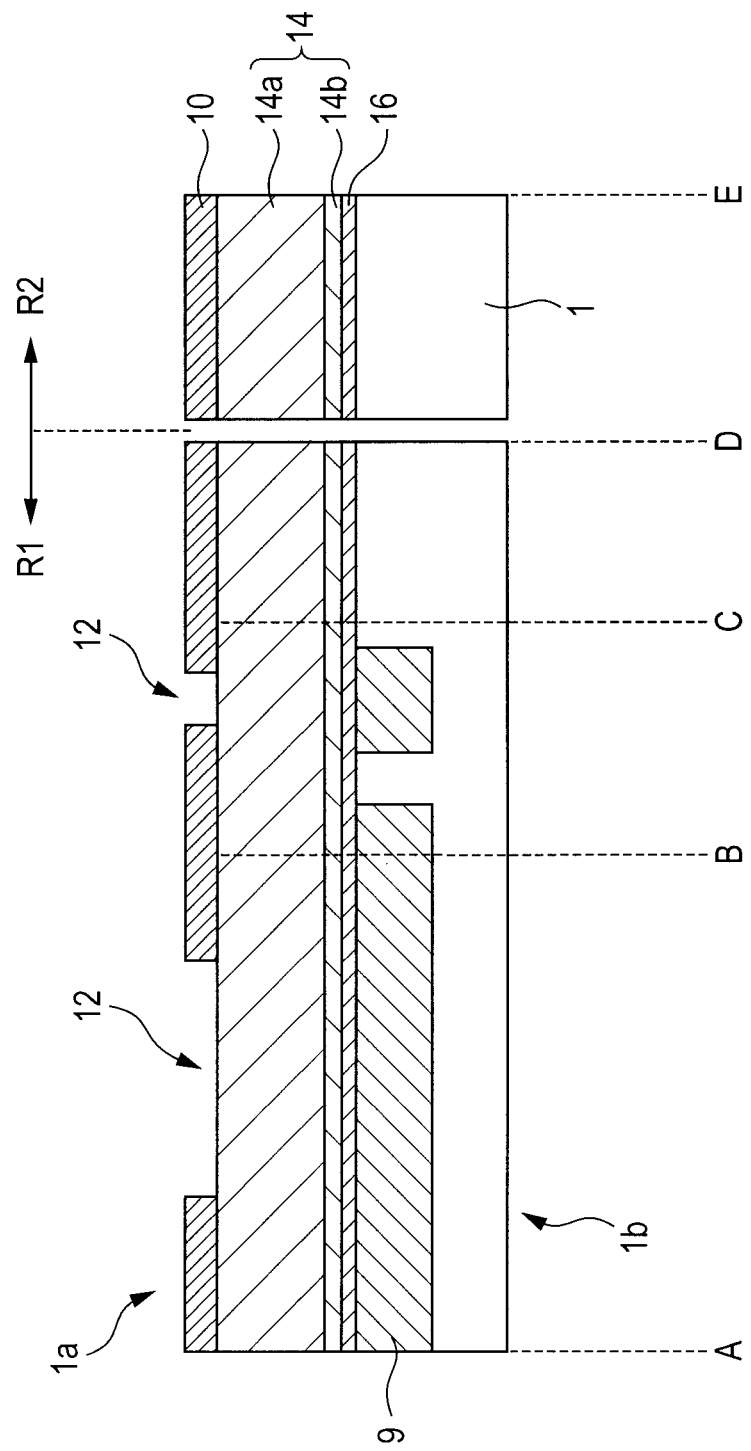
FIG. 73 is a device cross-sectional view (at the completion of etching of the hard mask for processing the cut regions between adjacent gate or dummy gate electrodes) corresponding to the A-B-C-D-E cross section of FIG. 72, which is for illustrating the details of the dummy gate patterning process in the manufacturing method of the semiconductor integrated circuit device of the above embodiment of the third part of the present invention.
Figure 74:
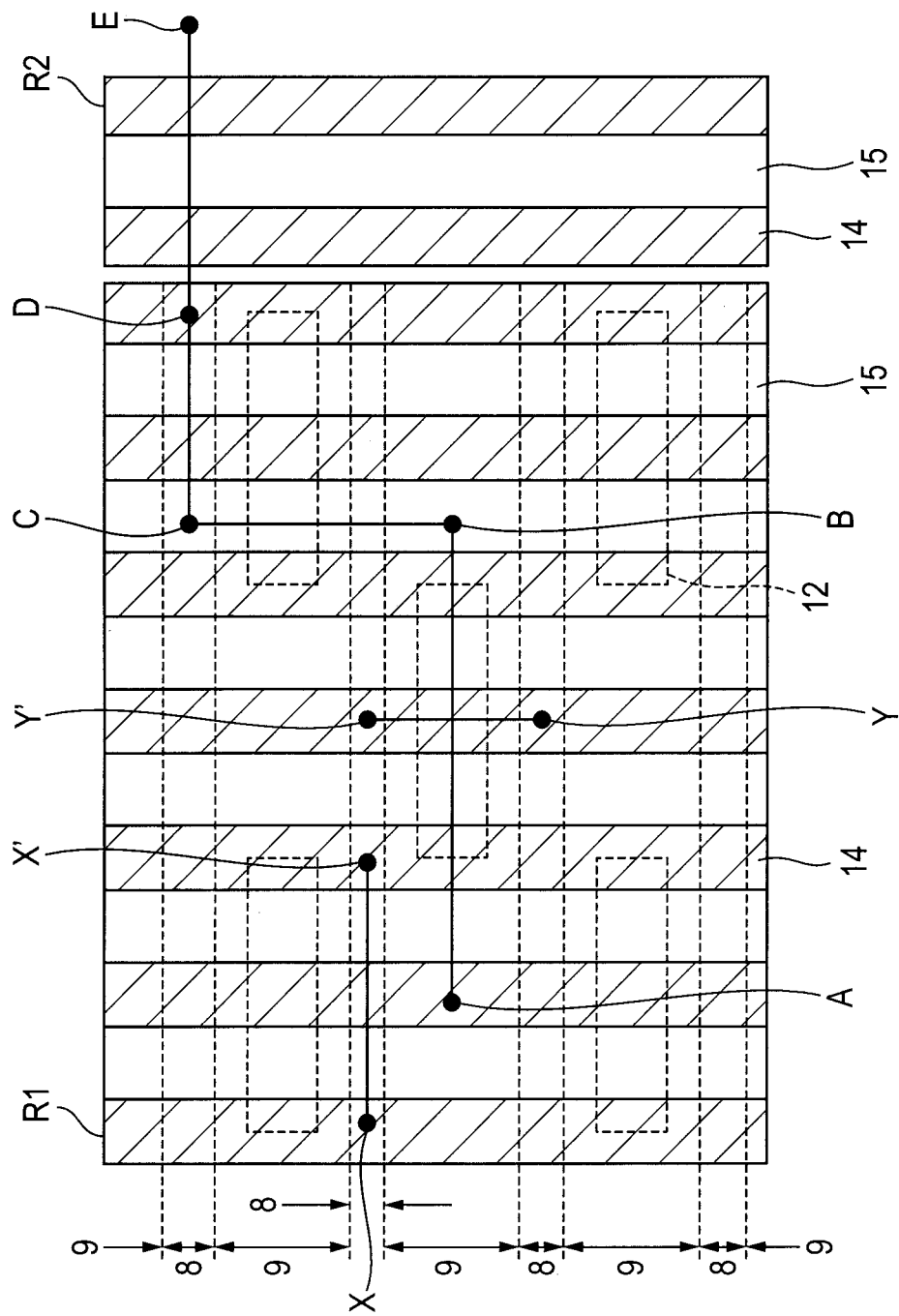
FIG. 74 is a top view (at the completion of patterning of a resist film for dummy gate electrode patterning) of the cut-away portion R1 from the memory region and the cut-away portion R2 from the non-memory region of FIG. 69, which is for illustrating the outline of the dummy gate patterning process in the manufacturing method of the semiconductor integrated circuit device of the above embodiment of the third part of the present invention.
Figure 75:
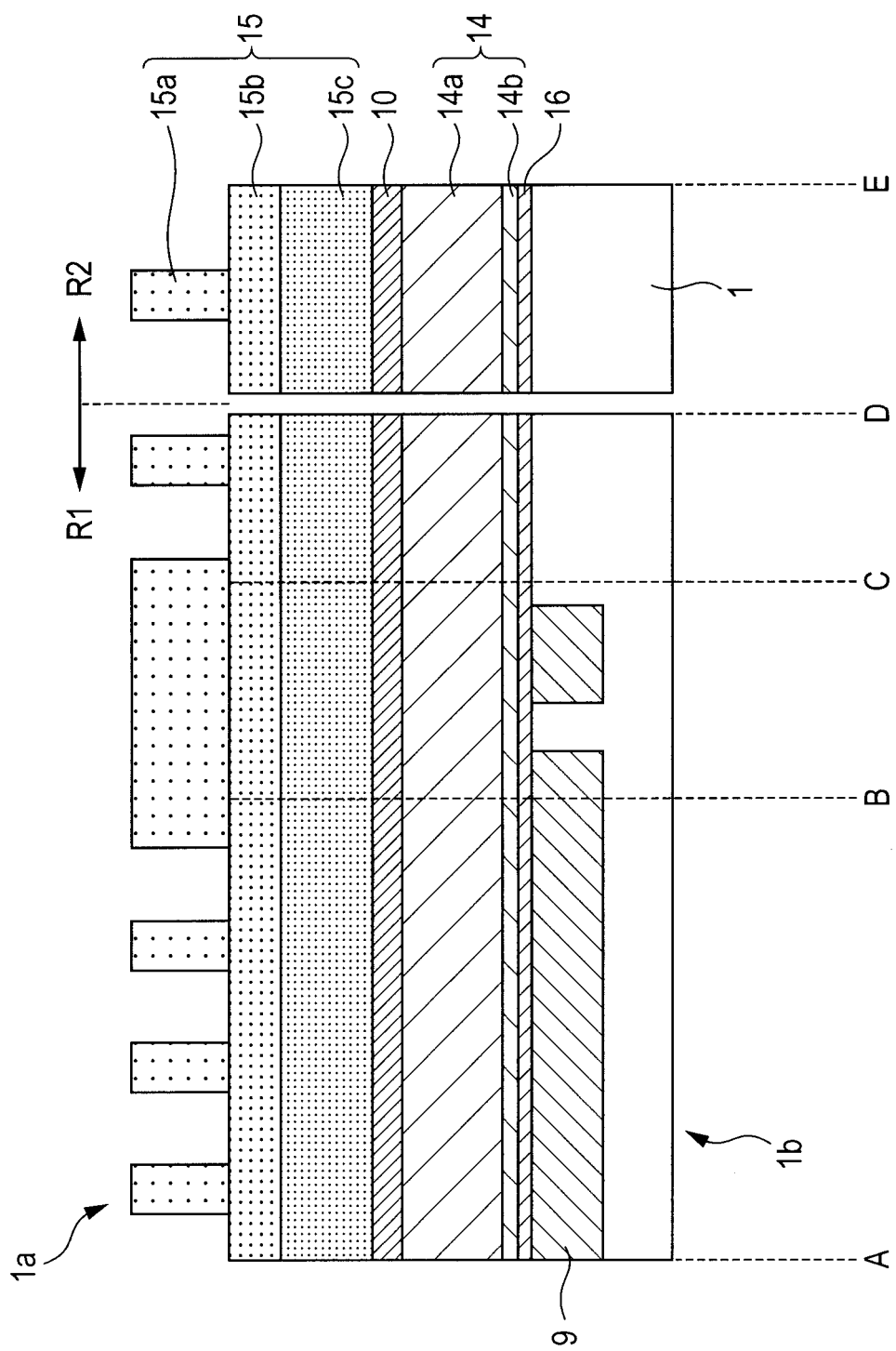
FIG. 75 is a device cross-sectional view (at the completion of patterning of the resist film for dummy gate electrode patterning) corresponding to the A-B-C-D-E cross section of FIG. 74, which is for illustrating the details of the dummy gate patterning process in the manufacturing method of the semiconductor integrated circuit device of the above embodiment of the third part of the present invention.
Figure 76:
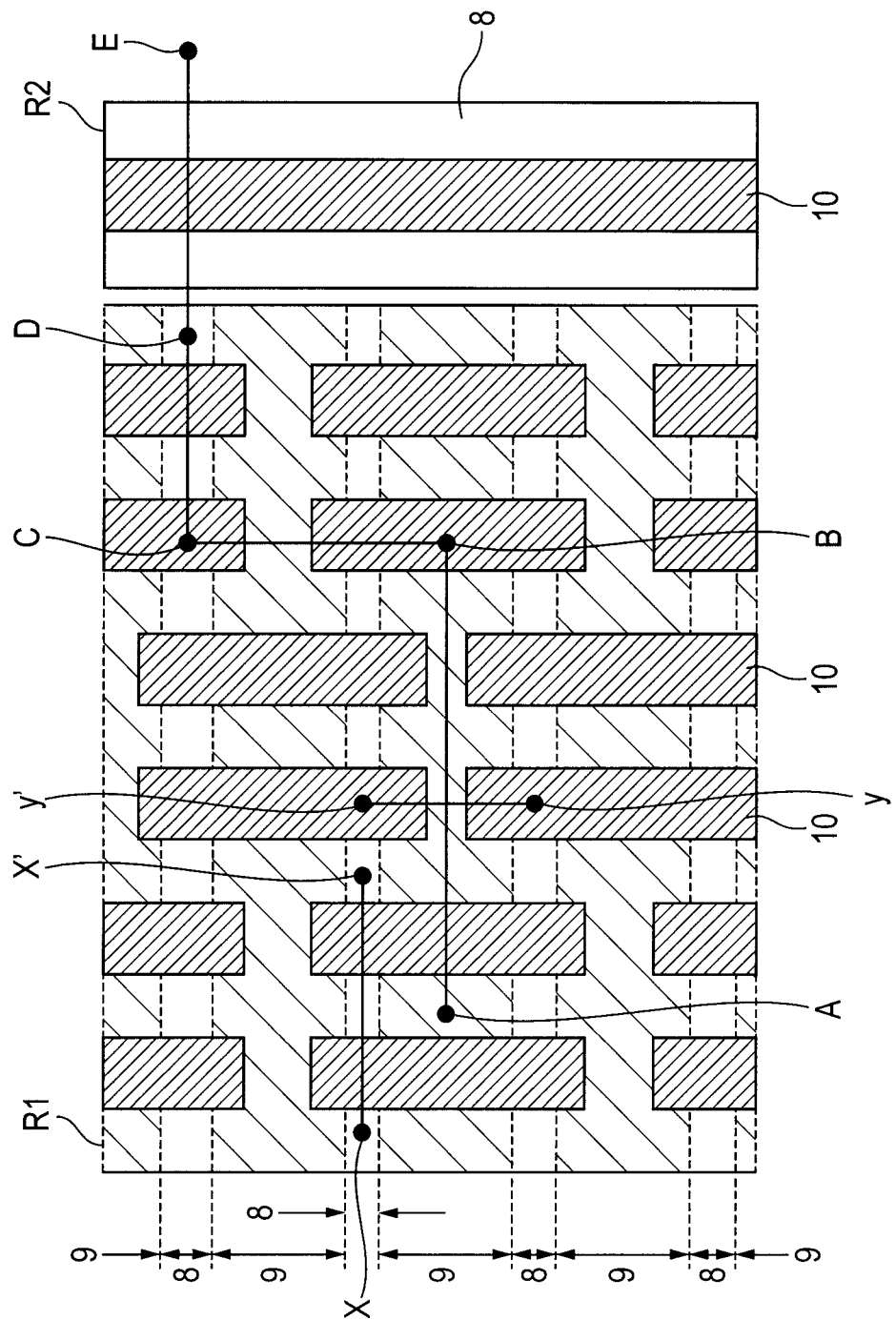
FIG. 76 is a top view (at the completion of etching of a dummy gate electrode film) of the cut-away portion R1 from the memory region and the cut-away portion R2 from the non-memory region of FIG. 69, which is for illustrating the outline of the dummy gate patterning process in the manufacturing method of the semiconductor integrated circuit device of the above embodiment of the third part of the present invention.
Figure 77:
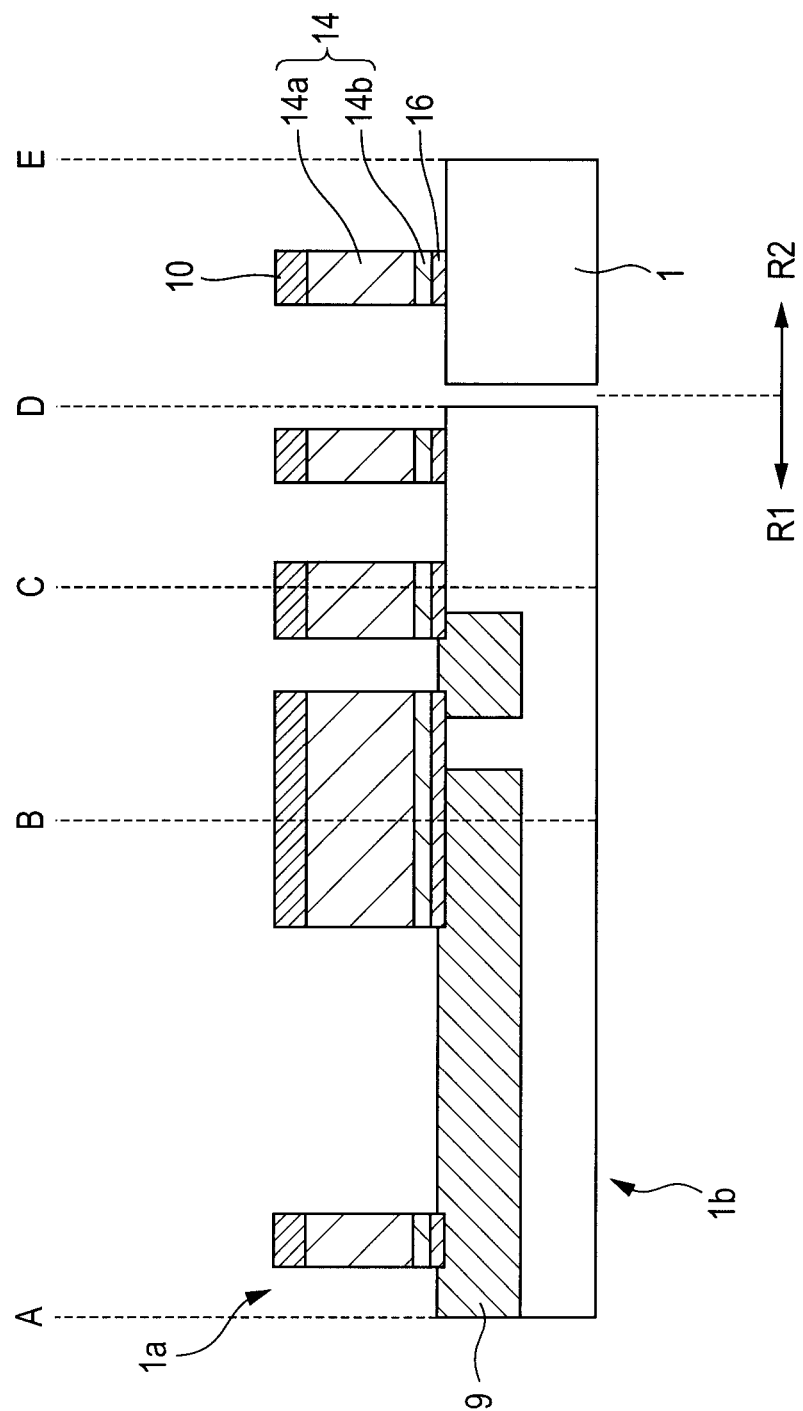
FIG. 77 is a device cross-sectional view (at the completion of the etching of the dummy gate electrode film) corresponding to the A-B-C-D-E cross section of FIG. 76, which is for illustrating the details of the dummy gate patterning process in the manufacturing method of the semiconductor integrated circuit device of the above embodiment of the third part of the present invention.

FIG. 70 is a top view (at the completion of patterning of a resist film for the patterning of cut regions between adjacent gate or dummy gate electrodes) of a cut-away portion R1 from the memory region and a cut-away portion R2 from the non-memory region of FIG. 69, which is for illustrating the outline of a dummy gate patterning process in the manufacturing method of the semiconductor integrated circuit device of the above embodiment of the present invention. FIG. 71 is a device cross-sectional view (at the completion of patterning of the resist film for the patterning of the cut regions between adjacent gate or dummy gate electrodes) corresponding to the A-B-C-D-E cross section of FIG. 70, which is for illustrating the details of the dummy gate patterning process in the manufacturing method of the semiconductor integrated circuit device of the above embodiment of the third part of the present invention. FIG. 72 is a top view (at the completion of etching of a hard mask for processing the cut regions between adjacent gate or dummy gate electrodes) of the cut-away portion R1 from the memory region and the cut-away portion R2 from the non-memory region of FIG. 69, which is for illustrating the outline of the dummy gate patterning process in the manufacturing method of the semiconductor integrated circuit device of the above embodiment of the third part of the present invention. FIG. 73 is a device cross-sectional view (at the completion of etching of the hard mask for processing the cut regions between adjacent gate or dummy gate electrodes) corresponding to the A-B-C-D-E cross section of FIG. 72, which is for illustrating the details of the dummy gate patterning process in the manufacturing method of the semiconductor integrated circuit device of the above embodiment of the third part of the present invention. FIG. 74 is a top view (at the completion of patterning of a resist film for dummy gate electrode patterning) of the cut-away portion R1 from the memory region and the cut-away portion R2 from the non-memory region of FIG. 69, which is for illustrating the outline of the dummy gate patterning process in the manufacturing method of the semiconductor integrated circuit device of the above embodiment of the third part of the present invention. FIG. 75 is a device cross-sectional view (at the completion of patterning of the resist film for dummy gate electrode patterning) corresponding to the A-B-C-D-E cross section of FIG. 74, which is for illustrating the details of the dummy gate patterning process in the manufacturing method of the semiconductor integrated circuit device of the above embodiment of the third part of the present invention. FIG. 76 is a top view (at the completion of etching of a dummy gate electrode film) of the cut-away portion R1 from the memory region and the cut-away portion R2 from the non-memory region of FIG. 69, which is for illustrating the outline of the dummy gate patterning process in the manufacturing method of the semiconductor integrated circuit device of the above embodiment of the third part of the present invention. FIG. 77 is a device cross-sectional view (at the completion of the etching of the dummy gate electrode film) corresponding to the A-B-C-D-E cross section of FIG. 76, which is for illustrating the details of the dummy gate patterning process in the manufacturing method of the semiconductor integrated circuit device of the above embodiment of the third part of the present invention. Based on these drawings, a description will be given to the outline of the gate patterning process in the manufacturing method of the semiconductor integrated circuit device of the above embodiment of the present invention.

First, the wafer 1 prior to processing of the gate electrode film is provided (see FIGS. 70 and 71). This is performed, for example, as follows. For example, the P-type single-crystal silicon wafer 1 is provided and, in the device main surface 1a (main surface opposite to a back surface 1b), isolation regions 9 such as, e.g., STI (Shallow Trench Isolation) are formed. Subsequently, in active regions 8, required impurity doped regions such as well regions are formed.

Further, over substantially the entire device main surface 1a (first main surface) of the wafer 1, a High-k gate insulating film 16 (gate insulating film including a High-k gate insulating film) is deposited. Here, the "High-k gate insulating film" indicates a gate insulating film having a dielectric constant higher than that of a related-art gate insulating film (a silicon oxide film, a silicon oxynitride film, a silicon nitride film, or a laminate film thereof) including a silicon oxide film as a main film component).

Next, over substantially the entire upper surface of the High-k gate insulating film 16, a lower-layer film 14b of the dummy gate electrode film, such as, e.g., a titanium nitride film, is deposited.

Next, over substantially the entire upper surface of the titanium nitride film 14b, e.g., a polysilicon film 14a (which may also be an amorphous silicon film) as an upper-layer film of the dummy gate electrode film is deposited.

Next, over substantially the entire upper surface of the polysilicon film 14a, a hard mask film 10 for dummy gate processing formed of a silicon nitride film or the like is formed.

Next, over substantially the entire upper surface of the hard mask film 10 for dummy gate processing, a multilayer resist film 11 (first resist film) for the patterning of the cut regions between adjacent gate electrodes is formed by coating or the like. The multilayer resist film 11 includes a carbon-based non-photosensitive lower-layer film 11c (lower-layer film) such as a SOC (Spin On Carbon) film, a silicon-based non-photosensitive middle-layer film 11b (middle-layer film) such as a Si-BARC (Silicon-Bottom Anti-Reflection Coating) film, an organic photosensitive upper-layer film 11a (upper-layer film) such as an ArF chemically amplified resist film, and the like. The Si-BARC film is a coated or CVD deposited antireflection film containing silicon as one of main components (the content of silicon is in a range of, e.g., about 15 wt % to 45 wt %, which is also the same in the following second resist film). The SOC film is a coated or CVD deposited (a CVD deposited carbon-based film is called an amorphous carbon film) underlying film (film having an etching selectivity to a silicon-based member) containing carbon as one of main components (the content of carbon is in a range of, e.g., about 80 wt % to 90 wt %, which is also the same in the following second resist film).

Next, as shown in FIGS. 70 and 71, exposure to light and development of the ArF chemically amplified resist film 11a are performed to form resist film openings 12 corresponding to the cut regions between adjacent gate or dummy gate electrodes. The exposure using ArF excimer laser light (at a wavelength of 193 nm) is performed using, e.g., an optical mask and an immersion projection lithography stepper (immersion scanner). Here, the width (equivalent to the length of a shorter side) of each of the resist film openings 12 is, e.g., about 60 to nm and on the same order as the width of each of the isolation regions, which is reduced to, e.g., about 20 to 25 nm by a shrinkage treatment described later.

Subsequently, the pattern of the ArF chemically amplified resist film 11a (upper-layer film) of the multilayer resist film 11 is successively transferred onto the Si-BARC film 11b (middle-layer film) and the SOC film 11c (lower-layer film) (the details of which will be described in Section 3).

Next, as shown in FIGS. 72 and 73, by dry etching using the patterned resist film 11 for the patterning of the cut regions between adjacent gate or dummy gate electrodes as a mask, the hard mask film 10 for dummy gate processing is processed to open portions corresponding to the cut regions 12 between adjacent gate or dummy gate electrodes. Thereafter, the remaining resist film 11 for the patterning of the cut regions between adjacent gate or dummy gate electrodes is entirely removed by ashing or the like.

Next, as shown in FIGS. 74 and 75, in the same manner as described above, a resist film 15 (second resist film) for dummy gate electrode patterning is formed over substantially the entire device main surface 1a (first main surface) of the wafer 1 by, e.g., coating or the like. The multilayer resist film 15 includes a carbon-based non-photosensitive lower-layer film 15c (lower-layer film) such as a SOC film, a silicon-based non-photosensitive middle-layer film 15b (middle-layer film) such as a Si-BARC film, an organic photosensitive upper-layer film 15a (upper-layer film) such as an ArF chemically amplified resist film, and the like. Here, in the same manner as described above, exposure to light and development of the ArF chemically amplified resist film 15a are performed to form the resist film pattern 15a corresponding to the line & space pattern of the dummy gate electrodes. In the same manner as described above, the exposure using ArF excimer laser light (at a wavelength of 193 nm) is performed using, e.g., an optical mask and an immersion projection lithography stepper (immersion scanner). Here, the width of the resist film pattern 15a corresponding to the line & space pattern of the dummy gate electrodes is, e.g., about 45 nm at the beginning of patterning, which is reduced to, e.g., about 30 nm by a trimming treatment described below. Note that, in terms of planarization, the carbon-based lower-layer film in this step is preferably a coated planar film such as a SOC film.

Subsequently, the pattern of the ArF chemically amplified resist film 15a (upper-layer film) of the multilayer resist film 15 is successively transferred onto the Si-BARC film 15b (middle-layer film) and the SOC film 15c (lower-layer film) (the details of which will be described in Section 3).

Next, as mentioned in Section 3 described later, by dry etching using the patterned multilayer resist film 15 (second resist film) for dummy gate electrode patterning as a mask, the hard mask film 10 for dummy gate processing is processed. Thereafter, the remaining resist film 15 for dummy gate electrode patterning is entirely removed by ashing or the like.

Next, as shown in FIGS. 76 and 77, by dry etching using the patterned hard mask 10 for dummy gate processing as a mask, the dummy gate electrode film 14 (including the polysilicon film 14a and the titanium nitride film 14b) and the High-k gate insulating film 16 are processed to form the dummy gate electrodes 14.

3. Detailed Description of Gate Patterning Process in Manufacturing Method of Semiconductor Integrated Circuit Device of Above Embodiment of Present Invention (See Mainly FIGS. 78 to 90)

Figure 78:
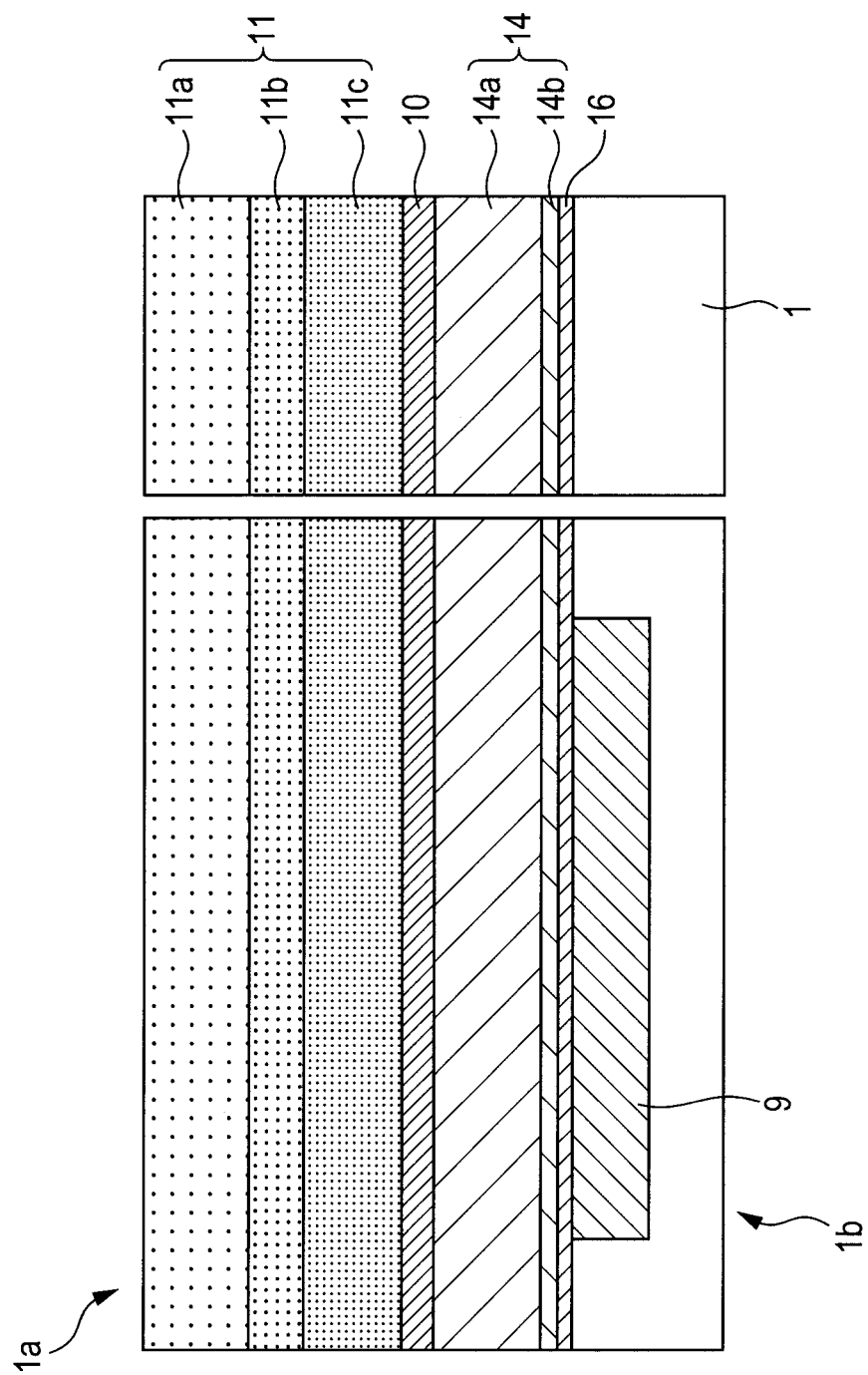
FIG. 78 is a device cross-sectional view (at the completion of formation of the resist film for the patterning of the cut regions between adjacent gate or dummy gate electrodes) along a Y-Y' cross section and a D-E cross section each corresponding to a process flow from FIG. 70 to FIG. 76, which is for illustrating a detailed step of the dummy gate patterning process in the manufacturing method of the semiconductor integrated circuit device of the above embodiment of the third part of the present invention.
Figure 79:
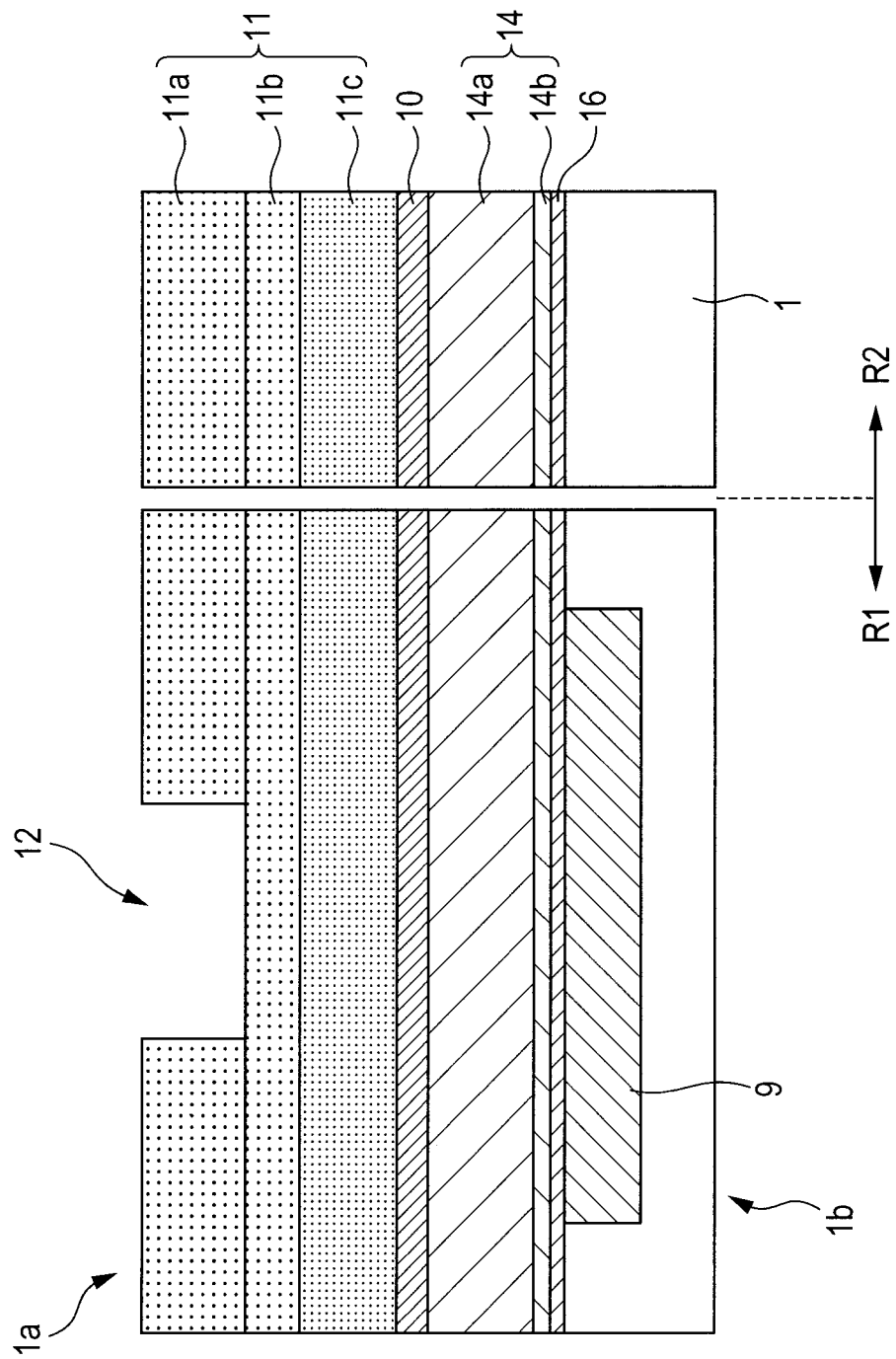
FIG. 79 is a device cross-sectional view (at the completion of patterning of an upper-layer film of a multilayer resist film for the patterning of the cut regions between adjacent gate or dummy gate electrodes) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention.
Figure 80:
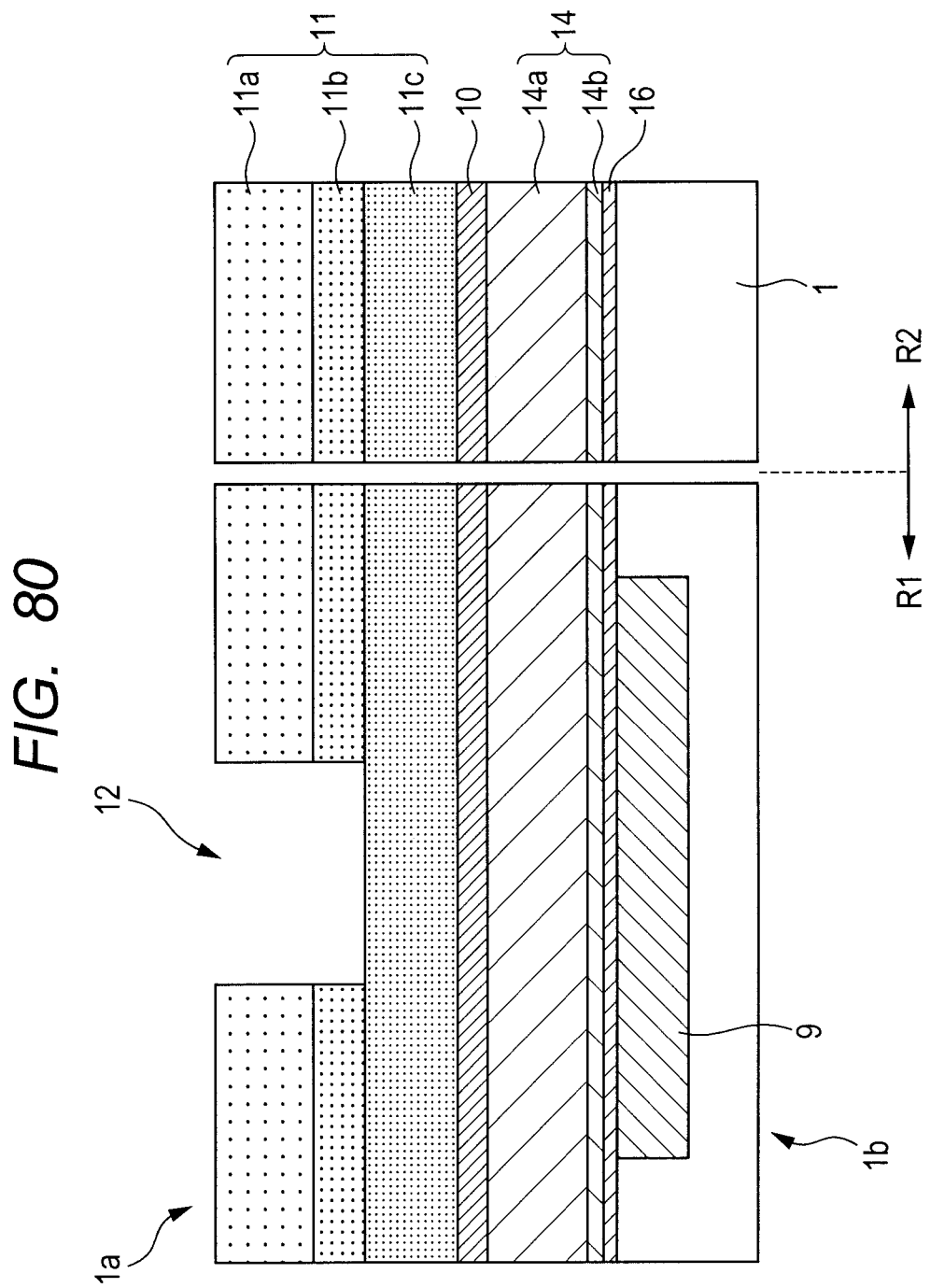
FIG. 80 is a device cross-sectional view (at the completion of etching of a middle-layer film of the multilayer resist film for the patterning of the cut regions between adjacent gate or dummy gate electrodes) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention.
Figure 81:
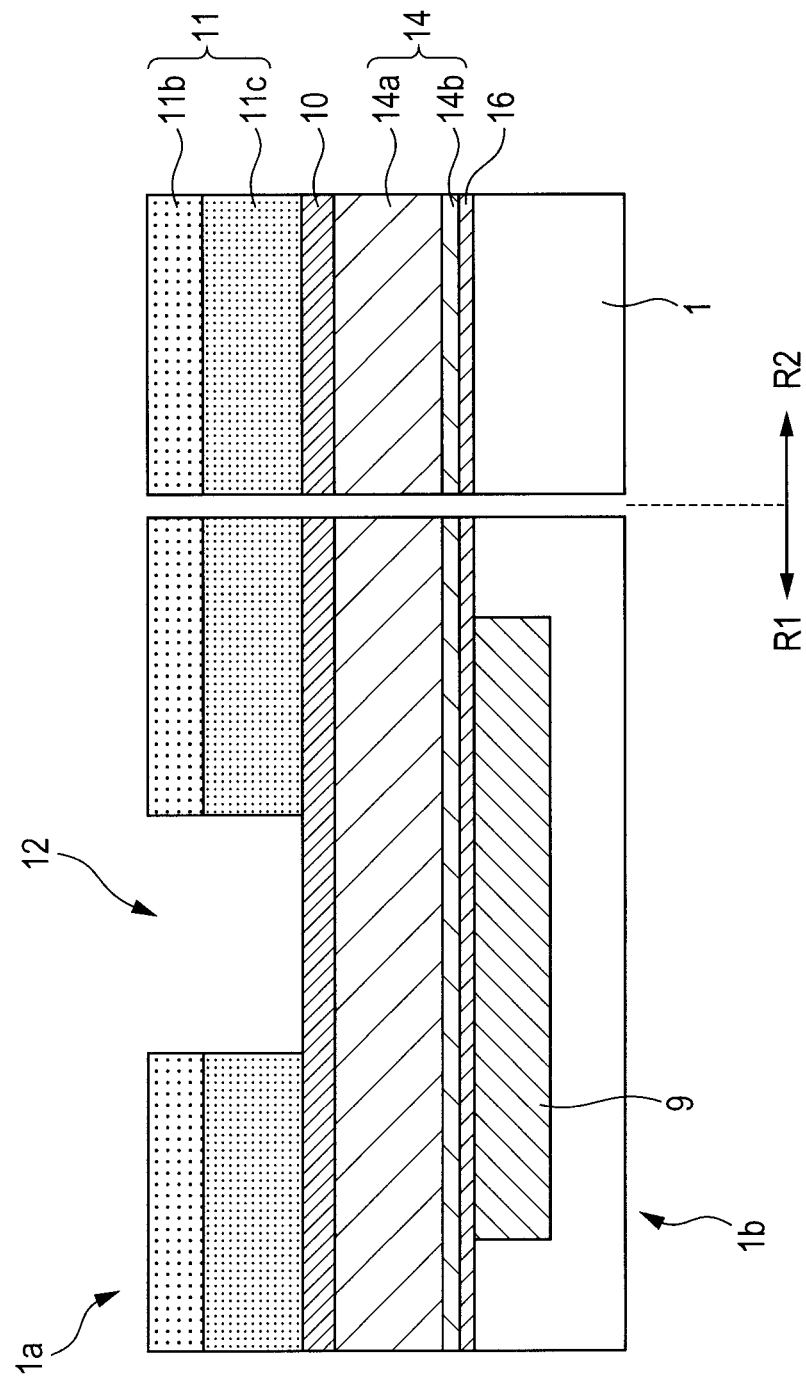
FIG. 81 is a device cross-sectional view (at the completion of etching of a lower-layer film of the multilayer resist film for the patterning of the cut regions between adjacent gate or dummy gate electrodes) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention.
Figure 82:
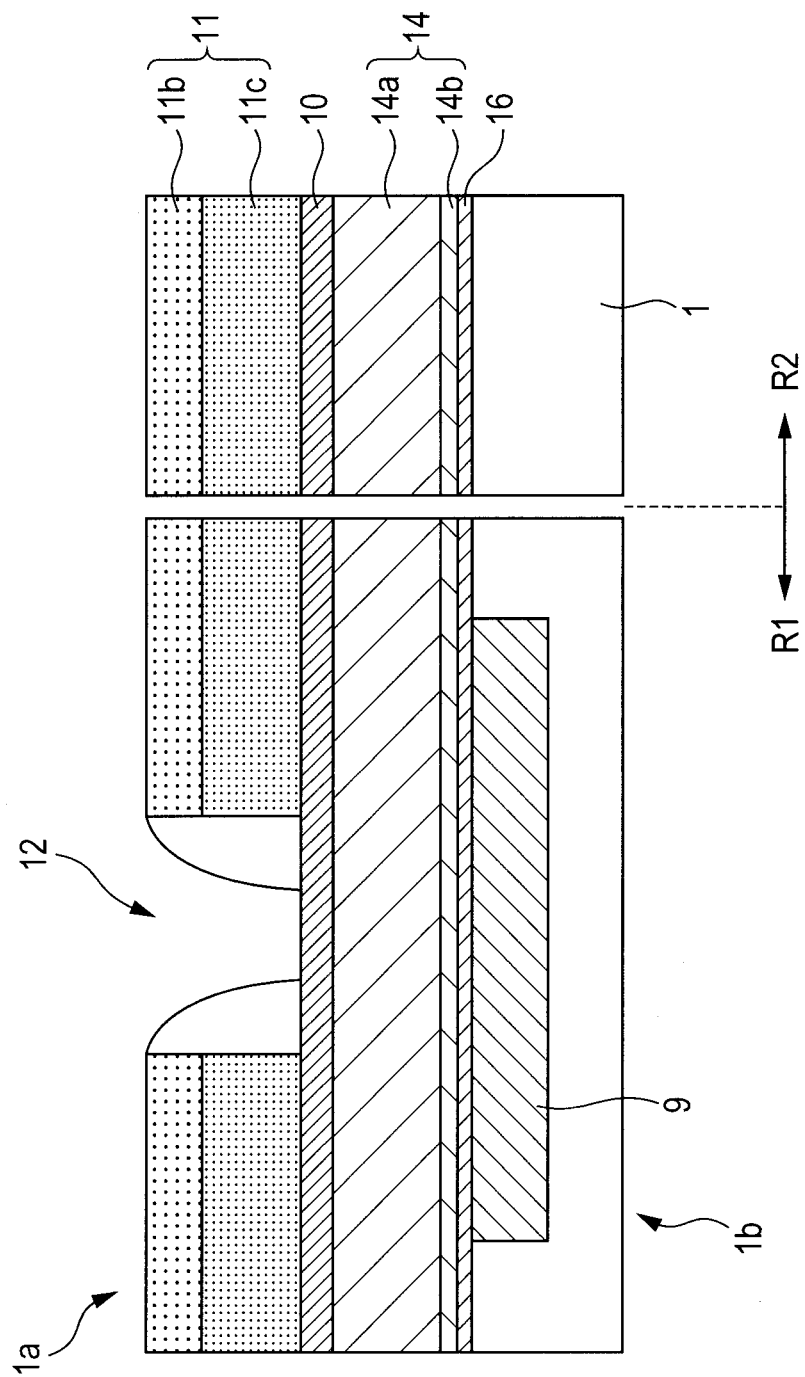
FIG. 82 is a device cross-sectional view (at the completion of a shrinkage step for processing the dummy gate electrode film and the like) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention.
Figure 83:
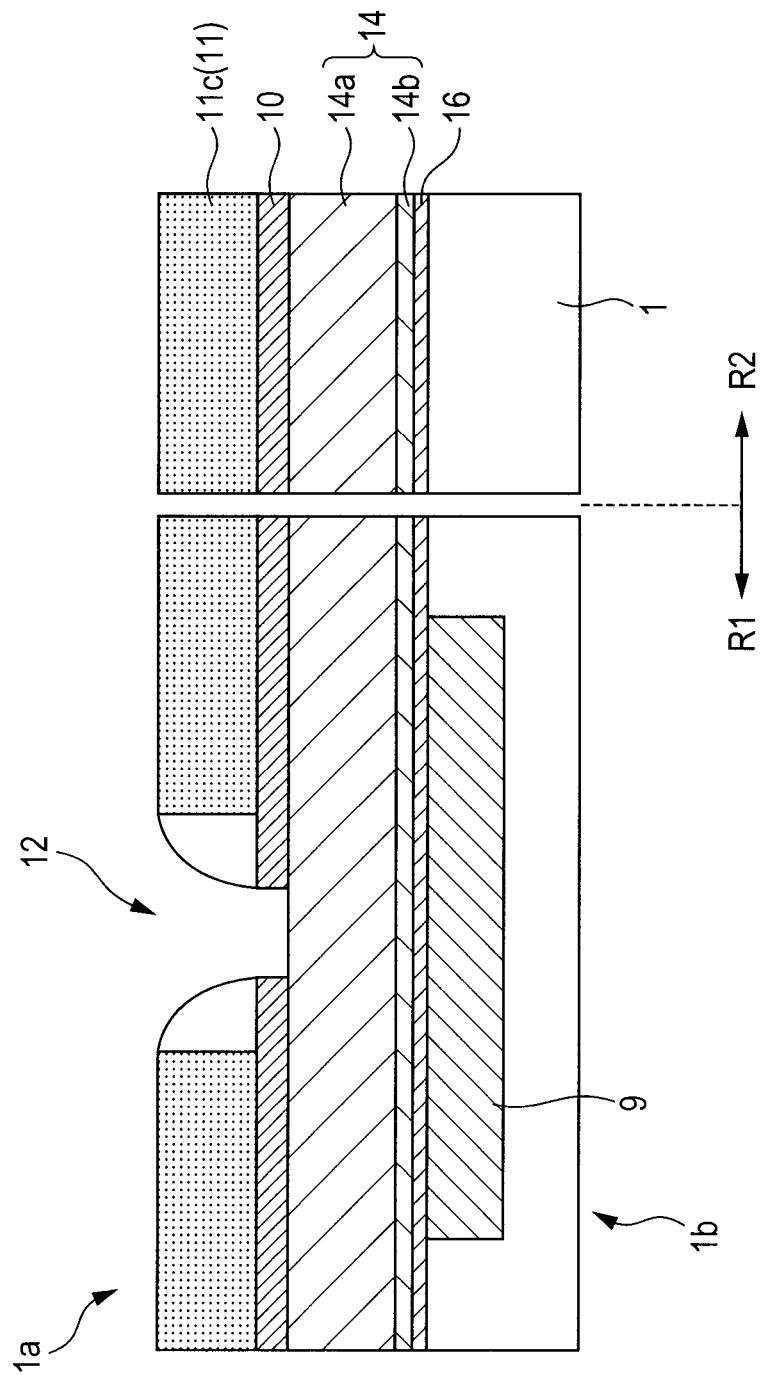
FIG. 83 is a device cross-sectional view (at the completion of a primary etching step for a hard mask film for dummy gate processing) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention.
Figure 84:
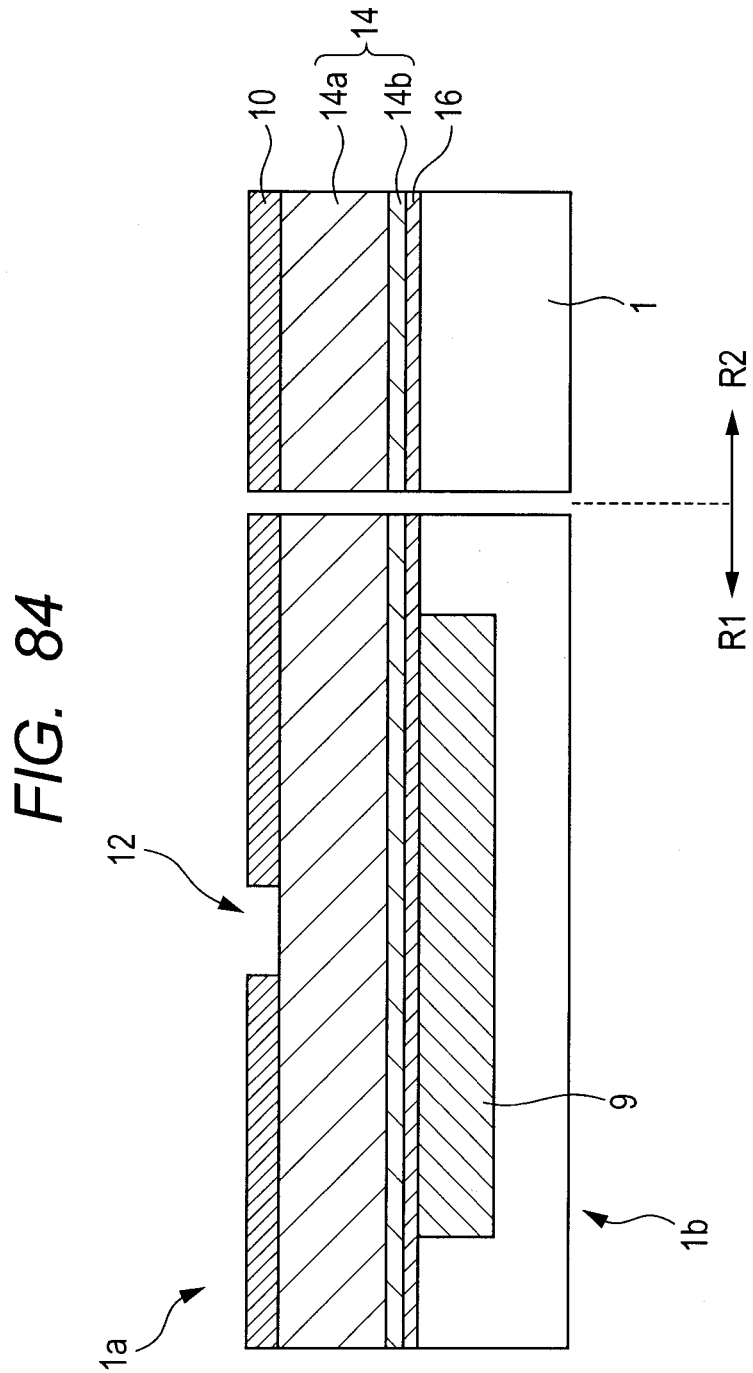
FIG. 84 is a device cross-sectional view (at the completion of removal of the lower-layer film of the multilayer resist film for the patterning of the cut regions between adjacent gate or dummy gate electrodes) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention.
Figure 85:
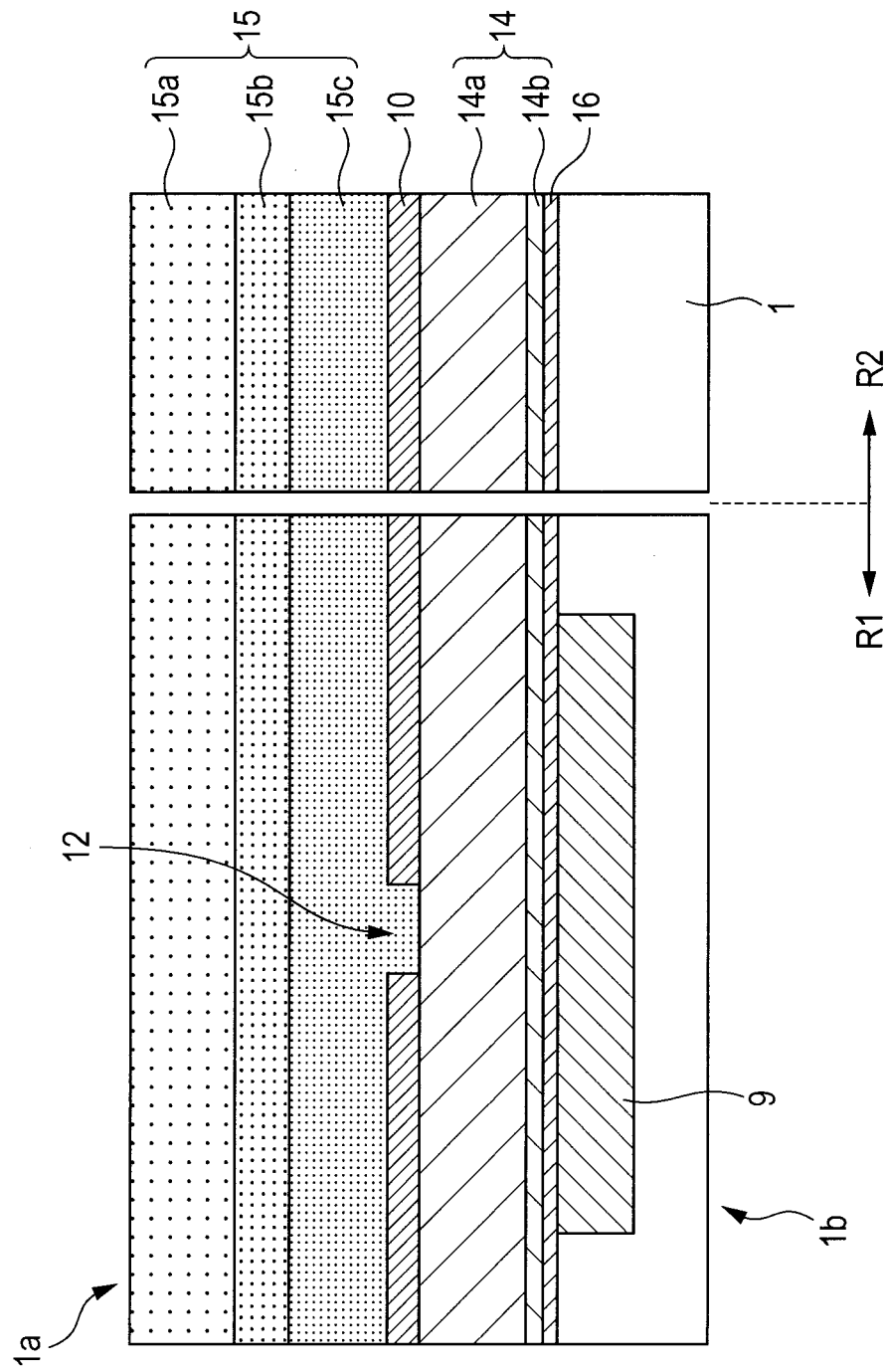
FIG. 85 is a device cross-sectional view (at the completion of coating of a resist film for secondary dummy gate electrode patterning) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention.
Figure 86:
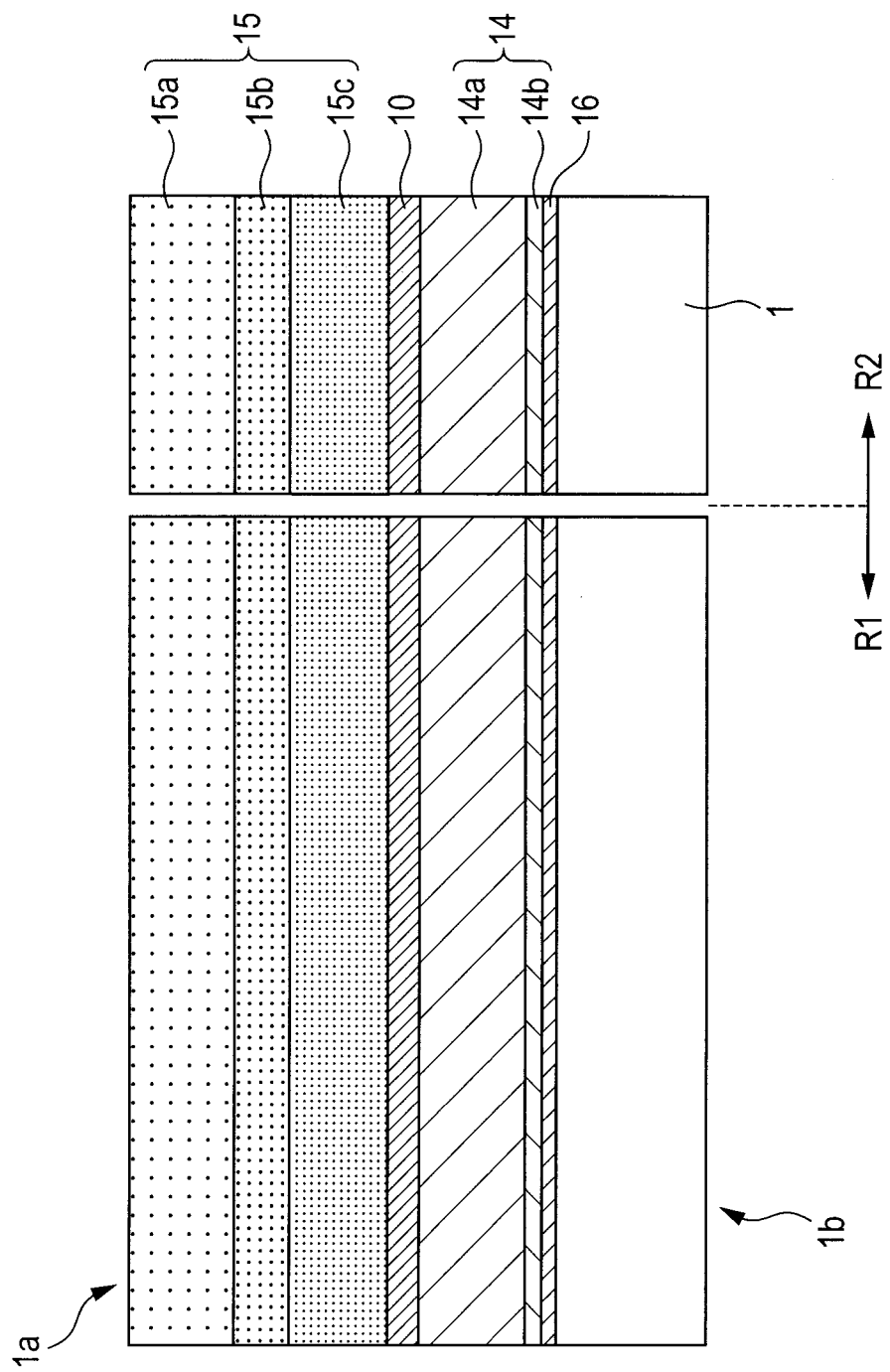
FIG. 86 is a device cross-sectional view (the same as FIG. 85, i.e., at the completion of coating of the resist film for secondary gate electrode patterning) along the X-X' cross section and the D-E cross section each corresponding to the process flow from FIG. 70 to FIG. 76, which is for illustrating a detailed step of the gate patterning process in the manufacturing method of the semiconductor integrated circuit device of the above embodiment of the third part of the present invention.
Figure 87:
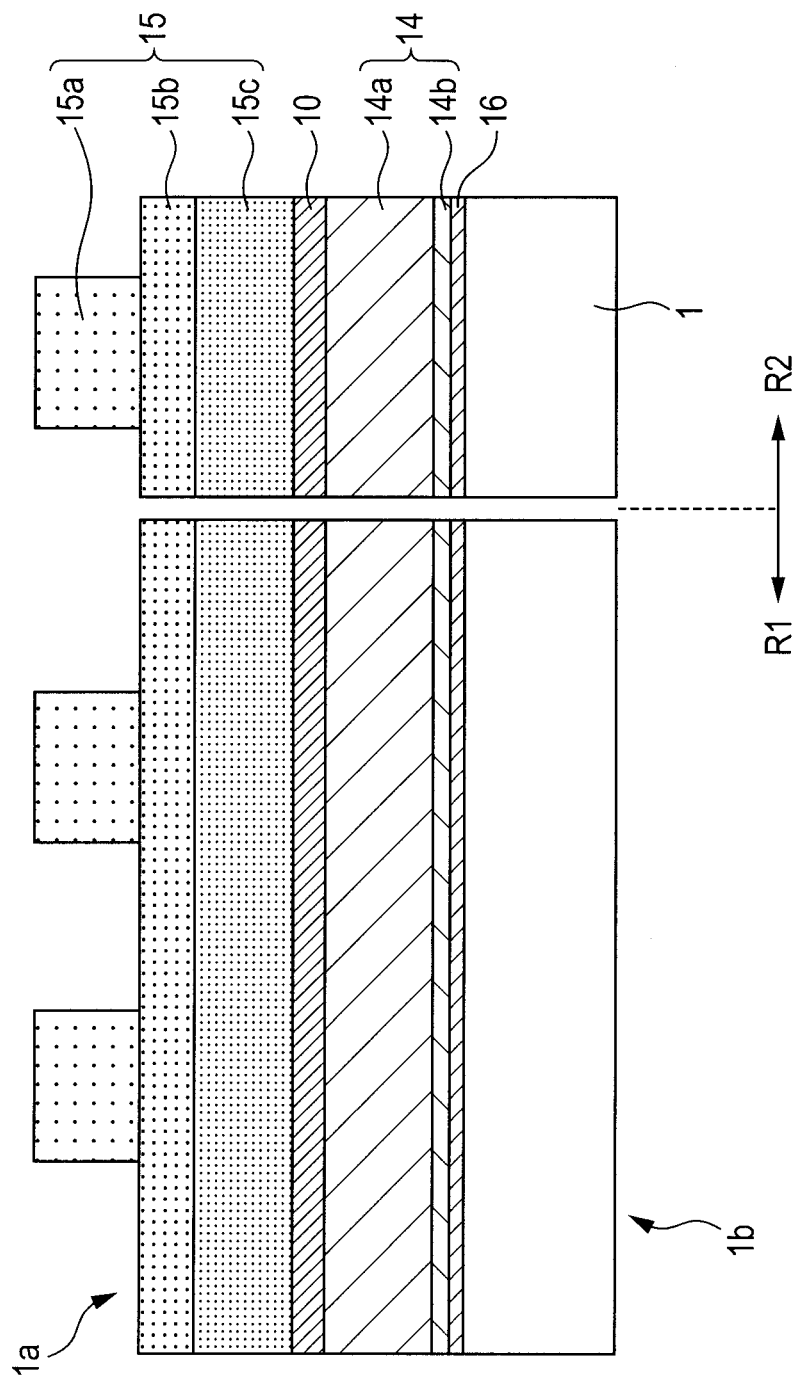
FIG. 87 is a device cross-sectional view (at the completion of development of an upper-layer film of a multilayer resist film for secondary dummy gate electrode patterning) along the X-X' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention.
Figure 88:
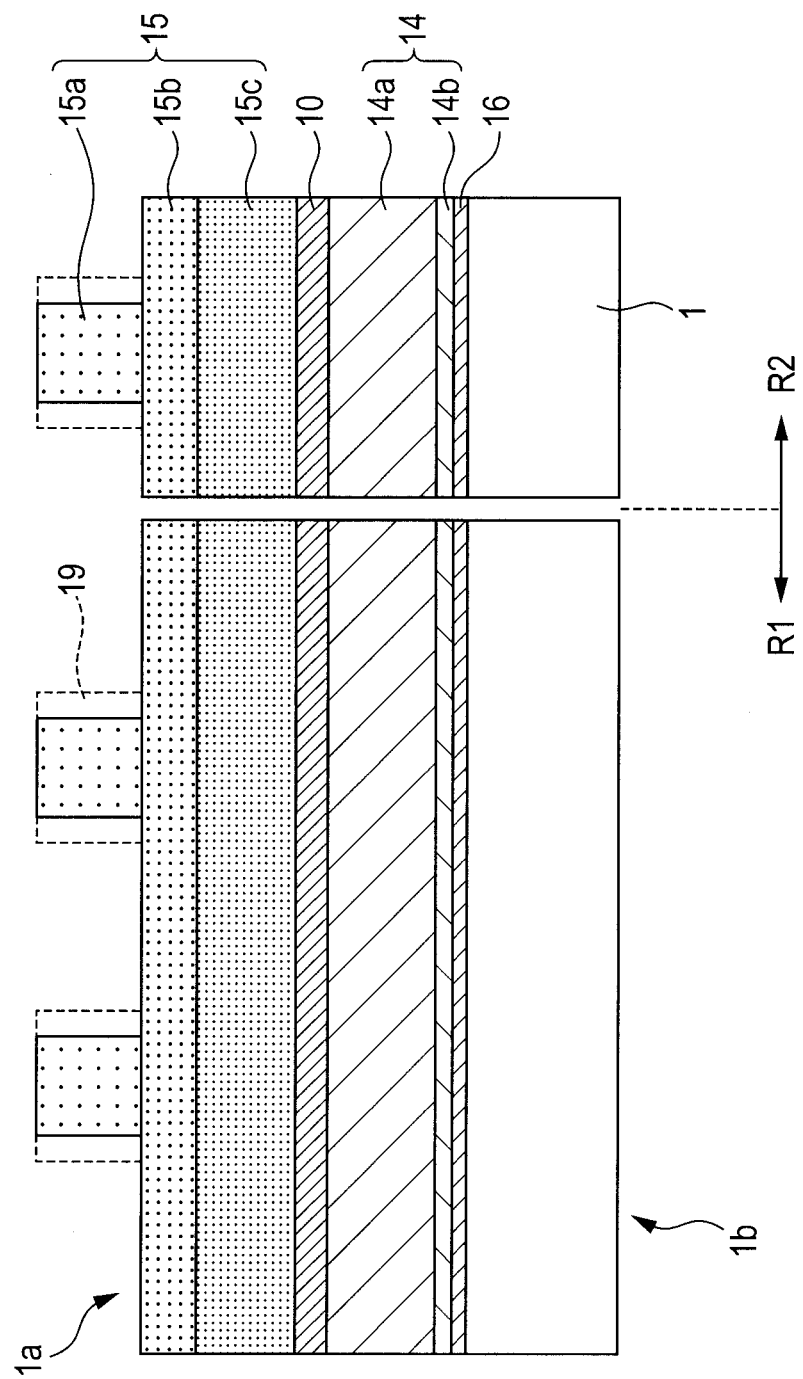
FIG. 88 is a device cross-sectional view (at the completion of trimming of the upper-layer film of the multilayer resist film for dummy gate electrode patterning) along the X-X' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention.
Figure 89:
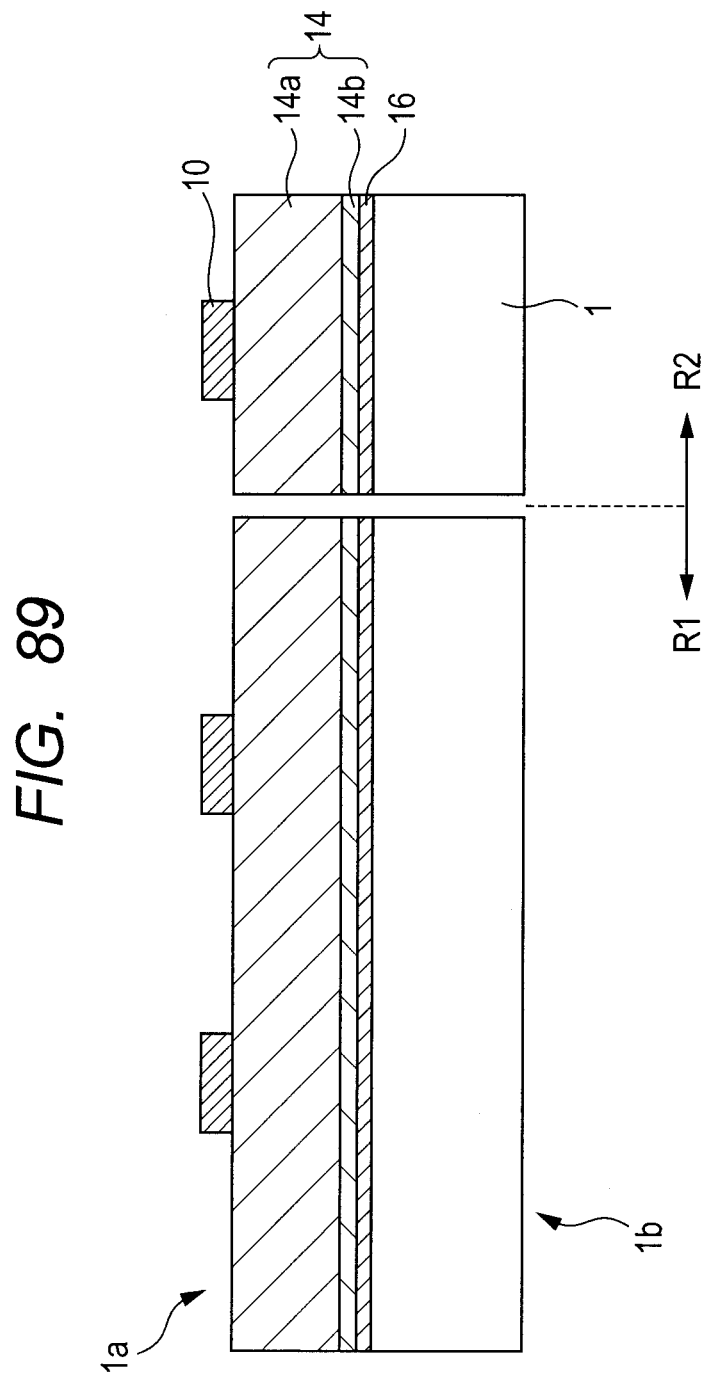
FIG. 89 is a device cross-sectional view (at the completion of primary etching of the hard mask film for dummy gate processing & the completion of removal of the lower-layer film of the multilayer resist film) along the X-X' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention.
Figure 90:
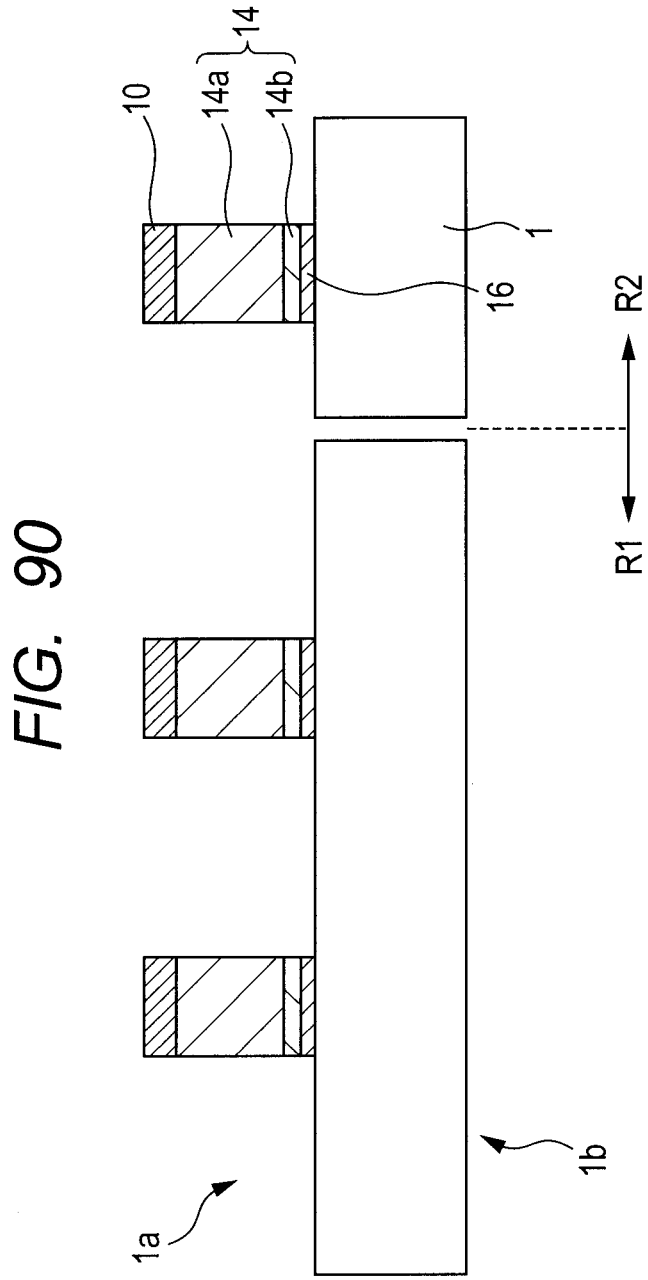
FIG. 90 is a device cross-sectional view (at the completion of dummy gate electrode patterning & the completion of removal of the lower-layer film of the multilayer resist film) along the X-X' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention.

FIG. 78 is a device cross-sectional view (at the completion of formation of the resist film for the patterning of the cut regions between adjacent gate or dummy gate electrodes) along a Y-Y' cross section and a D-E cross section each corresponding to a process flow from FIG. 70 to FIG. 76, which is for illustrating a detailed step of the dummy gate patterning process in the manufacturing method of the semiconductor integrated circuit device of the above embodiment of the third part of the present invention. FIG. 79 is a device cross-sectional view (at the completion of patterning of an upper-layer film of a multilayer resist film for the patterning of the cut regions between adjacent gate or dummy gate electrodes) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention. FIG. 80 is a device cross-sectional view (at the completion of etching of a middle-layer film of the multilayer resist film for the patterning of the cut regions between adjacent gate or dummy gate electrodes) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention. FIG. 81 is a device cross-sectional view (at the completion of etching of a lower-layer film of the multilayer resist film for the patterning of the cut regions between adjacent gate or dummy gate electrodes) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention. FIG. 82 is a device cross-sectional view (at the completion of a shrinkage step for processing the dummy gate electrode film and the like) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention. FIG. 83 is a device cross-sectional view (at the completion of a primary etching step for a hard mask film for dummy gate processing) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention. FIG. 84 is a device cross-sectional view (at the completion of removal of the lower-layer film of the multilayer resist film for the patterning of the cut regions between adjacent gate or dummy gate electrodes) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention. FIG. 85 is a device cross-sectional view (at the completion of coating of a resist film for secondary dummy gate electrode patterning) along the Y-Y' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention. FIG. 86 is a device cross-sectional view (the same as FIG. 85, i.e., at the completion of coating of the resist film for secondary gate electrode patterning) along the X-X' cross section and the D-E cross section each corresponding to the process flow from FIG. 70 to FIG. 76, which is for illustrating a detailed step of the gate patterning process in the manufacturing method of the semiconductor integrated circuit device of the above embodiment of the third part of the present invention. FIG. 87 is a device cross-sectional view (at the completion of development of an upper-layer film of a multilayer resist film for secondary dummy gate electrode patterning) along the X-X' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention. FIG. 88 is a device cross-sectional view (at the completion of trimming of the upper-layer film of the multilayer resist film for dummy gate electrode patterning) along the X-X' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention. FIG. 89 is a device cross-sectional view (at the completion of primary etching of the hard mask film for dummy gate processing & the completion of removal of the lower-layer film of the multilayer resist film) along the X-X' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention. FIG. 90 is a device cross-sectional view (at the completion of dummy gate electrode patterning & the completion of removal of the lower-layer film of the multilayer resist) along the X-X' cross section and the D-E cross section each corresponding to the process flow from FIG. 70 to FIG. 76, which is for illustrating a detailed step of the dummy gate patterning process in the manufacturing method of the semiconductor integrated circuit device of the above embodiment of the third part of the present invention. Based on these drawings, a description will be given to the details of the gate patterning process in the manufacturing method of the semiconductor integrated circuit device of the above embodiment of the present invention.

As shown in FIG. 78, e.g., the P-type single-crystal silicon wafer 1 is provided and, in the device main surface 1a, the isolation regions 9 such as, e.g., STI are formed. Subsequently, in the active regions 8, required impurity doped regions such as well regions are formed.

Further, over substantially the entire device main surface 1a (first main surface) of the wafer 1, a High-k gate insulating film 16 (gate insulating film including a High-k gate insulating film) is deposited. As an example of the High-k gate insulating film 16, a hafnium-oxide-based insulating film having a thickness of, e.g., about 0.7 to 1.5 nm can be shown.

Next, over substantially the entire upper surface of the High-k gate insulating film 16, the lower-layer film 14b of the dummy gate electrode film, such as, e.g., a titanium nitride film (having a thickness of, e.g., about 10 nm) is deposited.

Next, as the upper-layer film of the dummy gate electrode film, the polysilicon film 14a (which may also be, e.g., an amorphous silicon film) having a thickness of, e.g., about 50 nm is deposited over substantially the entire upper surface of the titanium nitride film 14b.

Next, over substantially the entire upper surface of the polysilicon film 14a, the multilayer resist film 11 (first resist film) for the patterning of the cut regions between adjacent gate or dummy gate electrodes is formed by coating or the like. For example, the multi-layer resist film 11 is formed as follows. That is, over substantially the entire upper surface of the polysilicon film 14a, the carbon-based non-photosensitive lower-layer film 11c (lower-layer film) such as a SOC film (having a thickness of, e.g., about 100 to 300 nm) is formed first by coating or the like. Note that the carbon-based non-photosensitive lower-layer film 11c may also be an amorphous carbon film deposited by CVD (Chemical Vapor Deposition) or the like. Subsequently, over substantially the entire upper surface of the SOC film 11c, the silicon-based non-photosensitive middle-layer film 11b (middle-layer film) such as, e.g., a Si-BARC film (having a thickness of, e.g., about 10 to 100 nm) is formed by coating or the like. Subsequently, over substantially the entire upper surface of the Si-BARC film 11b, the organic photosensitive upper-layer film 11a (upper-layer film) such as, e.g., an ArF chemically amplified resist film (having a thickness of, e.g., about 50 to 180 nm) is formed by coating or the like.

Next, as shown in FIG. 79, exposure to light and development of the ArF chemically amplified resist film 11a are performed to form each of the resist film openings 12 corresponding to the cut regions between adjacent gate or dummy gate electrodes. The exposure using ArF excimer laser light (at a wavelength of 193 nm) is performed using, e.g., an optical mask and an immersion projection lithography stepper (immersion scanner).

Next, as shown in FIG. 80, using the patterned ArF chemically amplified resist film 11a as a mask, the pattern of the ArF chemically amplified resist film 11a is transferred onto the Si-BARC film 11b by dry etching using a Fluorocarbon-based gas (such as, e.g., $CF_4$).

Next, as shown in FIG. 81, using the patterned Si-BARC film 11b as a mask, the pattern of the Si-BARC film 11b is transferred onto the SOC film 11c by dry etching using, e.g., an oxygen-based gas (such as, e.g., $O_2$). At this time, the remaining ArF chemically amplified resist film 11a is removed simultaneously.

Next, as shown in FIG. 82, in a state where the wafer 1 has been introduced into the etching chamber of a dry etching apparatus for etching, e.g., the hard mask film 10 for dummy gate processing, a pre-etching treatment (shrinkage treatment) is performed (a kind of dry etching treatment). That is, sidewalls 18 for shrinkage are formed over the side walls of each of the resist film openings 12. Examples of conditions for the shrinkage treatment that can be shown include a gas atmosphere of, e.g., $CHF_3$ (100 to 300 sccm)/$O_2$ (10 to 50 sccm), an RF power of, e.g., about 500 to 1000 W, a wafer bias of 100 to 300 V, and a wafer stage temperature of about 10 to 50° C.

Next, as shown in FIG. 83, by dry etching using the patterned SOC film 11c as a mask, the hard mask film 10 for dummy gate processing is patterned. At this time, the remaining Si-BARC film 11b is removed simultaneously.

Next, as shown in FIG. 84, the remaining resist film 11 for the patterning of the cut regions between dummy gate electrodes and the like are entirely removed by ashing or the like. That is, the SOC film 11c and the sidewalls 18 for shrinkage are removed by an ashing treatment and wet cleaning or the like. Preferred examples of conditions for the wet cleaning that can be shown are such that: (1) in a first step, a chemical solution is a diluted hydrochloric acid having a composition in which a hydrogen chloride concentration is about 0.0418 mol %, a processing time is about 60 seconds, and a processing temperature is a room temperature (15 to 25° C.); and (2) in a second step, a chemical solution is a mixed acid having a composition in which a hydrogen chloride concentration is about 0.411 mol % and a hydrogen fluoride concentration is about 0.0106 mol %, a processing time is about 60 seconds, and a processing temperature is a room temperature (15 to 25° C.).

Next, as shown in FIGS. 85 and 86, over substantially the entire device main surface 1a (first main surface) of the wafer 1, the multi-layer resist film 15 (second resist film) for dummy gate electrode patterning is formed by coating or the like. For example, the multilayer resist film 15 is formed as follows. That is, over substantially the entire device surface 1a of the wafer 1, the carbon-based non-photosensitive lower-layer film 15c (lower-layer film) such as a SOC film (having a thickness of, e.g., about 100 to 300 nm) is formed first by coating or the like. Subsequently, over substantially the entire upper surface of the SOC film 15c, the silicon-based non-photosensitive middle-layer film 15b (middle-layer film) such as, e.g., a Si-BARC film (having a thickness of, e.g., about 10 to 100 nm) is formed by coating or the like. Subsequently, over substantially the entire upper surface of the Si-BARC film 15b, e.g., the organic photosensitive upper-layer film 15a (upper-layer film) such as, e.g., an ArF chemically amplified resist film (having a thickness of, e.g., about 50 to 180 nm) is formed by coating or the like.

Next, as shown in FIG. 87, exposure to light and development of the ArF chemically amplified resist film 15a are performed to form the resist film pattern 15 corresponding to the line & space pattern of the dummy gate electrodes. In the same manner as described above, the exposure using ArF excimer laser light (at a wavelength of 193 nm) is performed using, e.g., an optical mask and an immersion projection lithography stepper (immersion scanner).

Next, as shown in FIG. 88, the patterned resist film pattern 15a is subjected to a Trimming treatment such that the final resist film pattern 15a has a width smaller than a width 19 of the original resist film. The trimming treatment is the same treatment as dry etching, and is normally performed in the same apparatus or the same chamber as used in a subsequent etching process. Examples of an atmospheric gas for the trimming treatment that can be shown include, e.g., a $Cl_2/O_2$-based gas.

Next, as shown in FIG. 89, in the same manner as described above, the trimmed resist film pattern 15a is transferred successively to the Si-BARC film 15a (an etching atmosphere is, e.g., a $CF_4$-based gas atmosphere) and the SOC film 15c (an etching atmosphere is, e.g., an $O_2$-based gas atmosphere). Then, in the same manner as described above, by dry etching using the patterned SOC film 15c as a mask, the final patterning of the resist film 10 for the patterning of the cut regions between dummy gate electrodes is performed. At this time, the remaining Si-BARC film 15b is removed simultaneously. Thereafter, the SOC film 15c is removed by an ashing treatment or the like and wet cleaning. Preferred examples of conditions for the wet cleaning that can be shown are such that: (1) in a first step, a chemical solution is a diluted hydrochloric acid having a composition in which a hydrogen chloride concentration is about 0.0418 mol %, a processing time is about 60 seconds, and a processing temperature is a room temperature (15 to 25° C.); and (2) in a second step, a chemical solution is a mixed acid having a composition in which a hydrogen chloride concentration is about 0.411 mol % and a hydrogen fluoride concentration is about 0.0106 mol %, a processing time is about 60 seconds, and a processing temperature is a room temperature (15 to 25° C.).

Next, as shown in FIG. 90, by dry etching using the patterned resist film 10 for the patterning of the cut regions between dummy gate electrodes as a mask, the line & space pattern of the trimmed dummy gate electrodes and the cut regions 12 between adjacent gate or dummy gate electrodes are formed successively in the polysilicon film 14a (an etching atmosphere is, e.g., a $SF_6/CF_4$-based gas atmosphere), the titanium nitride film 14b (an etching atmosphere is, e.g., a $HBr/Cl_2$-based gas atmosphere), and the gate insulating film 16 (an etching atmosphere is, e.g., a $BCl_3/Cl_2$-based gas atmosphere).

4. Description of Outline of Main Process After Dummy Gate Patterning in Manufacturing Method of Semiconductor Integrated Circuit Device of Above Embodiment of Present Invention (See Mainly FIGS. 91 to 105)

Figure 91:
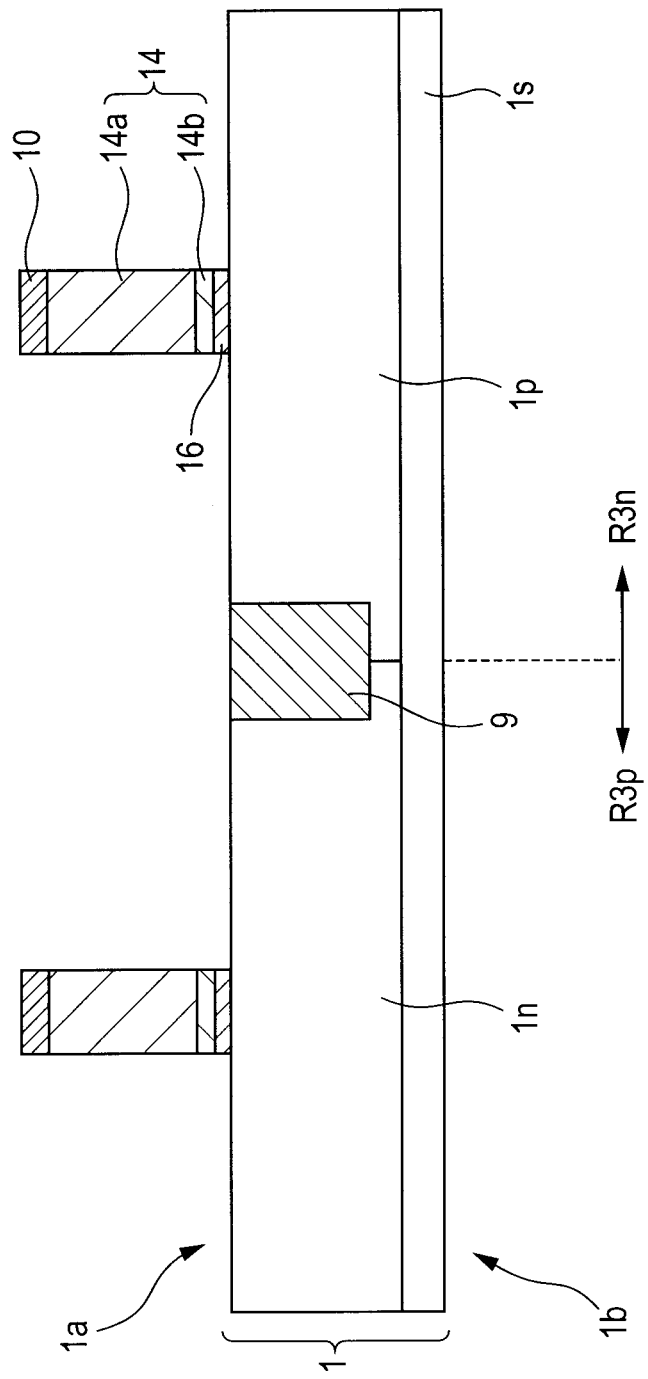
FIG. 91 is a schematic device cross-sectional view (the same as FIG. 90, i.e., at the completion of dummy gate electrode patterning & the completion of removal of the lower-layer film of the multilayer resist film) of a CMISFET pair cut-away portion R3 from the non-memory region of FIG. 69, which is for illustrating the outline of a main process after dummy gate processing in the manufacturing method of the semiconductor integrated circuit device of the above embodiment of the third part of the present invention.
Figure 92:
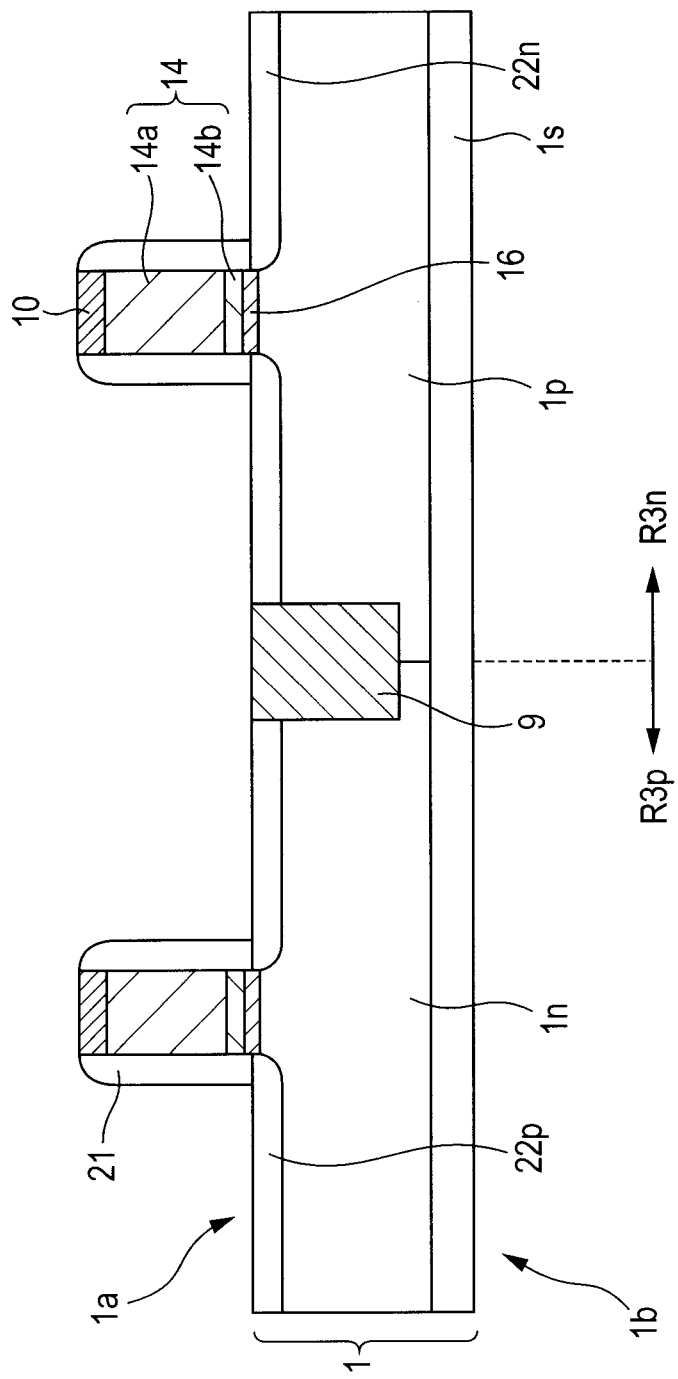
FIG. 92 is a schematic device cross-sectional view (at the completion of introduction of offset spacers and extension regions) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.
Figure 93:
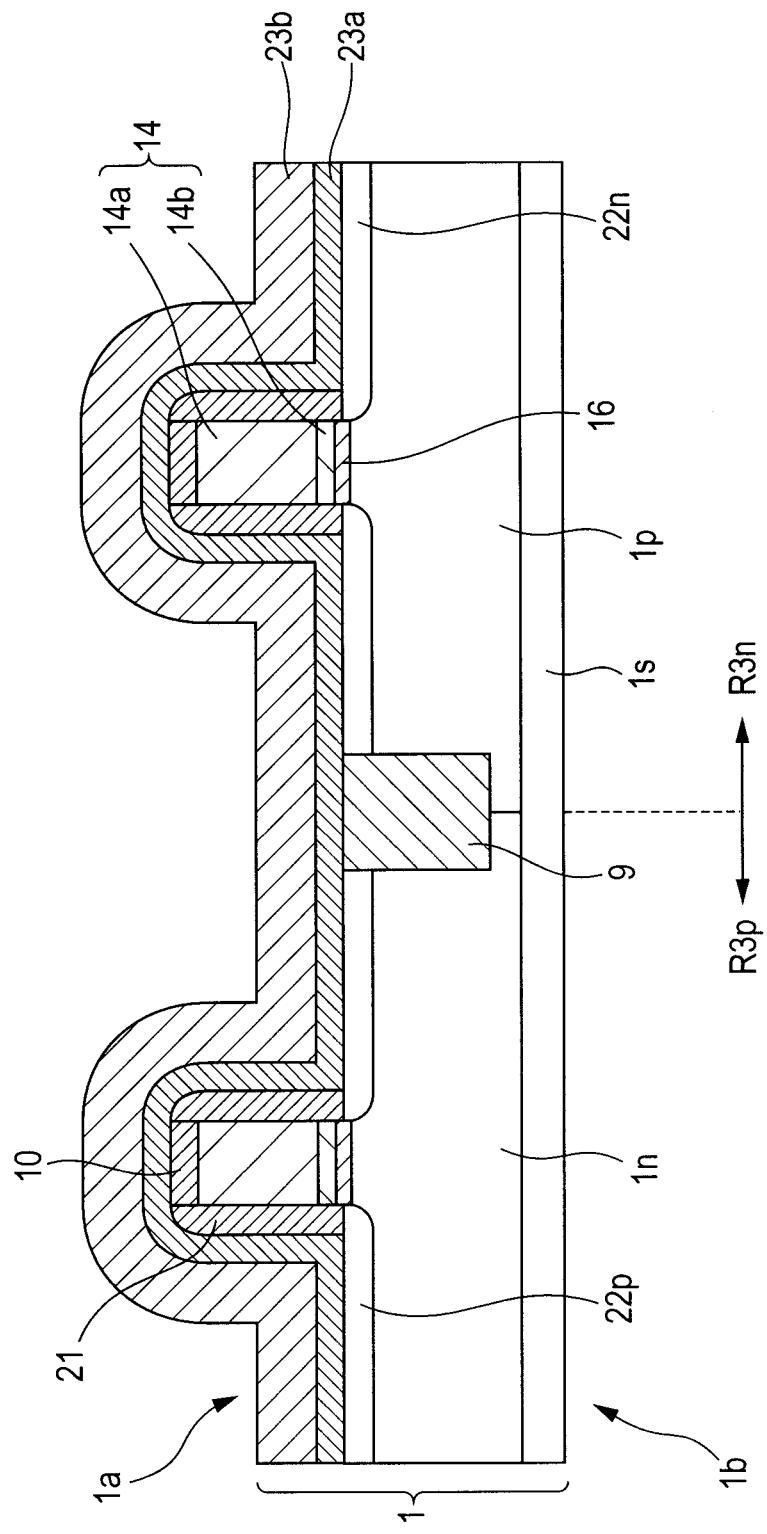
FIG. 93 is a schematic device cross-sectional view (at the completion of deposition of an insulating film for forming sidewalls) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.
Figure 94:
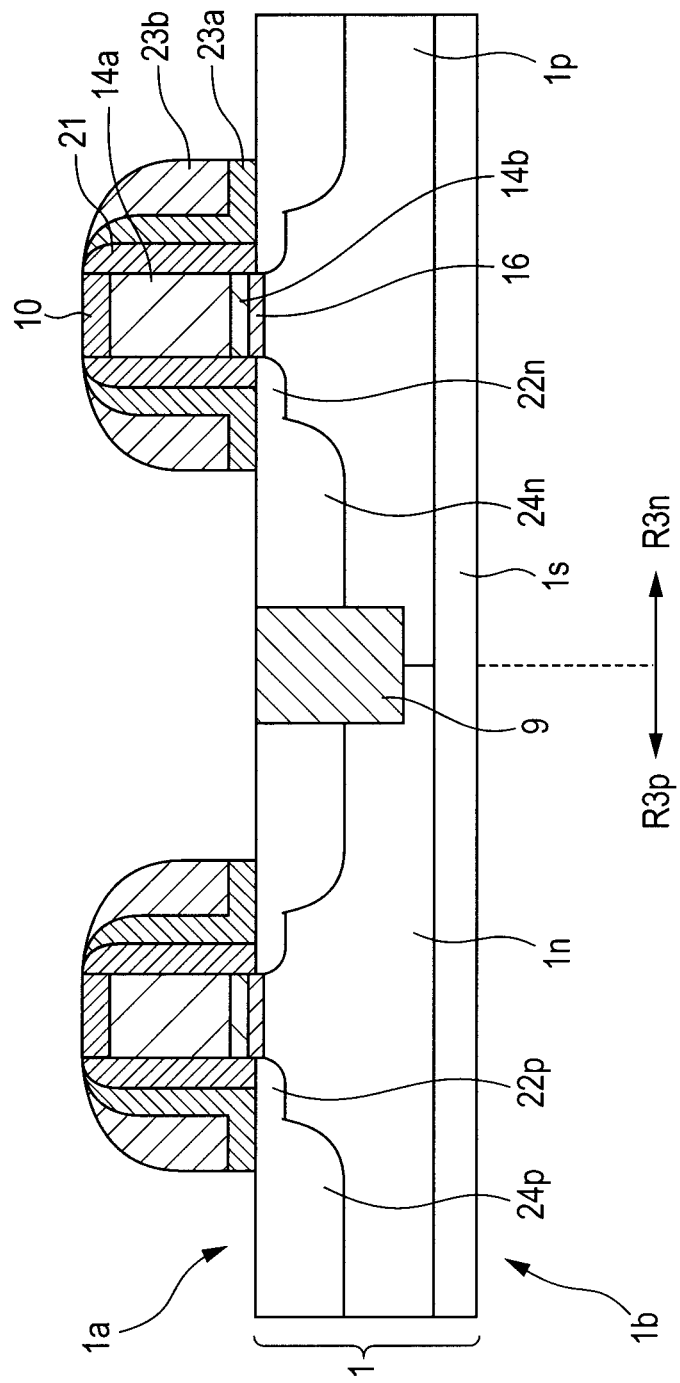
FIG. 94 is a schematic device cross-sectional view (at the completion of formation of the sidewalls) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.
Figure 95:
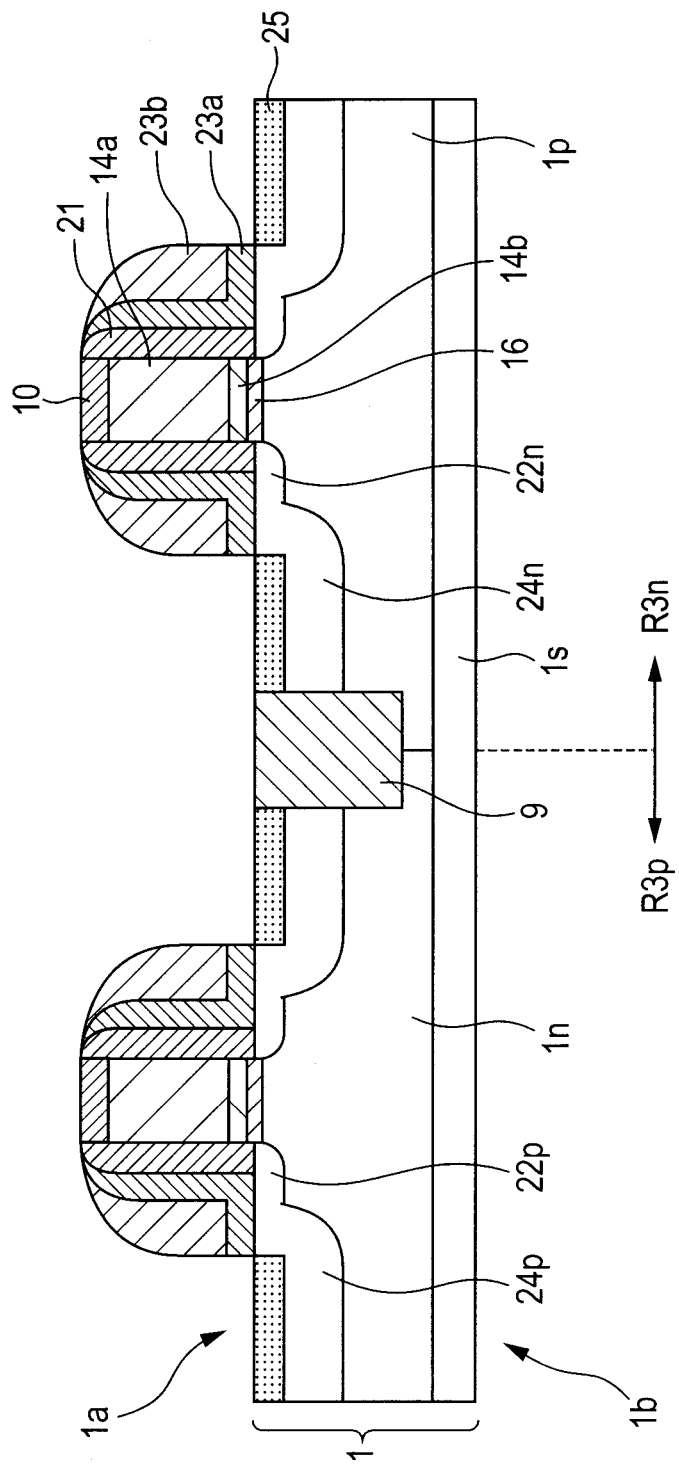
FIG. 95 is a schematic device cross-sectional view (at the completion of formation of silicide layers) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.
Figure 96:
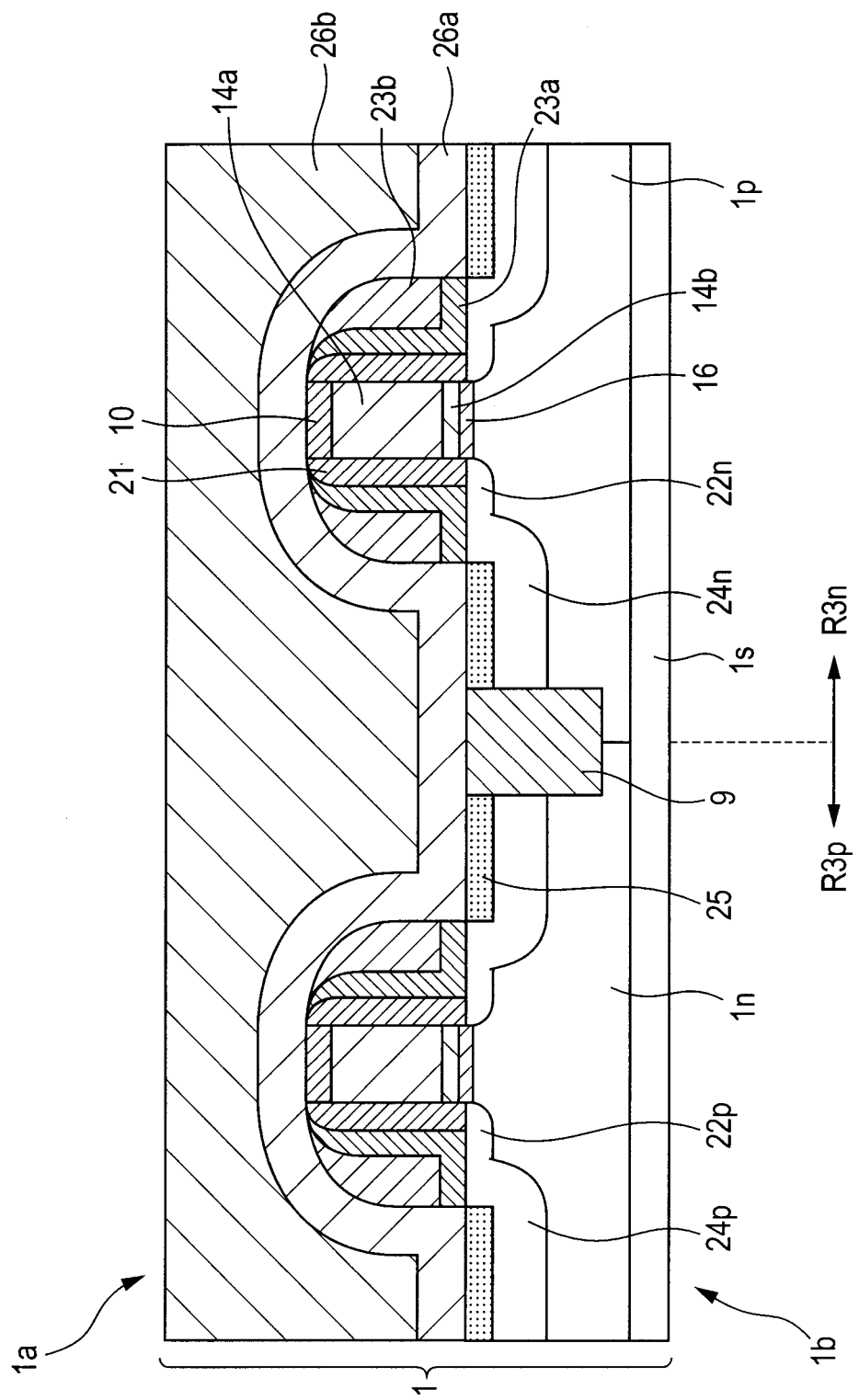
FIG. 96 is a schematic device cross-sectional view (at the completion of deposition of premetal insulting films) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.
Figure 97:
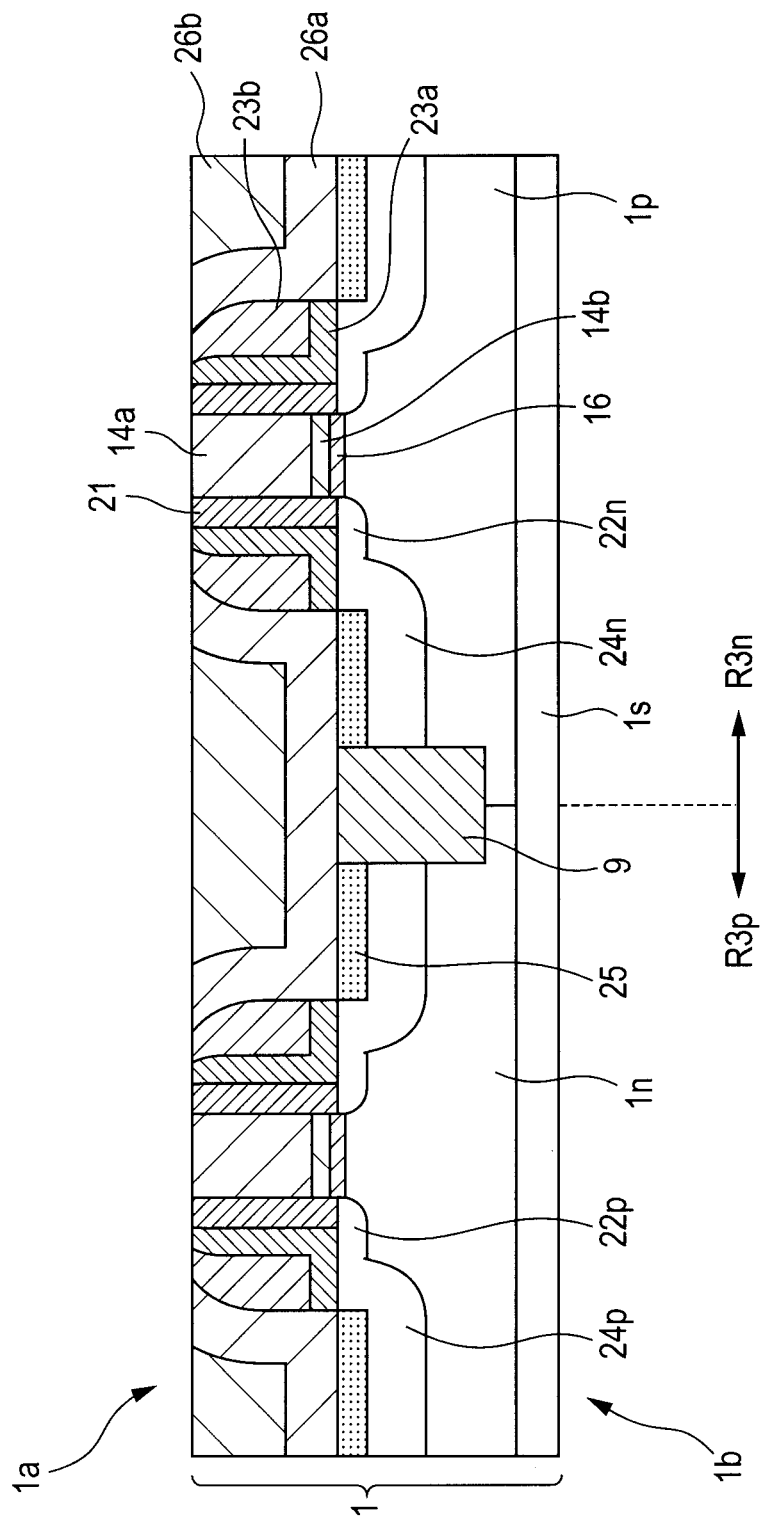
FIG. 97 is a schematic device cross-sectional view (at the completion of a surface planarization step prior to removal of the dummy gate electrodes) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.
Figure 98:
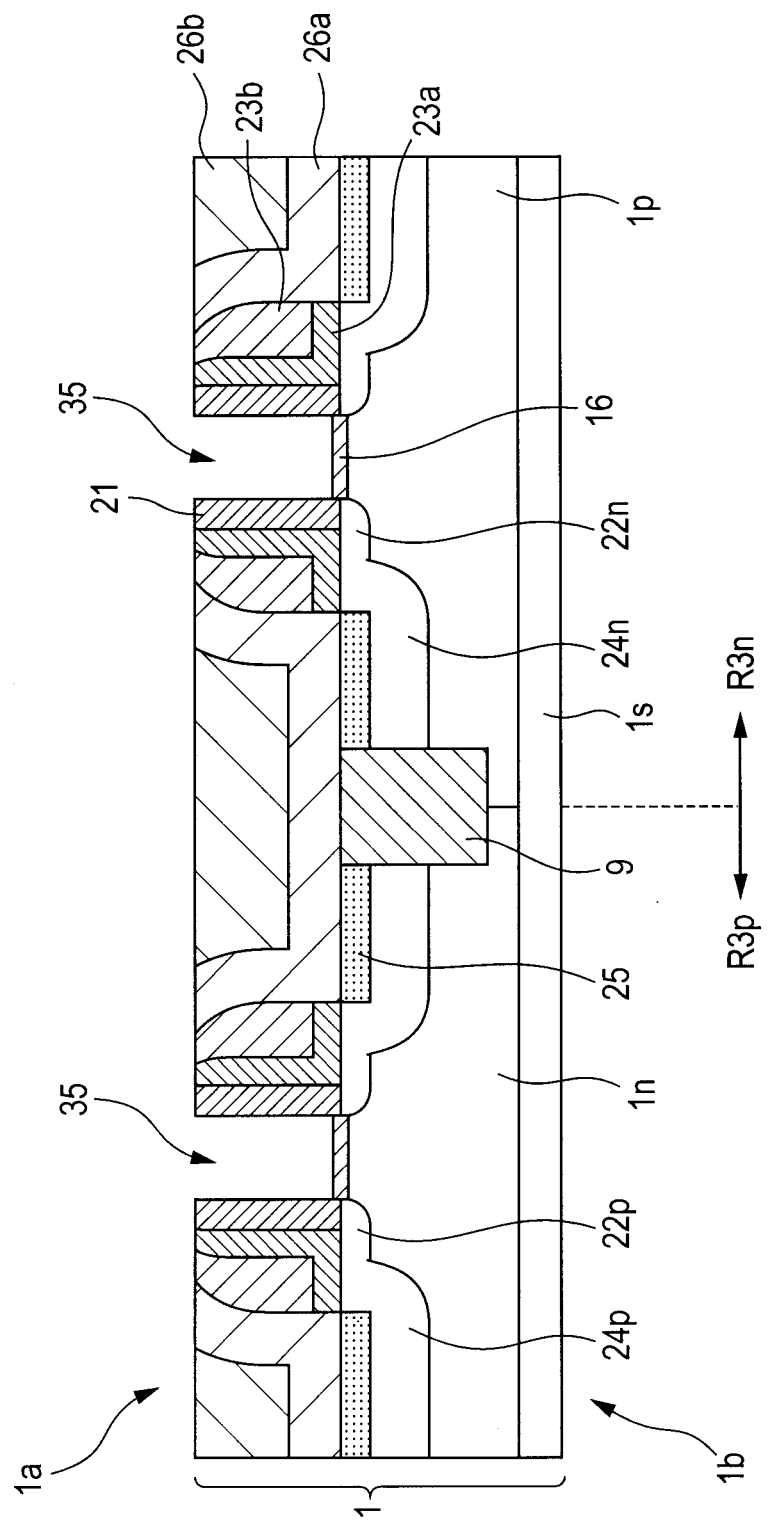
FIG. 98 is a schematic device cross-sectional view (at the completion of a step of removing the dummy gate electrodes) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.
Figure 99:
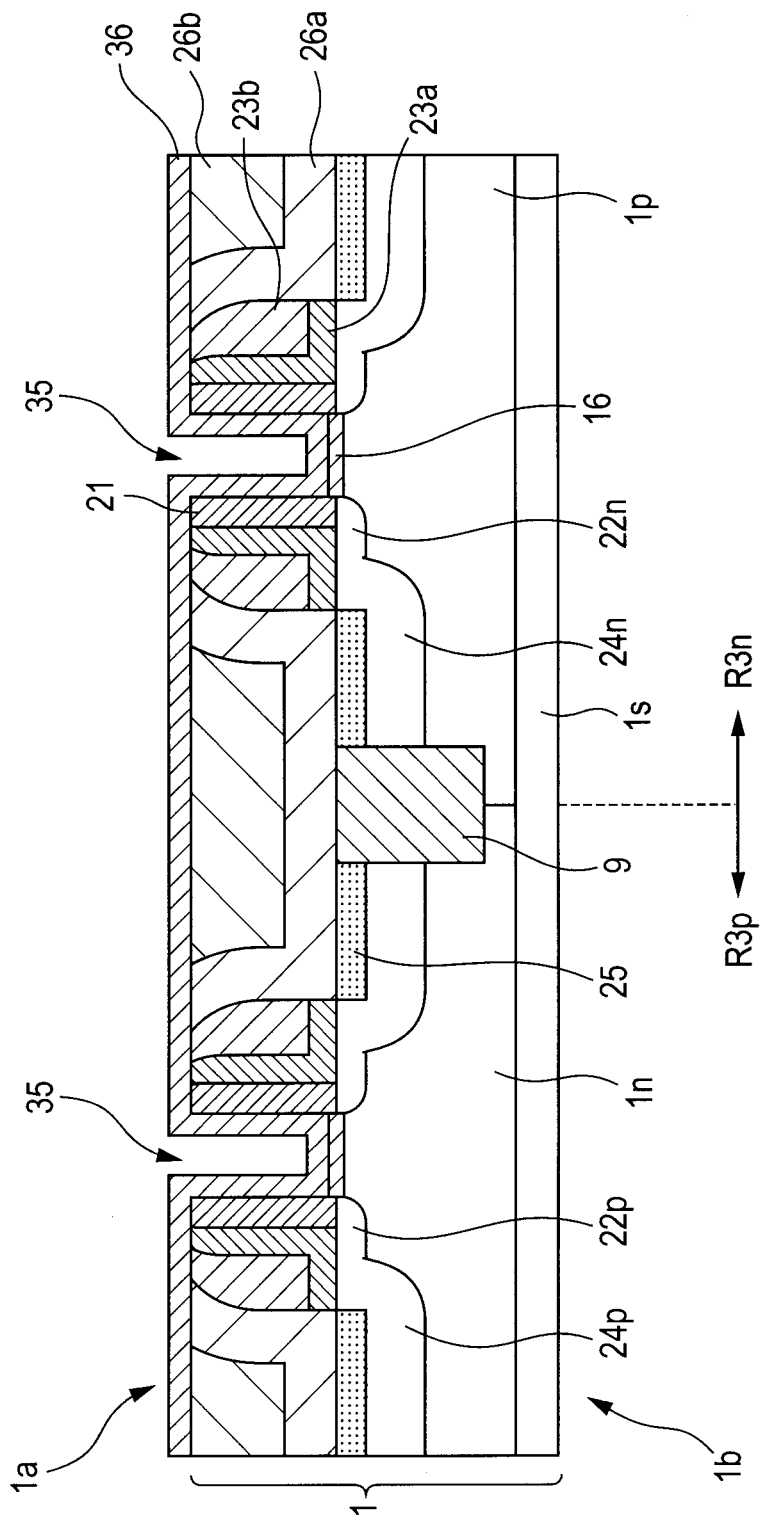
FIG. 99 is a schematic device cross-sectional view (at the completion of a step of depositing an NMIS work function metal film) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.
Figure 100:
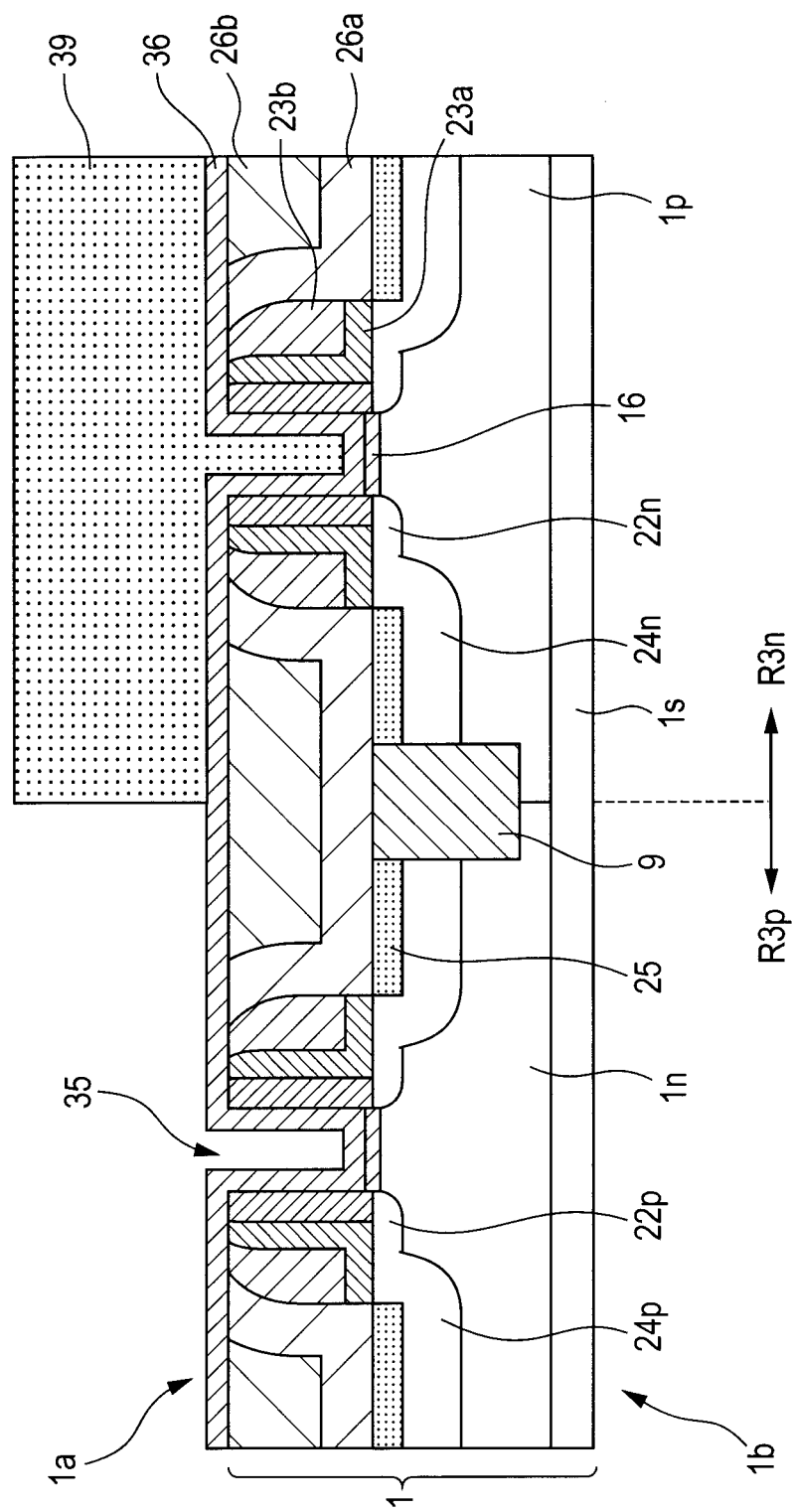
FIG. 100 is a schematic device cross-sectional view (at the completion of a step of patterning a resist film for removing the NMIS work function metal film) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.
Figure 101:
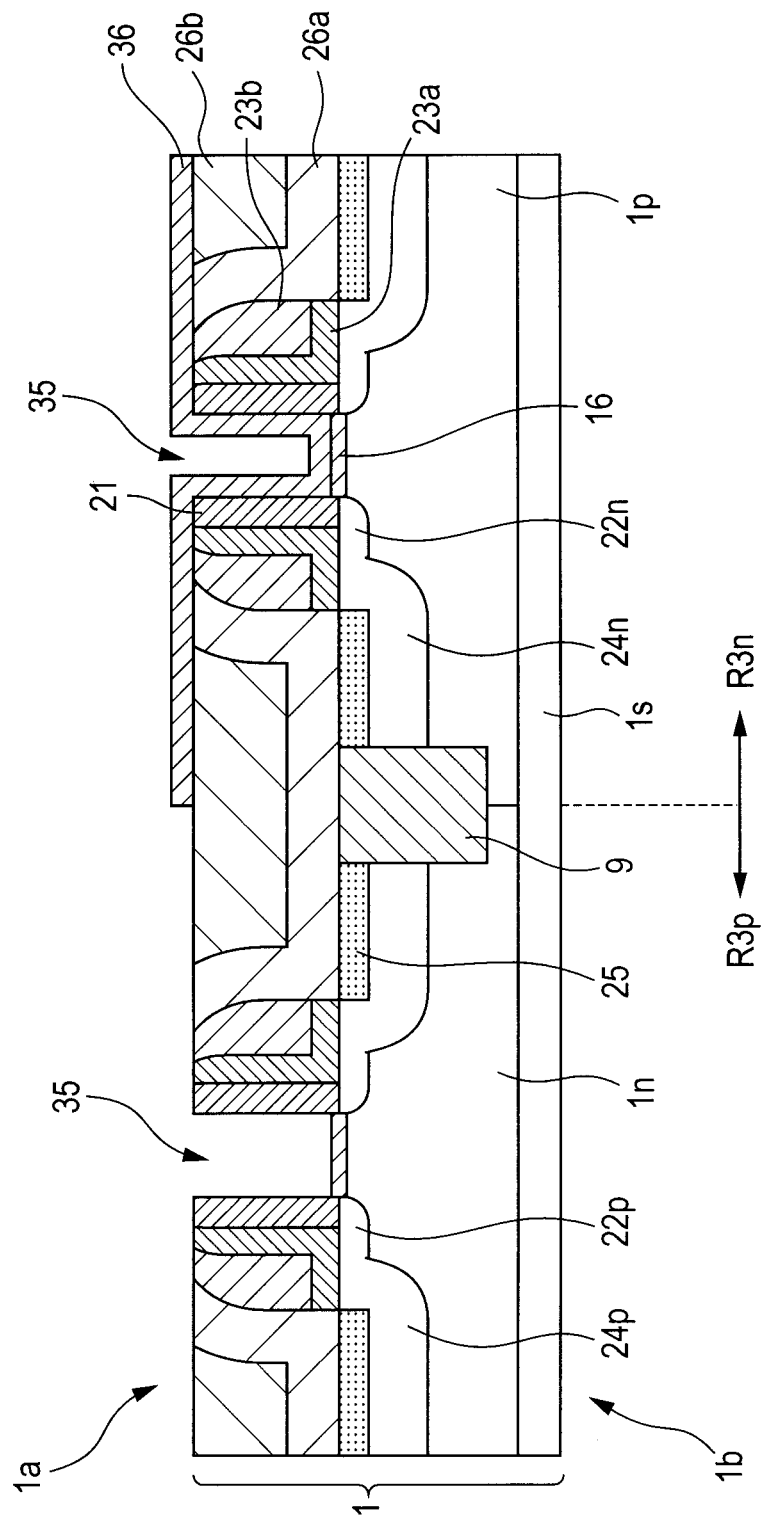
FIG. 101 is a schematic device cross-sectional view (at the completion of a step of patterning the NMIS work function metal film) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.
Figure 102:
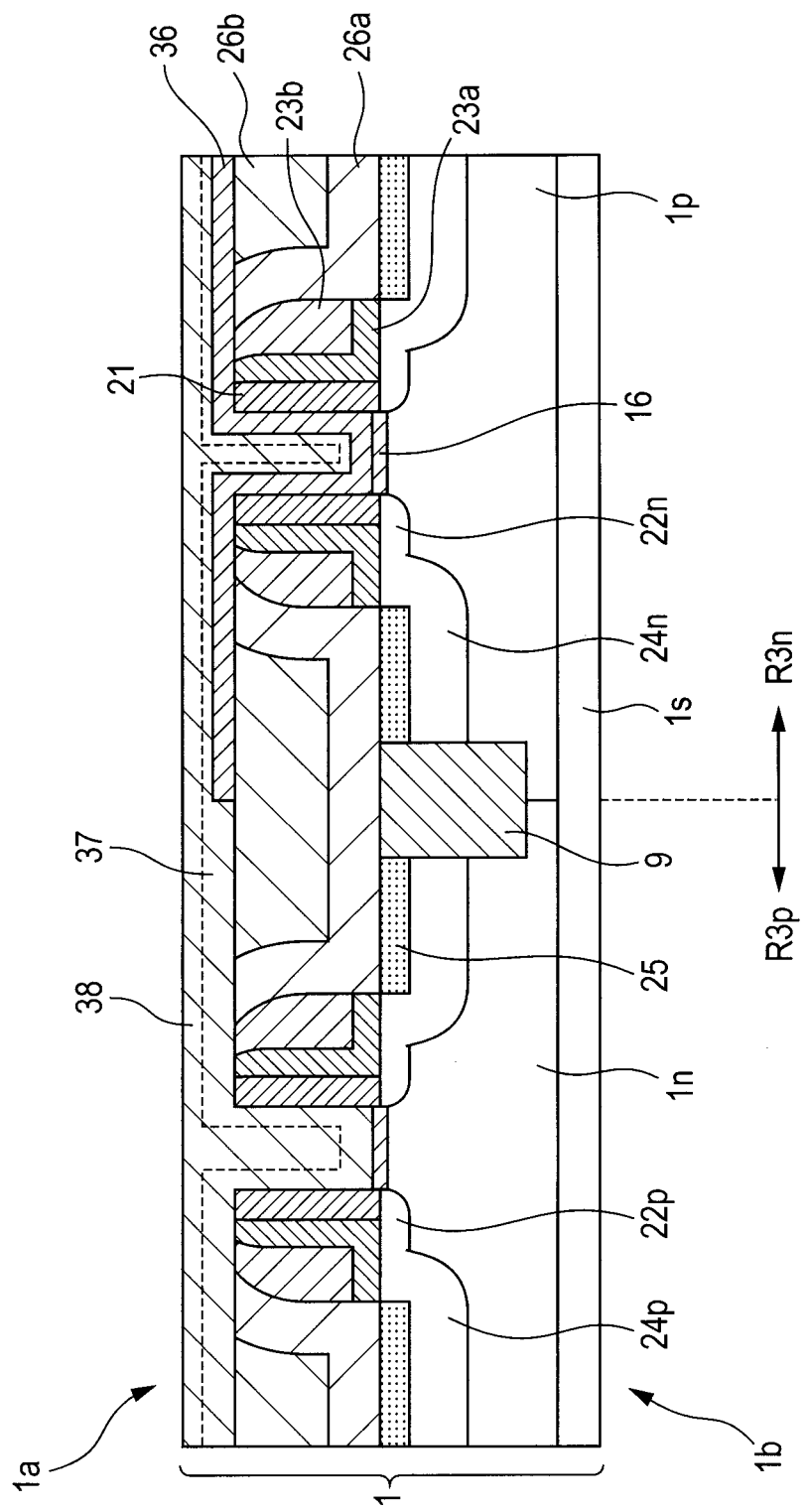
FIG. 102 is a schematic device cross-sectional view (at the completion of a step of depositing a PMIS work function metal film and depositing a metal film for filling gate electrode trenches to be filled) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.
Figure 103:
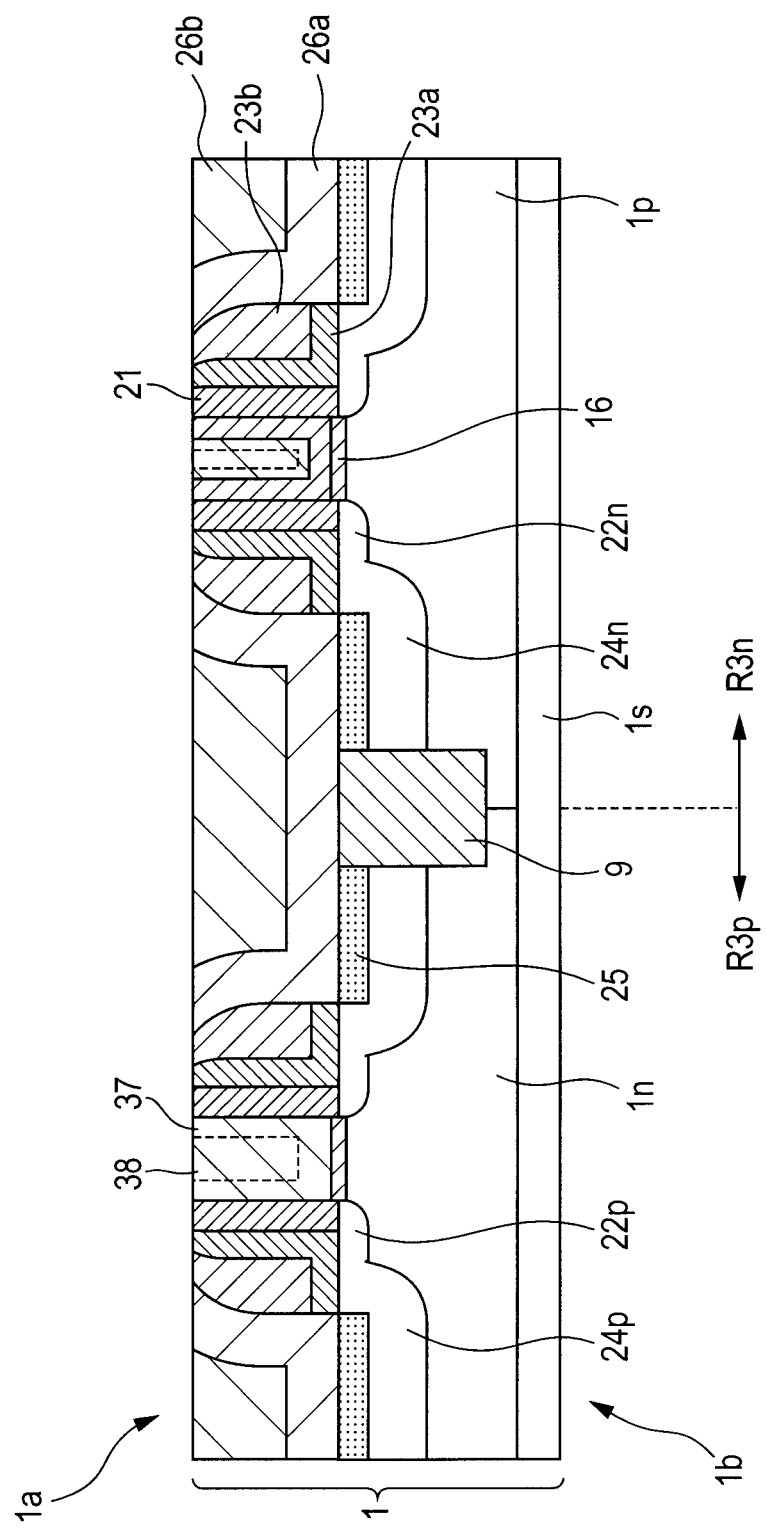
FIG. 103 is a schematic device cross-sectional view (at the completion of a work function metal CMP step) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.
Figure 104:
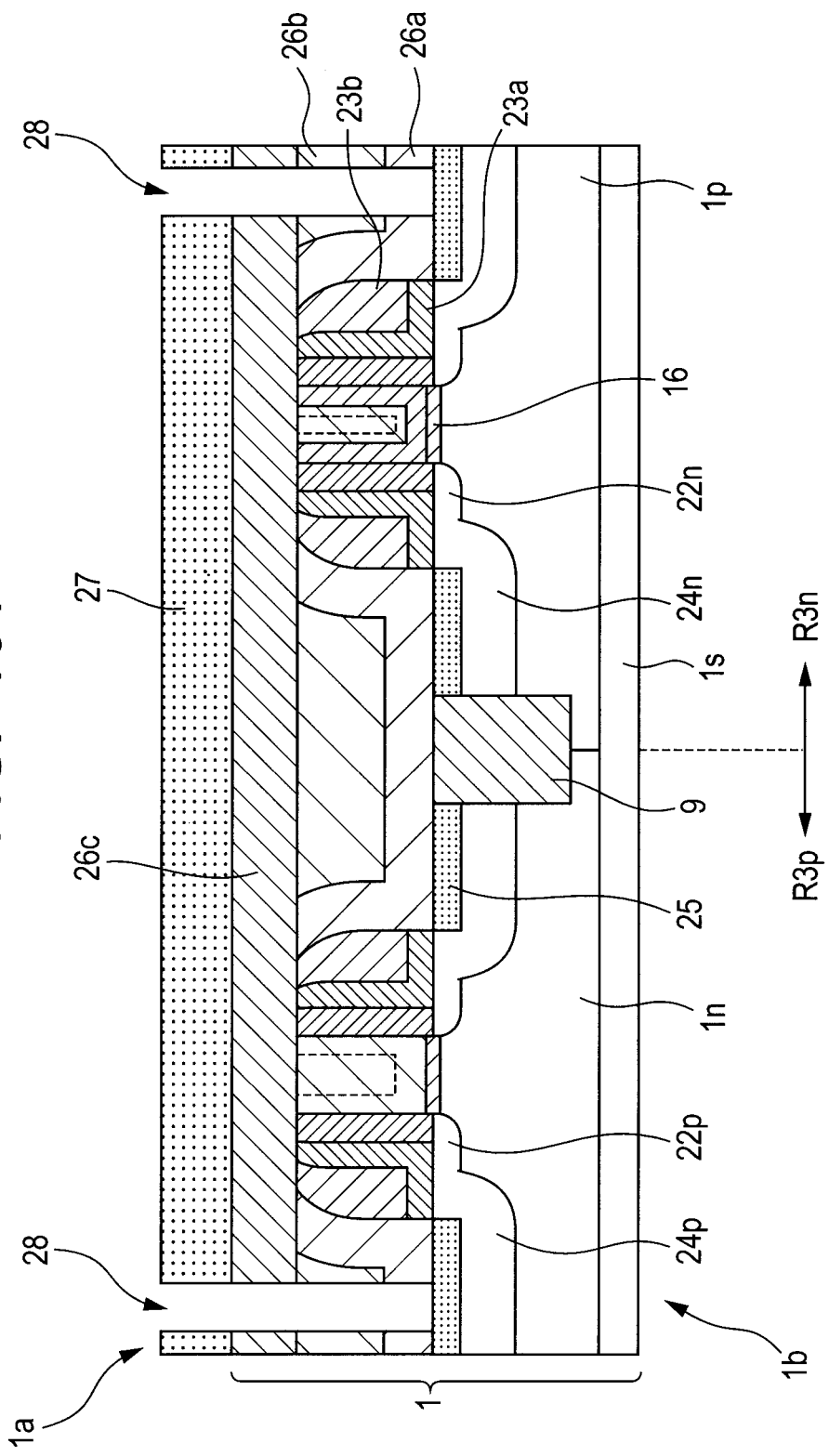
FIG. 104 is a schematic device cross-sectional view (at the completion of formation of contact holes) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.
Figure 105:
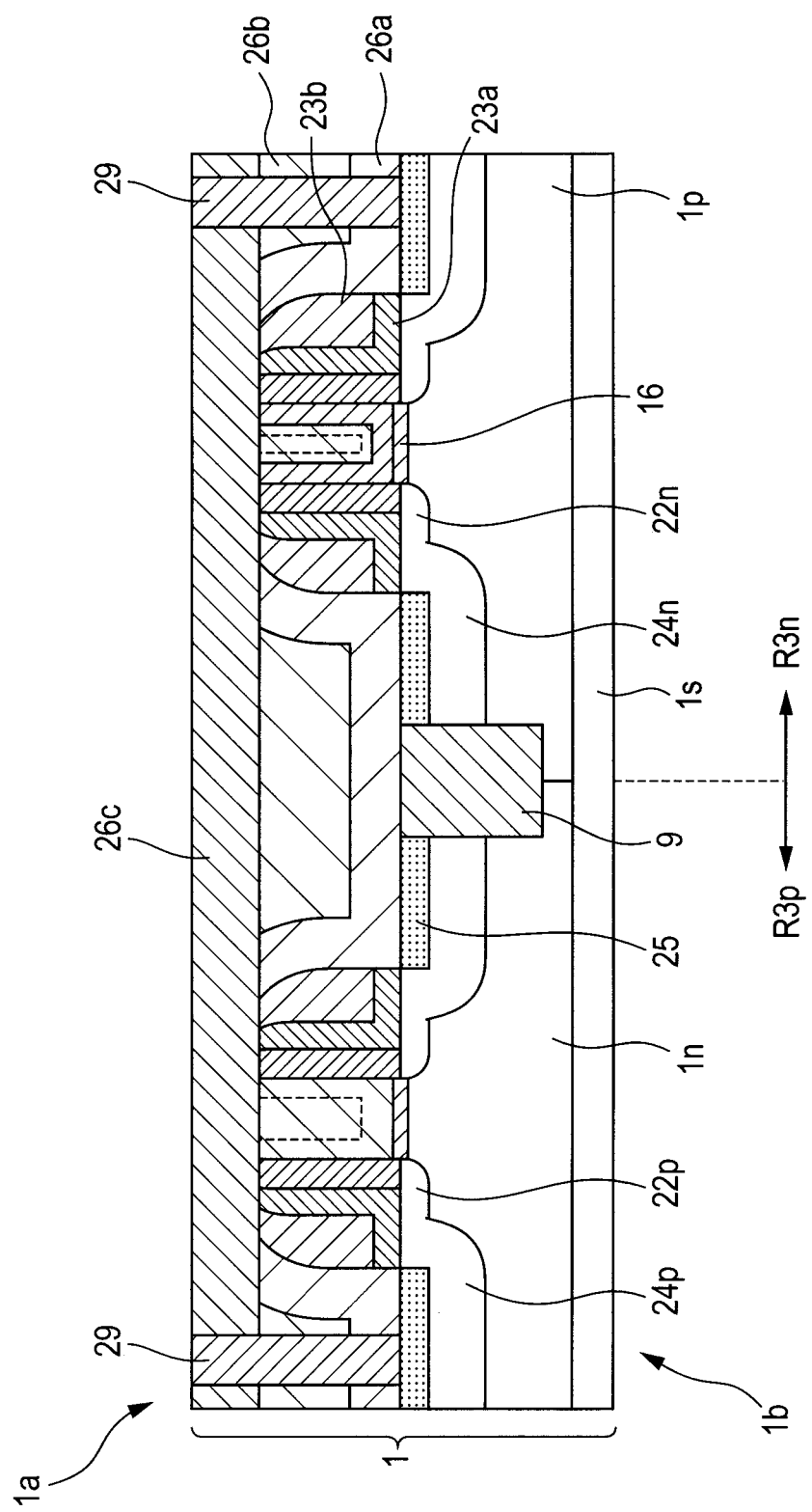
FIG. 105 is a schematic device cross-sectional view (at the completion of burying of tungsten plugs) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention.

FIG. 91 is a schematic device cross-sectional view (the same as FIG. 90, i.e., at the completion of dummy gate electrode patterning & the completion of removal of the lower-layer film of the multilayer resist film) of a CMISFET pair cut-away portion R3 from the non-memory region of FIG. 69, which is for illustrating the outline of a main process after dummy gate processing in the manufacturing method of the semiconductor integrated circuit device of the above embodiment of the third part of the present invention. FIG. 92 is a schematic device cross-sectional view (at the completion of introduction of offset spacers and extension regions) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. FIG. 93 is a schematic device cross-sectional view (at the completion of deposition of an insulating film for forming sidewalls) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. FIG. 94 is a schematic device cross-sectional view (at the completion of formation of the sidewalls) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. FIG. 95 is a schematic device cross-sectional view (at the completion of formation of silicide layers) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. FIG. 96 is a schematic device cross-sectional view (at the completion of deposition of premetal insulting films) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. FIG. 97 is a schematic device cross-sectional view (at the completion of a surface planarization step prior to removal of the dummy gate electrodes) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. FIG. 98 is a schematic device cross-sectional view (at the completion of a step of removing the dummy gate electrodes) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. FIG. 99 is a schematic device cross-sectional view (at the completion of a step of depositing an NMIS work function metal film) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. FIG. 100 is a schematic device cross-sectional view (at the completion of a step of patterning a resist film for removing the NMIS work function metal film) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. FIG. 101 is a schematic device cross-sectional view (at the completion of a step of patterning the NMIS work function metal film) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. FIG. 102 is a schematic device cross-sectional view (at the completion of a step of depositing a PMIS work function metal film and depositing a metal film for filling gate electrode trenches to be filled) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. FIG. 103 is a schematic device cross-sectional view (at the completion of a work function metal CMP step) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. FIG. 104 is a schematic device cross-sectional view (at the completion of formation of contact holes) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. FIG. 105 is a schematic device cross-sectional view (at the completion of burying of tungsten plugs) of the CMISFET pair cut-away portion R3 from the non-memory region of FIG. 69, which is for illustrating the outline of the main process after dummy gate processing in the manufacturing method of the semiconductor integrated circuit device of the above embodiment of the third part of the present invention. Based on these drawings, a description will be given to the outline of a main process after gate processing in the manufacturing method of the semiconductor integrated circuit device of the above embodiment of the present invention.

Based on FIG. 91 (showing the same process step as in FIGS. 77 and 90), a description will be given to portions corresponding to a P-channel device region R3p of the CMISFET pair cut-away portion from the non-memory region and an N-channel device region R3n of the CMISFET pair cut-away portion from the non-memory region of FIG. 69 after the time when the patterning of the line & space pattern of the dummy gate electrodes is completed. As shown in FIG. 91, in the upper half of the P-type single-crystal silicon substrate portion of the wafer 1, an N-well region 1n and a P-well region 1p are provided.

Next, as shown in FIG. 92, over substantially the entire device surface 1a of the wafer 1, an offset spacer silicon nitride film 21 (having a thickness of, e.g., about 2 to 7 nm) is deposited by, e.g., CVD. Subsequently, by anisotropic dry etching, the offset spacer silicon nitride film 21 is etched back to form the offset spacers 21.

Subsequently, into the respective surface areas of the device surface 1a of the wafer 1 in the P-channel device region R3p and the N-channel device region R3n, P-type extension regions 22p (examples of conditions for ion plantation include an ion species of $BF_2$, an implantation energy of 1 KeV to 5 KeV, and a dose of $1\times10^{15}/cm^2$ to $8\times10^{15}/cm^2$ and an ion species of C, an implantation energy of 1 KeV to 5 KeV, and a dose of $4\times10^{14}/cm^2$ to $9\times10^{14}/cm^2$) and N-type extension regions 22n (examples of conditions for ion plantation include an ion species of As, an implantation energy of 1 KeV to 10 KeV, and a dose of $1\times10^{15}/cm^2$ to $9\times10^{15}/cm^2$ and an ion species of C, an implantation energy of 1 KeV to 5 KeV, and a dose of $4\times10^{14}/cm^2$ to $9\times10^{14}/cm^2$) are introduced by ion implantation.

Next, as shown in FIG. 93, over substantially the entire device surface 1a of the wafer 1, a sidewall silicon oxide film 23a (having a thickness of, e.g., about 5 to 10 nm) is deposited by, e.g., CVD. Subsequently, over substantially the entire upper surface of the sidewall silicon oxide film 23a, a sidewall silicon nitride film 23b (having a thickness of, e.g., about 20 to 30 nm) is deposited by, e.g., CVD.

Next, as shown in FIG. 94, by anisotropic dry etching, the sidewall silicon oxide film 23a and the sidewall silicon nitride film 23b are etched back to form the silicon oxide film sidewalls 23a and the silicon nitride film sidewalls 23b. Subsequently, into the respective surface areas of the device surface 1a of the wafer 1 in the P-channel device region R3p and the N-channel device region R3n, P-type heavily doped source/drain regions 24p (examples of conditions for ion plantation include an ion species of B, an implantation energy of 0.5 KeV to 20 KeV, and a dose of $1\times10^{15}/cm^2$ to $8\times10^{15}/cm^2$) and N-type heavily doped source/drain regions 24n (examples of conditions for ion plantation include an ion species of As, an implantation energy of 2 KeV to 40 KeV, and a dose of $8\times10^{14}/cm^2$ to $4\times10^{15}/cm^2$ and an ion species of P, an implantation energy of 10 KeV to 80 KeV, and a dose of $1\times10^{13}/cm^2$ to $8\times10^{13}/cm^2$) are introduced by ion implantation.

Next, as shown in FIG. 95, by a Salicide process, silicide layers 25 such as, e.g., nickel platinum silicide layers are formed in the surface areas of the source/drain regions.

Next, as shown in FIG. 96, over substantially the entire device surface 1a of the wafer 1, a silicon nitride film (having a thickness of, e.g., about 20 to 30 nm) is deposited as a premetal lower-layer insulating film 26a by, e.g., plasma CVD. Subsequently, over substantially the entire upper surface of the silicon nitride film 26a, a silicon oxide film (having a thickness of, e.g., about 150 to 240 nm) is deposited as a premetal upper-layer insulating film 26b by, e.g., plasma CVD.

Next, as shown in FIG. 97, CMP (Chemical Mechanical Polishing) is performed on the device surface 1a of the wafer and stopped at the upper surfaces of the dummy-gate-electrode upper-layer films 14a.

Next, as shown in FIG. 98, the dummy gate electrodes 14 are removed by etching. Here, the removal of the dummy-gate-electrode upper-layer films 14a is performed by dry etching in a gas system of, e.g., $O_2/CF_4$ or the like, and the removal of the dummy-gate-electrode lower-layer film 14b is performed by wet etching using, e.g., a $HCl/H_2O_2$-based chemical solution.

Next, as shown in FIG. 99, over the entire device surface 1a of the wafer 1, an NMIS work function metal film 36 (e.g., a TiN film) having a thickness of, e.g., about 2 nm is deposited by, e.g., sputtering deposition or the like.

Next, as shown in FIG. 100, a resist film 39 for removing the NMIS work function metal film is patterned by typical lithography.

Next, as shown in FIG. 101, using the patterned resist film 39 for removing the NMIS work function metal film as a mask, an unneeded portion the NMIS work function metal film 36 is removed by, e.g., wet etching. Thereafter, the resist film 39 for removing the NMIS work function metal film that is no longer needed is entirely removed by ashing or the like. Examples of a solution for removing the NMIS work function metal film 36 that can be shown include, e.g., a HCl/H$_2$O$_2$-based chemical solution.

Next, as shown in FIG. 102, over the entire device surface 1a of the wafer 1, a PMIS work function metal film 37 (e.g., TiAlN film) having a thickness of, e.g., about 1.5 nm is deposited by, e.g., sputtering deposition or the like. Subsequently, over substantially the entire upper surface of the PMIS work function metal film 37, a gate-electrode-trench filling metal film 38 having a thickness of, e.g., about 20 nm is deposited by, e.g., sputtering deposition or the like.

Next, as shown in FIG. 103, the respective portions of the PMIS work function metal film 37 and the gate-electrode-trench filling metal film 38 which are located outside gate electrode trenches 35 to be filled are removed by, e.g., metal CMP.

Subsequently, as shown in FIG. 104, over substantially the entire upper surface of the silicon oxide film 26b, a silicon oxide film 26c is formed. Subsequently, over substantially the entire upper surface of the silicon oxide film 26c, a resist film 27 for forming contact holes is formed by coating or the like. Subsequently, by typical lithography (e.g., ArF lithography), the resist film 27 is patterned. By anisotropic dry etching using the patterned resist film 27 as a mask, contact holes 28 are opened in the silicon oxide film 26c, the silicon oxide film 26b, and the silicon nitride film 26a. Thereafter, the resist film 27 that is no longer needed is removed by ashing or the like.

Next, as shown in FIG. 105, tungsten plugs 29 are buried in the contact holes 28. Thereafter, as necessary, multilayer wiring is formed by a copper-based damascene method (buried wiring method) or an aluminum-based normal wiring method (non-buried wiring method).

5. Description of SRAM memory cell in SOC Chip as Example of Target Device, etc. in Manufacturing Method of Semiconductor Integrated Circuit Device of Above Embodiment of Present Invention (See Mainly FIGS. 106 and 107)

Here, the specific description has been given using the 6-transistor cell as an example, but the invention disclosed in the present application is not limited thereto. It will be appreciated that the present invention is also applicable to a memory cell having another structure.

Figure 106:
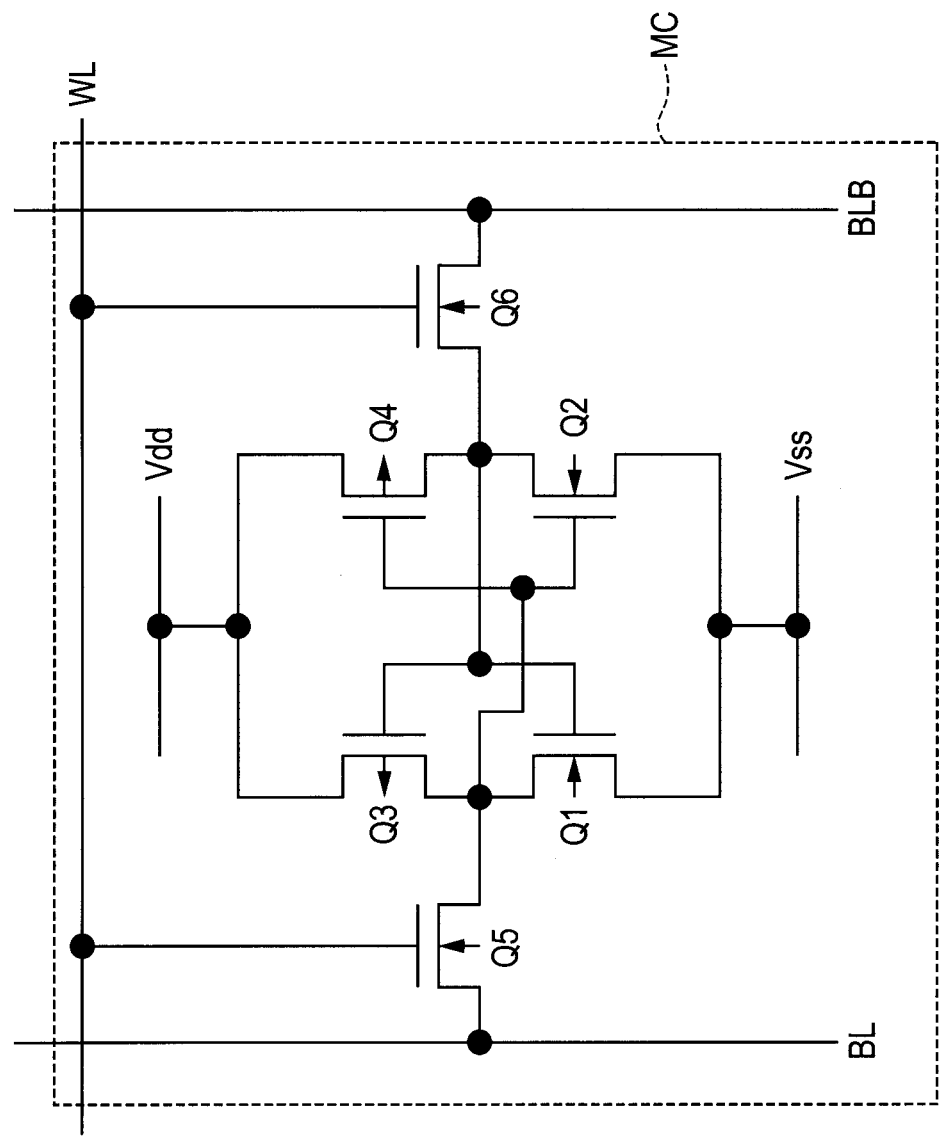
FIG. 106 is a circuit diagram of a SRAM memory cell of the SOC chip as an example of the target device in the manufacturing method of the semiconductor integrated circuit device of the above embodiment of the third part of the present invention.
Figure 107:
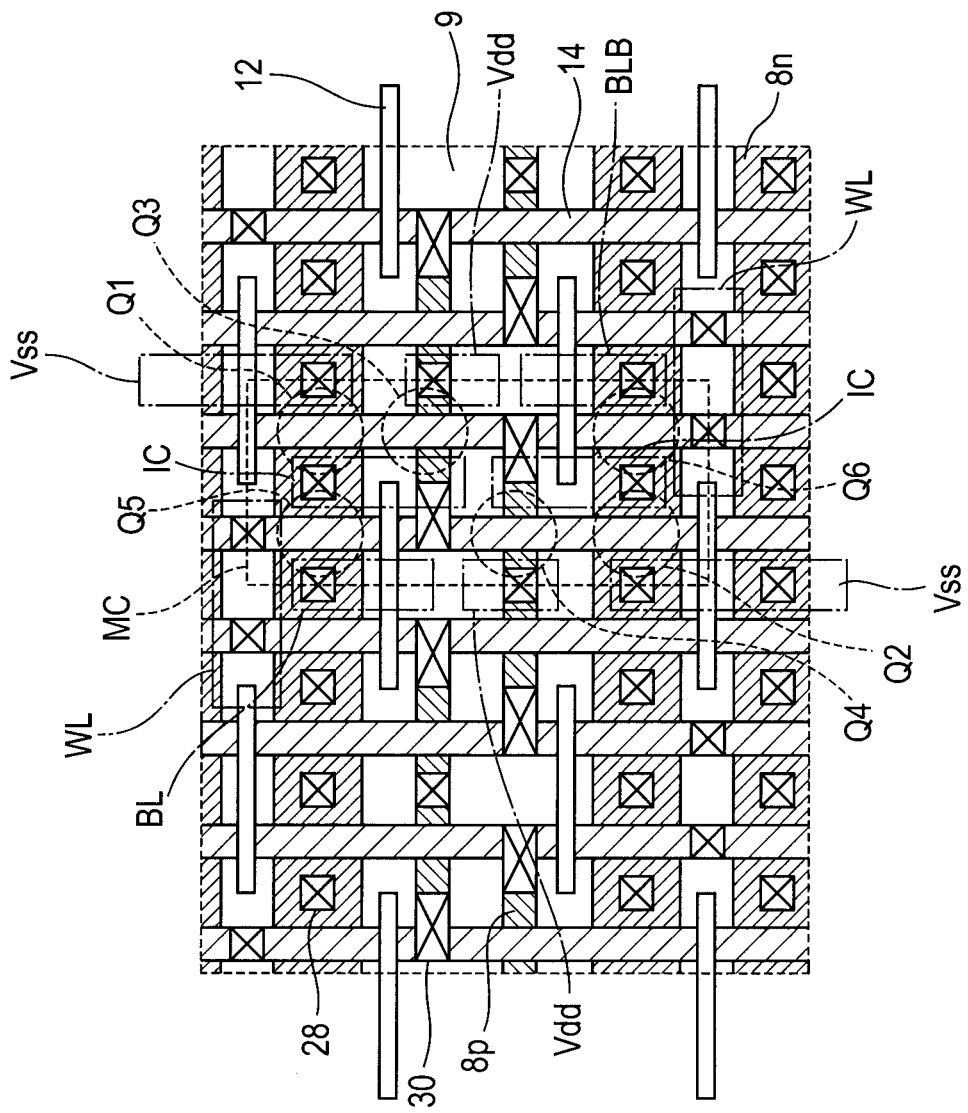
FIG. 107 is a two-dimensional layout diagram of the memory cell showing an example of a real two-dimensional layout of the SRAM memory cell of the SOC chip as the example of the target device in the manufacturing method of the semiconductor integrated circuit device of the above embodiment of the third part of the present invention.

FIG. 106 is a circuit diagram of a SRAM memory cell of the SOC chip as an example of the target device in the manufacturing method of the semiconductor integrated circuit device of the above embodiment of the present invention. FIG. 107 is a two-dimensional layout diagram of the memory cell showing an example of a real two-dimensional layout of the SRAM memory cell of the SOC chip as the example of the target device in the manufacturing method of the semiconductor integrated circuit device of the above embodiment of the present invention.

Based on these drawings, a description will be given to an SRAM memory cell in a SOC chip as an example of the target device and so forth in the manufacturing method of the semiconductor integrated circuit device of the above embodiment of the present invention.

As shown in FIG. 106, in an SRAM memory cell MC, a word line WL and a pair of bit lines BL and BLB are provided to extend orthogonally to each other. In the vicinities of the intersection points thereof, N-type memory transistors Q1 and Q2, P-type memory transistors Q3 and Q4, read transistors Q5 and Q6, a power supply line Vdd for supplying power thereto, a reference voltage line Vss, and the like, are disposed.

FIG. 107 illustrates the SRAM memory cell MC of FIG. 106 which is shown in a real layout. As shown in FIG. 107, it can be seen that a large number of the gate electrodes 14 extending vertically are regularly cut by the cut regions 12 between adjacent gate electrodes. Of a large number of contact portions 28 and 30, those shown in laterally elongated shapes are the shared contact portions 30. Here, the contact portions 28 of active regions 8n of the N-channel devices are coupled to the shared contact portions 30 of active regions 8p of the P-channel devices with interconnection metal wires IC.

6. Supplemental Description, Consideration, etc. to Every Aspect (Including Other Parts) of Present Invention and Manufacturing Method of Semiconductor Integrated Circuit Device of Above Embodiment thereof, etc.

In a SRAM wide cell as shown in Section 5, reducing the longitudinal space portion between adjacent dummy gates, i.e., the cut region 12 between adjacent gate or dummy gate electrodes (see FIG. 74) is an important technical challenge to a reduction in cell area. However, in the generation of 28 nm Technology Node or thereafter, a resolution limit is not surpassed. Therefore, it is impossible to perform dummy gate electrode patterning by one-step lithography (e.g., ArF lithography using exposure light at a wavelength of 193 nm and an immersion projection lithography stepper). Also, in the generation of 28 nm technology node or thereafter, a Gate stack Structure includes a High-k gate insulating film and a metal-based gate so that oxidation resistance and wet treatment resistance tend to deteriorate. In addition, since it is necessary to use a multilayer resist process (in the generation of 45 nm technology node or thereafter), there is also a problem specific to the multilayer resist process.

To solve the problem of the resolution limit, the present invention uses a Multiple Patterning Process which repeats patterning of an etching mask film such as a resist film and etching of an underlying film using the patterned etching mask film a plurality of times. However, a method (referred to as a "L & S first method") which simply performs the patterning (first lithography) of the line & space pattern of dummy gate electrodes first, and subsequently performs the patterning (second lithography) of the cut region 12 between adjacent gate or dummy gate electrodes (see FIG. 74) has a problem (see FIG. 69) that a resist film in the second lithography cannot ensure planarity between the memory region 6 (pattern high-density region) and the non-memory region 7 (pattern low-density region).

Accordingly, in the example shown in Sections 2 to 4, for example, the patterning (first lithography) of the hard mask into the pattern of the cut region 12 between adjacent gate or dummy gate electrodes (see FIG. 71) is performed first, then the patterning (second lithography) of the same hard mask 10 (see FIG. 74) into the line & space pattern of the dummy gate electrodes is performed and, using the patterned hard mask, an underlying gate stack structure is processed (referred to as a "hard mask multiple patterning method"). In accordance with the hard mask multiple patterning method, the hard mask 10 (see FIG. 75) is relatively thin so that planarity at the time of second exposure to light presents no problem. In the above embodiment, the method (referred to as the L & S last method) has been used in which the patterning of the cut region between adjacent gate or dummy gate electrodes is performed first in terms of exposure order, but the L & S first method may also be used in which the patterning of the line & space pattern is performed first.

Also, when a shrinkage treatment (treatment for reducing the area of the resist opening corresponding to the cut region 12 between adjacent gate or dummy gate electrodes) is involved in the patterning of the cut region 12 between adjacent gate or dummy gate electrodes (see FIG. 6), in accordance with a simple L & S first method, roughness in an underlie is significant so that a post-shrinkage shape becomes unstable depending on the underlie. On the other hand, in the L & S last method using the hard mask multiple patterning method, the underlie is extremely planar so that the post-shrinkage shape is significantly stabilized.

In addition, to solve the problems of deteriorated oxidation resistance and wet treatment resistance, it is effective not only to use the hard mask multiple patterning method, but also to perform layout such that the cut region 12 between adjacent gate or dummy gate electrodes (see FIG. 72) is included within the isolation region 9 (referred to as a "layout method which locates gate end portions within the isolation region"). In the multiple patterning process, removal of a resist film involving ashing and a wet chemical solution treatment is performed a plurality of times so that excessive recession of a gate insulating film and excessive oxidation of a metal-based gate electrode portion are likely to occur (though, in a method using a hard mask, damage resulting from ashing or a wet chemical solution treatment is relatively smaller than in a method not using a hard mask). However, in the layout method which locates gate end portions within the isolation region, such a multiple treatment is performed not over the active region, but mainly over the isolation region 9 (see FIG. 72). Therefore, it is possible to reduce influence on device characteristics.

Note that, in the hard mask multiple patterning method (irrelevant to exposure order), it is effective to perform the patterning of the gate electrodes in the non-memory region 7 simultaneously with the patterning of the line & space pattern of the gate electrodes in the memory region 6. This is because, since the shrinkage treatment increases the width of the covering portion of the resist, it cannot be used for the patterning of the line & space pattern of the gate electrodes. Additionally, by doing so, there is also the advantage of allowing a trimming treatment to be used for the patterning of the line & space pattern of the gate electrodes in the memory region 6 and the non-memory region 7 (irrespective of the presence or absence of the shrinkage treatment).

Also, in the hard mask multiple patterning method (irrelevant to exposure order), process consistency with a selective epitaxial filling method for the source/drain regions (see FIG. 59) is excellent.

Note that, in the second part, the description has been given mainly to the L & S first method using the hard mask. However, the L & S last method used for the dummy gates in the third part may also be used for the intrinsic gates in the second part.

7. Summary

While the invention achieved by the present inventors has been specifically described heretofore based on the embodiment thereof, the present invention is not limited thereto. It will be appreciated that various changes and modifications can be made in the invention within the scope not departing from the gist thereof.

For example, in the above embodiment, the specific description has been given by mainly using the Dummy Gate Process in the Gate Last method as an example, but the present invention is not limited thereto. It will be appreciated that the present invention is also applicable to the Gate First method.

Also, in the above embodiment, the specific description has been given by mainly using the method which uses the Hard Mask for either one or both of the Patterning of the cut region between adjacent gate or dummy gate electrodes and the patterning of the Line & space Pattern of the dummy gate electrodes as an example, but the present invention is not limited thereto. It will be appreciated that the present invention is also applicable to a method which uses the hard mask for either one of the Patterning of the cut region between adjacent gate or dummy gate electrodes and the patterning of the Line & space Patterning of the dummy gate electrodes or to a method which does not use a hard mask for either of the methods.

Also, in the above embodiment, the specific description has been given mainly to the example in which the typical silicon-based (not a silicon-based alloy) member is used in the source/drain regions, but the present invention is not limited thereto. It will be appreciated that the present invention is also applicable to an example in which a silicon-based alloy (SiGe or SiC) is used in source/drain regions.

Also, in the above embodiment, the specific description has been given mainly to the gate last method belonging to a high-k first/metal gate last method in which a gate insulating film is formed first, and then metal gate electrode and poly-silicon electrode portions are replaced with new metal gate electrodes, but the present invention is not limited thereto. It will be appreciated that the present invention is also applicable to a method in which the gate insulating film is entirely or partly replaced or the like.

What is claimed is:

1. A method of manufacturing a semiconductor integrated circuit device, comprising the steps of:
   (a) providing a semiconductor wafer having first and second main surfaces, of which the first main surface has a plurality of chip regions including a memory region and a non-memory region;
   (b) forming, over the first main surface of the semiconductor wafer, a gate stack film having a lower-layer high-k gate insulating film and an upper-layer gate metal electrode film;
   (c) forming, over the gate stack film, a first resist film for defining a cut region between adjacent gate electrodes in extending directions of gate electrodes in the memory region;
   (d) performing patterning of the first resist film to form a resist film opening corresponding to the cut region between adjacent gate electrodes;
   (e) performing etching of the gate stack film in the presence of the patterned first resist film;
   (f) after the step (e), removing the first resist film;
   (g) after the step (f), forming, over the first main surface of the semiconductor wafer, a second resist film for defining a line & space pattern corresponding to the gate electrodes in the memory region;
   (h) performing patterning of the second resist film;
   (i) performing etching of the gate stack film in the presence of the patterned second resist film; and
   (j) after the step (i), removing the second resist film.

2. A method of manufacturing a semiconductor integrated circuit device according to claim 1,
   wherein there is no hard mask film between each of the first and second resist films and the gate stack film.

3. A method of manufacturing a semiconductor integrated circuit device according to claim 2,
   wherein the cut region between adjacent gate electrodes is in an isolation region.

4. A method of manufacturing a semiconductor integrated circuit device according to claim 2,
   wherein each of the first and second resist films is a multilayer resist film.

5. A method of manufacturing a semiconductor integrated circuit device according to claim 4,
   wherein the step (e) includes the sub-steps of:

(e1) performing a treatment for reducing the resist film opening; and (e2) after the sub-step (e1), performing anisotropic dry etching of the gate stack film below the resist film opening.

6. A method of manufacturing a semiconductor integrated circuit device according to claim 5, wherein the step (i) includes the sub-steps of:

(i1) performing a treatment for reducing a width of the patterned second resist film; and (i2) after the sub-step (i1), performing anisotropic dry etching of a portion of the gate stack film which is not covered with the second resist film.

7. A method of manufacturing a semiconductor integrated circuit device according to claim 4, wherein each of the first resist film and the second resist film has:

(x1) a lower-layer resist film containing carbon as a main component;

(x2) a middle-layer resist film formed over the lower-layer resist film and containing silicon as a main component; and (x3) an upper-layer resist film formed over the middle-layer resist film.

8. A method of manufacturing a semiconductor integrated circuit device according to claim 4, wherein the second resist film has:

(x1) a lower-layer coated resist film containing carbon as a main component;

(x2) a middle-layer resist film formed over the lower-layer resist film and containing silicon as a main component; and (x3) a photosensitive upper-layer resist film formed over the middle-layer resist film.

9. A method of manufacturing a semiconductor integrated circuit device according to claim 1, wherein the second resist film in the step (g) is for also defining a line & space pattern corresponding to gate electrodes in the non-memory region.

10. A method of manufacturing a semiconductor integrated circuit device according to claim 1, wherein the patterning in each of the steps (d) and (h) is performed by ArF lithography using exposure light at 193 nm.

11. A method of manufacturing a semiconductor integrated circuit device, comprising the steps of:

(a) providing a semiconductor wafer having first and second main surfaces, of which the first main surface has a plurality of chip regions including a memory region and a non-memory region;

(b) forming, over the first main surface of the semiconductor wafer, a gate stack film having a lower-layer high-k gate insulating film and an upper-layer gate metal electrode film;

(c) forming, over the gate stack film, a hard mask film for gate processing;

(d) forming, over the hard mask film for gate processing, a first resist film for defining a cut region between adjacent gate electrodes in extending directions of gate electrodes in the memory region;

(e) performing patterning of the first resist film to form a resist film opening corresponding to the cut region between adjacent gate electrodes;

(f) performing etching of the hard mask film for gate processing in the presence of the patterned first resist film;

(g) after the step (f), removing the first resist film;

(h) after the step (c), forming, over the hard mask film for gate processing, a second resist film for defining a line & space pattern corresponding to the gate electrodes in the memory region;

(i) performing patterning of the second resist film;

(j) performing etching of the hard mask film for gate processing in the presence of the patterned second resist film;

(k) after the step (j), removing the second resist film;

(l) after the steps (g) and (k), performing etching of the gate stack film in the presence of the patterned hard mask film for gate processing; and (m) after the step (l), removing the hard mask film for gate processing.

12. A method of manufacturing a semiconductor integrated circuit device according to claim 11, wherein the step (h) is performed prior to the step (d).

13. A method of manufacturing a semiconductor integrated circuit device according to claim 12, wherein the cut region between adjacent gate electrodes is in an isolation region.

14. A method of manufacturing a semiconductor integrated circuit device according to claim 12, wherein each of the first and second resist films is a multilayer resist film.

15. A method of manufacturing a semiconductor integrated circuit device according to claim 14, wherein the step (e) includes the sub-steps of:

(e1) performing a treatment for reducing the resist film opening; and (e2) after the sub-step (e1), performing anisotropic dry etching of the hard mask film for gate processing below the resist film opening.

16. A method of manufacturing a semiconductor integrated circuit device according to claim 15, wherein the step (i) includes the sub-steps of:

(i1) performing a treatment for reducing a width of the patterned second resist film; and (i2) after the sub-step (i1), performing anisotropic dry etching of a portion of the hard mask film for gate processing which is not covered with the second resist film.

17. A method of manufacturing a semiconductor integrated circuit device according to claim 14, wherein the first resist film has:

(x1) a lower-layer resist film containing carbon as a main component;

(x2) a middle-layer resist film formed over the lower-layer resist film and containing silicon as a main component; and (x3) an upper-layer resist film formed over the middle-layer resist film.

18. A method of manufacturing a semiconductor integrated circuit device according to claim 14, wherein the second resist film has:

(x1) a lower-layer coated resist film containing carbon as a main component;

(x2) a middle-layer resist film formed over the lower-layer resist film and containing silicon as a main component; and (x3) a photosensitive upper-layer resist film formed over the middle-layer resist film.

19. A method of manufacturing a semiconductor integrated circuit device according to claim 11, wherein the second resist film in the step (h) is for defining a line & space pattern corresponding to gate electrodes in the non-memory region.

20. A method of manufacturing a semiconductor integrated circuit device according to claim 11,
wherein the patterning in each of the steps (e) and (i) is performed by ArF lithography using exposure light at 193 nm.

* * * * *